(12) United States Patent
Qiao et al.

(10) Patent No.: US 10,607,987 B2
(45) Date of Patent: Mar. 31, 2020

(54) BIPOLAR-CMOS-DMOS SEMICONDUCTOR DEVICE AND MANUFACTURING METHOD

(71) Applicant: University of Electronic Science and Technology of China, Chengdu (CN)

(72) Inventors: Ming Qiao, Chengdu (CN); Song Pu, Chengdu (CN); Bo Zhang, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 16/255,851

(22) Filed: Jan. 24, 2019

(65) Prior Publication Data
US 2020/0066714 A1 Feb. 27, 2020

(30) Foreign Application Priority Data
Aug. 22, 2018 (CN) .......................... 2018 1 0960849

(51) Int. Cl.
*H01L 27/06* (2006.01)
*H01L 21/8258* (2006.01)
*H01L 21/784* (2006.01)

(52) U.S. Cl.
CPC ........ *H01L 27/0635* (2013.01); *H01L 21/784* (2013.01); *H01L 21/8258* (2013.01)

(58) Field of Classification Search
CPC ............. H01L 27/0635; H01L 21/8258; H01L 21/784
See application file for complete search history.

(56) References Cited

U.S. PATENT DOCUMENTS

| 10,032,766 B2* | 7/2018 | Li ....................... H01L 29/7809 |
| 2010/0163973 A1* | 7/2010 | Nakamura .......... H01L 27/0629 257/328 |
| 2013/0072004 A1* | 3/2013 | Tsuchiko ............ H01L 21/8222 438/492 |
| 2014/0138735 A1* | 5/2014 | Clarke ................ H01L 27/0635 257/124 |
| 2014/0210002 A1* | 7/2014 | Sawase ............... H01L 29/7825 257/334 |

* cited by examiner

*Primary Examiner* — Yasser A Abdelaziez
(74) *Attorney, Agent, or Firm* — Bayramogiu Law Offices LLC

(57) ABSTRACT

A BIPOLAR-CMOS-DMOS (BCD) semiconductor device and manufacturing method, which can integrate a Junction Field-Effect Transistor (JFET), two classes of Vertical Double-diffusion Metal Oxide Semiconductor (VDMOS), a Lateral Insulated-Gate Bipolar Transistor (LIGBT) and seven kinds of Laterally Diffused Metal Oxide Semiconductor (LDMOS), a low-voltage Negative channel Metal Oxide Semiconductor (NMOS), a low-voltage Positive channel Metal Oxide Semiconductor (PMOS), a low-voltage Negative-Positive-Negative (NPN) transistor and a low-voltage Positive-Negative-Positive (PNP) transistor, and a diode in the same chip. Bipolar devices in the analog circuit, power components in the switch circuit, Complementary Metal Oxide Semiconductor (CMOS) devices in the logic circuit and other kinds of lateral and vertical components are integrated. This present invention saves costs at the same time greatly improve chip integration. The manufacturing method of the present invention is simple, and the difficulty of process is relatively less.

10 Claims, 98 Drawing Sheets

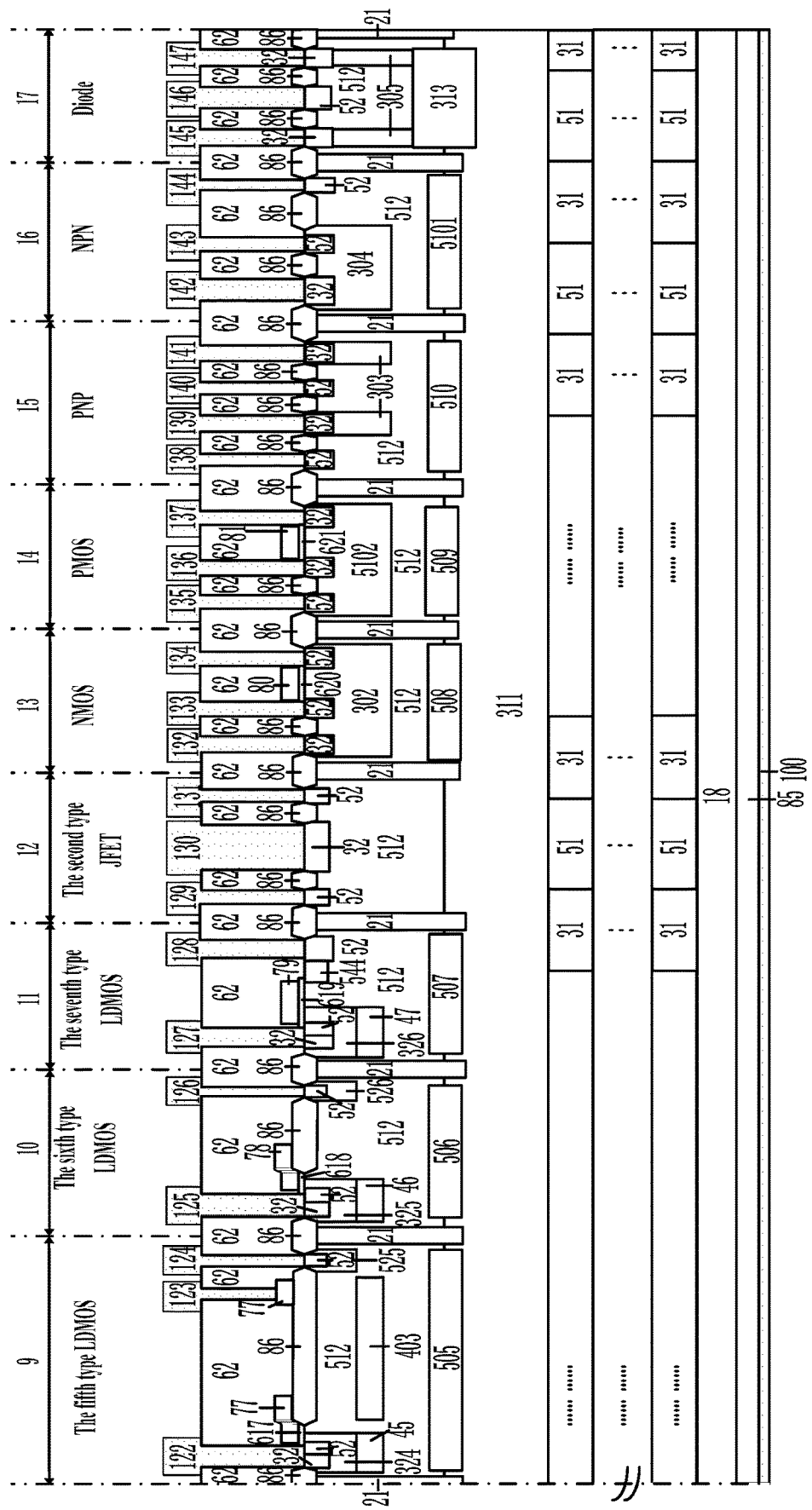
Fig.1（a）

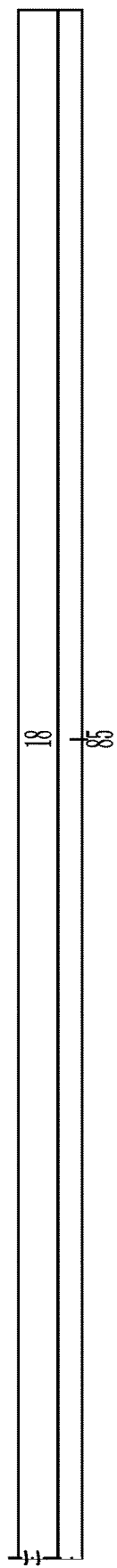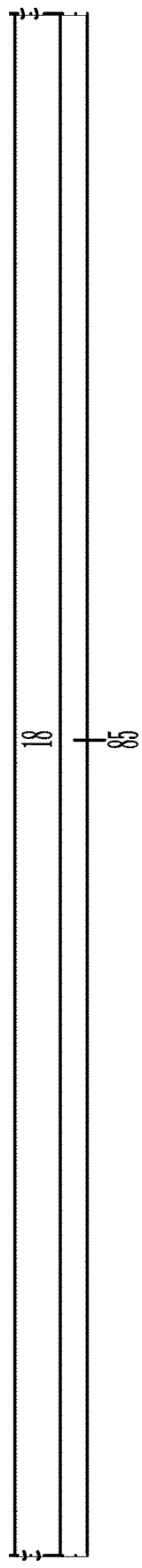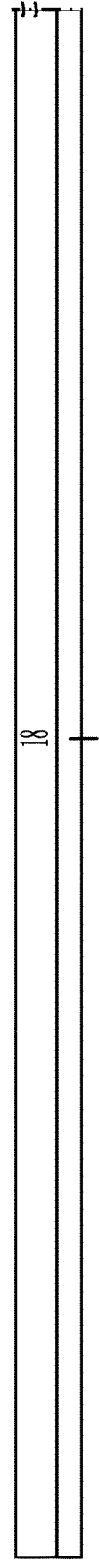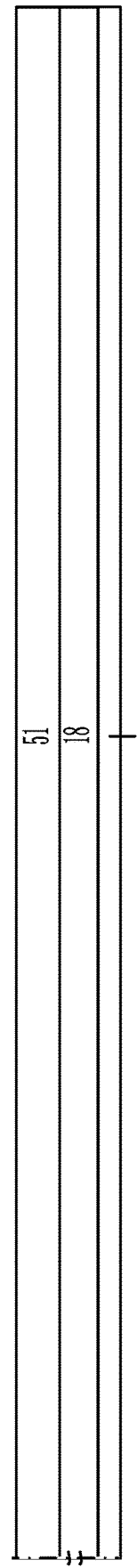
Fig.8A (a) Fig.8A (b) Fig.8A (c) Fig.8B (a)

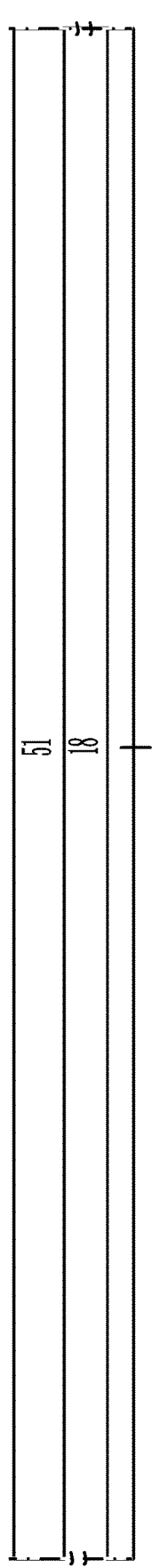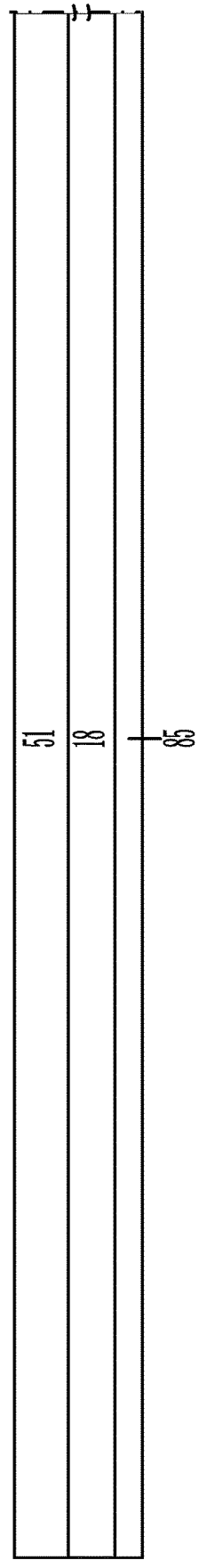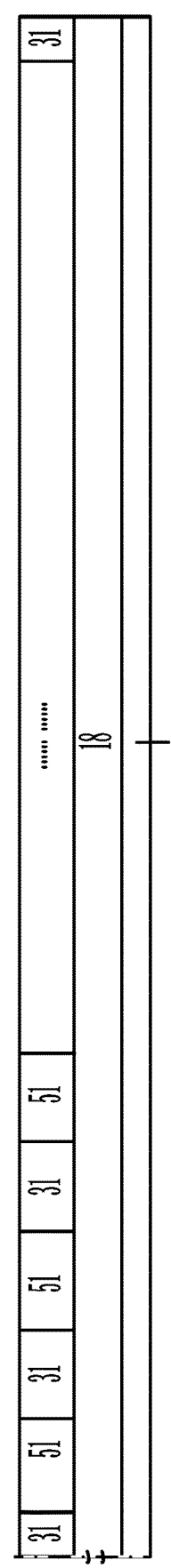
Fig.8B (b)　　Fig.8B (c)　　Fig.8C (a)

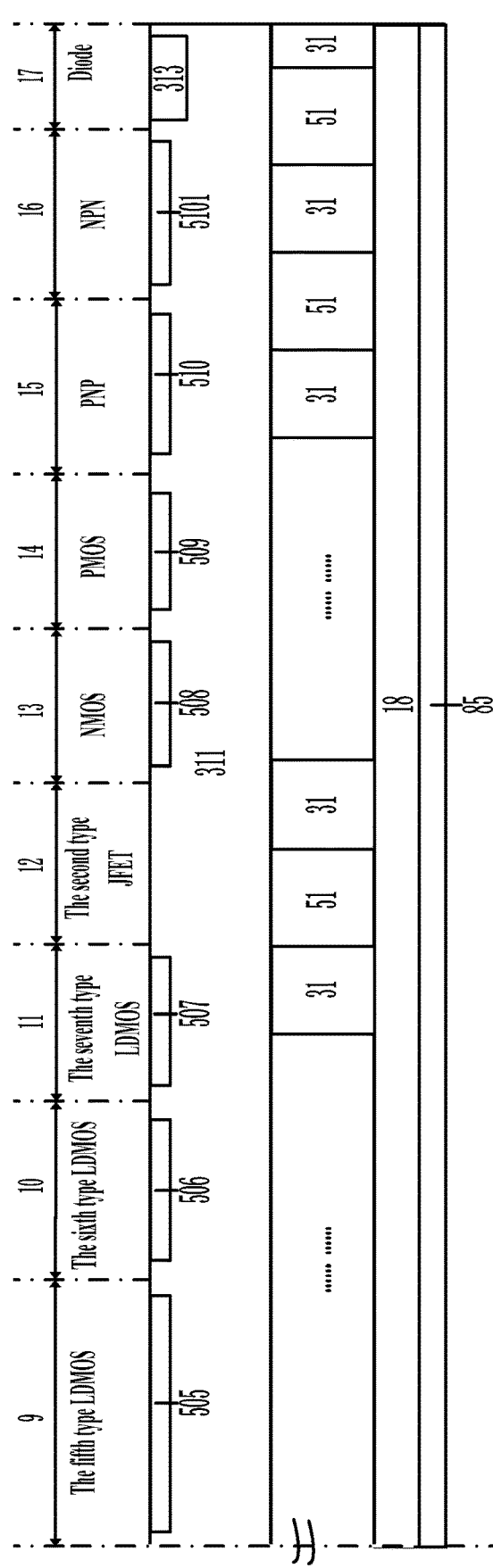
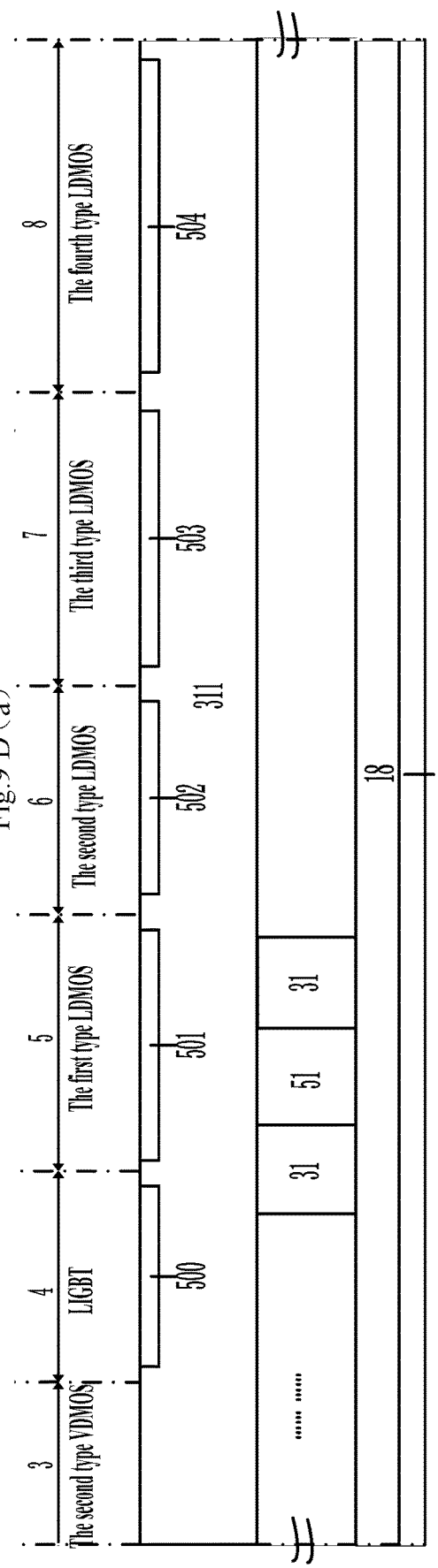
Fig. 9 D (a)
Fig. 9 D (b)

BIPOLAR-CMOS-DMOS SEMICONDUCTOR DEVICE AND MANUFACTURING METHOD

CROSS REFERENCE TO THE RELATED APPLICATIONS

The present application is based on, and claims priority from, Chinese Patent Application number 201810960849.1, filed on Aug. 22, 2018, the disclosure of which is here by incorporated by reference herein in its entirety.

TECHNICAL FIELD

The present invention relates to semiconductor power devices, particularly relates to a method for integrating CMOS and Bipolar into a DMOS process.

BACKGROUND

Power Integrated Circuit (PIC) refers to the Integrated Circuit which integrates high-voltage Power devices, signal processing system and peripheral interface circuit, protection circuit, detection and diagnosis circuit and other circuits in the same chip. It is divided generally into Smart Power Integrated Circuit (SPIC) and High Voltage Integrated Circuit (HVIC). Power integrated IC is widely used in power management, motor drive, automotive electronics, industrial control and other fields. BCD process refers to the process of integrating Bipolar, CMOS, DMOS and other high-voltage power devices, various resistance and capacitors, diodes into the same chip, which featured low cost, easy packaging and design, the simpler peripheral chips, rapidly developing into the mainstream technology in the power IC field, Bipolar transistors in BCD technology have high precision mainly used in analog circuits, CMOS have high integration mainly used in logic circuits, and DMOS have high power (high voltage) characteristics used commonly as a switch. DMOS used for switching is the core device of BCD technology. The function of DMOS requires that the device have high breakdown voltage and minimum specific conduction resistance. The performance of DMOS directly determines the driving capacity and area of the chip, so the design of DMOS is a key at the BCD technology. Because the BCD technology integrated the different function devices, so it requires the different working environment of a same chip, how to isolate different devices is another key in the design of BCD technology.

SUMMARY

This invention aims to provide a BCD semiconductor device and its manufacturing method, which can integrate some semiconductor devices into a chip at the same time, such as two types of JFET, two types of VDMOS, LIGBT, seven types of LDMOS, low-voltage NMOS, low-voltage PMOS, low-voltage NPN, low-voltage PNP and diode. Among these devices, the integrated two types of JFET and VDMOS devices have smaller conduction resistance with the same chip area (or smaller chip area under the same current capacity) compared with conventional high-voltage semiconductor devices. In addition, each device is isolated through the trench isolation structure which throughout the entire drift region vertically can play a good role in isolation. The manufacturing method is simple and the process difficulty is relatively low.

In order to realize the purpose of this invention, the technical scheme of the invention as follows:

BCD semiconductor device, including the first type of JFET device 1, the first isolation structure 204, the first type of VDMOS device 2, the second isolation structure 203, the second type of VDMOS device 3, the LIGBT device 4, the first type of LDMOS device 5, the second type of LDMOS device 6, the third type of LDMOS device 7, the fourth type of LDMOS device 8, the fifth type of LDMOS device 9, the sixth type of LDMOS device 10, the seventh type of LDMOS device 11, the second type of JFET device 12, the low-voltage NMOS device 13, the low-voltage PMOS device 14, the low-voltage PNP device 15, the low-voltage NPN device 16 and the diode 17, these devices integrated on the same chip.

The first type of JFET device 1 includes a series of repetitive cells, these cells are directly formed on the first doped type substrate 85, the high voltage drain metal 100 located in the below of the first doped type substrate 85, the drift region includes a first doped type Buffer region 18. The super junction which is located on the upper of the first doped type Buffer region 18 includes two parts, the first part comprise of the first doped type pillar 51 and the second doped type pillar 31, and the second part comprise of the third doped type pillar 511 and the second doped type epitaxial layer 311. The first doped type pillar 51 and the second doped type pillar 31 are arranged periodically and intervally, the third doped type pillar 511 and the second doped type epitaxial layer 311 are arranged periodically and intervally. The first doped type epitaxial layer 512 and the second doped type body region 312 are located on the upper of the third doped type pillar 511 and the second doped type epitaxial layer 311. The second heavily doped type source region 32 inlay the upper of the second doped type body region 312, and the first heavily doped type source region 52 is disposed in the middle of the upper of the first doped type epitaxial layer 512. The field oxide layer 86 is disposed between the first heavily doped type source region 52 and adjacent the second heavily doped type source region 32. The dielectric layer 62 covers the field oxide layer 86. The first electrode 101 covers a portion of the dielectric layer 62 and the upper of the second heavily doped type source region 32. The second electrode 102 covers a portion of the dielectric layer 62 and the upper of the first heavily doped type source region 52. The third electrode 103 covers a portion of the dielectric layer 62 and the upper of the second heavily doped type source region 32. The fourth electrode 104 covers a portion of the dielectric layer 62 and the upper of the first heavily doped type source region 52. The fifth electrode 105 covers a portion of the dielectric layer 62 and the upper of the second heavily doped type source region 32. The first doped type Buffer region 18 reduces the difficulty of the process, and relieves the reverse diffusion from high-doped substrate. The super junction arranged periodically are favorable for reducing the resistance of the drift region, the lateral junction introduced by super junction modulated the vertical electric field, so that the device can guarantee enough voltage with the lower on-resistance at the same time.

The first type VDMOS device 2 includes many repetitive cells, these cells are directly formed on the first doped type substrate 85, the high voltage drain metal 100 is located in below of the first doped type substrate 85, the drift region includes a first doped type Buffer region 18 at the bottom and the super junction. The super junction includes two parts, the first part comprise of the first doped type pillar 51 and the second doped type pillar 31, and the second part comprise of the third doped type pillar 511 and the second doped type epitaxial layer 311. The first doped type pillar 51 and the second doped type pillar 31 are arranged periodically and intervally, the third doped type pillar 511 and the second doped type epitaxial layer 311 are arranged periodically and intervally. The first doped type epitaxial layer 512 and the second doped type body region 312 are located on the upper of the third doped type pillar 511 and the second doped type epitaxial layer 311. The second heavily doped type source region 32 and the first heavily doped type source region 52 are located on the second doped type body region 312. The bottom of the first type of gate oxide layer 610 is bridged between two first heavily doped type source regions 52, which are located in adjacent second doped type body regions 312 respectively. The first type polysilicon layer 70 connects the first heavily doped type source region 52 and another first heavily doped type source region 52 located in the adjacent second doped type body region 312. The dielectric layer 62 covers a portion of the first type of gate oxide layer 610 and the first type of polysilicon layer 70. The first type metal layer 106 covers the dielectric layer 62 and the exposed first heavily doped type source region 52 and the upper of the second heavily doped type source region 32. The second type metal layer 107 covers the dielectric layer 62 and the first heavily doped type source region 52 exposed and the upper of the second heavily doped type source region 32. The first doped type Buffer region 18 reduces the difficulty of process and is advantageous for relieving the reverse diffusion from higher doped substrate. The periodically-array super junction are favorable for reducing the resistance of the device drift region, the lateral junction introduced by super junction modulated the vertical electric field, so that the device can guarantee enough voltage with the lower on-resistance at the same time.

The first isolation structure 204 is located between the last cell 1(n) of the first type JFET device 1 and the first cell 2(1) of the first type of VDMOS device 2, it is placed directly on the first doped type substrate 85. The bottom of the first doped type substrate 85 is a high voltage drain metal 100. The drift region includes a first doped type Buffer region 18 at the bottom and the super junction on the upper of the first doped type Buffer region 18. The super junction includes two parts, the second part is on the first part, the first part comprise of the first doped type pillar 51 and the second doped type pillar 31, and the second part comprise of the third doped type pillar 511 and the second doped type epitaxial layer 311, the first doped type pillar 51 and the second doped type pillar 31 are arranged periodically and intervally, the third doped type pillar 511 and the second doped type epitaxial layer 311 are arranged periodically and intervally. The first doped type epitaxial layer 512 and the second doped type body region 312 are located on the upper of the third doped type pillar 511 and the second doped type epitaxial layer 311, half of the adjacent two second doped type body regions 312 belong to the first isolation structure 204. The pillar structure composed of the second doped type pillar 31 and the second doped type epitaxial layer 311 extend lengthways the drift region. The upper of the half second doped type body region 312 belonging to the first isolation structure 204 is covered with a field oxide layer 86, the field oxide layer 86 covers the entire upper of the first isolation structure 204, dielectric layer 62 covers the field oxide layer 86. The second doped type pillar penetrating the entire drift region isolates the adjacent first doped type pillar that conduct electricity, effectively reducing leakage between the two devices.

The second type VDMOS device 3 includes a series of cells, the cells are directly formed on the first doped type substrate 85, the high voltage drain metal 100 is located in below the first doped type substrate 85, the drift region includes a first doped type Buffer region 18 and the super junction on the first doped type Buffer region 18. The super junction includes two parts, the first part comprise of the first doped type pillar 51 and the second doped type pillar 31, and the second part comprise of the third doped type pillar 511 and the second doped type epitaxial layer 311. The first doped type pillar 51 and the second doped type pillar 31 are arranged periodically and intervally, the third doped type pillar 511 and the second doped type epitaxial layer 311 are arranged periodically and intervally. The first doped type epitaxial layer 512 and the second doped type body region 312 are located on the third doped type pillar 511 and the upper of the second doped type epitaxial layer 311. The second heavily doped type source region 32 and the first heavily doped type source region 52 are located on the second doped type body region 312. The first lightly doped type depleted channel region 543 is disposed between the first heavily doped type source region 52 and the first heavily doped type source region 52 which are embedded in the adjacent second doped type body region 312. The bottom of the second type of gate oxide layer 611 is bridged between two first heavily doped type source regions 52 in the adjacent second doped type body region 312, two first heavily doped type source region 52 embedded in the adjacent second doped type body region 312 respectively are connected by the second type of polysilicon layer 71. The dielectric layer 62 covers a portion of the second type of gate oxide layer 611 and the second type of polysilicon layer 71. The third type of metal layer 108 covers the dielectric layer 62 and the first heavily doped type source region 52 and the upper of the second heavily doped type source region 32. The first doped type Buffer region 18 reduces the difficulty of process and is advantageous for relieving the reverse diffusion from the high-doped substrate. The super junction arranged periodically are favorable for reducing the resistance of the drift region, the lateral junction introduced by super junction modulates the vertical electric field of the device, so that the device can guarantee the enough breakdown voltage with the lower on-resistance at the same time. The first heavily doped source region 52 and the first doped type epitaxial layer 512 is connected by the first lightly doped type depleted channel region 543 which make the device is in a normally open state and play a role of switching.

The second isolation structure 203 is located between the last cell 2(n) of the first type of VDMOS device 2 and the first cell 3(1) of the second type of VDMOS device 3, which is formed directly on the first doped type substrate 85. The high voltage drain metal 100 is located in below of the first doped type substrate 85. The drift region includes a first doped type Buffer region 18 and the super junction. The super junction includes two parts, the second part is on the first part, the first part comprise of the first doped type pillar 51 and the second doped type pillar 31, and the second part comprise of the third doped type pillar 511 and the second doped type epitaxial layer 311, the first doped type pillar 51 and the second doped type pillar 31 are arranged periodically and intervally, the third doped type pillar 511 and the second doped type epitaxial layer 311 are arranged periodically and intervally. The first doped type epitaxial layer 512 and the second doped type body region 312 are located on the upper of the third doped type pillar 511 and the second doped type epitaxial layer 311. Half of each pair adjacent second doped type body regions 312 belongs to the second isolation structure 203. A pillar structure of the super junction composed of a second doped type pillar 31 and a second doped type epitaxial layer 311 extends through the entire drift region, the upper of the half second doped type body region 312 is covered with the field oxide layer 86. The upper of the body region 312 which belonging to the second isolation structure 203 is covered with a field oxide layer 86, the field oxide layer 86 covers the entire upper of the second isolation structure 203, the dielectric layer 62 covers the field oxide layer 86. The second doped type pillar intersects the entire drift region and isolates the adjacent first doped type pillars that have effect on electric conduction, which effectively reduces the leakage between the two devices.

The right side of the last cell 3(n) of the second type VDMOS device 3 are the remaining fourteen devices. They are respectively the LIGBT device 4, the first type of LDMOS device 5, the second type of LDMOS device 6, the third type of LDMOS device 7, the fourth type of LDMOS device 8, the fifth type of LDMOS device 9, the sixth type of LDMOS device 10, the seventh type of LDMOS device 11, the second type of JFET device 12, the low voltage NMOS device 13, the low voltage PMOS device 14, the low voltage PNP15, the low voltage NPN device 16, the diode 17. The above devices are all located in the second doped type epitaxial layer 311, the second doped type epitaxial layer 311 located on the the first doped type pillar 51 and the second doped type pillar 31, the first doped type pillar 51 and the second doped type pillar 31 are arranged periodically and intervally. The isolation strip includes three parts, they are the isolation pillar 21, the field oxide layer 86 on the upper of the isolation pillar 21, and the dielectric layer 62 covering the upper of the field oxide layer 86. These devices separated each other by the isolation isolation strip.

The LIGBT device 4 is located between the two adjacent isolation strips on the right side of the last cell 3(n) of the second type VDMOS device 3. The field oxide layer 86 is on the upper surface of the isolation pillar 21, and the dielectric layer 62 covers the upper of the field oxide layer 86. The first doped type buried layer 500 is located on the upper of the second doped type epitaxial layer 311, and the first doped type epitaxial layer 512 is located on the first doped type buried layer 500 which between the adjacent two isolation pillars 21. The second doped type well region 320 is disposed on the left side of the first doped type epitaxial layer 512. The second doped type of the first falling field layer 41 is underneath and tangent to the second doped type well region 320, a pair tangent of the first heavily doped type source region 52 and the second heavily doped type source region 32 near the upper surface are located in the second doped type well region 320. The first doped type first well region 520 is disposed on the right side of the first doped type epitaxial layer 512, the first heavily doped type source region 52 is disposed at middle portion near the upper of the first doped type first well region 520. The first doped type epitaxial layer 512 located between the first doped type first well region 520 and the second doped type well region 320. The field oxide layer 86 covers the upper of the first doped type epitaxial layer 512; the field oxide layer 86 is apart from the second doped type well region 320 a certain distance. The third type of gate oxide layer 612 connects the left boundary of the first heavy doped type source region 52 and the field oxide layer 86 located on the upper of the second doped well region 320. The third type of gate oxide layer 612 is partially covered or tangent to the right boundary of the first heavily doped type source region 52. The upper of the third type gate oxide layer 612 is covered with the third type polysilicon layer 72. The left of the third type polysilicon layer 72 is tangent or does not extend to the left boundary of the third type gate oxide layer 612, and the third type polysilicon layer 72 is covered or tangent to the right boundary of the first heavily doped type source region 52. The part of the field oxide layer 86 covered with the right side of the third type polysilicon layer 72. The exposed part of the third type of gate oxide 612 and the surface of the third type of polysilicon layer 72, the exposed surface of field oxide layer 86 is covered with the dielectric layer 62 respectively. The part surface of the first heavily doped type source region 52 and the second heavily doped type source region 32 are covered with the source metal 109, the first heavily doped type source region 52 nearly located on the middle upper surface of the first doped type first well region 520 is covered with the drain metal 110. The first doped type buried layer 500 is conducive to shield the depletion effect of the second doped epitaxial layer 311 on the first doped epitaxial layer 512 and regulate the electric field of the first doped epitaxial layer 512 to avoid the surface breakdown of the device. The second doped type of the first falling field layer 41, on the one hand, it can prevent the LIGBT device 4 through breakdown which caused by the depletion from the first doped type epitaxial layer 512 to the second doped type well region 320. On the other hand, it is conducive to regulate the peak electric field between the second doped type well region 320 and the first epitaxial layer doped type 512, avoiding the breakdown on the surface.

The first type of LDMOS device 5 is located on the right side of the LIGBT device 4 and separated from the adjacent LIGBT device 4 by isolation strips. The field oxide layer 86 is on the upper of the isolation pillar 21, the upper of the field oxide layer 86 is covered with the dielectric layer 62. The first type of LDMOS device 5 is located in the second doped type epitaxial layer 311. The first doped type first buried layer 501 is disposed at a portion upper of the second doped type epitaxial layer 311, the first doped type epitaxial layer 512 is located on the first doped type first buried layer 501 and located between the adjacent two isolation pillar 21. The first doped type first deep well region 301 is disposed on the upper of the first doped type epitaxial layer 512. The first doped type second well region 521 is disposed on the left side of the second doped type first deep well region 301. The first doped type falling field layer 550 is located directly below the first doped type second well region 521. The first heavily doped type source region 52 is located nearly in the upper of the first doped type second well region 521, and the second heavily doped type source region 32 is tangential to the first heavily doped type source region 52. The second heavily doped type source region 32 is disposed at the right upper of the second doped type first deep well region 301. The partial field oxide layer 86 is located at the upper of the second doped type of the first deep well region 301, the field oxide layer 86 is some distance from the first doped type of the second well region 521. The fourth type of gate oxide layer 613, which partially covers or is tangent to the right bordery of the second heavily doped type source region 32, is connected to the second heavily doped source region 32 and the left boundary of the field oxide layer 86 at the upper of the first doped type second well region 521. The fourth type of gate oxide layer 613 is tangent to or does not extend to the left boundary of the second heavily doped type source region 32, and covered with the fourth type of polysilicon layer 73 at the upper surface. The fourth type of polysilicon layer 73 covers a portion of the field oxide layer 86 on the right side, the fourth type of polysilicon layer 73 also covers or is tangent to the right border of the second doped type source region 32. The exposed portion of the fourth type of gate oxide layer 613, the upper of the fourth type of polysilicon layer 73, and the exposed upper of the field oxide layer 86 are covered with the dielectric layer 62. Portion of the first heavily doped source region 52 and the second heavily doped source region 32 are covered with a first type of source metal 111. The upper of the second heavily doped type source region 32 located in the middle near the upper surface of the second doped type of the first deep well region 301 is covered with the first type of drain metal 112. The first doped type of the first buried layer 501 is beneficial for shielding the depletion of the first doped type epitaxial layer 512 from the second doped type epitaxial layer 311, and is advantageous for adjusting the electric field of the first type of LDMOS device 5 to avoid the surface breakdown of the device. The first doped type falling field layer 550 can shield the depletion of the first doped well region 521 from the second doped type of the first deep well region 301 and prevent the punch through of the device 5. On the other hand, it is advantageous to adjust the electric field peak of the junction between the second doped type well region 301 and the first doped type of the second well region 521 to prevent the breakdown occurring on the surface of the first type of LDMOS device 5.

The second type of LDMOS device 6 is separated from the adjacent first type LDMOS device 5 by isolation strips. The first doped type of the second buried layer 502 of the second type of LDMOS device 6 is located at a portion of the upper of the second doped type epitaxial layer 311. The first doped type epitaxial layer 512 is located above the first doped type of the second buried layer 502. The second doped type of the first buried layer 401 is located directly above the first doped type of the second buried layer 502. The second doped type of the first well region 321 is disposed on the left side of the upper portion of the first doped type epitaxial layer 512. The second doped type of the second falling field layer 42 is located directly below the second doped type of the first well region 321, and is tangent to the second doped type of the first well region 321. The first doped type of the third well region 522 is disposed on the right side of the first doped type epitaxial layer 512, and the first heavily doped type source region 52 is disposed in near the upper surface of the first doped type of the third well region 522. The first doped type field region 552 is disposed on the right side of the first heavily doped type source region 52. There is a certain distance between the field oxide layer 86 and the second doped type of the first well region 321. The fifth type of gate oxide layer 614 is connected the first heavily doped source region 52 located at the upper of the second doped type of the first well region 321 and the left boundary of the field oxide layer 86. The fifth type of gate oxide layer 614 is thicker than the fourth type gate oxide layer 613 of the first type of LDMOS device 5 and covers partially or is tangent to the right bordery of the first heavily doped source region 52. The upper of the fifth type of gate oxide layer 614 is covered with a fifth type of polysilicon layer 74 which is tangentially left or not extended to the left boundary of the fifth type gate oxide layer 614. The fifth type of polysilicon layer 74 is covered or tangent to the right border of the first heavily doped source region 52. The fifth type polysilicon layer 74 covers a portion of the field oxide layer 86 on the right side. The dielectric layer 62 covers three parts, they are the exposed portion of the fifth type of gate oxide layer 614, the upper of the fifth type of polysilicon layer 74 and the exposed upper of the field oxide layer 86, respectively. The second type of source metal 113 covers a first heavily doped source region 52 and a portion of the upper of the second heavily doped source region 32 that is tangential to the left side of the first heavily doped source region 52. The second type of drain metal 115 covers the first heavily doped source region 52 on the right. The second type of field plate electrode metal 114 partially covers the upper of the fifth type of polysilicon layer 74. The first doped type field region 552 can prevent the breaking channel phenomenon occurring when the gate is connected to a high potential.

The third type of LDMOS device 7 is separated from the adjacent second type LDMOS device 6 by isolation strips. The first doped type of the third buried layer 503 is located on the portion upper of the second doped type epitaxial layer 311. The first doped type epitaxial layer 512 is located above the first doped type of the third buried layer 503, the field oxide layer 86 is disposed directly above the first doped type epitaxial layer 512. The second doped type of the second well region 322 is disposed on the left side of the first doped type epitaxial layer 512. The second doped type of the third falling field layer 43 is located directly below the second doped type of the second well region 322 and is tangent to the second doped type of the second well region 322. The first doped type of the fourth well region 523 is disposed on the right side of the first doped type epitaxial layer 512, and the first heavily doped type source region 52 is disposed in near the upper surface of the first doped type of the fourth well region 523. The field oxide layer 86 is spaced apart from the second doped type of the second well region 322 by a certain distance. The sixth type of gate oxide layer 615, which partially covers or is tangent to the right bordery of the first heavily doped type source region 52, is connected to the first heavily doped source region 52 which located in the upper of the second doped type of the second well region 322 and the left boundary of the field oxide layer 86. The surface of the sixth gate oxide layer 615 is covered with the sixth type of polysilicon layer 75. The sixth type of polysilicon layer 75 is tangentially left or not extended to the left boundary of the sixth type of gate oxide layer 615, it is covered or tangential to the right border of the first heavily doped source region 52. A portion of the field oxide layer 86 is covered with the tight side of the sixth type of polysilicon layer 75. The dielectric layer 62 overs three parts, they are the exposed portion of the sixth type of gate oxide layer 615 and the upper of the sixth type of polysilicon layer 75 and the exposed upper of the field oxide layer 86, respectively. The third type of source metal 116 overs the partially surface of the first heavily doped type source region 52 and the second heavily doped type source region 32 on the left side. The third type of drain metal 118 overs the first heavily doped source region 52 on the right side, the third type of field plate electrode metal 117 overs the partially surface of the sixth type polysilicon layer 75.

The fourth type of LDMOS device 8 is separated from the adjacent third type LDMOS device 7 by isolation strips. The first doped type of the fourth buried layer 504 is located on the portion upper of the second doped type epitaxial layer 311, the first doped type epitaxial layer 512 is located above the first doped type of the fourth buried layer 504. The second doped type of the top layer 402 is disposed directly above the first doped type epitaxial layer 512, the field oxide layer 86 is located above the second doped type of top layer 402. The second doped type of the third well region 323 is disposed on the left side of the first doped type epitaxial layer 512, the second doped type of the fourth falling field layer 44 is located directly below and tangent to the second doped type of the third well region 323. The first doped type of the fifth well region 524 is disposed on the right side of the first doped type epitaxial layer 512, and a first heavily doped type source region 52 is disposed in near the surface of the first doped type of the fifth well region 524. The field oxide layer 86 is spaced apart from the second doped type of the third well region 323 a certain distance. The seventh type of gate oxide layer 616, which partially covers or is tangent to the right bordery of the first heavily doped type source region 52, is connected to the first heavily doped source region 52 which located at the upper of the second doped type of the third well region 323 and the left boundary of the field oxide layer 86. The seventh type of gate oxide layer 616 is covered with a seventh type of polysilicon layer 76 which is tangentially left or not extended to the left boundary of the seventh type gate oxide layer 616. The seventh type of polysilicon layer 76 is covered or tangential to the right border of the first heavily doped source region 52, the seventh type of polysilicon layer 76 covers a portion of the field oxide layer 86 on the right side. The dielectric layer 62 covers three parts, they are the exposed portion of the seventh type of gate oxide layer 616, the upper of the seventh type of polysilicon layer 76 and the exposed upper of the field oxide layer 86, respectively. The fourth type of source metal 119 covers a portion of the first heavily doped source region 52 and a portion of the second heavily doped source region 32. The fourth type of drain metal 121 covers a portion of the first heavily doped type source region 52, the fourth type of field plate electrode metal 120 covers part of the upper surface of the seventh type of polysilicon layer field plate 76.

The fifth type of LDMOS device 9 is separated from the adjacent fourth type LDMOS device 8 by isolation strips, the fifth type of LDMOS device 9 is provided with a first doped type of the fifth buried layer 505 located at a portion of the upper of the second doped type epitaxial layer 311. The second doped type buried layer 403 is located above the first doped type of the fifth buried layer 505, the field oxide layer 86 is disposed over the second doped type buried layer 403. The second doped type of the fourth well region 324 is disposed on the left side of the first doped type epitaxial layer 512. The second doped type of the fifth falling field layer 45 is located directly below the second doped type of the fourth well region 324 and is tangent to the second doped type of the fourth well region 324. The first doped type of the sixth well region 525 is disposed on the right side of the first doped type epitaxial layer 512 and a first heavily doped type source region 52 is disposed in near the upper surface the first doped type of the sixth well region 525. The field oxide layer 86 is spaced apart from the second doped type of the fourth well region 324 by a certain distance. The eighth type gate oxide layer 617, which partially covers or is tangent to the right border of the first heavily doped type source region 52, is connected to the first heavily doped source region 52 located at the upper of the second doped type fourth well region 324 and the left boundary of the field oxide layer 86. The eighth type of gate oxide layer 617 is covered with an eighth type polysilicon layer 77 which is tangentially left or not extended to the left boundary of the eighth type gate oxide layer 617. The eighth type polysilicon layer 77 is covered or tangential to the right bordery of the first heavily doped type source region 52, and covers a portion of the eighth type field oxide layer 86 on the right side. The dielectric layer 62 covers three parts, they are the exposed portion of the eighth type gate oxide layer 617, the upper of the eighth type polysilicon layer 77, and the exposed upper of the field oxide layer 86, respectively. The fifth type of source metal 122 covers a portion of the first heavily doped source region 52 and a portion of the second heavily doped source region 32. The fifth type of drain metal 124 covers a portion of the first heavily doped type source region 52, the fifth type of field plate electrode metal 123 covers part of the polysilicon 77. The second doped type of the buried layer 403 can assist the depletion of the first doped type epitaxial layer 512, which is beneficial to increase the doped concentration of the first doped type epitaxial layer 512 and further reduce the on-resistance of the fifth type of LDMOS device 9.

The sixth type of LDMOS device 10 is separated from the adjacent fifth type LDMOS device 9 by isolation strips. The sixth type of LDMOS device 10 is provided with a first doped type of the sixth buried layer 506 at a portion of the upper of the second doped type epitaxial layer 311. The first doped type epitaxial layer 512 is located above the first doped type of the sixth buried layer 506. The field oxide layer 86 is disposed over the first doped type epitaxial layer 512, the second doped type of the fifth well region 325 is disposed on the left side of the first doped type epitaxial layer 512. The second doped type of the sixth falling field layer 46 is located directly below and tangent to the second doped type of the fifth well region 325. The first doped type of the seventh well region 526 is disposed on the right side of the first doped type epitaxial layer 512 and a first heavily doped type source region 52 is disposed in near the upper surface of the first doped type of the seventh well region 526. The field oxide layer 86 is spaced apart from the second doped type of the fifth well region 325 by a certain distance. The ninth type gate oxide layer 618, which covers or is tangent to the right bordery of the first heavily doped source region 52, is connected to the first heavily doped source region 52 located at the upper of the second doped type of the fifth well region 325 and the left boundary of the field oxide layer 86. The ninth type polysilicon layer 78 is covered on the upper of the ninth type gate oxide layer 618 and is tangentially left or not extended to the left boundary of the ninth type gate oxide layer 618. The ninth type polysilicon layer 78 is covered or tangential to the right border of the first heavily doped source region 52. The ninth type polysilicon layer 78 covers a portion of the ninth field oxide layer 86 on the right side. The ninth type of dielectric layer 62 is covered with three parts, they are the exposed portion of gate oxide layer 618, the upper of ninth type polysilicon layer 78, and the exposed upper of field oxide layer 86, respectively. The sixth source metal 125 covers a portion of the first heavily doped source region 52 and a portion of the second heavily doped source region 32. The sixth type of drain metal 126 covers a portion of the first heavily doped type source region 52.

The seventh type LDMOS device 11 is separated from the adjacent sixth type LDMOS device 10 by isolation strips, the seventh type of LDMOS device 11 is provided with a first doped type of the seventh buried layer 507 located at a portion of the upper of the second doped type epitaxial layer 311, the first doped type epitaxial layer 512 is located above the first doped type of the seventh buried layer 507. The second doped type of the sixth well region 326 is disposed on the left side of the first doped type epitaxial layer 512. The second doped type of the seventh falling field layer 47 is located just below and is tangent to the second doped type of the sixth well region 326, the first heavily doped type source region 52 is disposed on the right side of the first doped type epitaxial layer 512. The tenth type gate oxide layer 619, which is partially covered or tangential to the right border of the first heavily doped type source region 52, is connected to the first heavily doped source region 52 which located at the upper of the second doped type of the sixth well region 326 and the first doped type sustain voltage layer 544 disposed on the right side of the first doped type epitaxial layer 512. The upper of the tenth type gate oxide layer 619 is covered with a tenth type polysilicon layer 79 which is tangentially left or not extended to the left boundary of the tenth gate oxide layer 619 and is covered or tangent to the right border of the first heavily doped source region 52. The dielectric layer 62 is covered by the tenth type of the exposed portion of the tenth type gate oxide layer 619, the upper of the tenth type polysilicon layer 79, and the exposed upper of the field oxide layer 86. The seventh type of source metal 127 covers a portion of the first heavily doped source region 52 and a portion of the second heavily doped source region 32, the seventh type of drain metal 128 covers a portion of the first heavily doped type source region 52.

The second type of JFET device 12 is separated from the adjacent seventh type LDMOS device 11 by the isolation strips. The second type of JFET device 12 is provided with a first doped type epitaxial layer 512 located at a portion of the upper of the second doped type epitaxial layer 311, a second type of heavily doped type 32 is disposed at near the middle upper of the first doped type epitaxial layer 512. The first type of heavily doped source region 52 is symmetrically disposed on the left and right sides of the second type of heavily doped type source region 32. The first type of heavily doped source region 52 is isolated from the second type of heavily doped source region 32 by a field oxide layer 86 in the horizontal direction, the field oxide layer 86 is covered with a dielectric layer 62. The fourth type of metal layer 129 covers the first type of heavily doped source region 52 on the left side of the second type of heavily doped source region 32. The fifth type of metal layer 130 covers a portion of the second type of heavily doped source regions 32. The sixth type of metal layer 131 covers the first type of heavily doped source region 52 on the right side of the second type of heavily doped source region 32.

The low voltage NMOS device 13 is separated from the adjacent second type JFET device 12 by the isolation strips. The low voltage NMOS device 13 is provided with a first doped type of the eighth buried layer 508 located at a portion of the upper of the second doped type epitaxial layer 311. The first doped type epitaxial layer 512 is located above the first doped type of the eighth buried layer 508. The second doped type of the second deep well region 302 is located above the first doped type epitaxial layer 512. The second doped type of the second deep well region 302 is provided with a first heavily doped type source region 52 and a second heavily doped type source region 32 on the left side. The first doped type source region 52 is disposed on the right side of the second doped type of the second deep well region 302. The upper surfaces of two adjacent first heavily doped source regions 52 are connected by an eleventh type of gate oxide layer 620. The eleventh type of gate oxide layer 620 is tangent or covers a portion of the first heavily doped type source region 52. The eleventh type of polysilicon layer 80 covers the upper of the eleventh type of gate oxide layer 620. The dielectric layer 62 covers the eleventh type of polysilicon layer 80. The first type of body region metal layer 132 covers the second heavily doped type source region 32, the eighth type source metal layer 133 covers the first heavily doped type source region 52, the eighth type of drain metal layer 134 covers the first heavily doped type source region 52.

The low voltage PMOS device 14 is separated from adjacent low voltage NMOS devices 13 by isolation strips. The low voltage PMOS device 14 is provided with a first doped type of the ninth type of buried layer 509 located at a portion of the upper of the second doped type epitaxial layer 311. The first doped type epitaxial layer 512 is located above the first doped type of the ninth buried layer 509. The first doped type of the second well region 521 is located above the first doped type epitaxial layer 512. The first doped type of the deep well region 5102 is provided with a first heavily doped type source region 52 and a second heavily doped type source region 32 on the left side. The second heavily doped type source region 32 is disposed on the right side of the first doped type of the deep well region 5102. The upper surfaces of two adjacent second heavily doped source regions 32 are connected by a twelfth type of gate oxide layer 621. The twelfth type of gate oxide layer 621 is tangent or covers a portion of the second heavily doped type source region 32, the twelfth type of polysilicon layer 81 covers the upper of the twelfth type of gate oxide layer 621, the dielectric layer 62 covers the upper of the twelfth type of polysilicon layer 81. The second type of body region metal layer 135 covers the first heavily doped type source region 52, the ninth source metal 136 covers the second heavily doped source region 32, the ninth type drain metal 137 covers the second heavily doped source region 32.

The PNP device 15 is separated from adjacent low voltage PMOS devices 14 by isolation strips. The PNP device 15 is provided with a first doped type of the tenth buried layer 510 located at a portion of the upper of the second doped type epitaxial layer 311. The first doped type epitaxial layer 512 is located above the first doped type of the tenth buried layer 510, the first doped type epitaxial layer 512 is provided with two first heavily doped type source regions 52 and two second heavily doped type source regions 32 both of which are alternately distributed with equally spaced. The first heavily doped type source region 52 disposed at the leftmost side of the first doped type epitaxial layer 512, adjacent to the right side of the first heavily doped type source region 52 is a second heavily doped type source region 32. The surfaces of both the first heavily doped source region 52 and the second heavily doped source region 32 each other are isolated by the field oxide layer 86. The two first heavily doped source regions 52 and the second heavily doped source regions 32 distributed alternately with equally spaced, are isolated from each other by the field oxide layer 86. Two second heavily doped type source regions 32 surrounded by a second doped type of the third deep well region 303. The seventh type of metal layer 138 covers the upper of the first heavily doped source region 52, the eighth type of metal layer 139 covers the second doped type source region 32, the ninth metal layer 140 covers the first heavily doped source region 52, the tenth metal layer 141 covers the second doped type source region 32.

The NPN device 16 is separated from the adjacent PNP device 15 by the isolation strips. The NPN device 16 is provided with the first doped type of eleventh buried layer 5101 located at a portion of the upper of the second doped type epitaxial layer 311. The first doped type epitaxial layer 512 is located above the first doped type of eleventh buried layer 5101. The second doped type of the fourth deep well region 304 is disposed at the upper left of the first doped type epitaxial layer 512. The first doped type source region 52 and the second heavily doped type source region 32 separated by the field oxide layer 86 are disposed at the upper of the second doped type fourth of the deep well region 304. The upper of the field oxide layer 86 covered with a dielectric layer 62. The first heavily doped type source region 52 is disposed at the upper of the first doped type epitaxial layer 512 which is outside the fourth doped type of the fourth deep well region 304. The left side of the first heavily doped source region 52 is separated from the right side of the second doped type of the fourth deep well region 304 by the field oxide layer 86. The dielectric layer 62 covers field oxide layer 86. The twelfth type metal layer 143 covers the first heavily doped source region 52 located in the fourth deep well region 304. The eleventh metal layer 142 covers the second heavily doped source region 32 in the fourth deep well region 304. The thirteenth metal layer 144 covers the first heavily doped source region 52 outside the third deep well region 304.

The diode device 17 is separated from the adjacent PNP device 16 by isolation strips. The diode device 17 is provided with a second doped type of the third buried layer 313 at a portion of the upper of the second doped type epitaxial layer 311. The second doped type of the third buried layer 313 is led to the surface through the second doped type of the fifth deep well region 305, realizing the function of a diode anode. The first doped type epitaxial layer 512 is located above the second doped type of the third buried layer 313. The second doped type of the fifth deep well region 305 is disposed on each side of the first doped type epitaxial layer 512. The second heavily doped type source region 32 is disposed at an upper of the second doped type of the fifth well region 305. Two second heavily doped type source regions 32 and a first heavily doped type source region 52 are located on the upper of the first doped type epitaxial layer 512. The first heavily doped source region 52 and the two adjacent second heavily doped source regions 32 each other are separated by field oxide layer 86. The upper of the field oxide layer 86 is covered with a dielectric layer 62. The fourteenth metal layer 145 covers the second heavily doped source region 32, the fifteenth class of metal 146 covers the first heavily doped source region 52, the sixteenth metal layer 147 covers the second heavily doped source region 32.

Particularly, the isolation strip 21 is formed by filling dielectric layer.

Particularly, the first doped type pillar 51 and the second doped type pillar 31 of the device are formed by etching trench and refilling.

Particularly, between the first doped type pillar 51 and the second doped type pillar 31 of the device equip with a thin dielectric layer 63.

Particularly, the first doped type pillar 51 and the second doped type pillar 31 of the device are directly on the first doped type substrate 85, and the first doped type Buffer region 18 is removed.

Particularly, the devices 4-17 on the right of the second type of VDMOS device 3 manufactured in the second doped epitaxial layer 311.

Particularly, the device 4-17 located on the right of the second type of VDMOS device 3 and the second doped type epitaxial 311 separated by the dielectric layer.

Particularly, the isolation strip comprises a second doped type isolation buried layer 82 and the isolation pillar 21.

For realizing the abovementioned purpose of this invention, the present invention also provides a manufacturing method of the BCD semiconductor device, including the following steps:

Step 1: on the first doped type substrate 85, the first doped type epitaxial layer 512 is grown by epitaxy, the resistivity of the first doped type substrate 85 is 0.0001~0.01 ohm·cm, and the resistivity of the first doped type epitaxial layer 512 is 1~15 ohm·cm.

Step 2: on the upper of the first doped epitaxial layer 512, the first doped type pillar 51 is grown by epitaxy, and the resistivity of the first doped type pillar 51 is 1~15 ohm·cm.

Step 3: injecting impurities to form the second doped type pillar 31, and the injection dose of impurity is $1e11$ $cm^{-2}$~$1e14$ $cm^{-2}$.

Step 4: repeat step 2 and step 3 until the ability sustaining voltage meets the design requirements.

Step 5: the second doped epitaxial layer 311 is grown on the drift area formed by periodic arrangement of the first doped type pillar 51 and the second doped type pillar 31.

Step 6: injecting impurities in the area of the second doped type epitaxial layer 311 to form the third doped type pillar 511, the area of the second doped type epitaxial layer 311 is necessary to form high voltage vertical device, including the first type of JFET device 1, the first type of VDMOS devices 2 and the second type of VDMOS devices 3; the rest of the region of the second doped type epitaxial layer 311 implant the impurities to form the buried layer which are the first doped type first buried layer 501 to the first doped type 511 buried layer. Injecting impurity to form the second doping type of third buried layer 313 of the diodes 17, the requirement for injection impurity of buried layer is heavy impurity ion to prevent the diffusion.

Step 7: growing epitaxial layer to form the first doped type epitaxial layer 512 at the upper surface in which the second doped type epitaxial layer 311 and the third doped type pillar 511, the first doped type first buried layer to the eleventh buried layer and the second doped type third buried layer.

Step 8: injecting impurities to form the isolation pillar 21 and the second doped type body region 312. The isolation pillar 21 is located between the right of second type of VDMOS devices 3 and the lateral device 4-17. The second doped type body region 312 belong to the high-voltage vertical devices includes the the first type of the JFET devices 1, the first type of VDMOS devices 2 and the second type of VDMOS devices 3; the lateral device 4-17 includes the LIGBT device 4, the first type of LDMOS device 5, the second type of LDMOS device 6, the third type of LDMOS device 7, the fourth type of LDMOS device 8, the fifth type of LDMOS device 9, the sixth type of LDMOS device 10 and the seventh type of LDMOS device 11, the second type of JFET device 12, the low-voltage NATOS device 13, the low-voltage PMOS device 14, the low-voltage PNP device 15, the low-voltage NPN device 16 and the diode 17.

Step 9: driving in and thermal oxidation to form the field oxide layer 86, and opening the window of source area by etching.

Step 10: successively injecting into impurity to form the first doped type of the deep well region 5102 of the low-voltage PMOS device 14 and the second doped type first deep well region 301 to the second doped type fifth deep well region 305. The second doped type first deep well region 301 to the second doped type fifth deep well region 305 belong to the first type of LDMOS device 5, the low voltage NMOS device 13, the PNP device 15, the NPN device 16, the diodes device 17, respectively.

Step 11: injecting impurities to form the first doped type first well region to seventh well region 520-526 of the device 4-11 at the right side the second type VDMOS device 3; the device on the right side the second type VDMOS device includes the LIGBT device 4, the first type of LDMOS device 5, the second type of LDMOS device 6, the third type of LDMOS device 7, the fourth type of LDMOS device 8, the fifth type of LDMOS device 9, the sixth type of LDMOS device 10 and the seventh type of LDMOS device 11.

Step 12: injecting impurities to form the first doped type falling field layer 550 of the device 4-11 at the right side of the second type VDMOS device 3. Injecting impurities to form the second doped type of the first falling field layer to the seventh falling field layer 41-47 of the device 4-11 at the right side of the second type VDMOS device 3.

Step 13: injecting impurities to form the first lightly doped type depleted channel region 543 of the second type of VDMOS device 3 and the first doped type sustain voltage layer 544 of the seven type of device 11.

Step 14: forming gate oxide layer, polysilicon gate and polysilicon field plate, the polysilicon gate resistance is 10~40 ohm/square.

Step 15: injecting successively impurity to form the first heavily doped type source region 52 and the second heavily doped type source region 32, the dose of the impurity is 1e15 cm$^{-2}$~2e16 cm$^{-2}$.

Step 16: depositing dielectric material to form the dielectric layer 62.

Step 17: metallizing the metal electrode, and forming the high voltage drain metal 100 on the back.

For realizing the abovementioned purpose of this invention, the present invention provides another manufacturing method of the BCD semiconductor device, including the following steps:

Step 1: on the first doped type substrate 85, the first doped type epitaxial layer 512 is grown by epitaxy, the resistivity of the first doped type substrate 85 is 0.0001~0.01 ohm·cm, and the resistivity of the first doped type epitaxial layer 512 is 1~15 ohm·cm.

Step 2: on the upper of the first doped epitaxial layer 512, the first doped type pillar 51 is grown by epitaxy, and the resistivity of the first doped type pillar 51 is 1~15 ohm·cm.

Step 3: etching the first doped type pillar 51 to form a number of trench, and growing epitaxial layer to form the second doped type pillar 31. After refilling the trench, planarization the upper surface of the epitaxial layer.

Step 4: growing epitaxial layer to form the second doped epitaxial layer 311, implanting the impurities to form the third doped type pillar 511 at the region need to form the devices: the first type JFET 1, the first type of VDMOS devices 2 and the second type of VDMOS devices 3. Implanting the impurities to form the buried layer, which are the first doped type first buried layer 501 to the first doped type buried layer 5101 and the second doped type third buried layer 313 at the other region of the second doped epitaxial layer 311. The requirement for injection impurity of buried layer is heavy impurity ion to prevent the diffusion.

Step 5: growing epitaxial layer to form the first doped type epitaxial layer 512 at the upper surface of the second doped type epitaxial layer 311 and the third doped type pillar 511.

Step 6: implanting impurities to form the isolation pillar 21 and the second doped type body region 312 of the high voltage vertical device.

Step 7: driving in and thermal oxidation to form the field oxide layer 86, and opening the window of source area by etching.

Step 8: successively inject into impurity to form the first doped type of the deep well region 5102 of the low-voltage PMOS device 14 and the second doped type first deep well region 301 to the second doped type fifth deep well region 305. The second doped type first deep well region 301 to the second doped type fifth deep well region 305 belong to the first type of LDMOS device 5, the low voltage NMOS device 13, the PNP device 15, the NPN device 16, the diodes device 17, respectively.

Step 9: injecting impurities to form the first doped type first well region to seventh well region 520-526 of the device 4-11. Injecting impurities to form the well region of the device 4-11 on the right side the second type of VDMOS device 3, the device on the right side the second type of VDMOS device includes: the LIGBT device 4, the first type of LDMOS device 5, the second type of LDMOS device 6, the third type of LDMOS device 7, the fourth type of LDMOS device 8, the fifth type of LDMOS device 9, the sixth type of LDMOS device 10, the seventh type of LDMOS device 11.

Step 10: injecting impurities to form the first doped type falling field layer 550 of the the first type of LDMOS device 5. Inject impurities to form the second doped type of the first falling field layer to the seventh falling field layer 41-47 of the LIGBT device 4, the second type of LDMOS device 6, the third type of LDMOS device 7, the fourth type of LDMOS device 8, the fifth type of LDMOS device 9, the sixth type of LDMOS device 10, the seventh type of LDMOS device 11, respectively.

Step 11: injecting impurities to form the first lightly doped type depleted channel region 543 of the second type of VDMOS device 3 and the first doped type sustain voltage layer 544 of the seventh type of LDMOS device 11.

Step 12: forming gate oxide layer, polysilicon gate and polysilicon field plate, the polysilicon gate resistance is 10~40 ohm/square.

Step 13: injecting successively impurity forming the first heavily doped type source region 52 and the second heavily doped type source region 32, the dose of the impurity is 1e15 cm$^{-2}$~2e16 cm$^{-2}$.

Step 14: depositing dielectric material to form the dielectric layer 62.

Step 15: metallizing the metal electrodes, and forming the high voltage drain metal 100 on the back.

The beneficial effect of the invention is as follows: the invention realizes the single-chip integration of the first type of JFET, the first type of VDMOS, the second type of VDMOS, the LIGBT, the seventh type of LDMOS, the second type of JFET, NMOS, PMOS, NPN, PNP and diode on the substrate. Part of the drift region comprised of the first doped type pillar and the second doped type pillar is periodic arranged alternately. The lateral junction formed by the first doped type pillar and the second doped type pillar can modulated the vertical electric field at sustaining the reverse voltage. The conductive effect of lateral modulation effect makes the doping concentration of the first doped type pillar was improved, greatly improving the current ability of the first JFETs device 1, 2, the second type of VDMOS device 3, which make sure the device sustaining high voltage, the conductive ability enhanced at the same time. By changing the type of the last epitaxial of superjunction pillar in the drift area, the horizontal component can be integrated with the single chip of the high-voltage super junction longitudinal component to reduce the manufacturing cost of the chip. In addition, the process of forming the second doped well region which compatible with the first type of JFET device 1, the first type of VDMOS device 2 and the second type of VDMOS device 3 is used to realize the trench isolation structure of the 4th to 17th type of device on the right of the second type of VDMOS device 3, which can better isolate each device and improve the overall performance of the chip. The first type of JFET devices 1, the first type of VDMOS devices 2 and the second type of VDMOS devices 3 are isolated naturally by the whole drift area formed by the alternating the first doped type and the second doped type pillar. So that the vertical devices with different functions can work independently without any influence. The invention integrates the high-voltage device and the lateral device together without increasing the process cost and greatly reduces the manufacture cost of chip. Compared with conventional integrated high voltage semiconductor devices, the high voltage semiconductor devices of this present invention have smaller on resistance under the condition of (or in the case of the same conduction ability has a smaller chip size) same chip area. High voltage power integrated circuits composed of this present invention can be used in consumer electronics, display drivers, and other products.

BRIEF DESCRIPTION OF THE DRAWINGS

Due to the complexity of structure and limited definition, each figure from FIG. 1 to FIG. 7 is divided into sections a, b and c for clear review.

Figure 1:
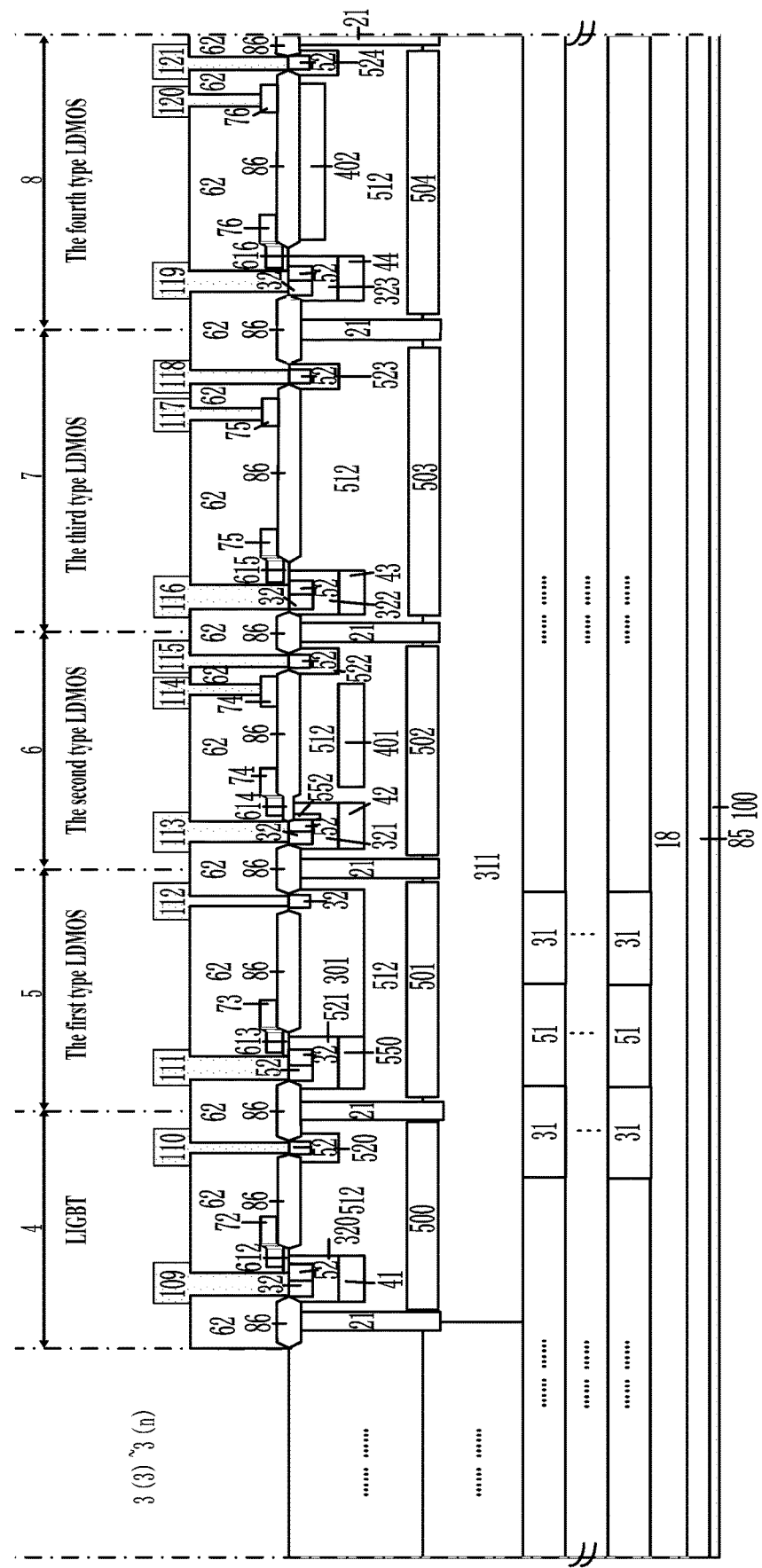
FIG. 1(a)-1(c) is a schematic diagram of the embodiment 1 of the invention.
Figure 1:
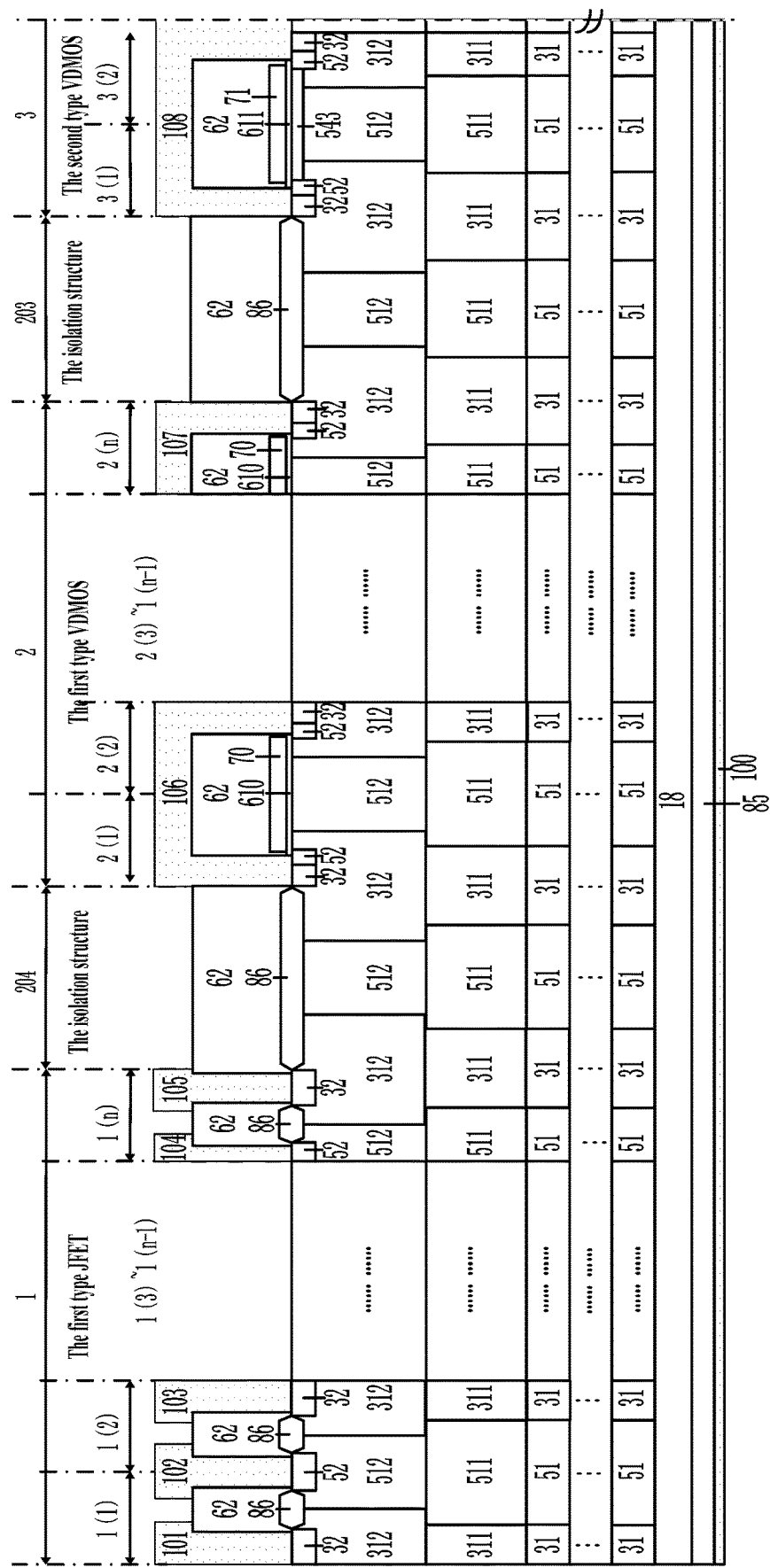

Among them, 1 is the first type of HET device, 2 is the first type of VDMOS device, 203 is the second isolation structure, 3 is the second type of VDMOS device, 4 is LIGBT device, 5 is the first type of LDMOS device, 6 is the second type of LDMOS device, 7 is the third type of LDMOS device, 8 is the fourth type of LDMOS device, 9 is the fifth type of LDMOS device, 10 is the sixth type of LDMOS device, 11 is the seventh type of LDMOS device, 12 is the second type of JFET device, 13 is the low voltage NMOS device, 14 is the low voltage PMOS device, 15 is the low voltage PNP, 16 is the low voltage NPN device, 17 is the diodes. 18 is the first doped type Buffer region, 85 is the first doped type substrate, 86 is the field oxide layer, 1(1)-1(n) is the cell of the first JFET device 1, 2(1)-2(n) is the cell of the first VDMOS device 2, 3(1)-3(n) is the cell of the second VDMOS device 3, 51 is the first doped type pillar, 31 is the second doped type pillar 31, 511 is the third doped type pillar, 311 is the second doped type epitaxial layer, 610-621 are the first type to the twelfth type gate oxide layer, 70-81 are the first type to the twelfth type of polysilicon layer, 512 is the first doped type epitaxial layer, 52 is the first heavily doped type source region, 32 is the second heavily doped type source region, 543 is the first lightly doped type depleted channel region, 100 is the high voltage drain metal, 101-105 are the first electrode to the fifth electrode, 106-108 are the first type metal layer to the third metal layer. 109 is the source of metal, 110 is the drain metal, 111 is the first type of source of metal, 112 is the first type of drain metal, 113 is the second source of metal, 115 is the second type of drain metal, 114 is the second type of a metal electrode, 116 is the third source of metal, 118 is the third type of drain metal, 117 is the third type of electrode metal, 119 is the fourth type of source of metal, 120 is the fourth type version electrode metal, 121 is the fourth type drain metal, 122 is the fifth type source metal, 123 is the fifth type electrode metal, 124 is the fifth type drain metal, 125 is the sixth type of the source of metal, 126 is the sixth type drain metal, 127 is the seventh type source metal, 128 is the seventh type drain metal, 129 is the fourth type of metal layer, 130 is the fifth type of metal layer, 131 is the sixth type of metal layer, 132 is the first metal layer, 133 is the eighth type source metal layer, 134 is the eighth type drain metal, 135 is the second metal layer, 136 is the ninth type source metal, 137 is the ninth type drain metal, 138 is the seventh type of metal layer, 139 is the eighth type of metal layer, 140 is the ninth type metal layer, 141 is the tenth type of metal layer, 142 is the eleven type metal layer, 143 is the twelve metal layer, 144 is the thirteen type metal layer, 145 is the fourteen type metal layer, 146 is the fifteen metal layer, 147 is the sixteen type metal layer. 62 is the dielectric layer, the second doped type body region 312, the isolation pillar 21, the first doped type buried layer 500, 501-510 is the first doped type first buried layer to tenth buried layer, 5101 is the first doped type eleventh buried layer, 320 is the second doped type well region, 321-325 is the second doped type of the first well region to the second doped type of the five well region 325, 401 is the second doped type of the first buried layer, 402 is the second doped type of the top layer, 403 is the second doped buried layer, 313 is the second doping type third buried layer, 301-305 is the first doped type first deep well region to the fifth deep well region, 544 is the first doped type sustain voltage layer, 520-526 is the first doped type first well region to the seventh well region, 5102 is the first doped type deep well region, 550 is the first doped type falling field layer, 41-41 are the second doped type of the first falling field layer to the seventh falling field layer, 552 is the first doped type field region, 63 is the thin dielectric layer, 82 is the second doped type buried isolation layer.

DETAILED DESCRIPTION OF THE EMBODIMENTS

The following specific examples illustrate the embodiment of the invention, and the technical personnel in this field can easily understand the other advantages and effects of the invention by the content disclosed in this manual. The invention can also be implemented or applied by different concrete embodiments, the details can be based on different viewpoints and applications, in the spirit of the invention without any modification or alteration.

Embodiment 1

BCD semiconductor device, including the first type of JFET device 1, the first isolation structure 204, the first type of VDMOS device 2, the second isolation structure 203, the second type of VDMOS device 3, the LIGBT device 4, the first type of LDMOS device 5, the second type of LDMOS device 6, the third type of LDMOS device 7, the fourth type of LDMOS device 8, the fifth type of LDMOS device 9, the sixth type of LDMOS device 10, the seventh type of LDMOS device 11, the second type of JFET device 12, the low-voltage NMOS device 13, the low-voltage PMOS device 14, the low-voltage PNP device 15, the low-voltage NPN device 16 and the diode 17, these devices integrated on the same chip.

The first type of JFET device 1 includes a series of repetitive cells, these cells are directly formed on the first doped type substrate 85, the high voltage drain metal 100 located in the below of the first doped type substrate 85, the drift region includes a first doped type Buffer region 18. The super junction which is located on the upper of the first doped type Buffer region 18 includes two parts, the first part comprise of the first doped type pillar 51 and the second doped type pillar 31, and the second part comprise of the third doped type pillar 511 and the second doped type epitaxial layer 311. The first doped type pillar 51 and the second doped type pillar 31 are arranged periodically and intervally, the third doped type pillar 511 and the second doped type epitaxial layer 311 are arranged periodically and intervally. The first doped type epitaxial layer 512 and the second doped type body region 312 are located on the upper of the third doped type pillar 511 and the second doped type epitaxial layer 311. The second heavily doped type source region 32 inlay the upper of the second doped type body region 312, and the first heavily doped type source region 52 is disposed in the middle of the upper of the first doped type epitaxial layer 512. The field oxide layer 86 is disposed between the first heavily doped type source region 52 and adjacent the second heavily doped type source region 32. The dielectric layer 62 covers the field oxide layer 86. The first electrode 101 covers a portion of the dielectric layer 62 and the upper of the second heavily doped type source region 32. The second electrode 102 covers a portion of the dielectric layer 62 and the upper of the first heavily doped type source region 52. The third electrode 103 covers a portion of the dielectric layer 62 and the upper of the second heavily doped type source region 32. The fourth electrode 104 covers a portion of the dielectric layer 62 and the upper of the first heavily doped type source region 52. The fifth electrode 105 covers a portion of the dielectric layer 62 and the upper of the second heavily doped type source region 32. The first doped type Buffer region 18 reduces the difficulty of the process, and relieves the reverse diffusion from high-doped substrate. The super junction arranged periodically are favorable for reducing the resistance of the drift region, the lateral junction introduced by super junction modulated the vertical electric field, so that the device can guarantee enough voltage with the lower on-resistance at the same time.

The first type VDMOS device 2 includes many repetitive cells, these cells are directly formed on the first doped type substrate 85, the high voltage drain metal 100 is located in below of the first doped type substrate 85, the drift region includes a first doped type Buffer region 18 at the bottom and the super junction. The super junction includes two parts, the first part comprise of the first doped type pillar 51 and the second doped type pillar 31, and the second part comprise of the third doped type pillar 511 and the second doped type epitaxial layer 311. The first doped type pillar 51 and the second doped type pillar 31 are arranged periodically and intervally, the third doped type pillar 511 and the second doped type epitaxial layer 311 are arranged periodically and intervally. The first doped type epitaxial layer 512 and the second doped type body region 312 are located on the upper of the third doped type pillar 511 and the second doped type epitaxial layer 311. The second heavily doped type source region 32 and the first heavily doped type source region 52 are located on the second doped type body region 312. The bottom of the first type of gate oxide layer 610 is bridged between two first heavily doped type source regions 52, which are located in adjacent second doped type body regions 312 respectively. The first type polysilicon layer 70 connects the first heavily doped type source region 52 and another first heavily doped type source region 52 located in the adjacent second doped type body region 312. The dielectric layer 62 covers a portion of the first type of gate oxide layer 610 and the first type of polysilicon layer 70. The first type metal layer 106 covers the dielectric layer 62 and the exposed first heavily doped type source region 52 and the upper of the second heavily doped type source region 32. The second type metal layer 107 covers the dielectric layer 62 and the first heavily doped type source region 52 exposed and the upper of the second heavily doped type source region 32. The first doped type Buffer region 18 reduces the difficulty of process and is advantageous for relieving the reverse diffusion from higher doped substrate. The periodically-array super junction are favorable for reducing the resistance of the device drift region, the lateral junction introduced by super junction modulated the vertical electric field, so that the device can guarantee enough voltage with the lower on-resistance at the same time.

The first isolation structure 204 is located between the last cell 1(*n*) of the first type JFET device 1 and the first cell 2(1) of the first type of VDMOS device 2, it is placed directly on the first doped type substrate 85. The bottom of the first doped type substrate 85 is a high voltage drain metal 100. The drift region includes a first doped type Buffer region 18 at the bottom and the super junction on the upper of the first doped type Buffer region 18. The super junction includes two parts, the second part is on the first part, the first part comprise of the first doped type pillar 51 and the second doped type pillar 31, and the second part comprise of the third doped type pillar 511 and the second doped type epitaxial layer 311, the first doped type pillar 51 and the second doped type pillar 31 are arranged periodically and intervally, the third doped type pillar 511 and the second doped type epitaxial layer 311 are arranged periodically and intervally. The first doped type epitaxial layer 512 and the second doped type body region 312 are located on the upper of the third doped type pillar 511 and the second doped type epitaxial layer 311, half of the adjacent two second doped type body regions 312 belong to the first isolation structure 204. The pillar structure composed of the second doped type pillar 31 and the second doped type epitaxial layer 311 extend lengthways the drift region. The upper of the half second doped type body region 312 belonging to the first isolation structure 204 is covered with a field oxide layer 86, the field oxide layer 86 covers the entire upper of the first isolation structure 204, dielectric layer 62 covers the field oxide layer 86. The second doped type pillar penetrating the entire drift region isolates the adjacent first doped type pillar that conduct electricity, effectively reducing leakage between the two devices.

The second type VDMOS device 3 includes a series of cells, the cells are directly formed on the first doped type substrate 85, the high voltage drain metal 100 is located in below the first doped type substrate 85, the drift region includes a first doped type Buffer region 18 and the super junction on the first doped type Buffer region 18. The super junction includes two parts, the first part comprise of the first doped type pillar 51 and the second doped type pillar 31, and the second part comprise of the third doped type pillar 511 and the second doped type epitaxial layer 311. The first doped type pillar 51 and the second doped type pillar 31 are arranged periodically and intervally, the third doped type pillar 511 and the second doped type epitaxial layer 311 are arranged periodically and intervally. The first doped type epitaxial layer 512 and the second doped type body region 312 are located on the third doped type pillar 511 and the upper of the second doped type epitaxial layer 311. The second heavily doped type source region 32 and the first heavily doped type source region 52 are located on the second doped type body region 312. The first lightly doped type depleted channel region 543 is disposed between the first heavily doped type source region 52 and the first heavily doped type source region 52 which are embedded in the adjacent second doped type body region 312. The bottom of the second type of gate oxide layer 611 is bridged between two first heavily doped type source regions 52 in the adjacent second doped type body region 312, two first heavily doped type source region 52 embedded in the adjacent second doped type body region 312 respectively are connected by the second type of polysilicon layer 71. The dielectric layer 62 covers a portion of the second type of gate oxide layer 611 and the second type of polysilicon layer 71. The third type of metal layer 108 covers the dielectric layer 62 and the first heavily doped type source region 52 and the upper of the second heavily doped type source region 32. The first doped type Buffer region 18 reduces the difficulty of process and is advantageous for relieving the reverse diffusion from the high-doped substrate. The super junction arranged periodically are favorable for reducing the resistance of the drift region, the lateral junction introduced by super junction modulates the vertical electric field of the device, so that the device can guarantee the enough breakdown voltage with the lower on-resistance at the same time. The first heavily doped source region 52 and the first doped type epitaxial layer 512 is connected by the first lightly doped type depleted channel region 543 which make the device is in a normally open state and play a role of switching.

The second isolation structure 203 is located between the last cell 2(n) of the first type of VDMOS device 2 and the first cell 3(1) of the second type of VDMOS device 3, which is formed directly on the first doped type substrate 85. The high voltage drain metal 100 is located in below of the first doped type substrate 85. The drift region includes a first doped type Buffer region 18 and the super junction. The super junction includes two parts, the second part is on the first part, the first part comprise of the first doped type pillar 51 and the second doped type pillar 31, and the second part comprise of the third doped type pillar 511 and the second doped type epitaxial layer 311, the first doped type pillar 51 and the second doped type pillar 31 are arranged periodically and intervally, the third doped type pillar 511 and the second doped type epitaxial layer 311 are arranged periodically and intervally. The first doped type epitaxial layer 512 and the second doped type body region 312 are located on the upper of the third doped type pillar 511 and the second doped type epitaxial layer 311. Half of each pair adjacent second doped type body regions 312 belongs to the second isolation structure 203. A pillar structure of the super junction composed of a second doped type pillar 31 and a second doped type epitaxial layer 311 extends through the entire drift region, the upper of the half second doped type body region 312 is covered with the field oxide layer 86. The upper of the body region 312 which belonging to the second isolation structure 203 is covered with a field oxide layer 86, the field oxide layer 86 covers the entire upper of the second isolation structure 203, the dielectric layer 62 covers the field oxide layer 86. The second doped type pillar intersects the entire drift region and isolates the adjacent first doped type pillars that have effect on electric conduction, which effectively reduces the leakage between the two devices.

The right side of the last cell 3(n) of the second type VDMOS device 3 are the remaining fourteen devices. They are respectively the LIGBT device 4, the first type of LDMOS device 5, the second type of LDMOS device 6, the third type of LDMOS device 7, the fourth type of LDMOS device 8, the fifth type of LDMOS device 9, the sixth type of LDMOS device 10, the seventh type of LDMOS device 11, the second type of JFET device 12, the low voltage NMOS device 13, the low voltage PMOS device 14, the low voltage PNP15, the low voltage NPN device 16, the diode 17. The above devices are all located in the second doped type epitaxial layer 311, the second doped type epitaxial layer 311 located on the the first doped type pillar 51 and the second doped type pillar 31, the first doped type pillar 51 and the second doped type pillar 31 are arranged periodically and intervally. The isolation strip includes three parts, they are the isolation pillar 21, the field oxide layer 86 on the upper of the isolation pillar 21, and the dielectric layer 62 covering the upper of the field oxide layer 86. These devices separated each other by the isolation isolation strip.

The LIGBT device 4 is located between the two adjacent isolation strips on the right side of the last cell 3(n) of the second type VDMOS device 3. The field oxide layer 86 is on the upper surface of the isolation pillar 21, and the dielectric layer 62 covers the upper of the field oxide layer 86. The first doped type buried layer 500 is located on the upper of the second doped type epitaxial layer 311, and the first doped type epitaxial layer 512 is located on the first doped type buried layer 500 which between the adjacent two isolation pillars 21. The second doped type well region 320 is disposed on the left side of the first doped type epitaxial layer 512. The second doped type of the first falling field layer 41 is underneath and tangent to the second doped type well region 320, a pair tangent of the first heavily doped type source region 52 and the second heavily doped type source region 32 near the upper surface are located in the second doped type well region 320. The first doped type first well region 520 is disposed on the right side of the first doped type epitaxial layer 512, the first heavily doped type source region 52 is disposed at middle portion near the upper of the first doped type first well region 520. The first doped type epitaxial layer 512 located between the first doped type first well region 520 and the second doped type well region 320. The field oxide layer 86 covers the upper of the first doped type epitaxial layer 512; the field oxide layer 86 is apart from the second doped type well region 320 a certain distance. The third type of gate oxide layer 612 connects the left boundary of the first heavy doped type source region 52 and the field oxide layer 86 located on the upper of the second doped well region 320. The third type of gate oxide layer 612 is partially covered or tangent to the right boundary of the first heavily doped type source region 52. The upper of the third type gate oxide layer 612 is covered with the third type polysilicon layer 72. The left of the third type polysilicon layer 72 is tangent or does not extend to the left boundary of the third type gate oxide layer 612, and the third type polysilicon layer 72 is covered or tangent to the right boundary of the first heavily doped type source region 52. The part of the field oxide layer 86 covered with the right side of the third type polysilicon layer 72. The exposed part of the third type of gate oxide 612 and the surface of the third type of polysilicon layer 72, the exposed surface of field oxide layer 86 is covered with the dielectric layer 62 respectively. The part surface of the first heavily doped type source region 52 and the second heavily doped type source region 32 are covered with the source metal 109, the first heavily doped type source region 52 nearly located on the middle upper surface of the first doped type first well region 520 is covered with the drain metal 110. The first doped type buried layer 500 is conducive to shield the depletion effect of the second doped epitaxial layer 311 on the first doped epitaxial layer 512 and regulate the electric field of the first doped epitaxial layer 512 to avoid the surface breakdown of the device. The second doped type of the first falling field layer 41, on the one hand, it can prevent the LIGBT device 4 through breakdown which caused by the depletion from the first doped type epitaxial layer 512 to the second doped type well region 320. On the other hand, it is conducive to regulate the peak electric field between the second doped type well region 320 and the first epitaxial layer doped type 512, avoiding the breakdown on the surface.

The first type of LDMOS device 5 is located on the right side of the LIGBT device 4 and separated from the adjacent LIGBT device 4 by isolation strips. The field oxide layer 86 is on the upper of the isolation pillar 21, the upper of the field oxide layer 86 is covered with the dielectric layer 62. The first type of LDMOS device 5 is located in the second doped type epitaxial layer 311. The first doped type first buried layer 501 is disposed at a portion upper of the second doped type epitaxial layer 311, the first doped type epitaxial layer 512 is located on the first doped type first buried layer 501 and located between the adjacent two isolation pillar 21. The first doped type first deep well region 301 is disposed on the upper of the first doped type epitaxial layer 512. The first doped type second well region 521 is disposed on the left side of the second doped type first deep well region 301. The first doped type falling field layer 550 is located directly below the first doped type second well region 521. The first heavily doped type source region 52 is located nearly in the upper of the first doped type second well region 521, and the second heavily doped type source region 32 is tangential to the first heavily doped type source region 52. The second heavily doped type source region 32 is disposed at the right upper of the second doped type first deep well region 301. The partial field oxide layer 86 is located at the upper of the second doped type of the first deep well region 301, the field oxide layer 86 is some distance from the first doped type of the second well region 521. The fourth type of gate oxide layer 613, which partially covers or is tangent to the right bordery of the second heavily doped type source region 32, is connected to the second heavily doped source region 32 and the left boundary of the field oxide layer 86 at the upper of the first doped type second well region 521. The fourth type of gate oxide layer 613 is tangent to or does not extend to the left boundary of the second heavily doped type source region 32, and covered with the fourth type of polysilicon layer 73 at the upper surface. The fourth type of polysilicon layer 73 covers a portion of the field oxide layer 86 on the right side, the fourth type of polysilicon layer 73 also covers or is tangent to the right border of the second doped type source region 32. The exposed portion of the fourth type of gate oxide layer 613, the upper of the fourth type of polysilicon layer 73, and the exposed upper of the field oxide layer 86 are covered with the dielectric layer 62. Portion of the first heavily doped source region 52 and the second heavily doped type source region 32 are covered with a first type of source metal 111. The upper of the second heavily doped type source region 32 located in the middle near the upper surface of the second doped type of the first deep well region 301 is covered with the first type of drain metal 112. The first doped type of the first buried layer 501 is beneficial for shielding the depletion of the first doped type epitaxial layer 512 from the second doped type epitaxial layer 311, and is advantageous for adjusting the electric field of the first type of LDMOS device 5 to avoid the surface breakdown of the device. The first doped type falling field layer 550 can shield the depletion of the first doped well region 521 from the second doped type of the first deep well region 301 and prevent the punch through of the device 5. On the other hand, it is advantageous to adjust the electric field peak of the junction between the second doped type well region 301 and the first doped type of the second well region 521 to prevent the breakdown occurring on the surface of the first type of LDMOS device 5.

The second type of LDMOS device 6 is separated from the adjacent first type LDMOS device 5 by isolation strips. The first doped type of the second buried layer 502 of the second type of LDMOS device 6 is located at a portion of the upper of the second doped type epitaxial layer 311. The first doped type epitaxial layer 512 is located above the first doped type of the second buried layer 502. The second doped type of the first buried layer 401 is located directly above the first doped type of the second buried layer 502. The second doped type of the first well region 321 is disposed on the left side of the upper portion of the first doped type epitaxial layer 512. The second doped type of the second falling field layer 42 is located directly below the second doped type of the first well region 321, and is tangent to the second doped type of the first well region 321. The first doped type of the third well region 522 is disposed on the right side of the first doped type epitaxial layer 512, and the first heavily doped type source region 52 is disposed in near the upper surface of the first doped type of the third well region 522. The first doped type field region 552 is disposed on the right side of the first heavily doped type source region 52. There is a certain distance between the field oxide layer 86 and the second doped type of the first well region 321. The fifth type of gate oxide layer 614 is connected the first heavily doped source region 52 located at the upper of the second doped type of the first well region 321 and the left boundary of the field oxide layer 86. The fifth type of gate oxide layer 614 is thicker than the fourth type gate oxide layer 613 of the first type of LDMOS device 5 and covers partially or is tangent to the right bordery of the first heavily doped source region 52. The upper of the fifth type of gate oxide layer 614 is covered with a fifth type of polysilicon layer 74 which is tangentially left or not extended to the left boundary of the fifth type gate oxide layer 614. The fifth type of polysilicon layer 74 is covered or tangent to the right border of the first heavily doped source region 52. The fifth type polysilicon layer 74 covers a portion of the field oxide layer 86 on the right side. The dielectric layer 62 covers three parts, they are the exposed portion of the fifth type of gate oxide layer 614, the upper of the fifth type of polysilicon layer 74 and the exposed upper of the field oxide layer 86, respectively. The second type of source metal 113 covers a first heavily doped source region 52 and a portion of the upper of the second heavily doped source region 32 that is tangential to the left side of the first heavily doped source region 52. The second type of drain metal 115 covers the first heavily doped source region 52 on the right. The second type of field plate electrode metal 114 partially covers the upper of the fifth type polysilicon layer 74. The first doped type field region 552 can prevent the breaking channel phenomenon occurring when the gate is connected to a high potential.

The third type of LDMOS device 7 is separated from the adjacent second type LDMOS device 6 by isolation strips. The first doped type of the third buried layer 503 is located on the portion upper of the second doped type epitaxial layer 311. The first doped type epitaxial layer 512 is located above the first doped type of the third buried layer 503, the field oxide layer 86 is disposed directly above the first doped type epitaxial layer 512. The second doped type of the second well region 322 is disposed on the left side of the first doped type epitaxial layer 512. The second doped type of the third falling field layer 43 is located directly below the second doped type of the second well region 322 and is tangent to the second doped type of the second well region 322. The first doped type of the fourth well region 523 is disposed on the right side of the first doped type epitaxial layer 512, and the first heavily doped type source region 52 is disposed in near the upper surface of the first doped type of the fourth well region 523. The field oxide layer 86 is spaced apart from the second doped type of the second well region 322 by a certain distance. The sixth type of gate oxide layer 615, which partially covers or is tangent to the right bordery of the first heavily doped type source region 52, is connected to the first heavily doped source region 52 which located in the upper of the second doped type of the second well region 322 and the left boundary of the field oxide layer 86. The surface of the sixth gate oxide layer 615 is covered with the sixth type of polysilicon layer 75. The sixth type of polysilicon layer 75 is tangentially left or not extended to the left boundary of the sixth type of gate oxide layer 615, it is covered or tangential to the right border of the first heavily doped source region 52. A portion of the field oxide layer 86 is covered with the right side of the sixth type of polysilicon layer 75. The dielectric layer 62 overs three parts, they are the exposed portion of the sixth type of gate oxide layer 615 and the upper of the sixth type of polysilicon layer 75 and the exposed upper of the field oxide layer 86, respectively. The third type of source metal 116 overs the partially surface of the first heavily doped type source region 52 and the second heavily doped type source region 32 on the left side. The third type of drain metal 118 overs the first heavily doped source region 52 on the right side, the third type of field plate electrode metal 117 overs the partially surface of the sixth type polysilicon layer 75.

The fourth type of LDMOS device 8 is separated from the adjacent third type LDMOS device 7 by isolation strips. The first doped type of the fourth buried layer 504 is located on the portion upper of the second doped type epitaxial layer 311, the first doped type epitaxial layer 512 is located above the first doped type of the fourth buried layer 504. The second doped type of the top layer 402 is disposed directly above the first doped type epitaxial layer 512, the field oxide layer 86 is located above the second doped type of top layer 402. The second doped type of the third well region 323 is disposed on the left side of the first doped type epitaxial layer 512, the second doped type of the fourth falling field layer 44 is located directly below and tangent to the second doped type of the third well region 323. The first doped type of the fifth well region 524 is disposed on the right side of the first doped type epitaxial layer 512, and a first heavily doped type source region 52 is disposed in near the surface of the first doped type of the fifth well region 524. The field oxide layer 86 is spaced apart from the second doped type of the third well region 323 a certain distance. The seventh type of gate oxide layer 616, which partially covers or is tangent to the right bordery of the first heavily doped type source region 52, is connected to the first heavily doped source region 52 which located at the upper of the second doped type of the third well region 323 and the left boundary of the field oxide layer 86. The seventh type of gate oxide layer 616 is covered with a seventh type of polysilicon layer 76 which is tangentially left or not extended to the left boundary of the seventh type gate oxide layer 616. The seventh type of polysilicon layer 76 is covered or tangential to the right border of the first heavily doped source region 52, the seventh type of polysilicon layer 76 covers a portion of the field oxide layer 86 on the right side. The dielectric layer 62 covers three parts, they are the exposed portion of the seventh type of gate oxide layer 616, the upper of the seventh type of polysilicon layer 76 and the exposed upper of the field oxide layer 86, respectively. The fourth type of source metal 119 covers a portion of the first heavily doped source region 52 and a portion of the second heavily doped source region 32. The fourth type of drain metal 121 covers a portion of the first heavily doped type source region 52, the fourth type of field plate electrode metal 120 covers part of the upper surface of the seventh type of polysilicon layer field plate 76.

The fifth type of LDMOS device 9 is separated from the adjacent fourth type LDMOS device 8 by isolation strips, the fifth type of LDMOS device 9 is provided with a first doped type of the fifth buried layer 505 located at a portion of the upper of the second doped type epitaxial layer 311. The second doped type buried layer 403 is located above the first doped type of the fifth buried layer 505, the field oxide layer 86 is disposed over the second doped type buried layer 403. The second doped type of the fourth well region 324 is disposed on the left side of the first doped type epitaxial layer 512, The second doped type of the fifth falling field layer 45 is located directly below the second doped type of the fourth well region 324 and is tangent to the second doped type of the fourth well region 324. The first doped type of the sixth well region 525 is disposed on the right side of the first doped type epitaxial layer 512 and a first heavily doped type source region 52 is disposed in near the upper surface the first doped type of the sixth well region 525. The field oxide layer 86 is spaced apart from the second doped type of the fourth well region 324 by a certain distance. The eighth type gate oxide layer 617, which partially covers or is tangent to the right border of the first heavily doped type source region 52, is connected to the first heavily doped source region 52 located at the upper of the second doped type fourth well region 324 and the left boundary of the field oxide layer 86. The eighth type of gate oxide layer 617 is covered with an eighth type polysilicon layer 77 which is tangentially left or not extended to the left boundary of the eighth type gate oxide layer 617. The eighth type polysilicon layer 77 is covered or tangential to the right bordery of the first heavily doped type source region 52, and covers a portion of the eighth type field oxide layer 86 on the right side. The dielectric layer 62 covers three parts, they are the exposed portion of the eighth type gate oxide layer 617, the upper of the eighth type polysilicon layer 77, and the exposed upper of the field oxide layer 86, respectively. The fifth type of source metal 122 covers a portion of the first heavily doped source region 52 and a portion of the second heavily doped source region 32. The fifth type of drain metal 124 covers a portion of the first heavily doped type source region 52, the fifth type of field plate electrode metal 123 covers part of the polysilicon 77. The second doped type of the buried layer 403 can assist the depletion of the first doped type epitaxial layer 512, which is beneficial to increase the doped concentration of the first doped type epitaxial layer 512 and further reduce the on-resistance of the fifth type of LDMOS device 9.

The sixth type of LDMOS device 10 is separated from the adjacent fifth type LDMOS device 9 by isolation strips. The sixth type of LDMOS device 10 is provided with a first doped type of the sixth buried layer 506 at a portion of the upper of the second doped type epitaxial layer 311. The first doped type epitaxial layer 512 is located above the first doped type of the sixth buried layer 506. The field oxide layer 86 is disposed over the first doped type epitaxial layer 512, the second doped type of the fifth well region 325 is disposed on the left side of the first doped type epitaxial layer 512. The second doped type of the sixth falling field layer 46 is located directly below and tangent to the second doped type of the fifth well region 325. The first doped type of the seventh well region 526 is disposed on the right side of the first doped type epitaxial layer 512 and a first heavily doped type source region 52 is disposed in near the upper surface of the first doped type of the seventh well region 526. The field oxide layer 86 is spaced apart from the second doped type of the fifth well region 325 by a certain distance. The ninth type gate oxide layer 618, which covers or is tangent to the right bordery of the first heavily doped source region 52, is connected to the first heavily doped source region 52 located at the upper of the second doped type of the fifth well region 325 and the left boundary of the field oxide layer 86. The ninth type polysilicon layer 78 is covered on the upper of the ninth type gate oxide layer 618 and is tangentially left or not extended to the left boundary of the ninth type gate oxide layer 618. The ninth type polysilicon layer 78 is covered or tangential to the right border of the first heavily doped source region 52. The ninth type polysilicon layer 78 covers a portion of the ninth field oxide layer 86 on the right side. The ninth type of dielectric layer 62 is covered with three parts, they are the exposed portion of gate oxide layer 618, the upper of ninth type polysilicon layer 78, and the exposed upper of field oxide layer 86, respectively. The sixth source metal 125 covers a portion of the first heavily doped source region 52 and a portion of the second heavily doped source region 32. The sixth type of drain metal 126 covers a portion of the first heavily doped type source region 52.

The seventh type LDMOS device 11 is separated from the adjacent sixth type LDMOS device 10 by isolation strips, the seventh type of LDMOS device 11 is provided with a first doped type of the seventh buried layer 507 located at a portion of the upper of the second doped type epitaxial layer 311, the first doped type epitaxial layer 512 is located above the first doped type of the seventh buried layer 507. The second doped type of the sixth well region 326 is disposed on the left side of the first doped type epitaxial layer 512. The second doped type of the seventh falling field layer 47 is located just below and is tangent to the second doped type of the sixth well region 326, the first heavily doped type source region 52 is disposed on the right side of the first doped type epitaxial layer 512. The tenth type gate oxide layer 619, which is partially covered or tangential to the right border of the first heavily doped type source region 52, is connected to the first heavily doped source region 52 which located at the upper of the second doped type of the sixth well region 326 and the first doped type sustain voltage layer 544 disposed on the right side of the first doped type epitaxial layer 512. The upper of the tenth type gate oxide layer 619 is covered with a tenth type polysilicon layer 79 which is tangentially left or not extended to the left boundary of the tenth gate oxide layer 619 and is covered or tangent to the right border of the first heavily doped source region 52. The dielectric layer 62 is covered by the tenth type of the exposed portion of the tenth type gate oxide layer 619, the upper of the tenth type polysilicon layer 79, and the exposed upper of the field oxide layer 86. The seventh type of source metal 127 covers a portion of the first heavily doped source region 52 and a portion of the second heavily doped source region 32, the seventh type of drain metal 128 covers a portion of the first heavily doped type source region 52.

The second type of JFET device 12 is separated from the adjacent seventh type LDMOS device 11 by the isolation strips. The second type of JFET device 12 is provided with a first doped type epitaxial layer 512 located at a portion of the upper of the second doped type epitaxial layer 311, a second type of heavily doped type 32 is disposed at near the middle upper of the first doped type epitaxial layer 512. The first type of heavily doped source region 52 is symmetrically disposed on the left and right sides of the second type of heavily doped type source region 32. The first type of heavily doped source region 52 is isolated from the second type of heavily doped source region 32 by a field oxide layer 86 in the horizontal direction, the field oxide layer 86 is covered with a dielectric layer 62. The fourth type of metal layer 129 covers the first type of heavily doped source region 52 on the left side of the second type of heavily doped source region 32. The fifth type of metal layer 130 covers a portion of the second type of heavily doped source regions 32. The sixth type of metal layer 131 covers the first type of heavily doped source region 52 on the tight side of the second type of heavily doped source region 32.

The low voltage NMOS device 13 is separated from the adjacent second type JFET device 12 by the isolation strips. The low voltage NMOS device 13 is provided with a first doped type of the eighth buried layer 508 located at a portion of the upper of the second doped type epitaxial layer 311. The first doped type epitaxial layer 512 is located above the first doped type of the eighth buried layer 508. The second doped type of the second deep well region 302 is located above the first doped type epitaxial layer 512. The second doped type of the second deep well region 302 is provided with a first heavily doped type source region 52 and a second heavily doped type source region 32 on the left side. The first doped type source region 52 is disposed on the right side of the second doped type of the second deep well region 302. The upper surfaces of two adjacent first heavily doped source regions 52 are connected by an eleventh type of gate oxide layer 620. The eleventh type of gate oxide layer 620 is tangent or covers a portion of the first heavily doped type source region 52. The eleventh type of polysilicon layer 80 covers the upper of the eleventh type of gate oxide layer 620. The dielectric layer 62 covers the eleventh type of polysilicon layer 80. The first type of body region metal layer 132 covers the second heavily doped type source region 32, the eighth type source metal layer 133 covers the first heavily doped type source region 52, the eighth type of drain metal layer 134 covers the first heavily doped type source region 52.

The low voltage PMOS device 14 is separated from adjacent low voltage NMOS devices 13 by isolation strips. The low voltage PMOS device 14 is provided with a first doped type of the ninth type of buried layer 509 located at a portion of the upper of the second doped type epitaxial layer 311. The first doped type epitaxial layer 512 is located above the first doped type of the ninth buried layer 509. The first doped type of the second well region 521 is located above the first doped type epitaxial layer 512. The first doped type of the deep well region 5102 is provided with a first heavily doped type source region 52 and a second heavily doped type source region 32 on the left side. The second heavily doped type source region 32 is disposed on the fight side of the first doped type of the deep well region 5102. The upper surfaces of two adjacent second heavily doped source regions 32 are connected by a twelfth type of gate oxide layer 621. The twelfth type of gate oxide layer 621 is tangent or covers a portion of the second heavily doped type source region 32, the twelfth type of polysilicon layer 81 covers the upper of the twelfth type of gate oxide layer 621, the dielectric layer 62 covers the upper of the twelfth type of polysilicon layer 81. The second type of body region metal layer 135 covers the first heavily doped type source region 52, the ninth source metal 136 covers the second heavily doped source region 32, the ninth type drain metal 137 covers the second heavily doped source region 32.

The PNP device 15 is separated from adjacent low voltage PMOS devices 14 by isolation strips. The PNP device 15 is provided with a first doped type of the tenth buried layer 510 located at a portion of the upper of the second doped type epitaxial layer 311. The first doped type epitaxial layer 512 is located above the first doped type of the tenth buried layer 510, the first doped type epitaxial layer 512 is provided with two first heavily doped type source regions 52 and two second heavily doped type source regions 32 both of which are alternately distributed with equally spaced. The first heavily doped type source region 52 disposed at the leftmost side of the first doped type epitaxial layer 512, adjacent to the right side of the first heavily doped type source region 52 is a second heavily doped type source region 32. The surfaces of both the first heavily doped source region 52 and the second heavily doped source region 32 each other are isolated by the field oxide layer 86. The two first heavily doped source regions 52 and the second heavily doped source regions 32 distributed alternately with equally spaced, are isolated from each other by the field oxide layer 86. Two second heavily doped type source regions 32 surrounded by a second doped type of the third deep well region 303. The seventh type of metal layer 138 covers the upper of the first heavily doped source region 52, the eighth type of metal layer 139 covers the second doped type source region 32, the ninth metal layer 140 covers the first heavily doped source region 52, the tenth metal layer 141 covers the second doped type source region 32.

The NPN device 16 is separated from the adjacent PNP device 15 by the isolation strips. The NPN device 16 is provided with the first doped type of eleventh buried layer 5101 located at a portion of the upper of the second doped type epitaxial layer 311. The first doped type epitaxial layer 512 is located above the first doped type of eleventh buried layer 5101. The second doped type of the fourth deep well region 304 is disposed at the upper left of the first doped type epitaxial layer 512. The first doped type source region 52 and the second heavily doped type source region 32 separated by the field oxide layer 86 are disposed at the upper of the second doped type fourth of the deep well region 304. The upper of the field oxide layer 86 covered with a dielectric layer 62. The first heavily doped type source region 52 is disposed at the upper of the first doped type epitaxial layer 512 which is outside the fourth doped type of the fourth deep well region 304. The left side of the first heavily doped source region 52 is separated from the right side of the second doped type of the fourth deep well region 304 by the field oxide layer 86. The dielectric layer 62 covers field oxide layer 86. The twelfth type metal layer 143 covers the first heavily doped source region 52 located in the fourth deep well region 304. The eleventh metal layer 142 covers the second heavily doped source region 32 in the fourth deep well region 304. The thirteenth metal layer 144 covers the first heavily doped source region 52 outside the third deep well region 304.

The diode device 17 is separated from the adjacent PNP device 16 by isolation strips. The diode device 17 is provided with a second doped type of the third buried layer 313 at a portion of the upper of the second doped type epitaxial layer 311. The second doped type of the third buried layer 313 is led to the surface through the second doped type of the fifth deep well region 305, realizing the function of a diode anode. The first doped type epitaxial layer 512 is located above the second doped type of the third buried layer 313. The second doped type of the fifth deep well region 305 is disposed on each side of the first doped type epitaxial layer 512. The second heavily doped type source region 32 is disposed at an upper of the second doped type of the fifth well region 305. Two second heavily doped type source regions 32 and a first heavily doped type source region 52 are located on the upper of the first doped type epitaxial layer 512. The first heavily doped source region 52 and the two adjacent second heavily doped source regions 32 each other are separated by field oxide layer 86. The upper of the field oxide layer 86 is covered with a dielectric layer 62. The fourteenth metal layer 145 covers the second heavily doped source region 32, the fifteenth class of metal 146 covers the first heavily doped source region 52, the sixteenth metal layer 147 covers the second heavily doped source region 32.

The isolation strip 21 is formed by filling dielectric layer.

Embodiment 2

Figure 2:
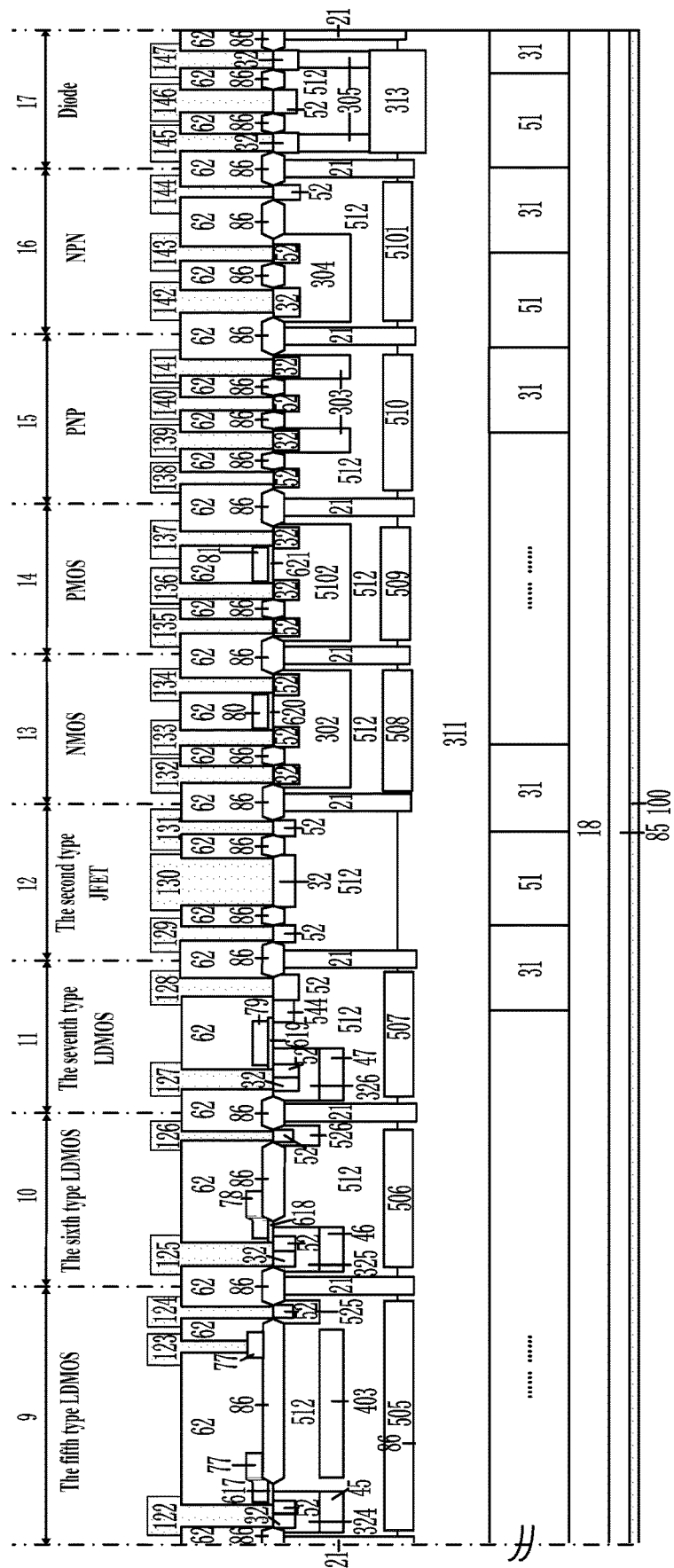
FIG. 2(a)-2(c) is a schematic diagram of the embodiment 2 of the invention.
Figure 2:
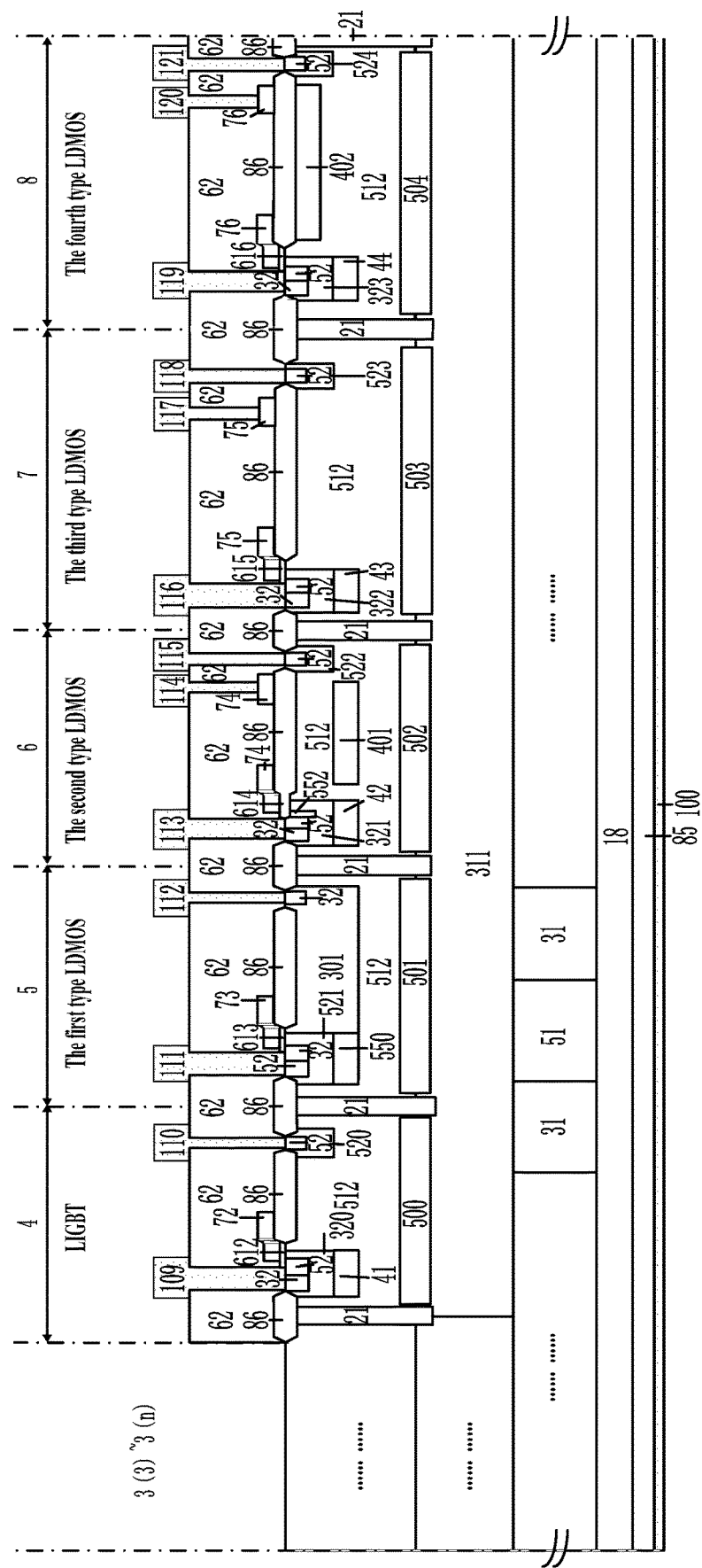
Figure 2:
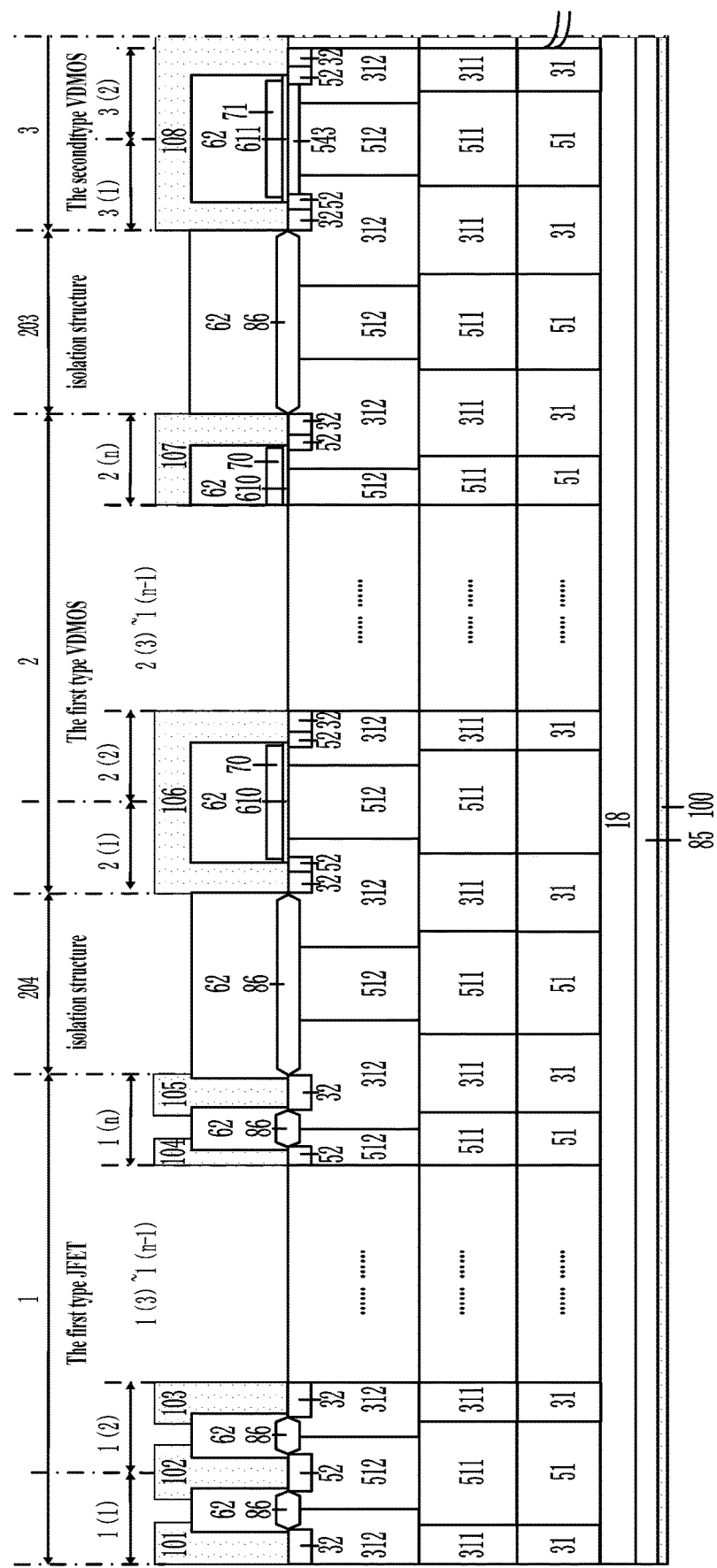

The difference between this embodiment and the embodiment 1 is that the first doping type pillar 51 and the second doping type pillar 31 of the device periodically arranged are formed by trench-refilling, as shown in FIG. 2.

Embodiment 3

Figure 3:
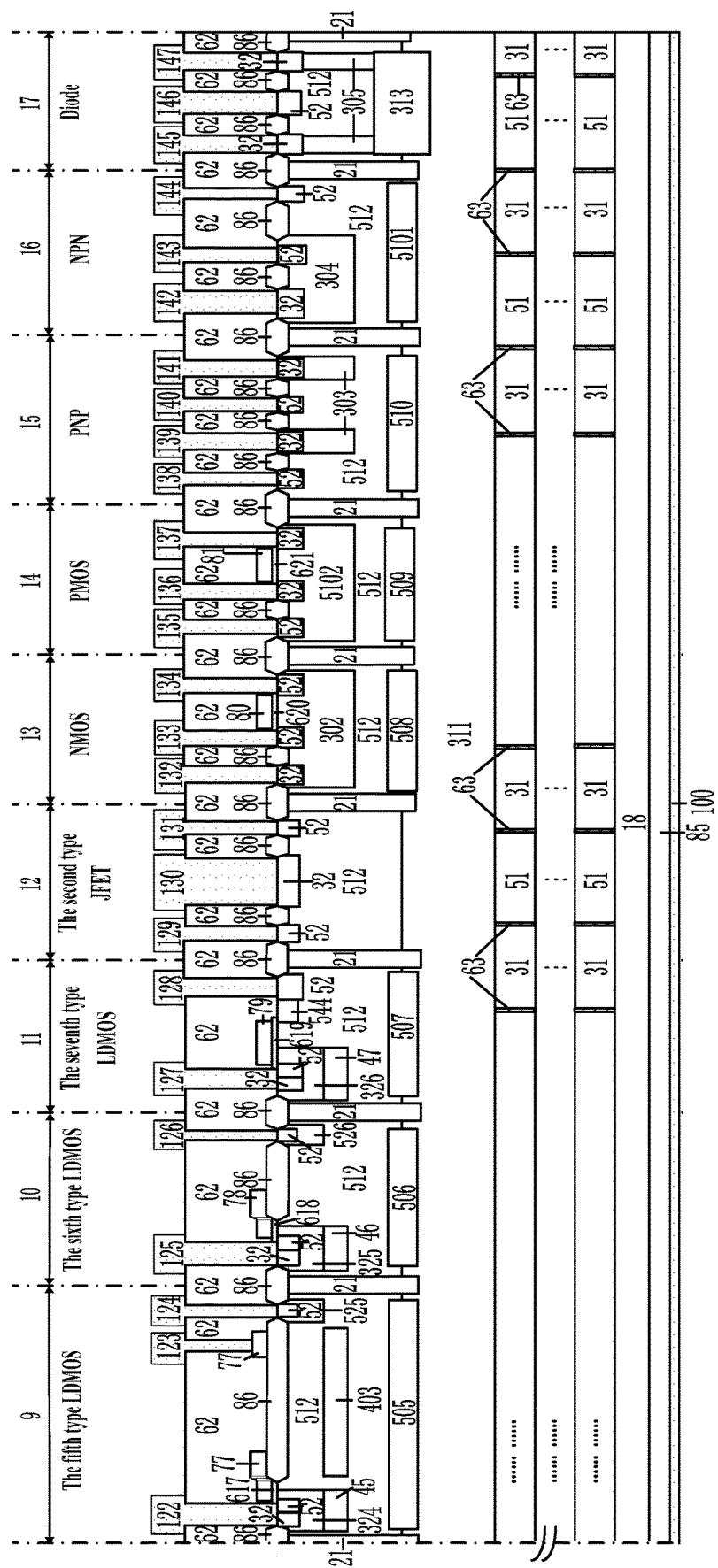
FIG. 3(a)-3(c) is a schematic diagram of the embodiment 3 of the invention.
Figure 3:
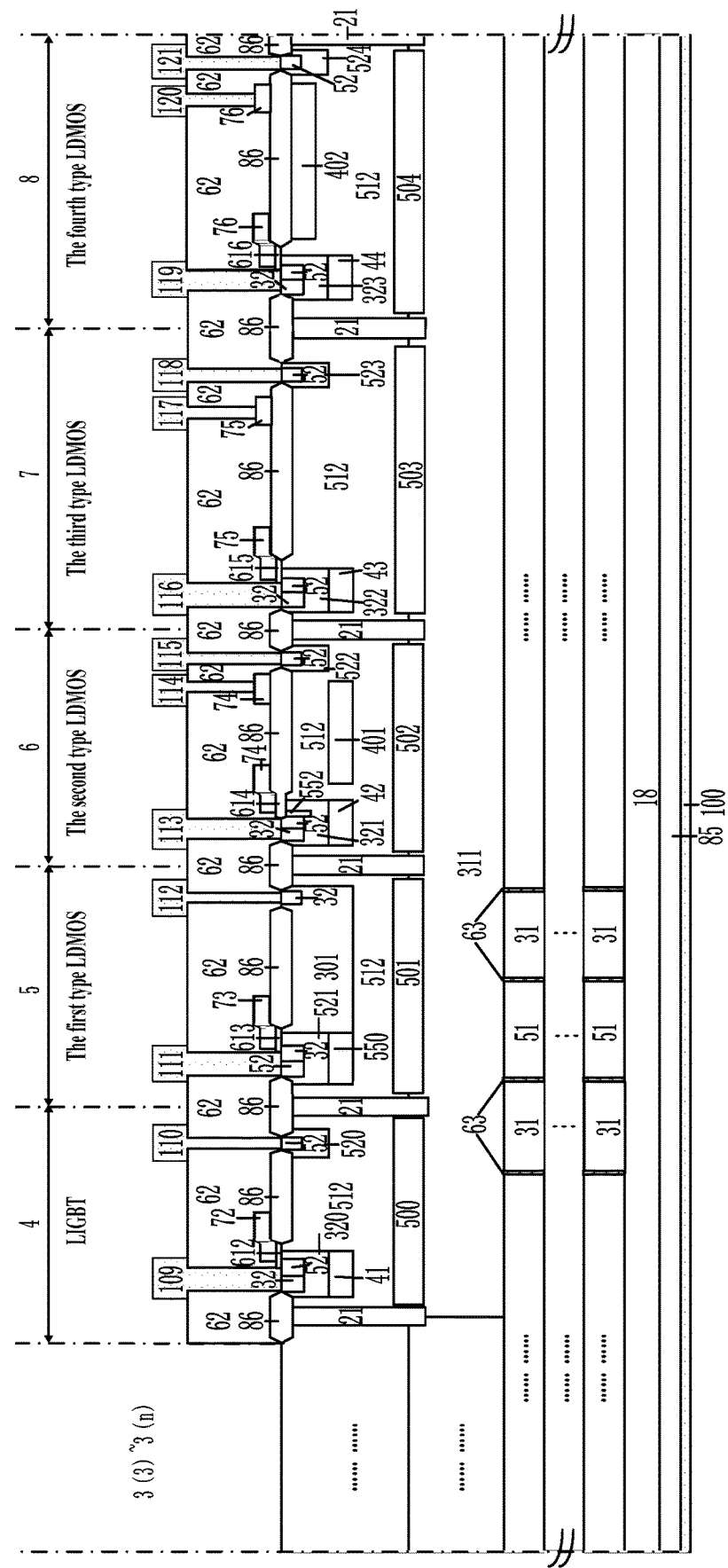
Figure 3:
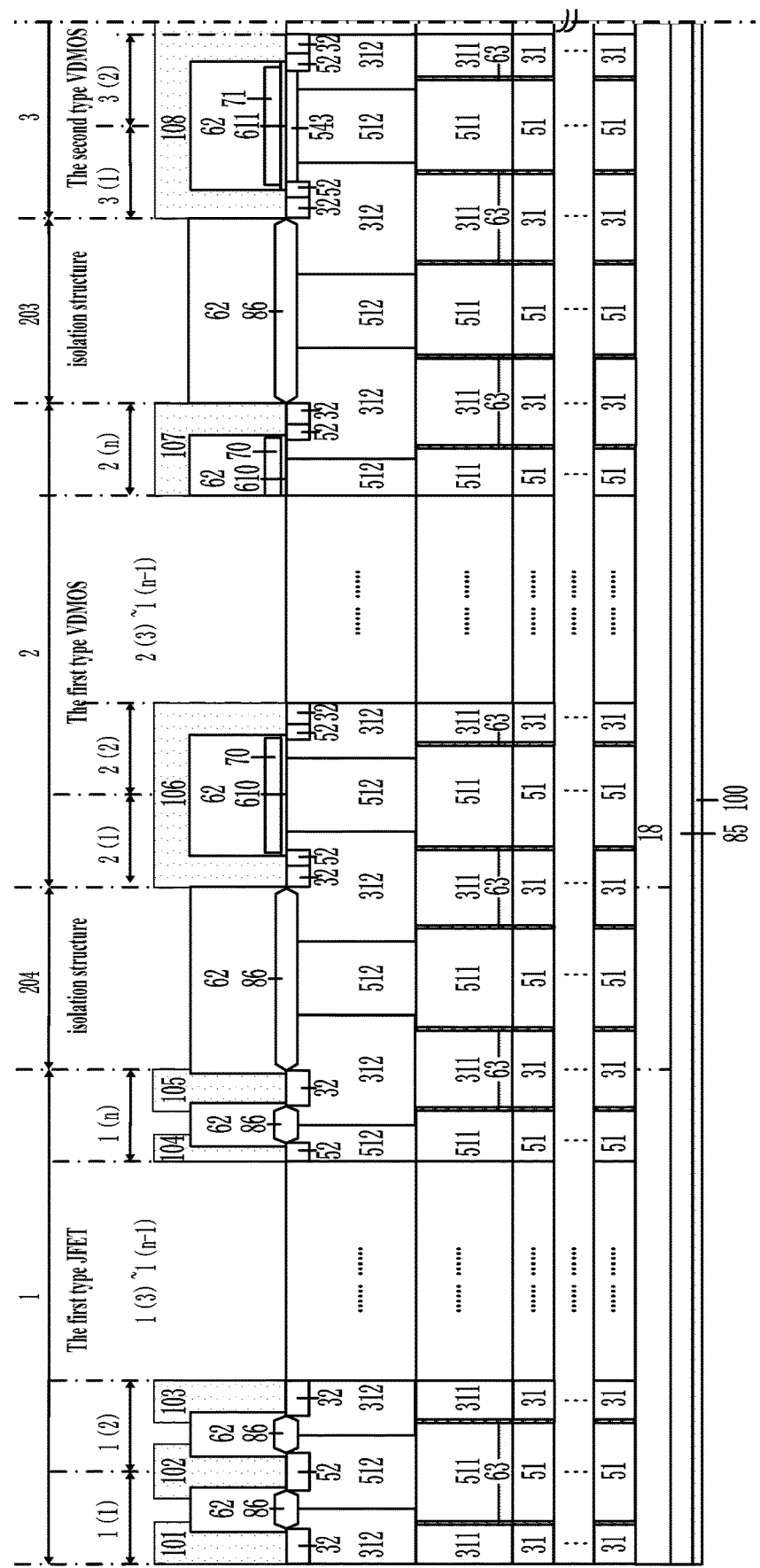

The difference between this embodiment and the embodiment 1 is that the first doped type pillar 51 and the second doping type strip 31 of the periodic arrangement of the device are separated by thin dielectric layer 63, as shown in FIG. 3.

Embodiment 4

Figure 4:
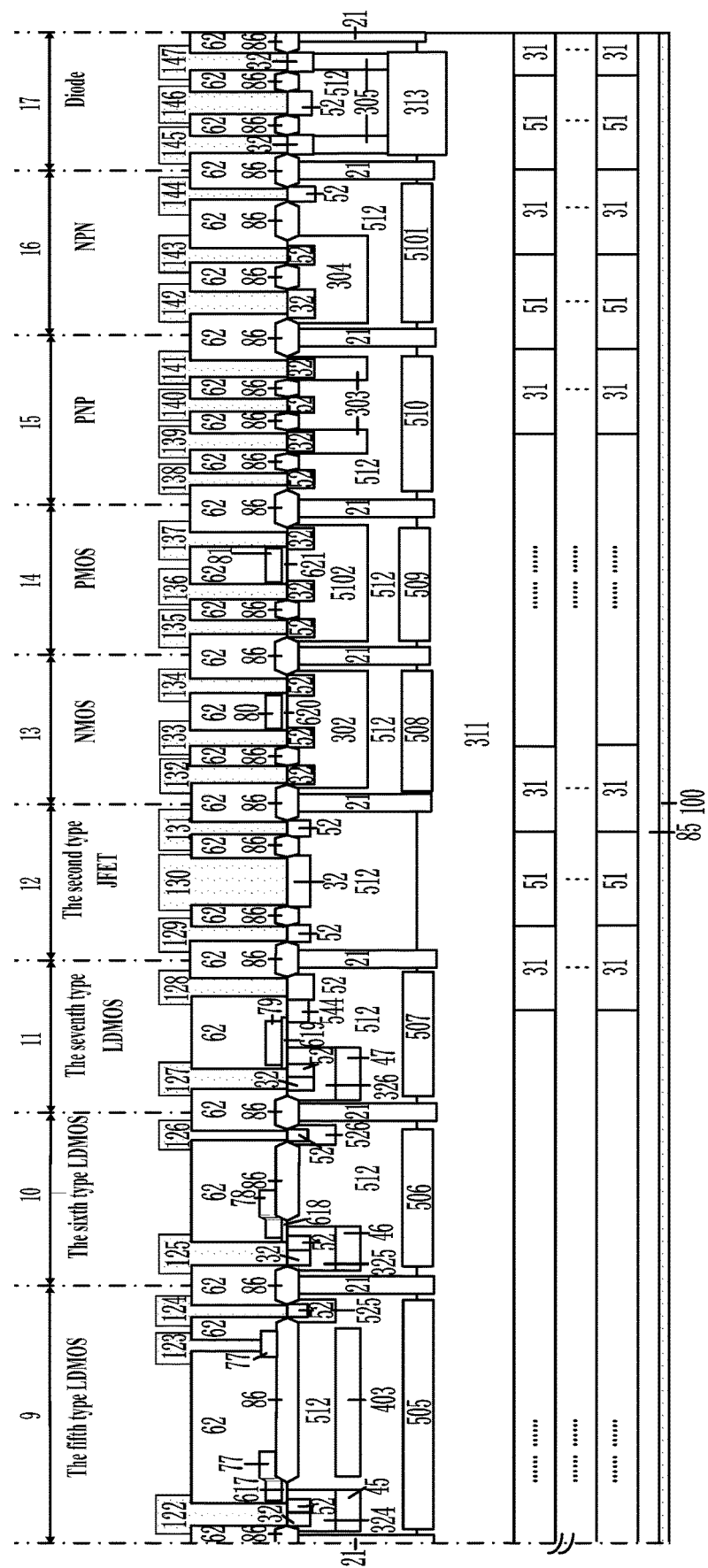
FIG. 4(a)-4(c) is a schematic diagram of the embodiment 4 of the invention.
Figure 4:
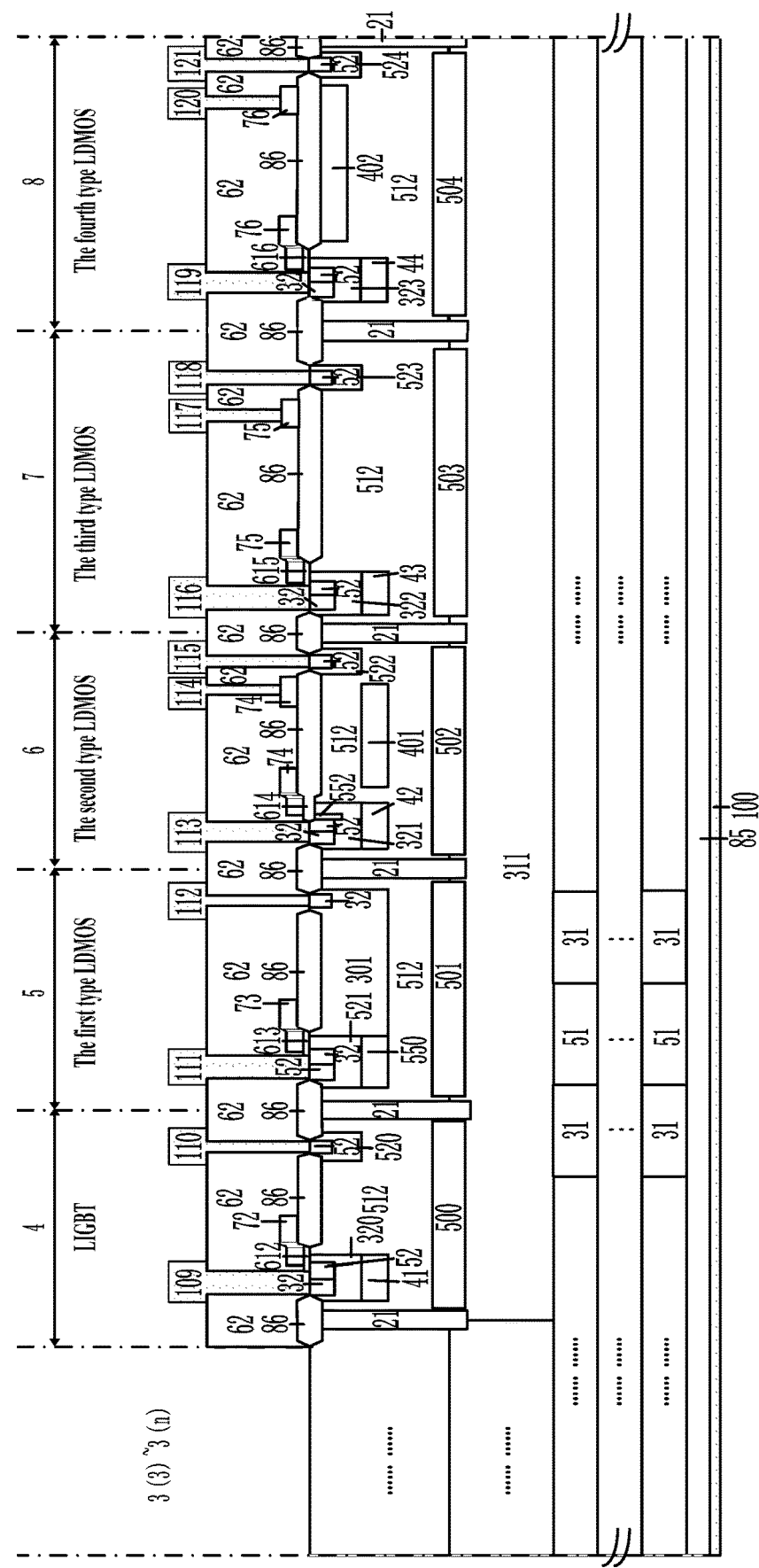
Figure 4:
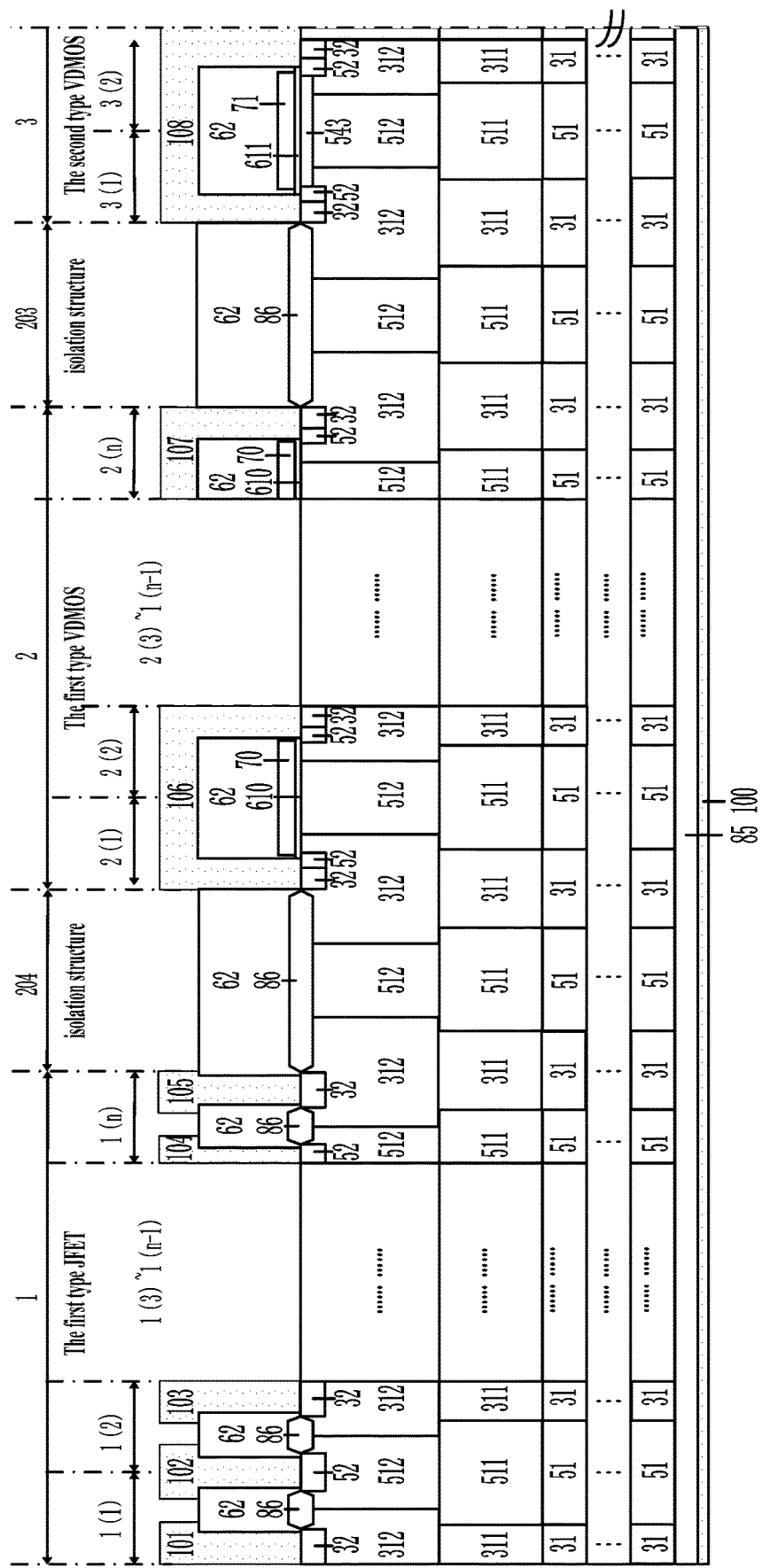

The difference between this embodiment and the embodiment 1 is that the first doping type pillar 51 and the second doping type pillar 31 of the device are arranged directly on the first doped type substrate 85. The first doped type Buffer region 18 is removed. As shown in FIG. 4.

Embodiment 5

Figure 5:
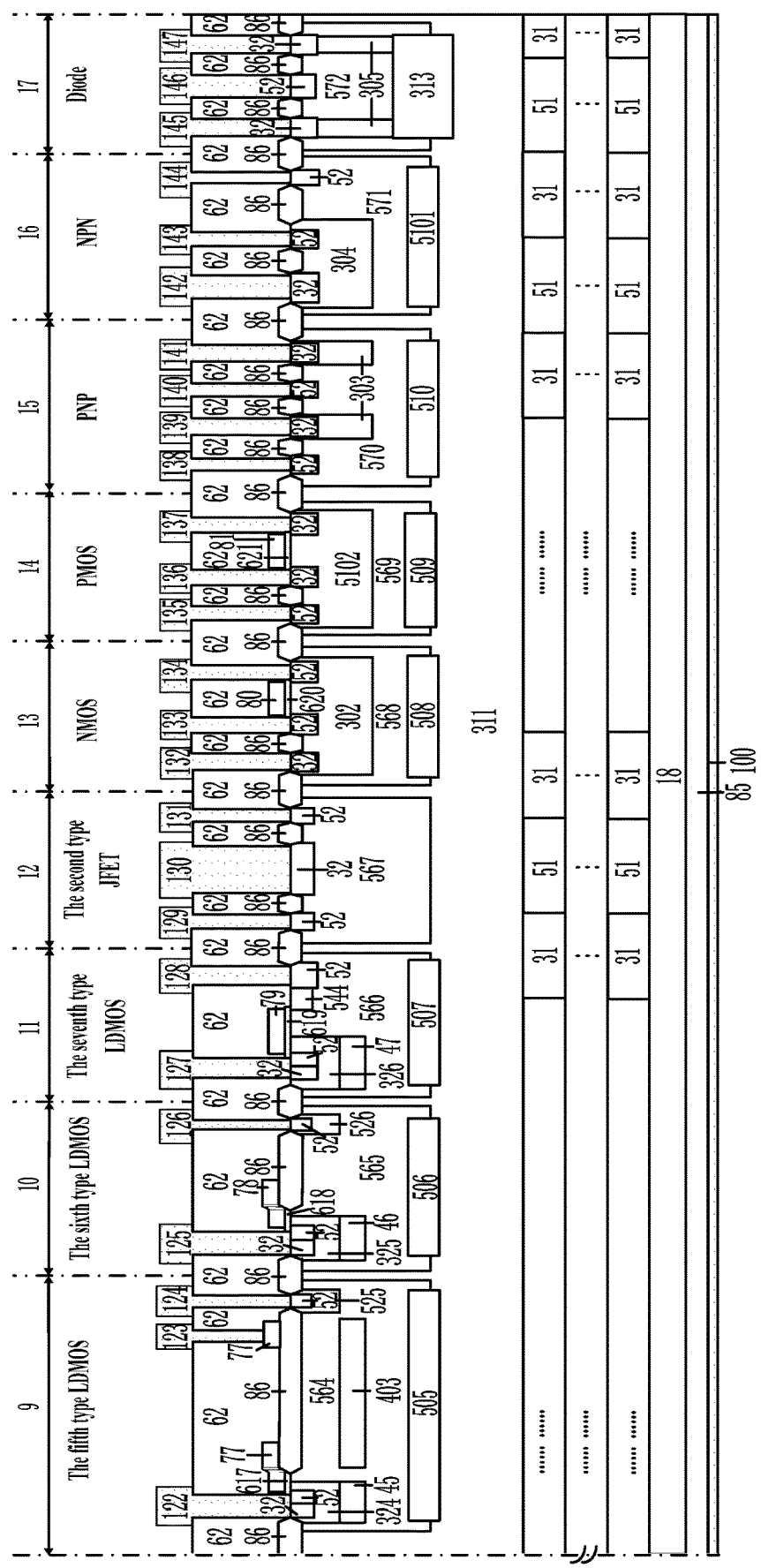
FIG. 5(a)-5(c) is a schematic diagram of the embodiment 5 of the invention.
Figure 5:
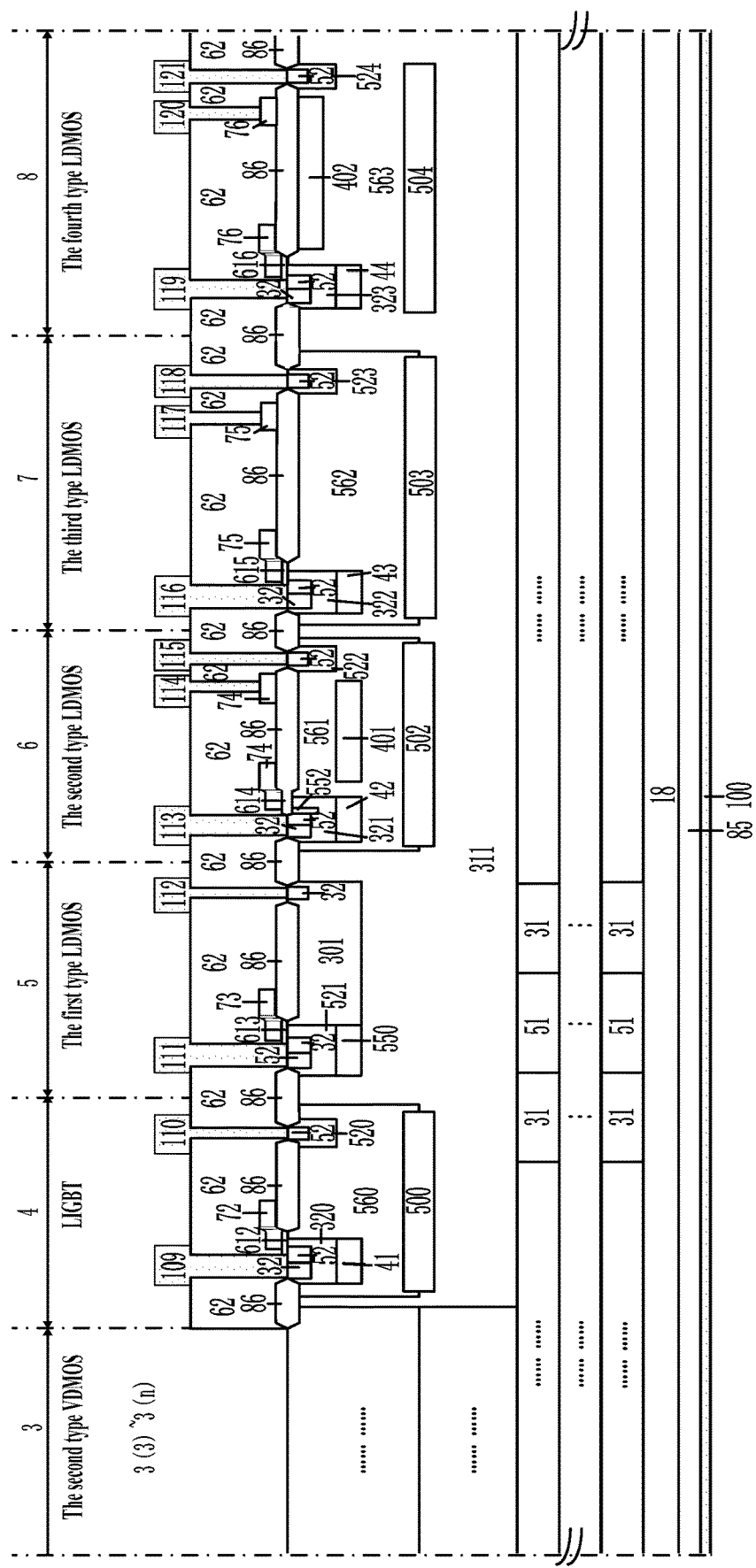
Figure 5:
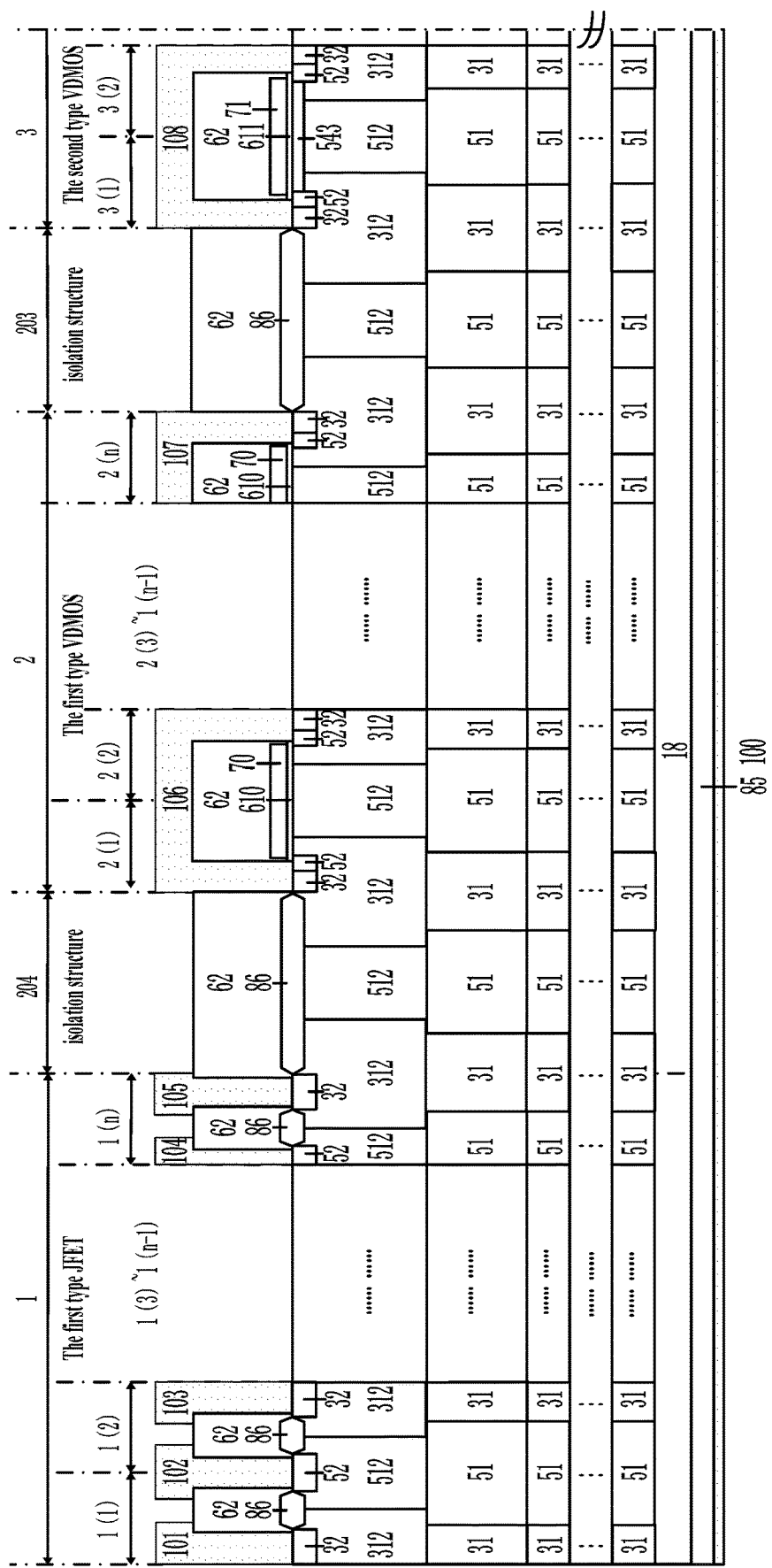

The difference between this embodiment and the embodiment 1 is that the devices 4-17 on the right side of the second type VDMOS device 3 are formed in the second doped type epitaxial layer 311. As shown in FIG. 5.

Embodiment 6

Figure 6:
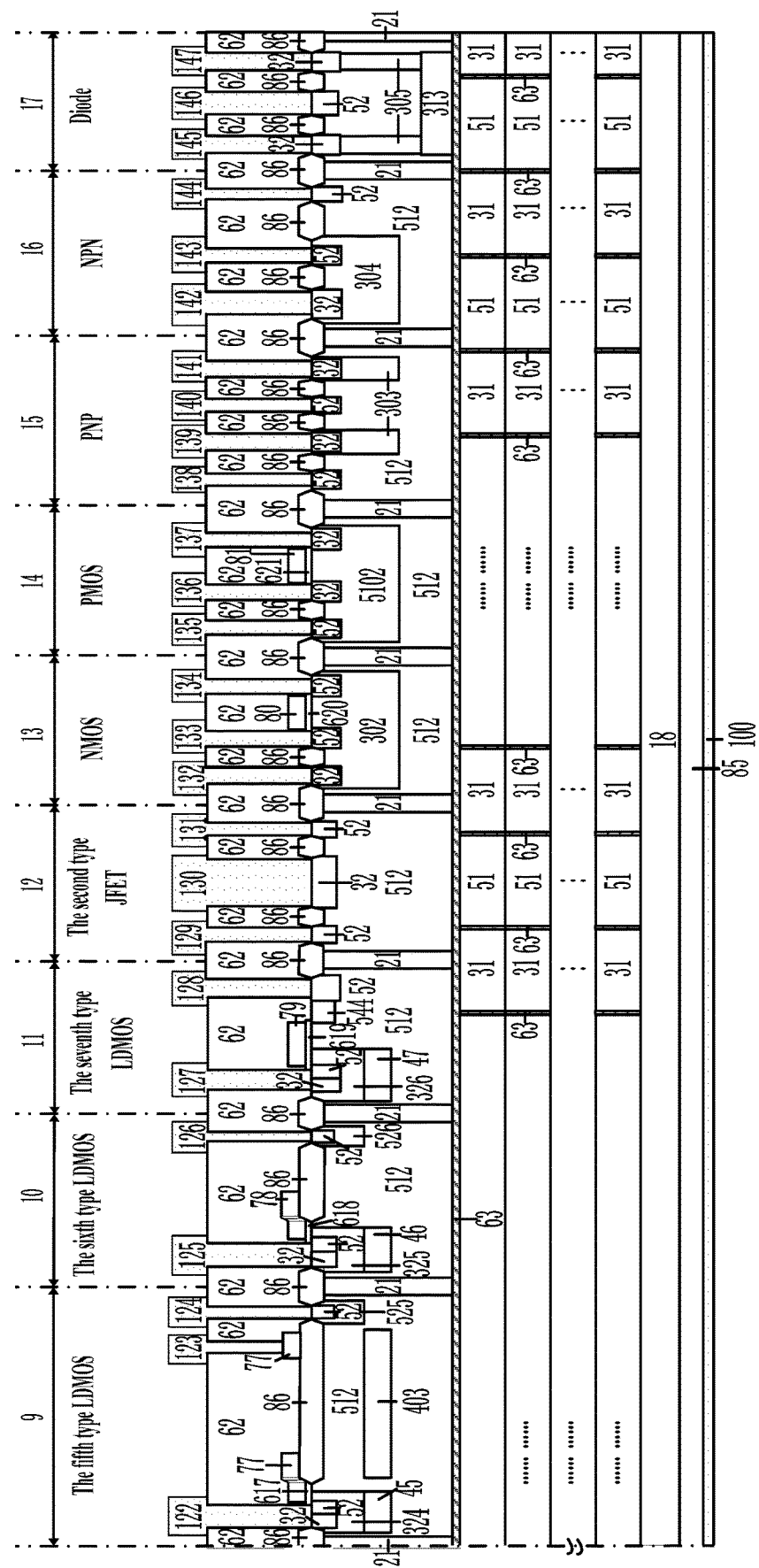
FIG. 6(a)-6(c) is a schematic diagram of the embodiment 6 of the invention.
Figure 6:
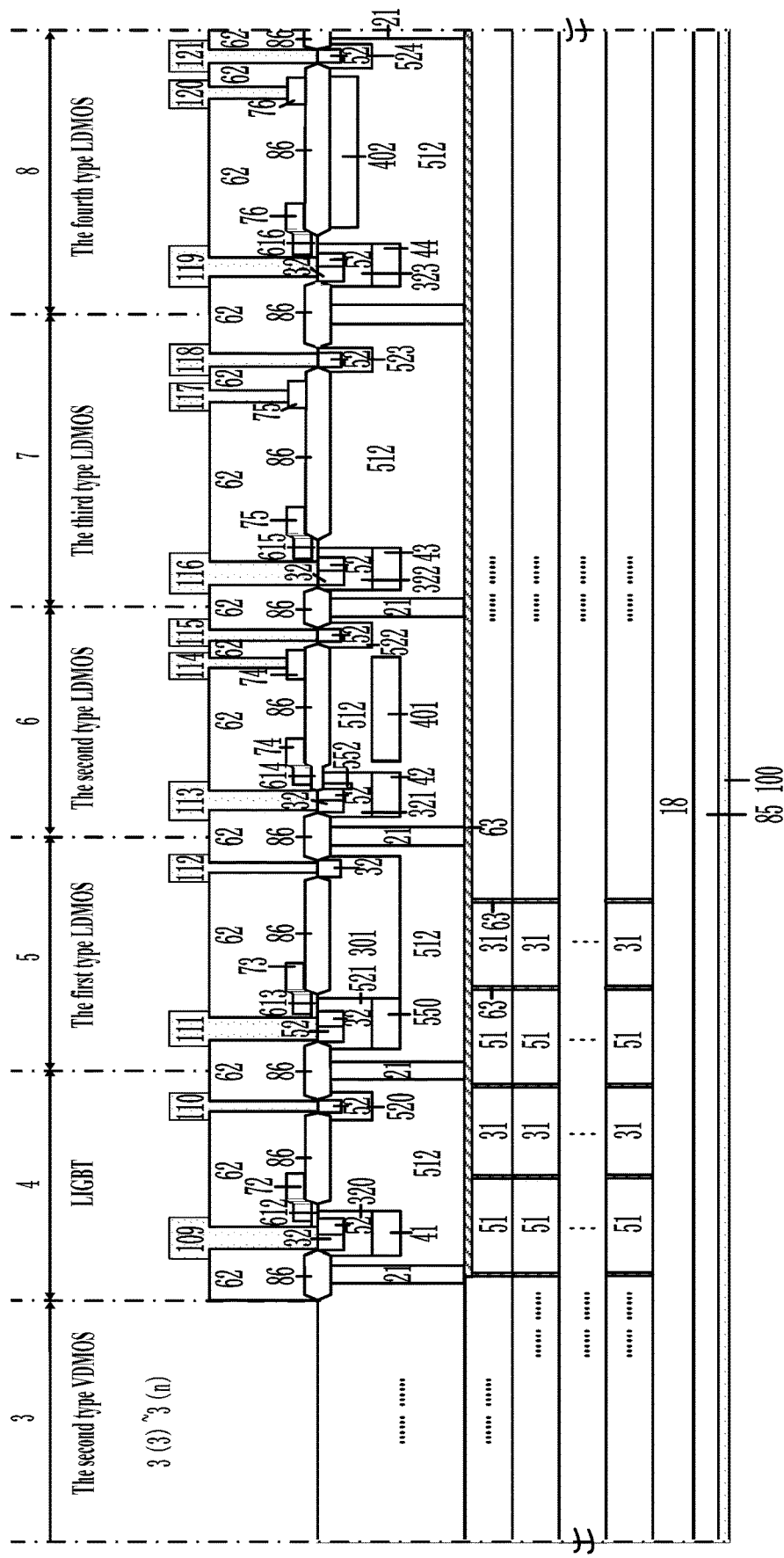
Figure 6:
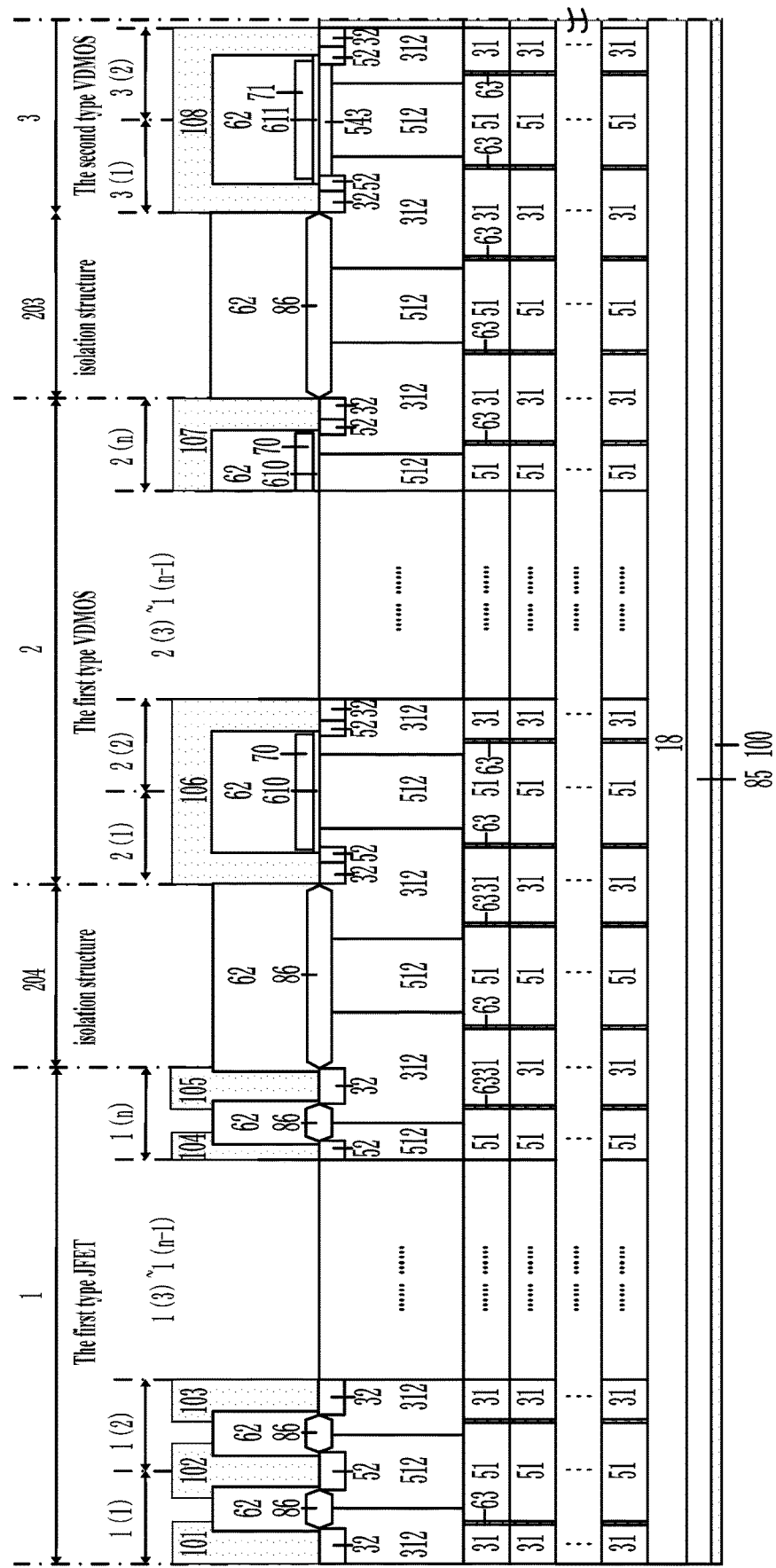

The difference between this embodiment and the embodiment 3 is that the device 4-17 on the right side of the second type VDMOS device 3 is separated from the second doped type epitaxial layer 311 by a dielectric layer. As shown in FIG. 6.

Embodiment 7

Figure 7:
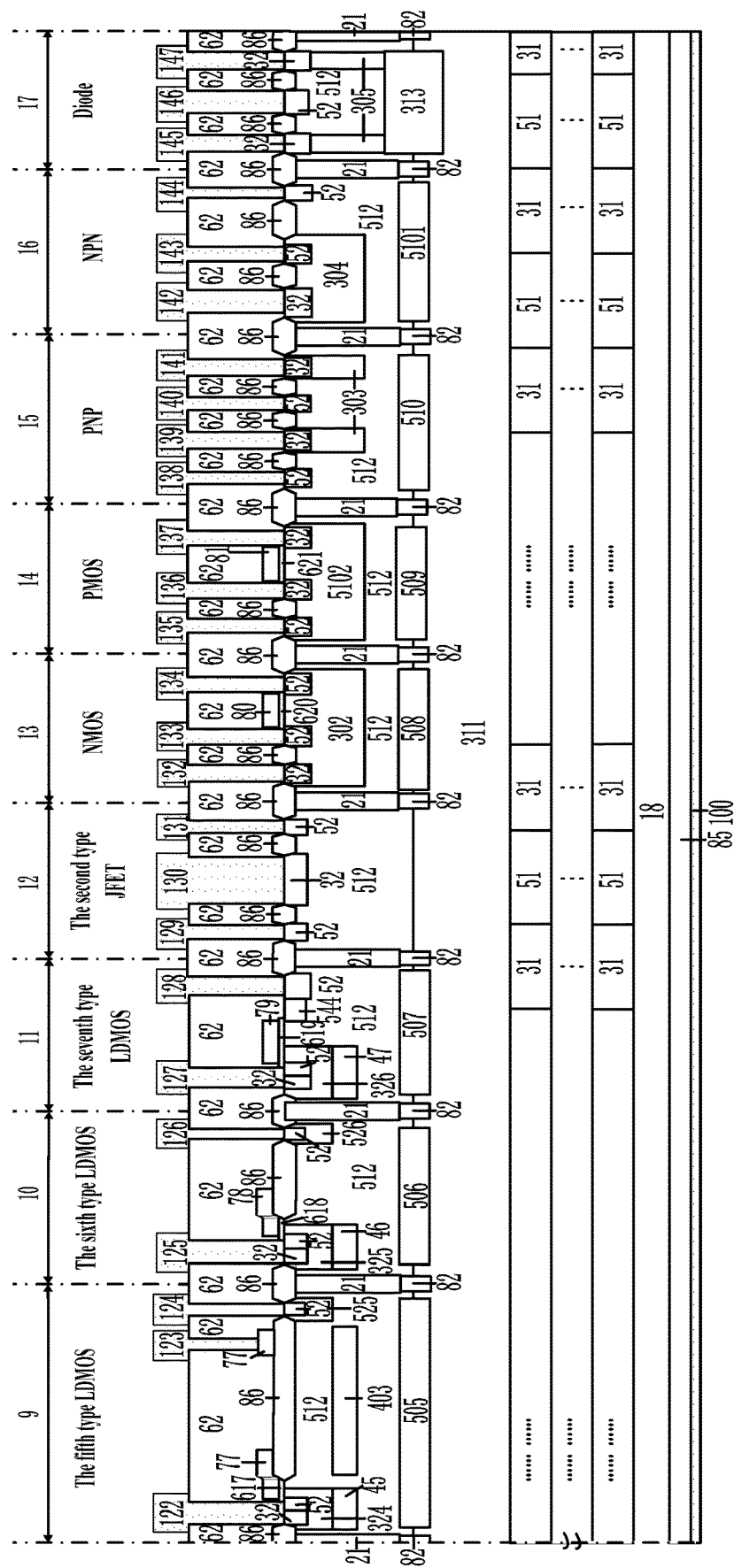
FIG. 7(a)-7(c) is a schematic diagram of the embodiment 7 of the invention.
Figure 7:
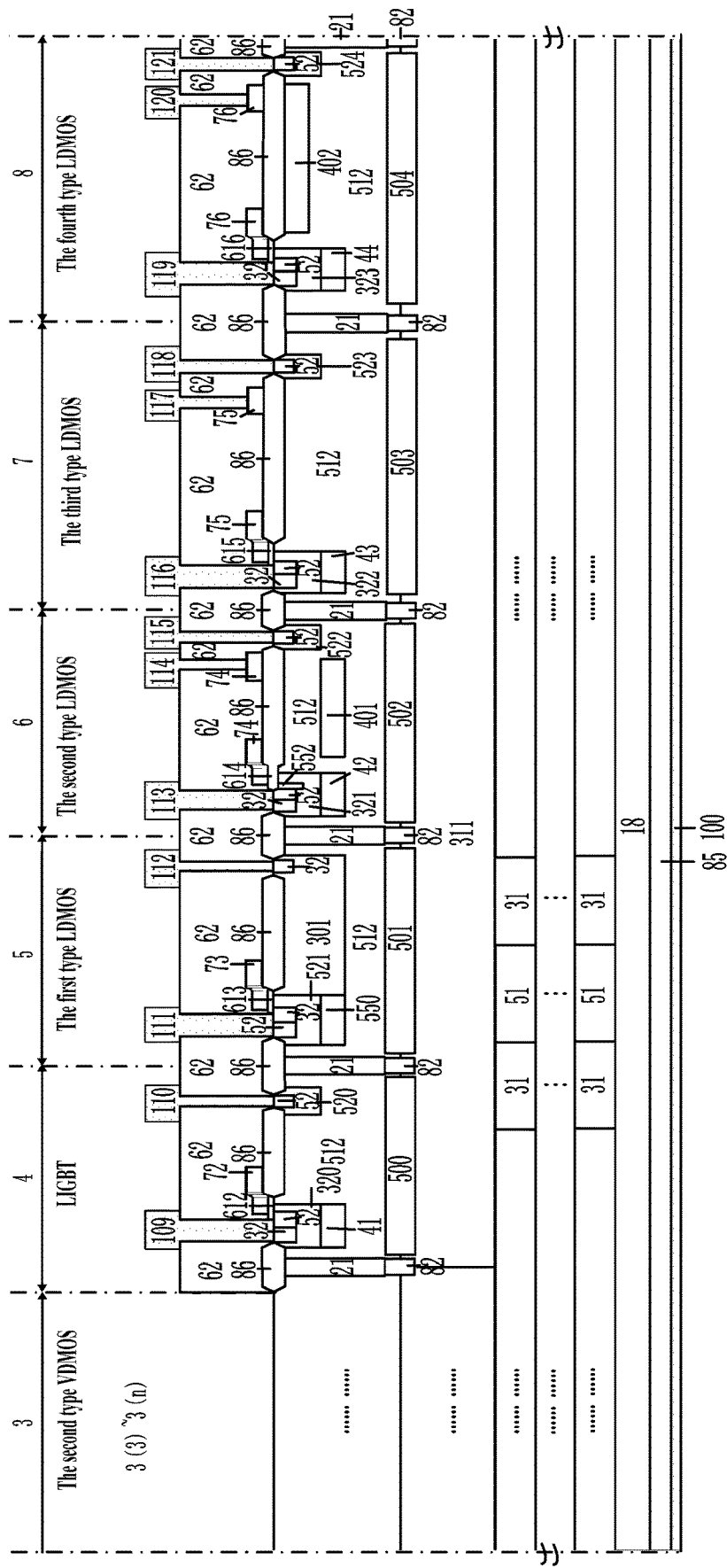
Figure 7:
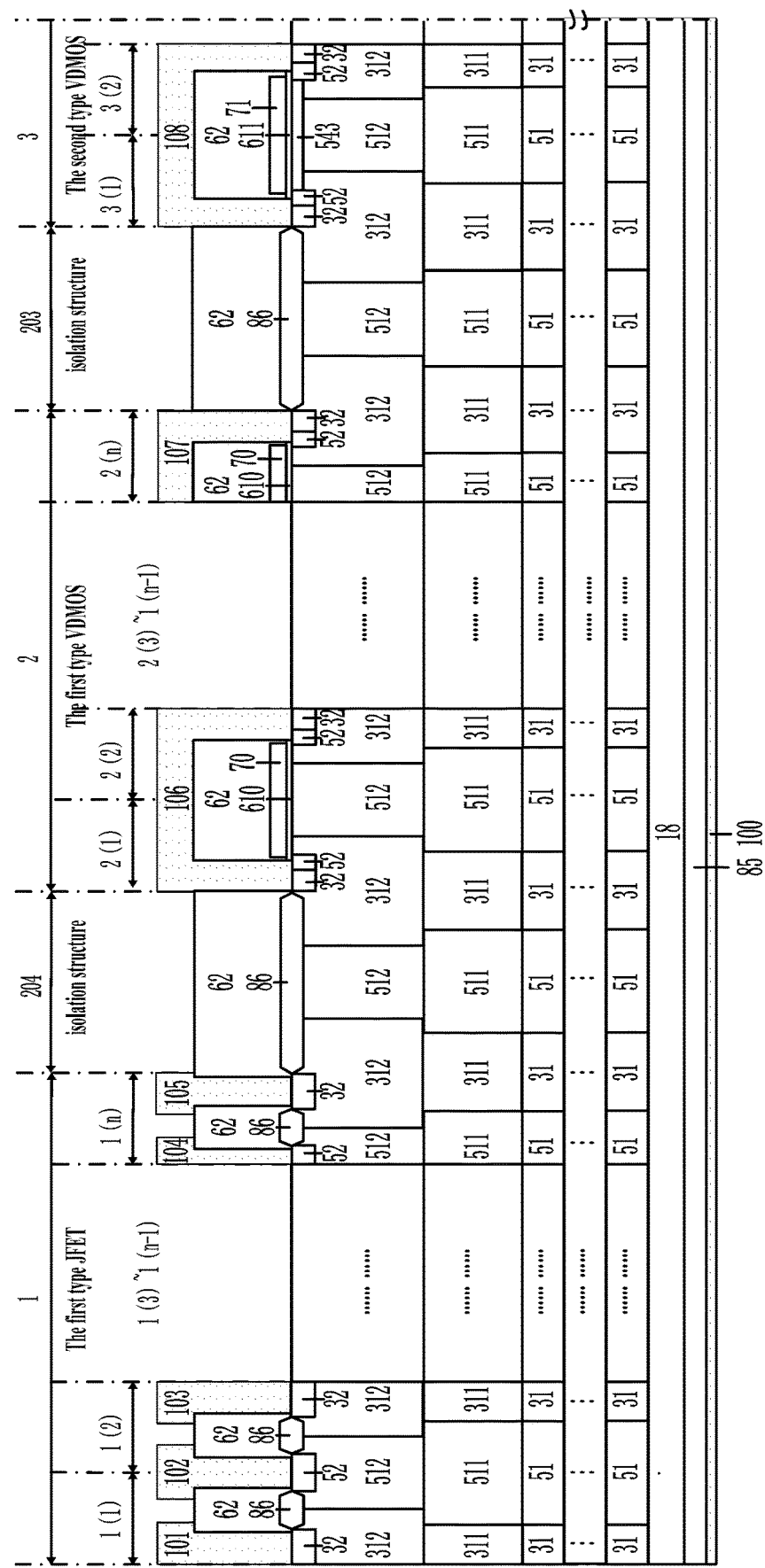

The difference between this embodiment and the embodiment 1 is that the isolation pillar comprises of the second doped type buried isolation layer and the isolation pillar 21. As shown in FIG. 7.

Embodiment 8

This embodiment provides a method for manufacturing the BCD semiconductor device, as shown in FIG. 8A to FIG. 8Q, including the following steps:

Step 1: on the first doped type substrate 85, the first doped type epitaxial layer 512 is grown by epitaxy, the resistivity of the first doped type substrate 85 is 0.0001~0.01 ohm·cm, and the resistivity of the first doped type epitaxial layer 512 is 1~15 ohm·cm. As shown in FIG. 8A.

Step 2: on the upper of the first doped epitaxial layer 512, the first doped type pillar 51 is grown by epitaxy, and the resistivity of the first doped type pillar 51 is 1~15 ohm·cm. As shown in FIG. 8B.

Figure 8C:
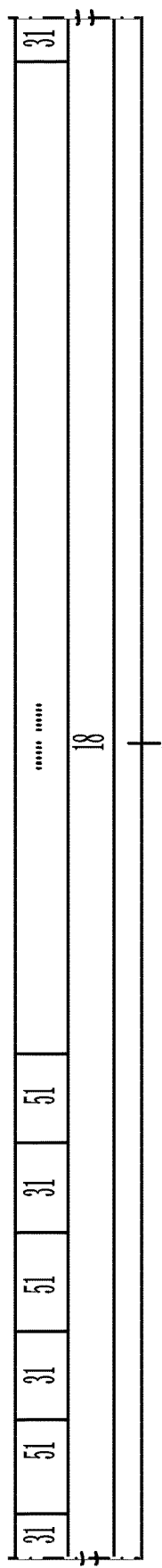
FIG. 8A(a)-FIG. 8Q(c) is a flow chart of a manufacturing method of BCD semiconductor device for the embodiment 8.
Figure 8C:
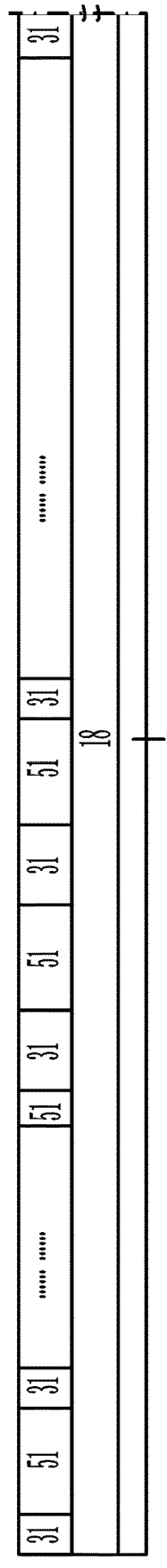

Step 3: injecting impurities to form the second doped type pillar 31, and the injection dose of impurity is 1e11 cm$^{-2}$~1e14 cm$^{-2}$. As shown in FIG. 8C.

Figure 8D:
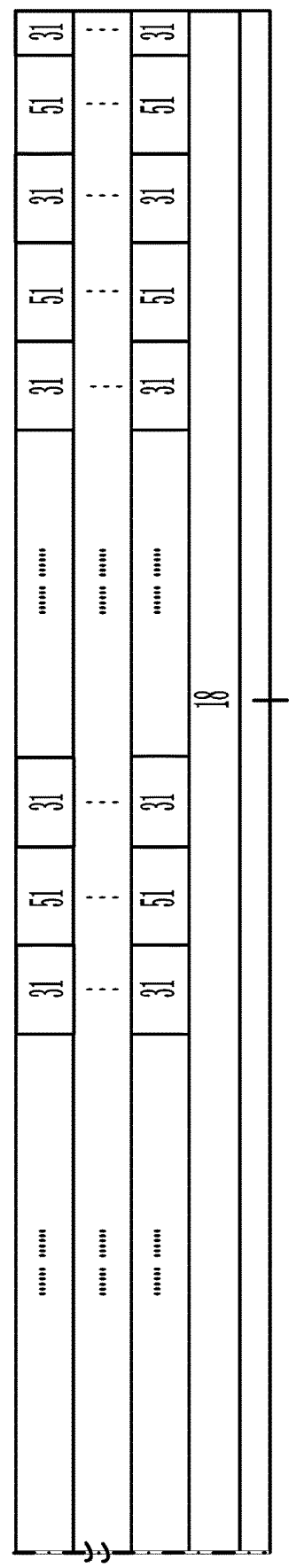
Figure 8D:
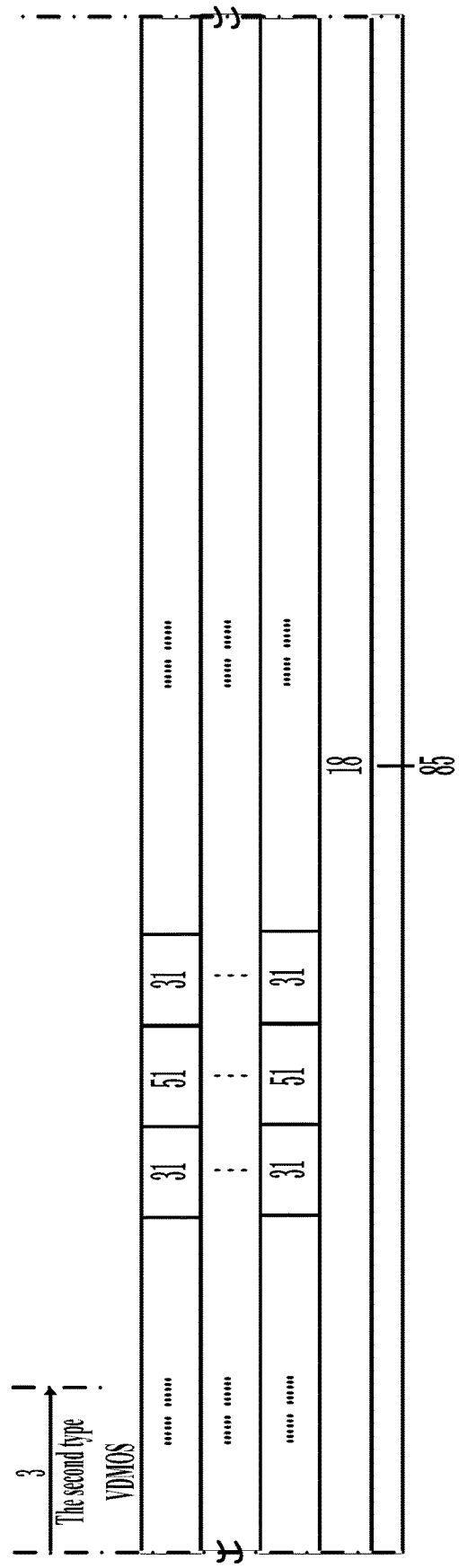
Figure 8D:
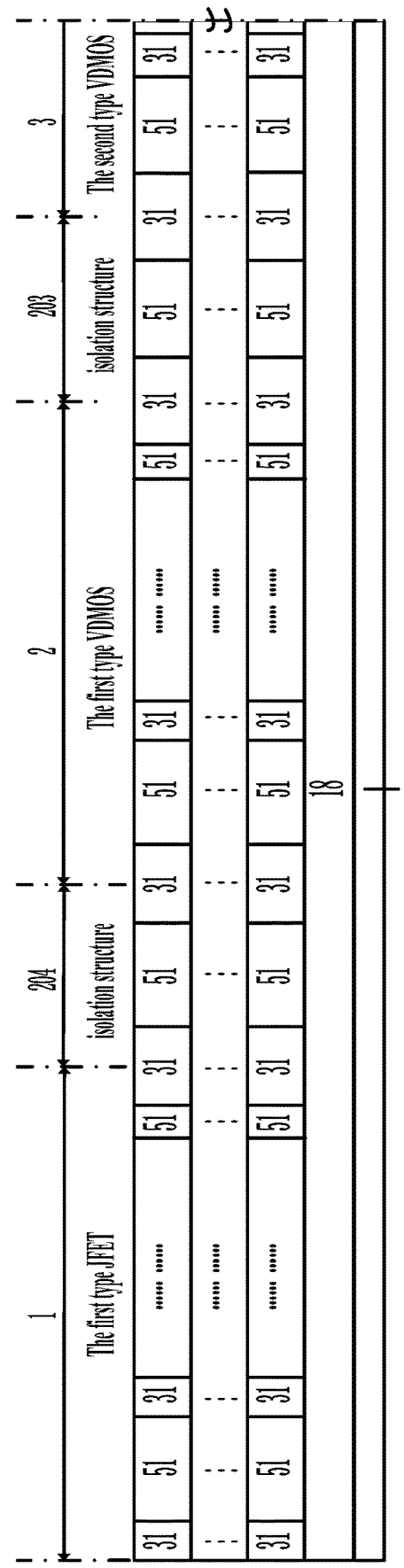
Figure 8:
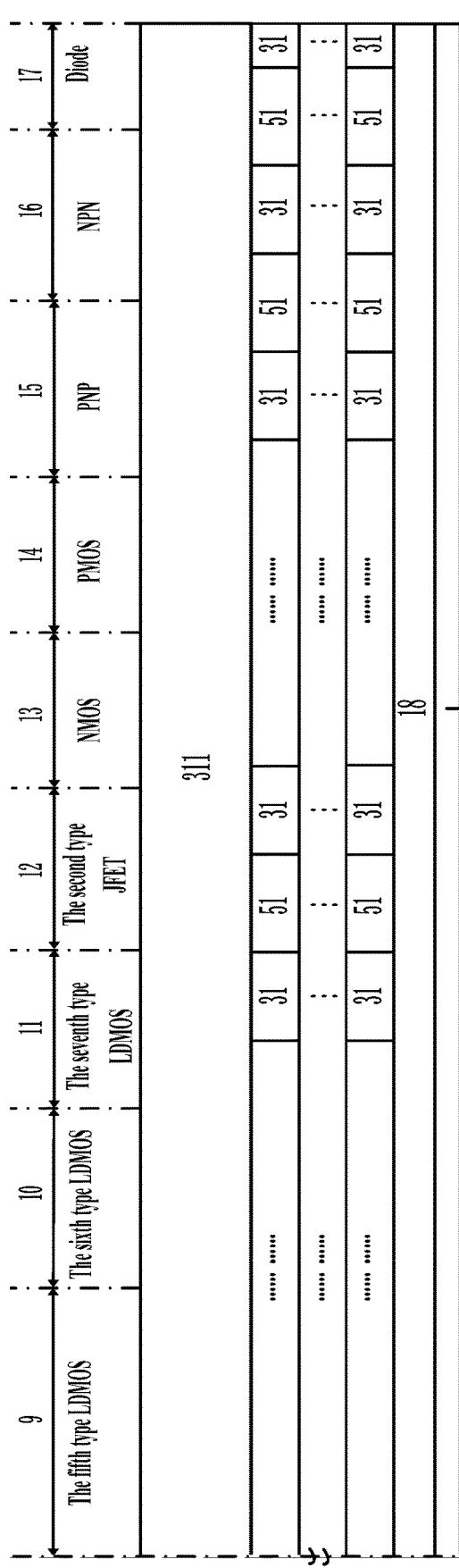
Figure 8:
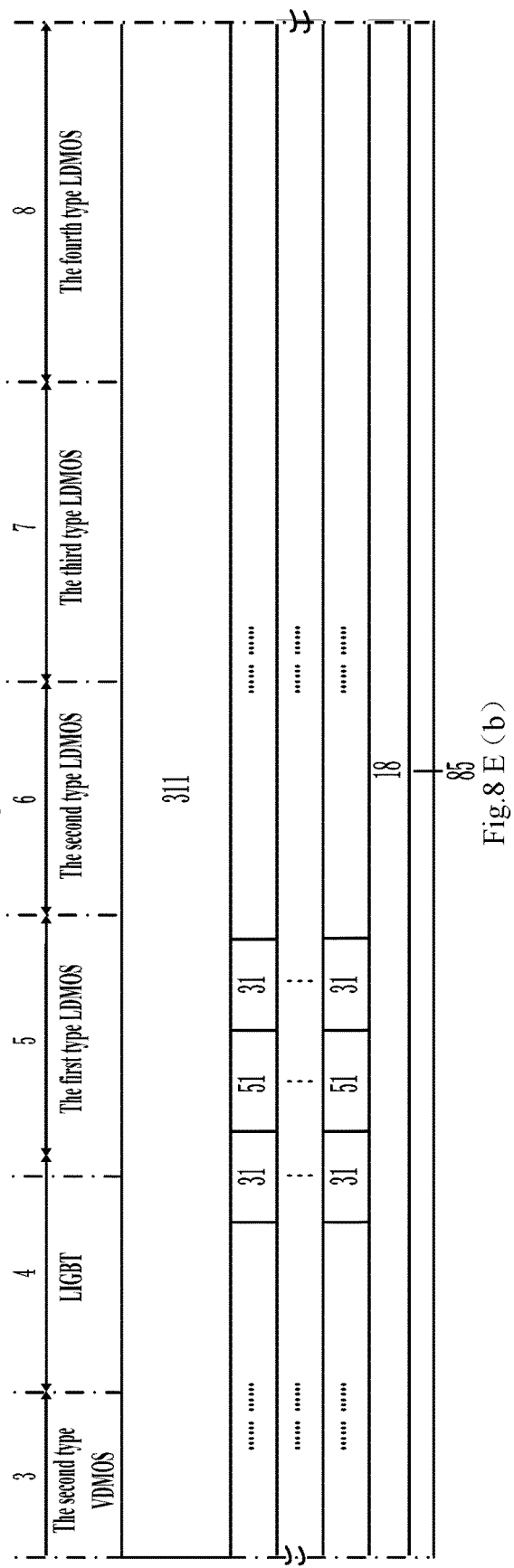
Figure 8:
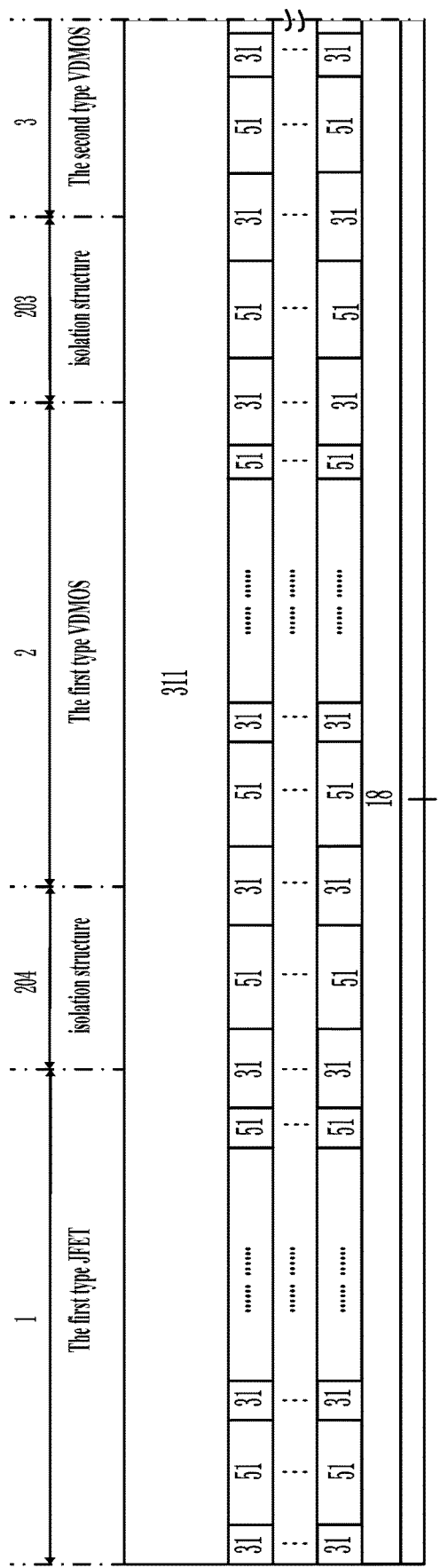
Figure 8:
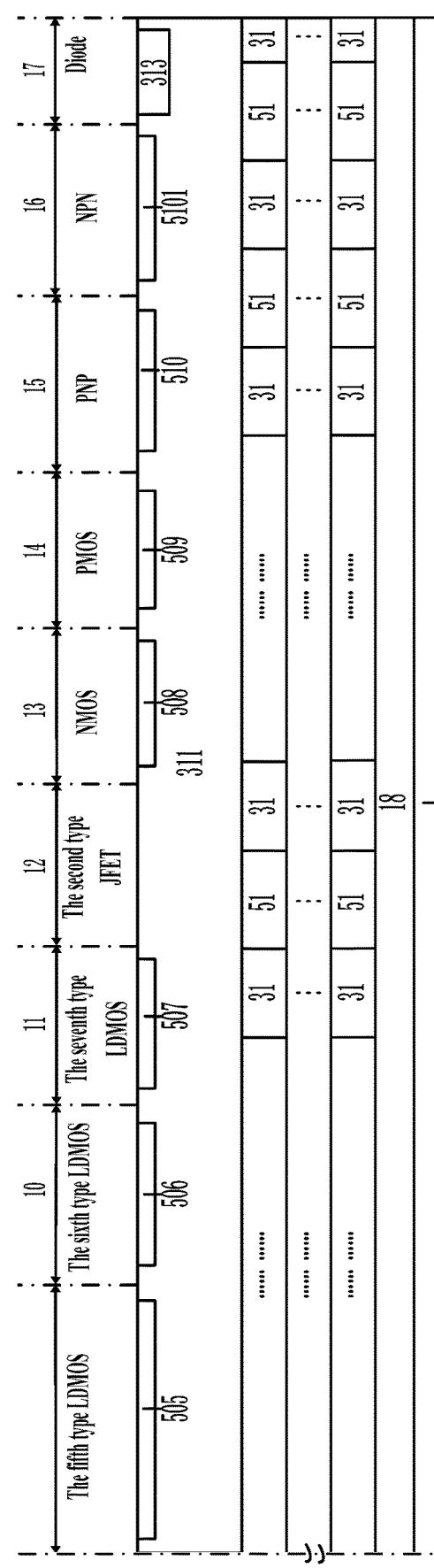
Figure 8:
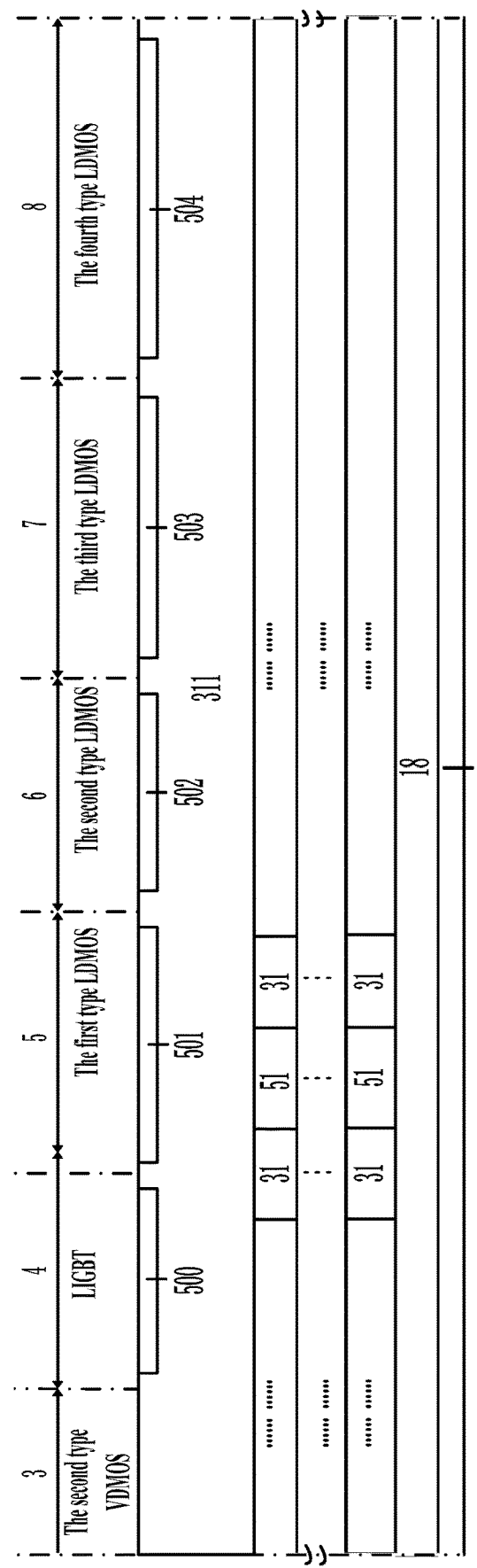
Figure 8:
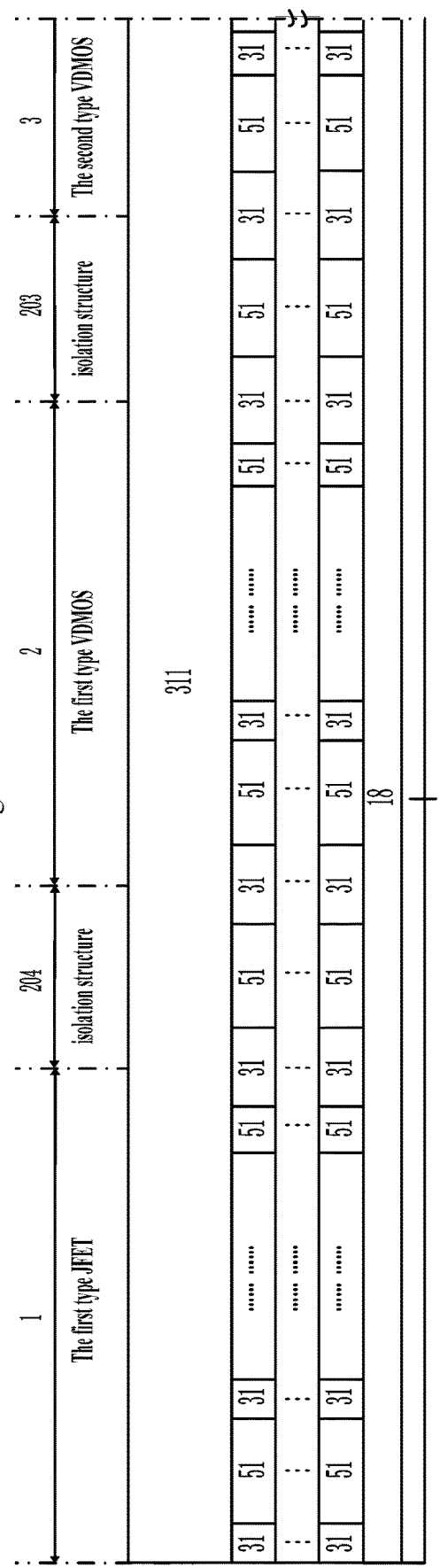
Figure 8:
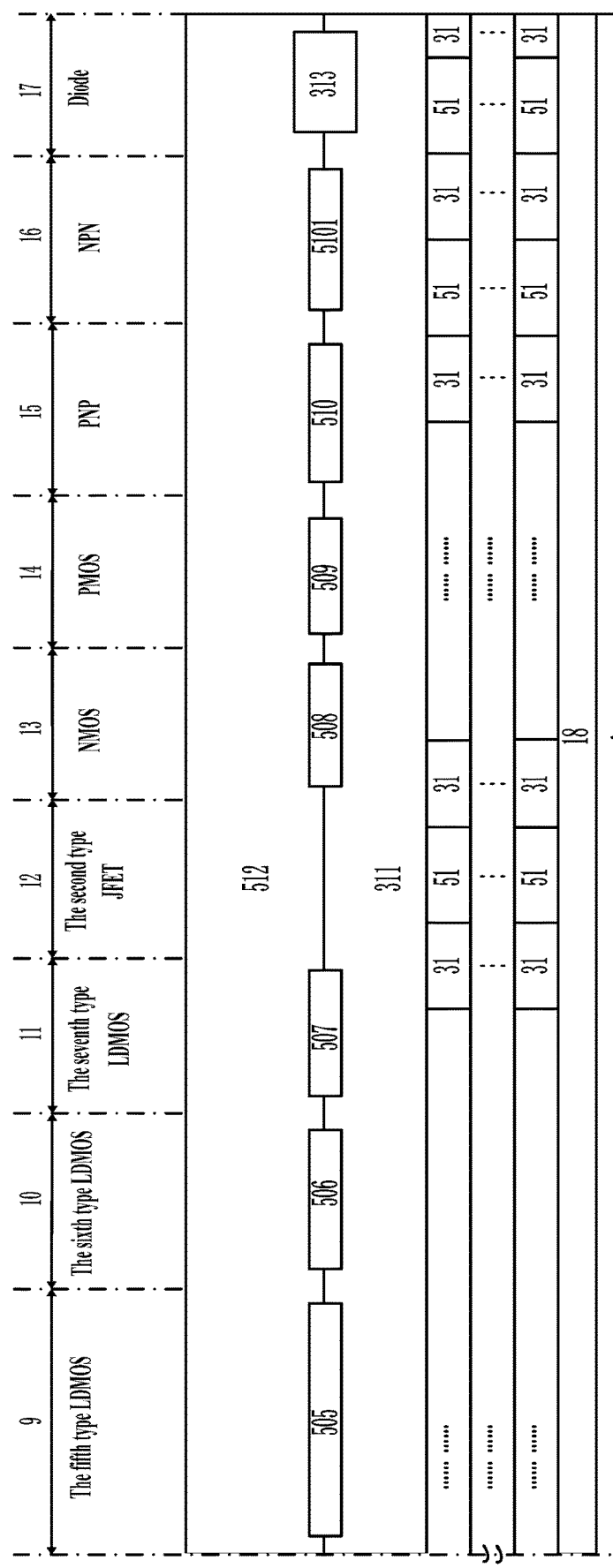

Step 4: repeat step 2 and step 3 until the ability sustaining voltage meets the design requirements. As shown in FIG. 8D.

Step 5: the second doped epitaxial layer 311 is grown on the drift area formed by periodic arrangement of the first doped type pillar 51 and the second doped type pillar 31. As shown in FIG. 8E.

Step 6: injecting impurities in the area of the second doped type epitaxial layer 311 to form the third doped type pillar 511, the area of the second doped type epitaxial layer 311 is necessary to form high voltage vertical device, including the first type of JFET device 1, the first type of VDMOS devices 2 and the second type of VDMOS devices 3; the rest of the region of the second doped type epitaxial layer 311 implant the impurities to form the buried layer which are the first doped type first buried layer 501 to the first doped type 511 buried layer. Injecting impurity to form the second doping type of third buried layer 313 of the diodes 17, the requirement for injection impurity of buried layer is heavy impurity ion to prevent the diffusion. As shown in FIG. 8F.

Figure 8G:
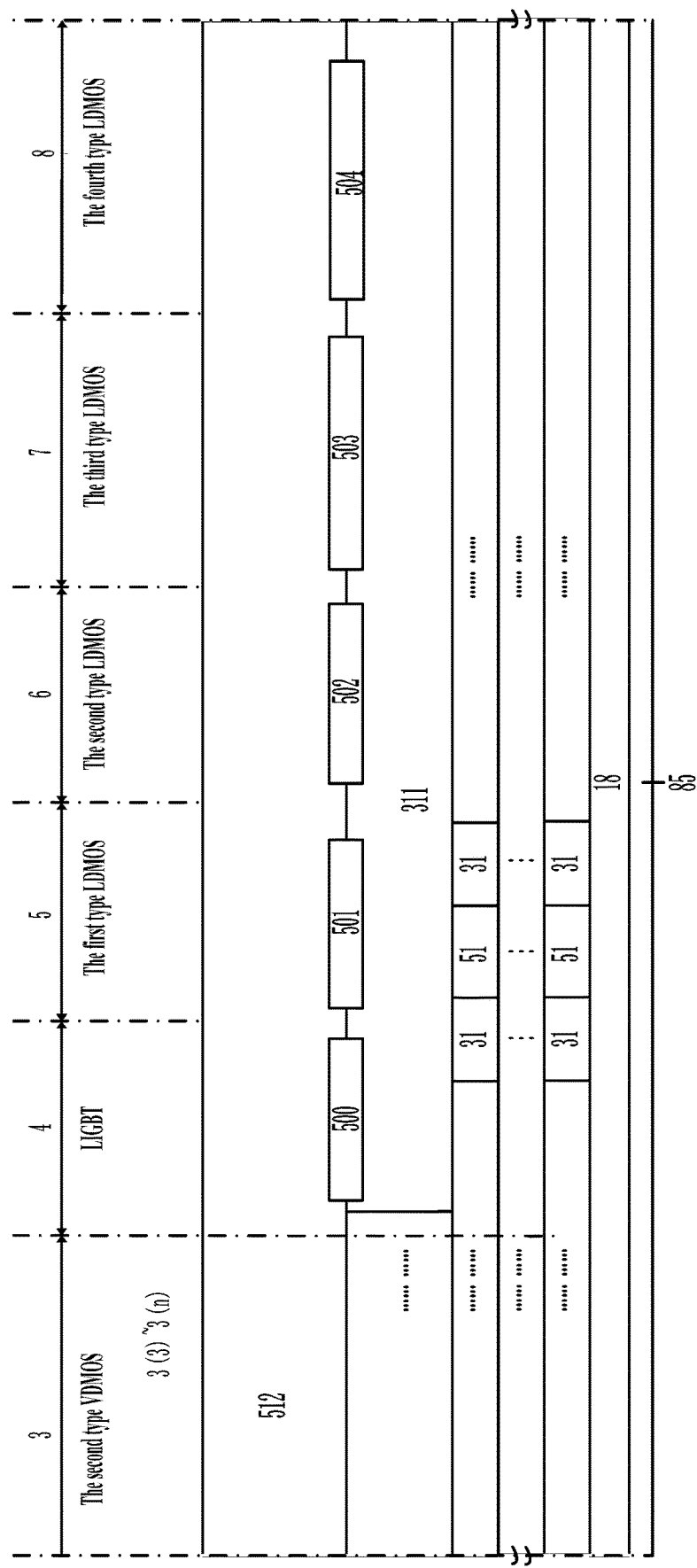
Figure 8:
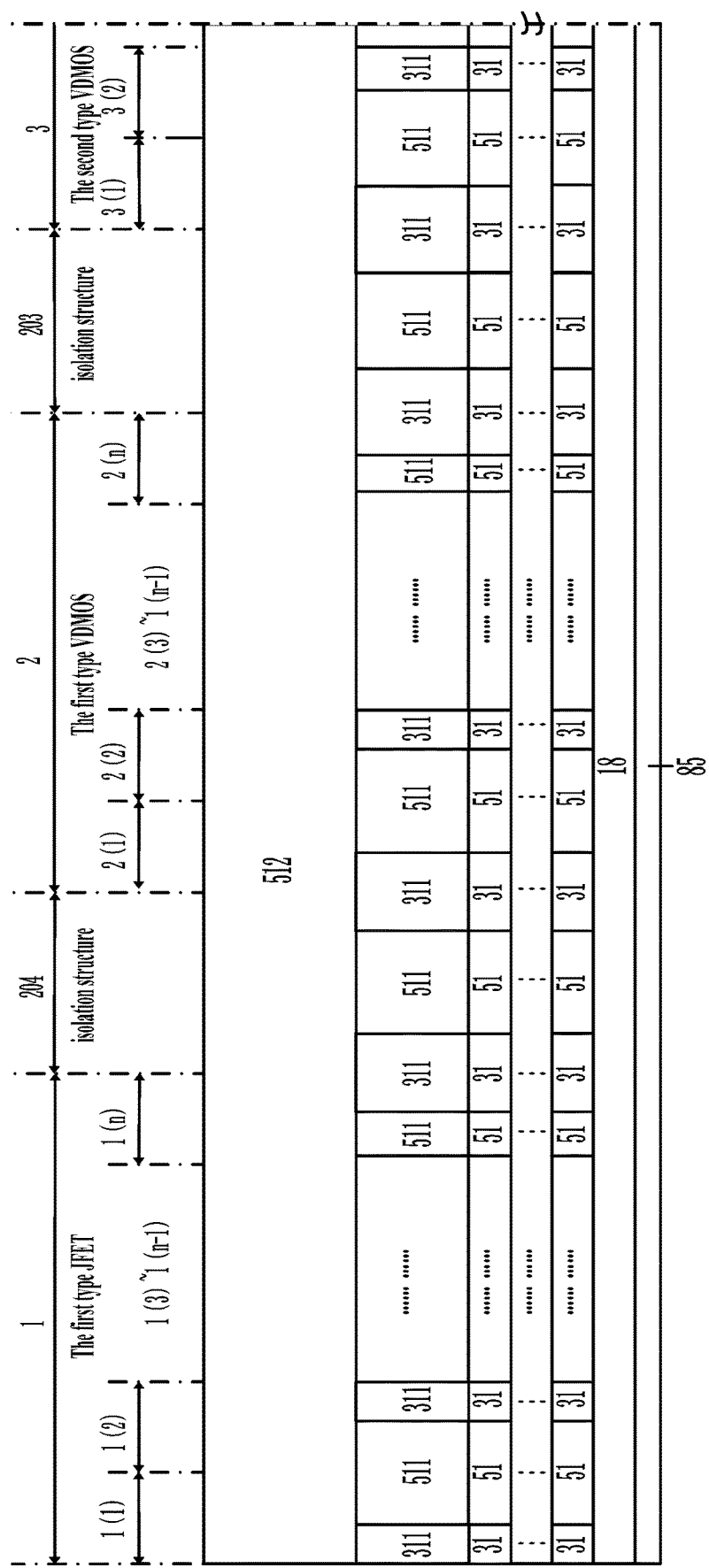
Figure 8:
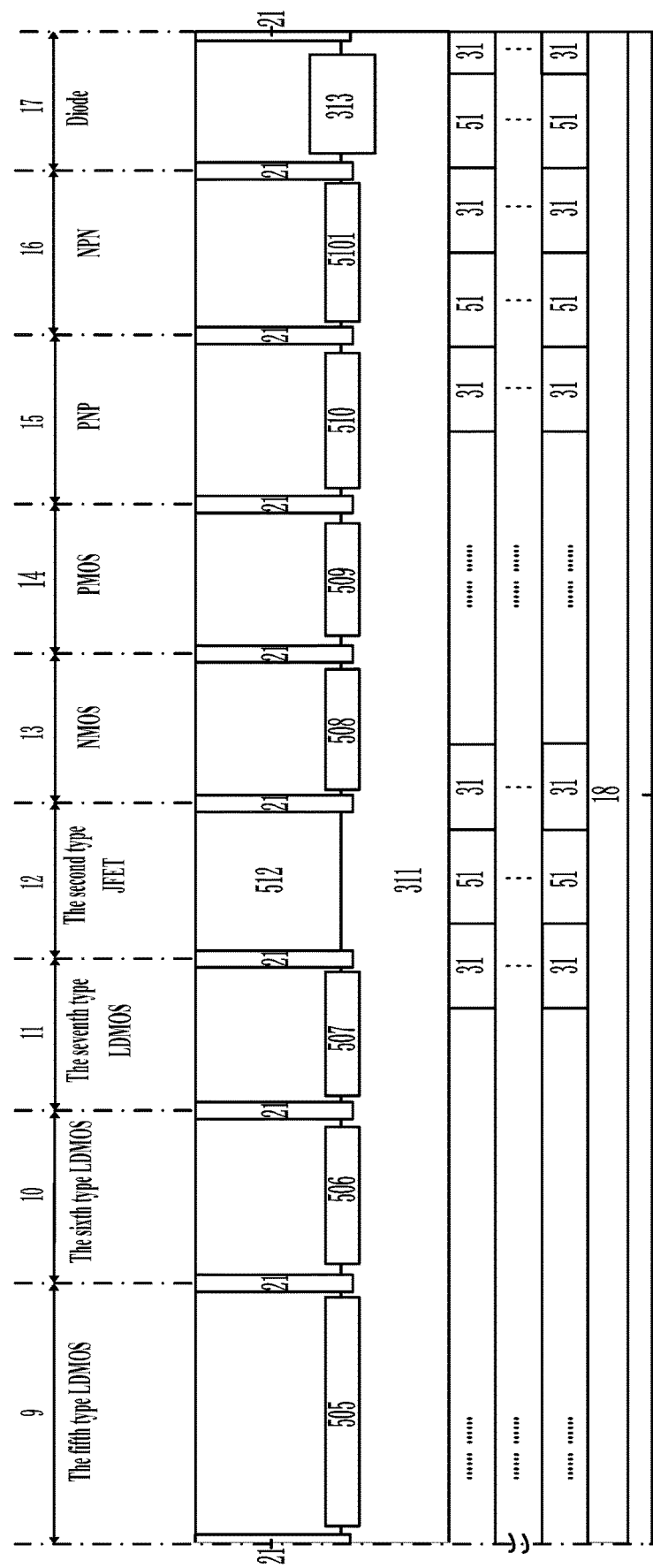
Figure 8:
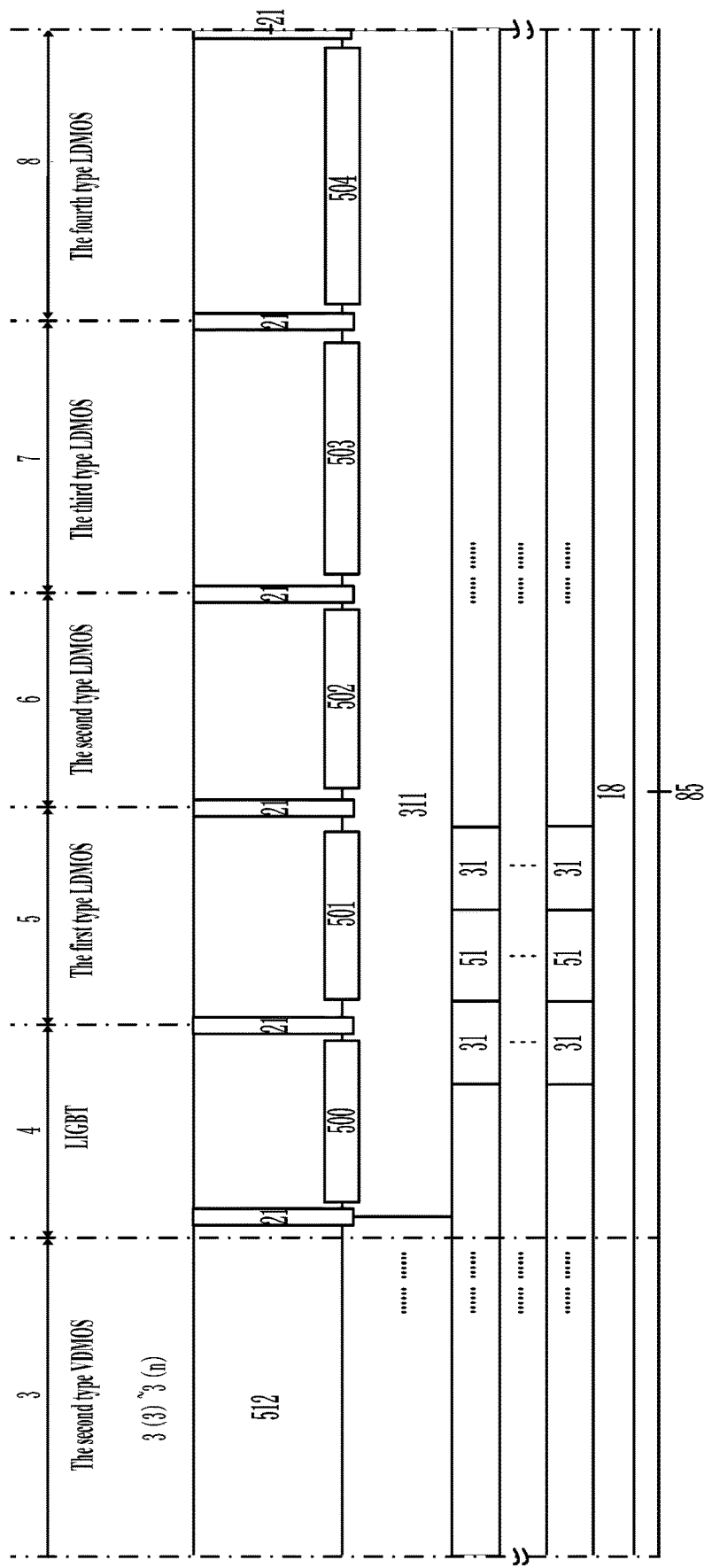
Figure 8:
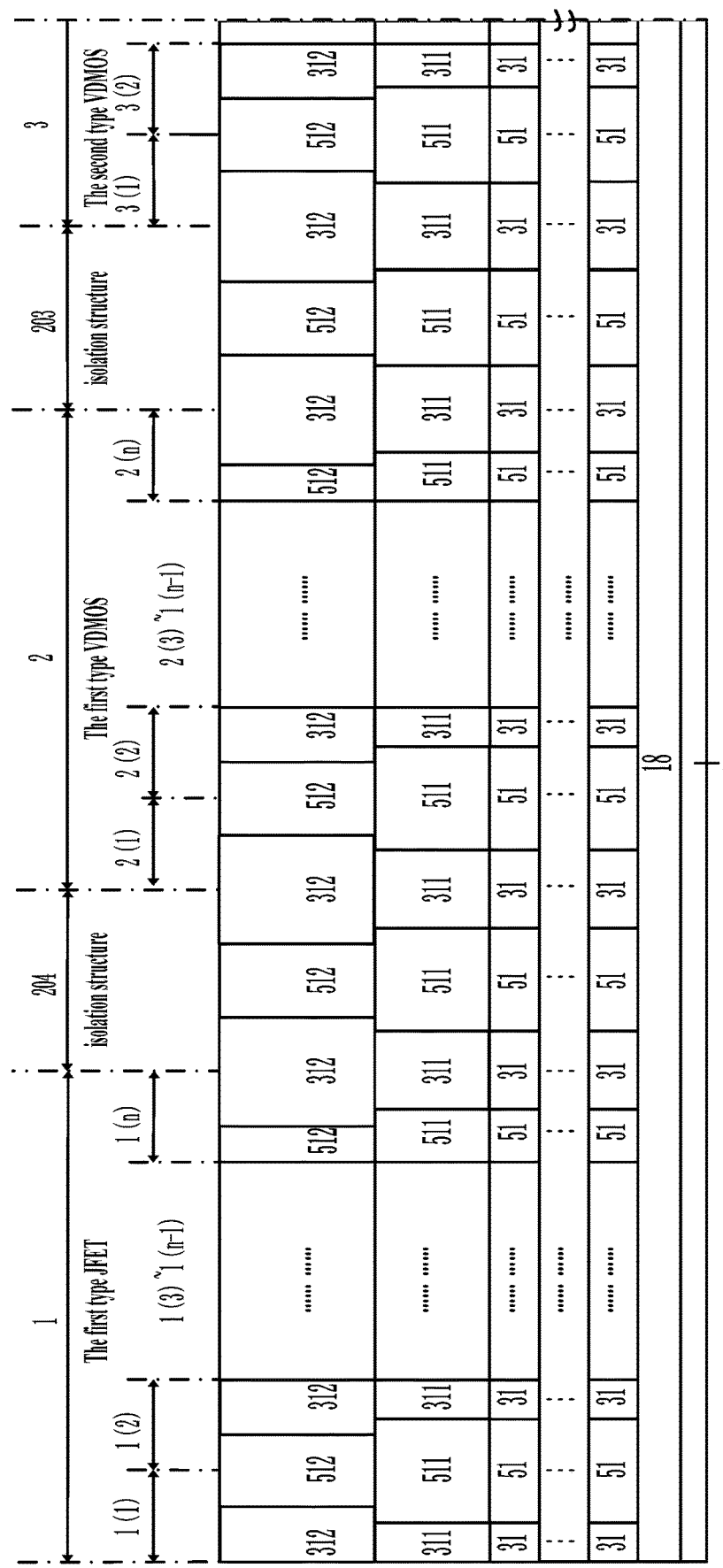
Figure 8:
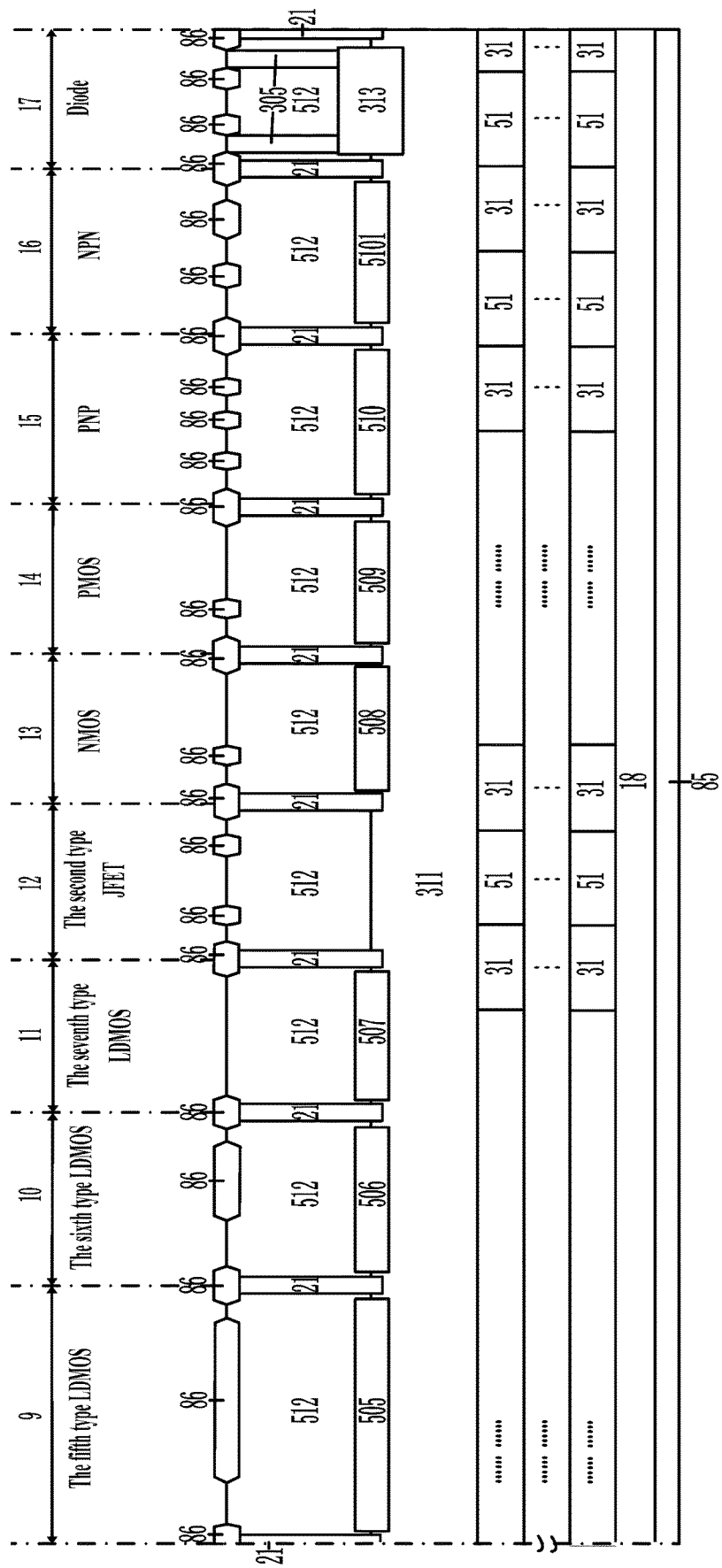
Figure 8:
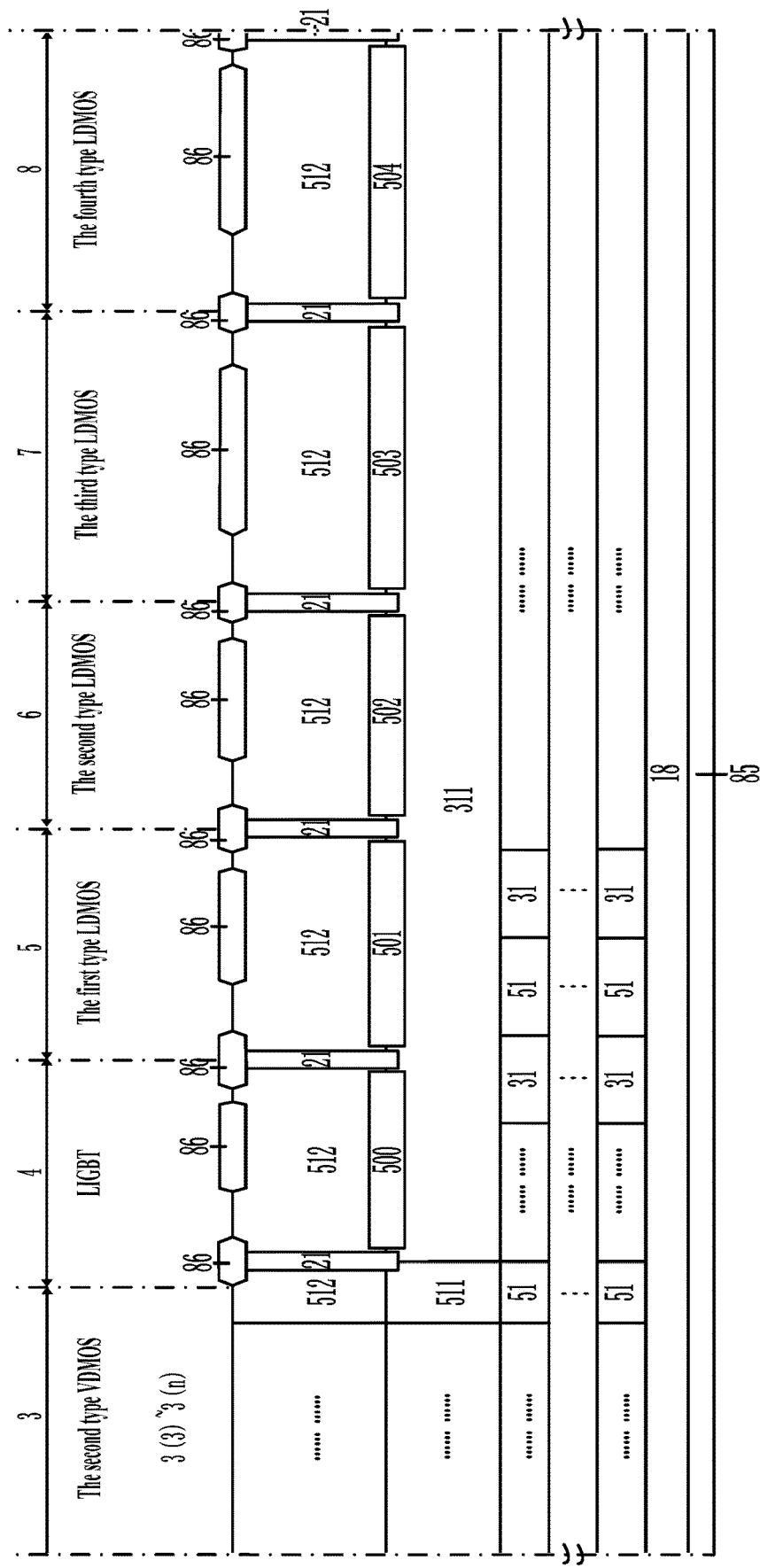
Figure 8:
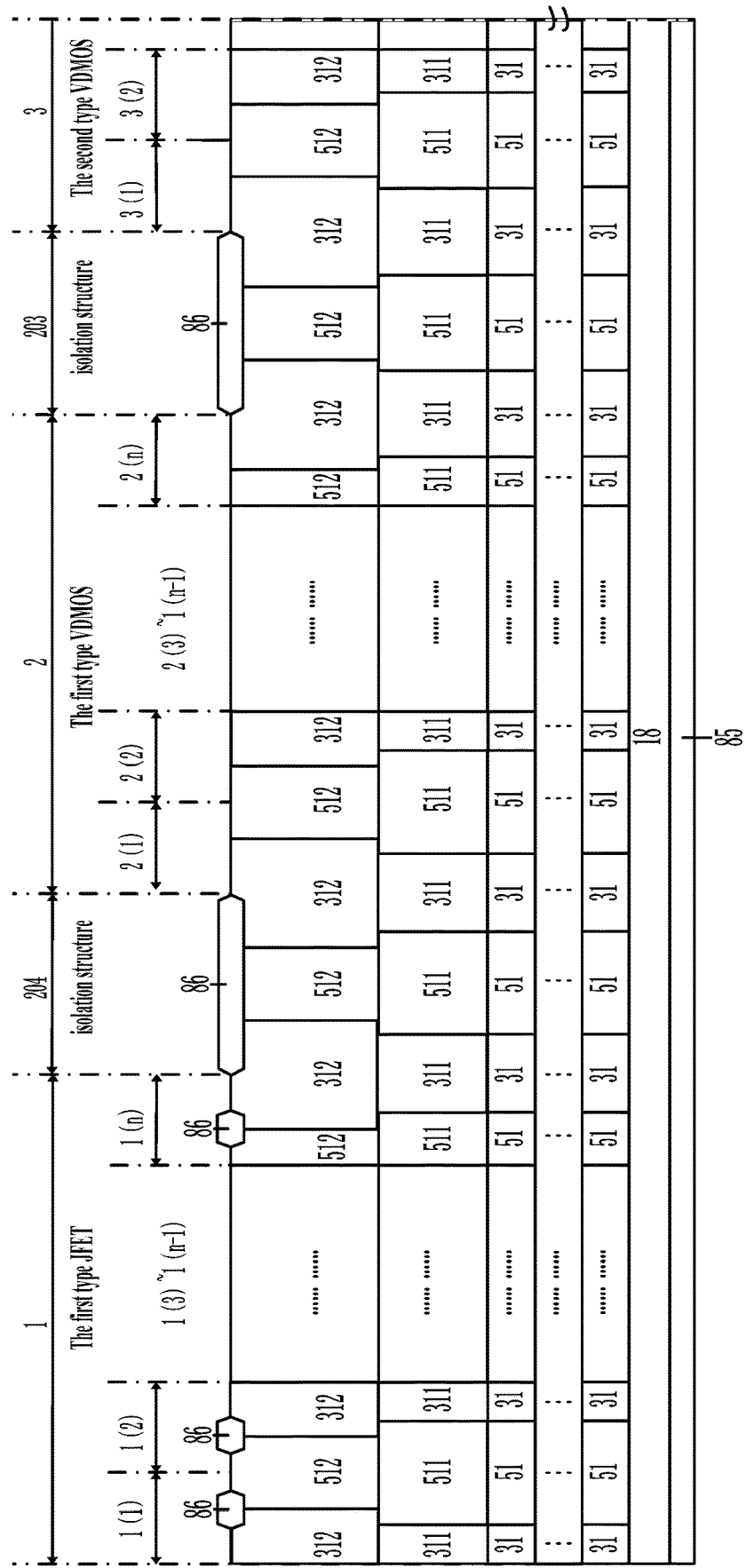
Figure 8:
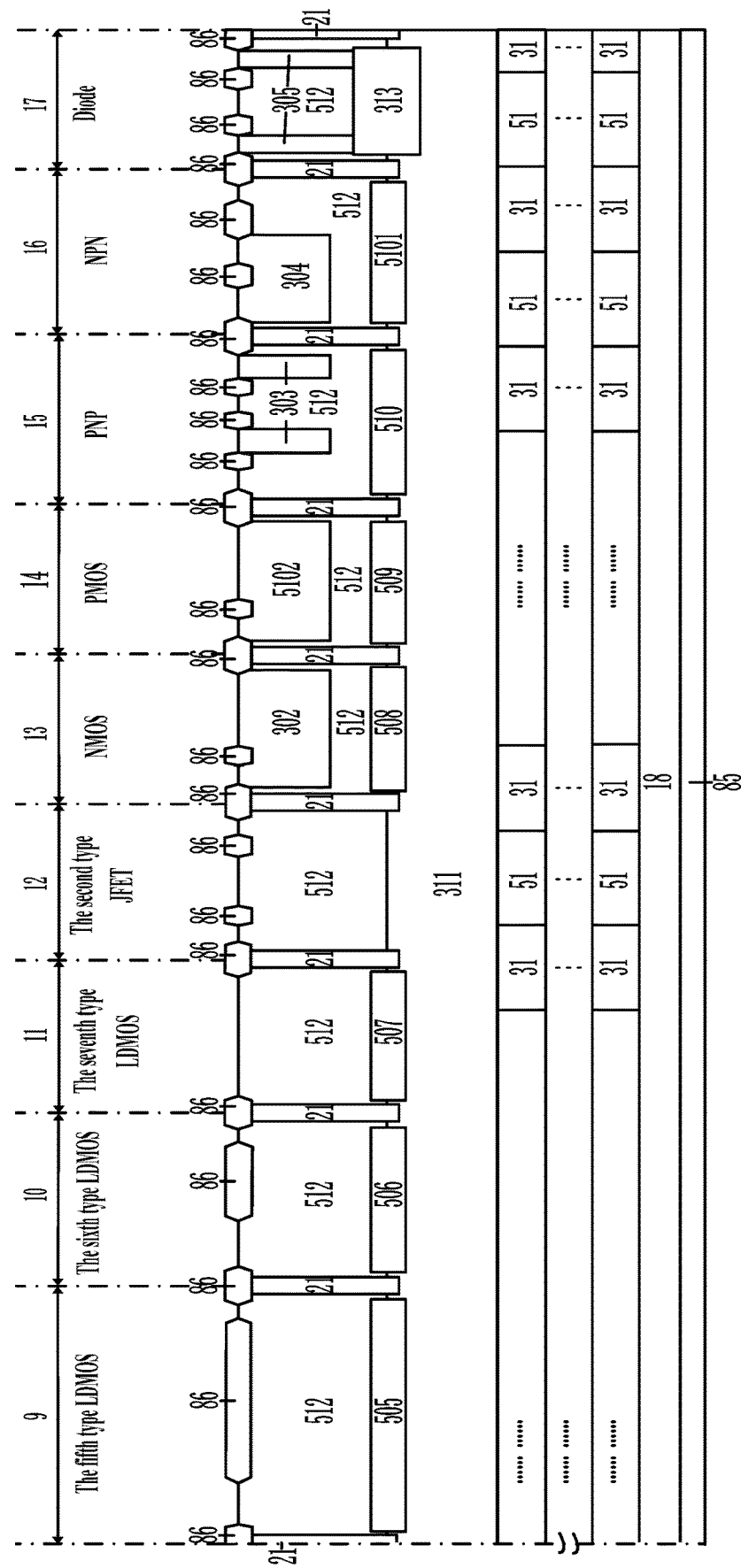
Figure 8:
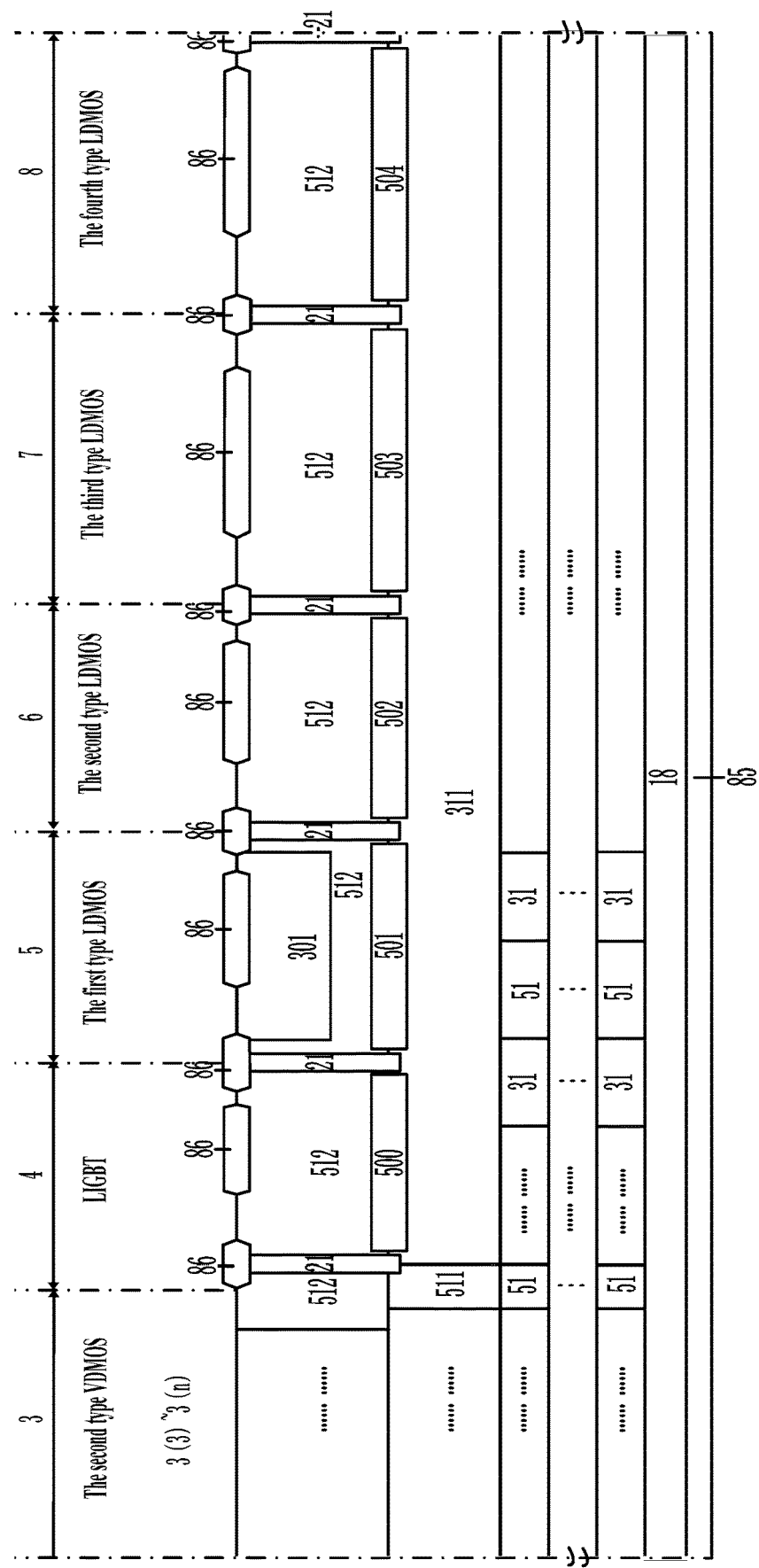

Step 7: growing epitaxial layer to form the first doped type epitaxial layer 512 at the upper surface in which the second doped type epitaxial layer 311 and the third doped type pillar 511, the first doped type first buried layer to the eleventh buried layer and the second doped type third buried layer. As shown in FIG. 8G.

Step 8: injecting impurities to form the isolation pillar 21 and the second doped type body region 312. The isolation pillar 21 is located between the right of second type of VDMOS devices 3 and the lateral device 4-17. The second doped type body region 312 belong to the high-voltage vertical devices includes the the first type of the JFET devices 1, the first type of VDMOS devices 2 and the second type of VDMOS devices 3; the lateral device 4-17 includes the LIGBT device 4, the first type of LDMOS device 5, the second type of LDMOS device 6, the third type of LDMOS device 7, the fourth type of LDMOS device 8, the fifth type of LDMOS device 9, the sixth type of LDMOS device 10 and the seventh type of LDMOS device 11, the second type of JFET device 12, the low-voltage NMOS device 13, the low-voltage PMOS device 14, the low-voltage PNP device 15, the low-voltage NPN device 16 and the diode 17. As shown in FIG. 8H.

Step 9: driving in and thermal oxidation to form the field oxide layer 86, and open the window of source area by etching. As shown in FIG. 8I.

Figure 8J:
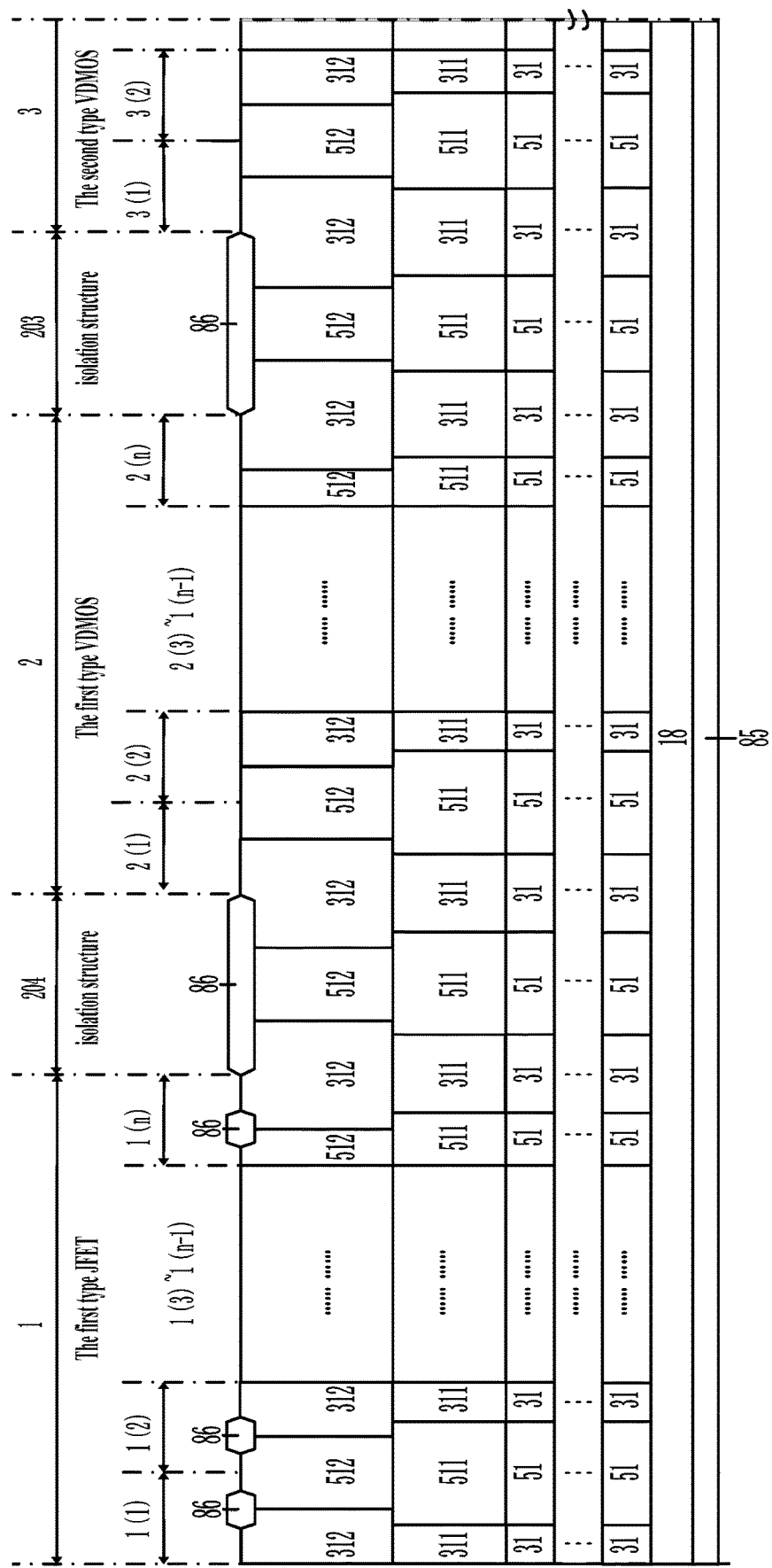
Figure 8:
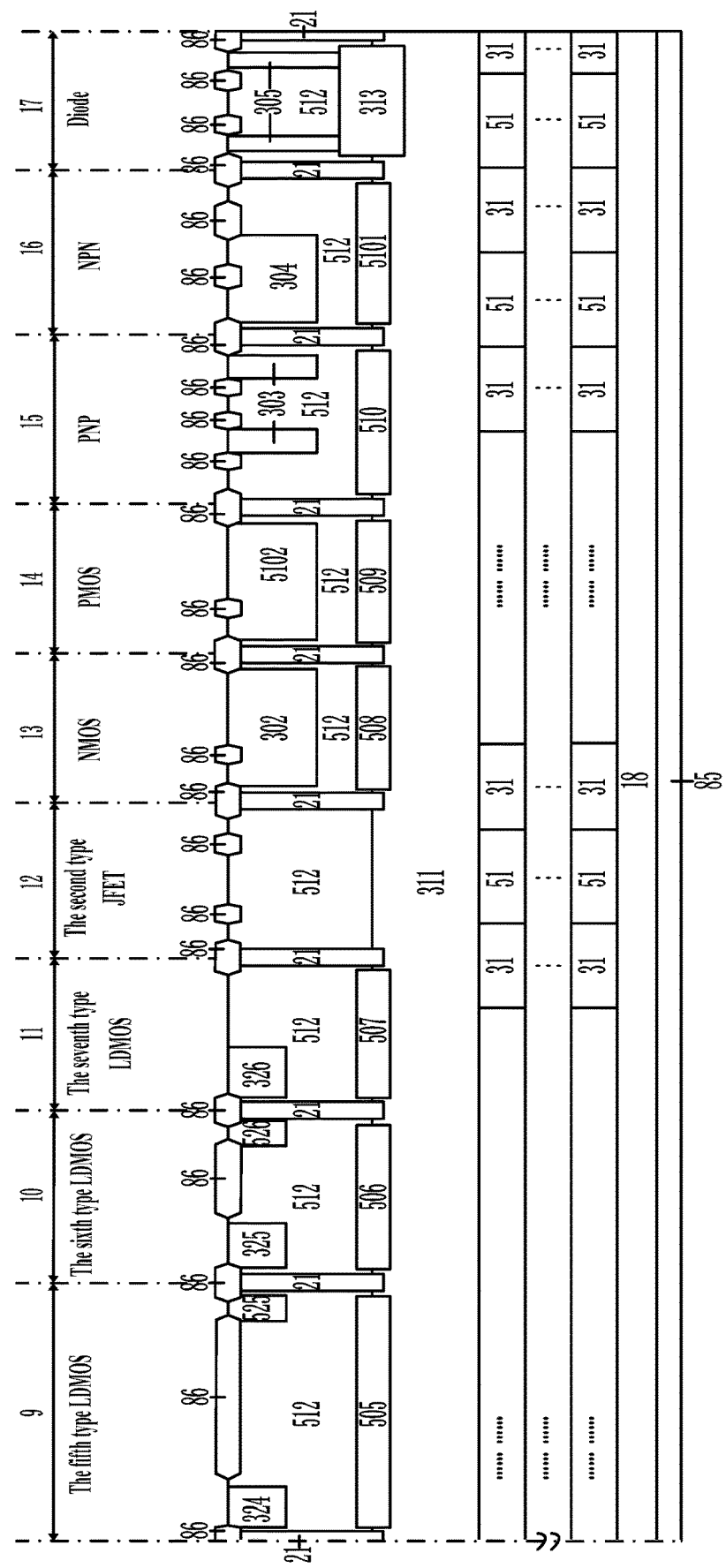
Figure 8:
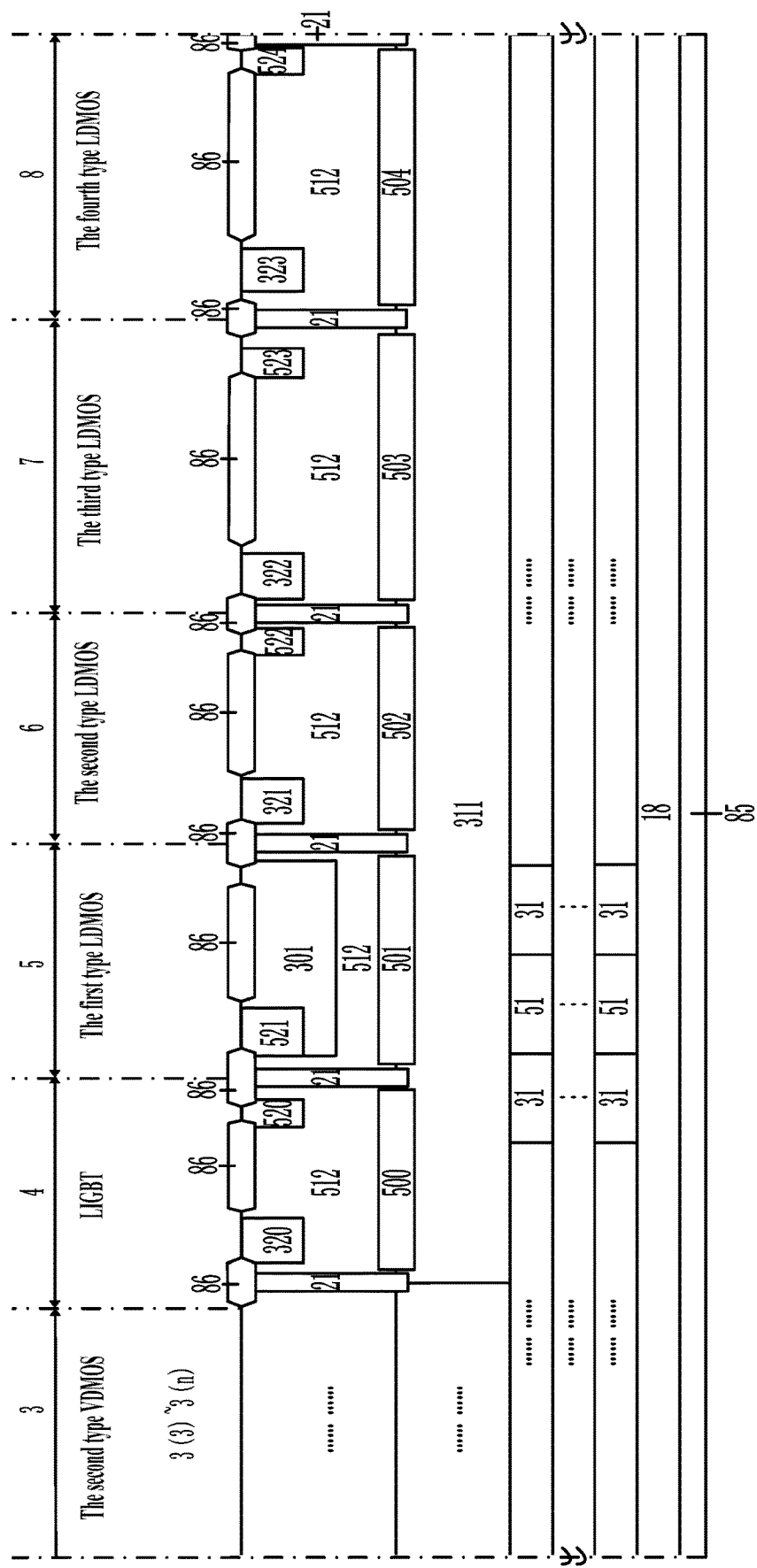
Figure 8:
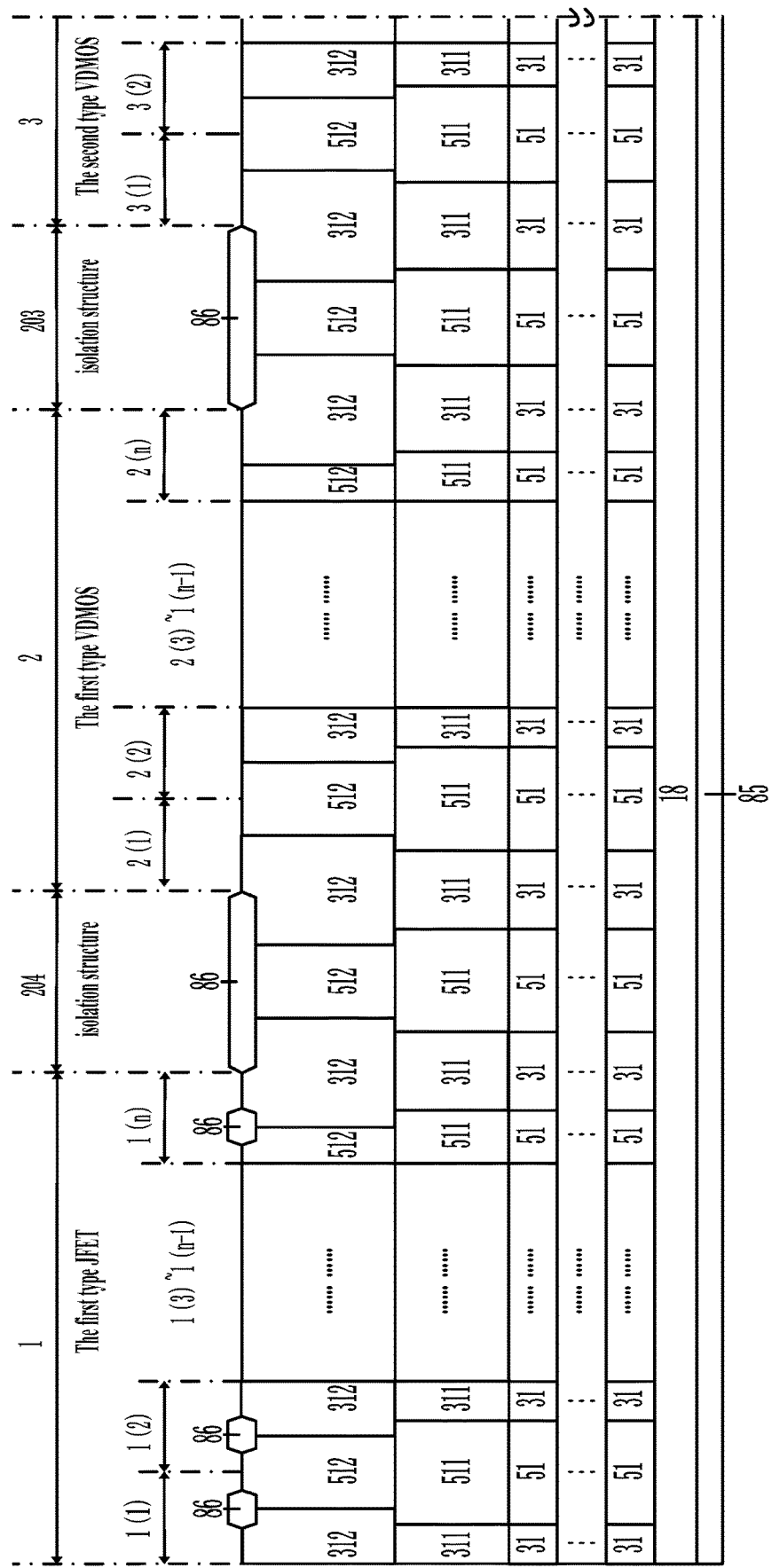
Figure 8:
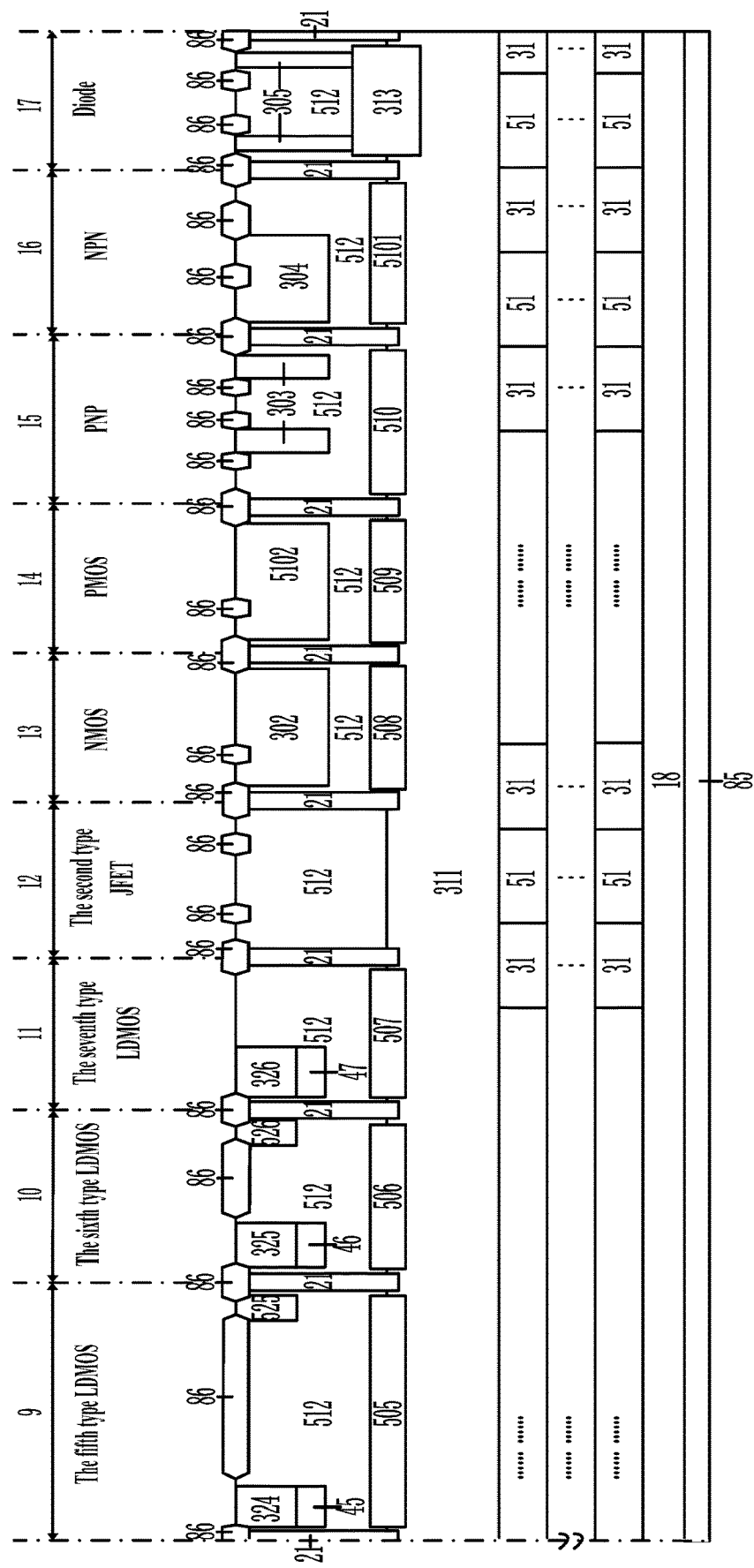
Figure 8:
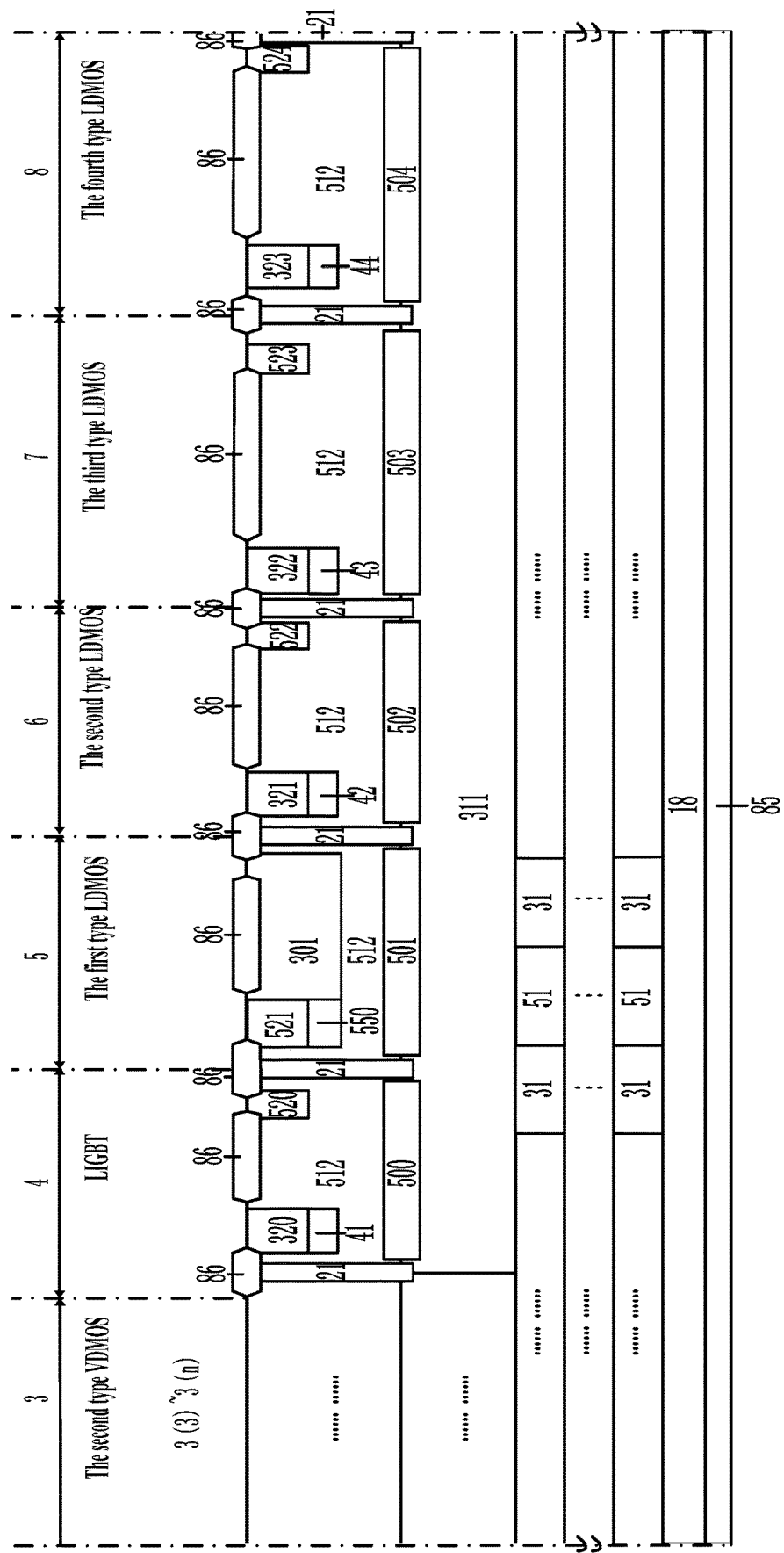
Figure 8:
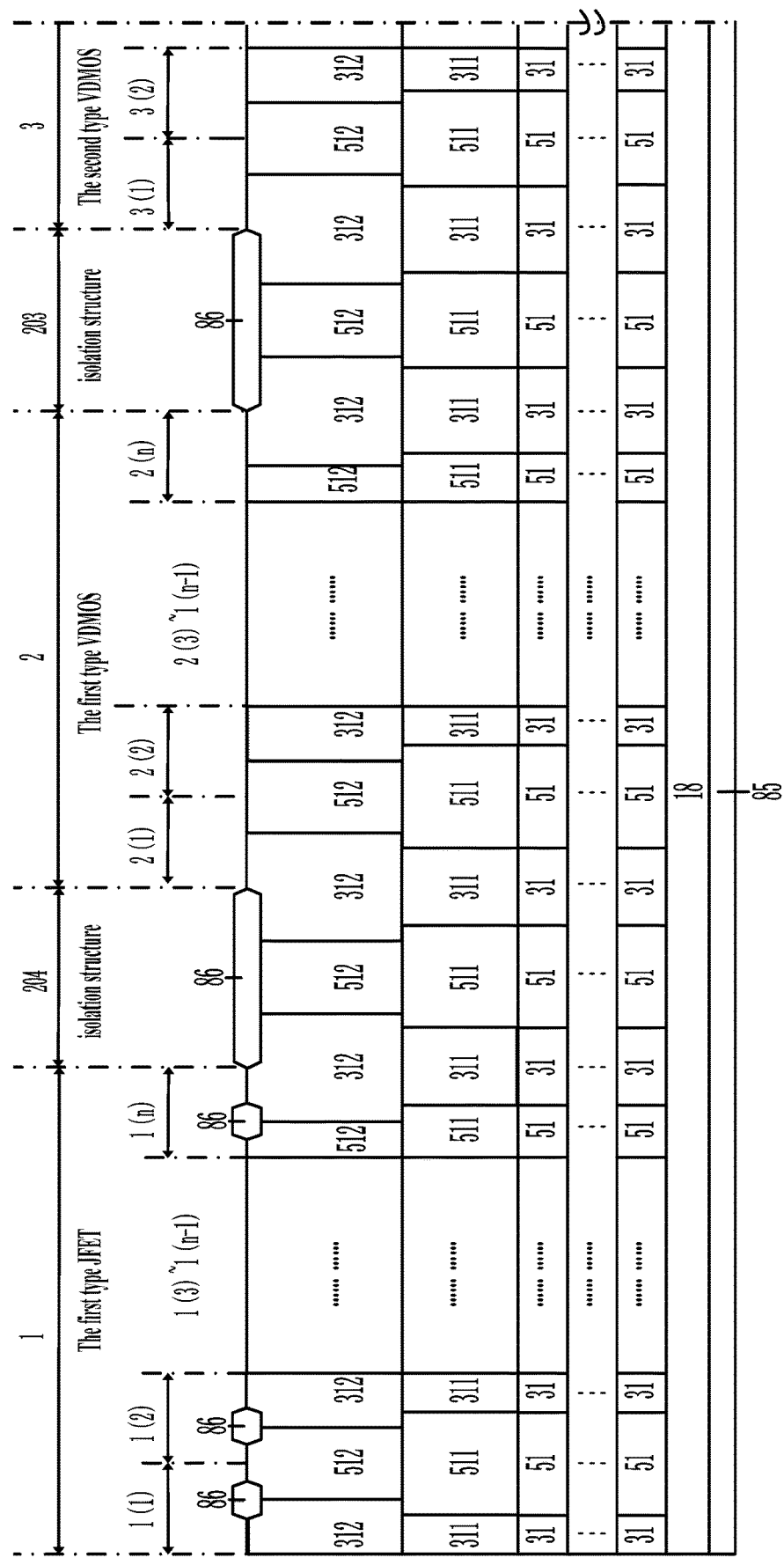
Figure 8:
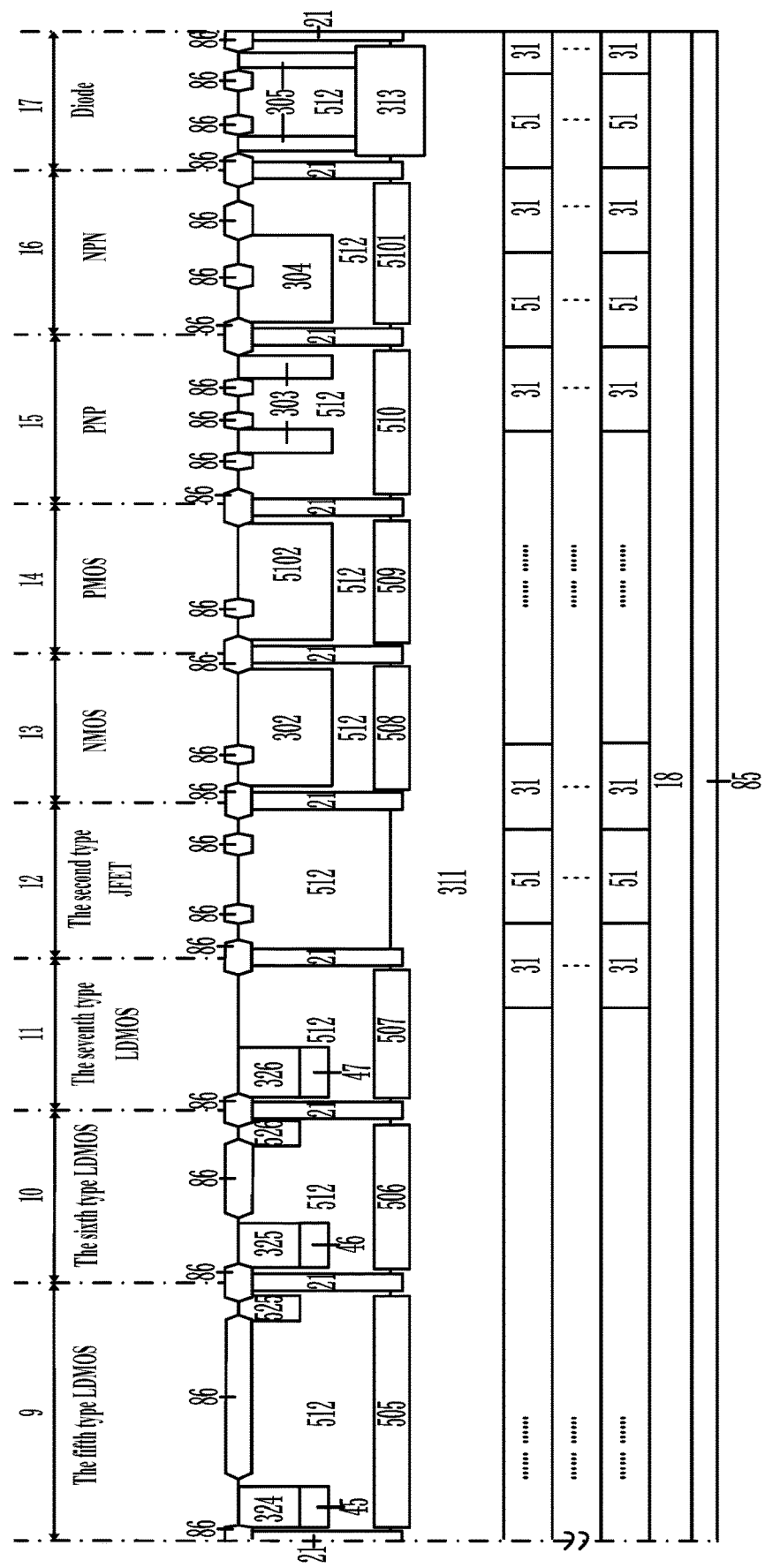
Figure 8:
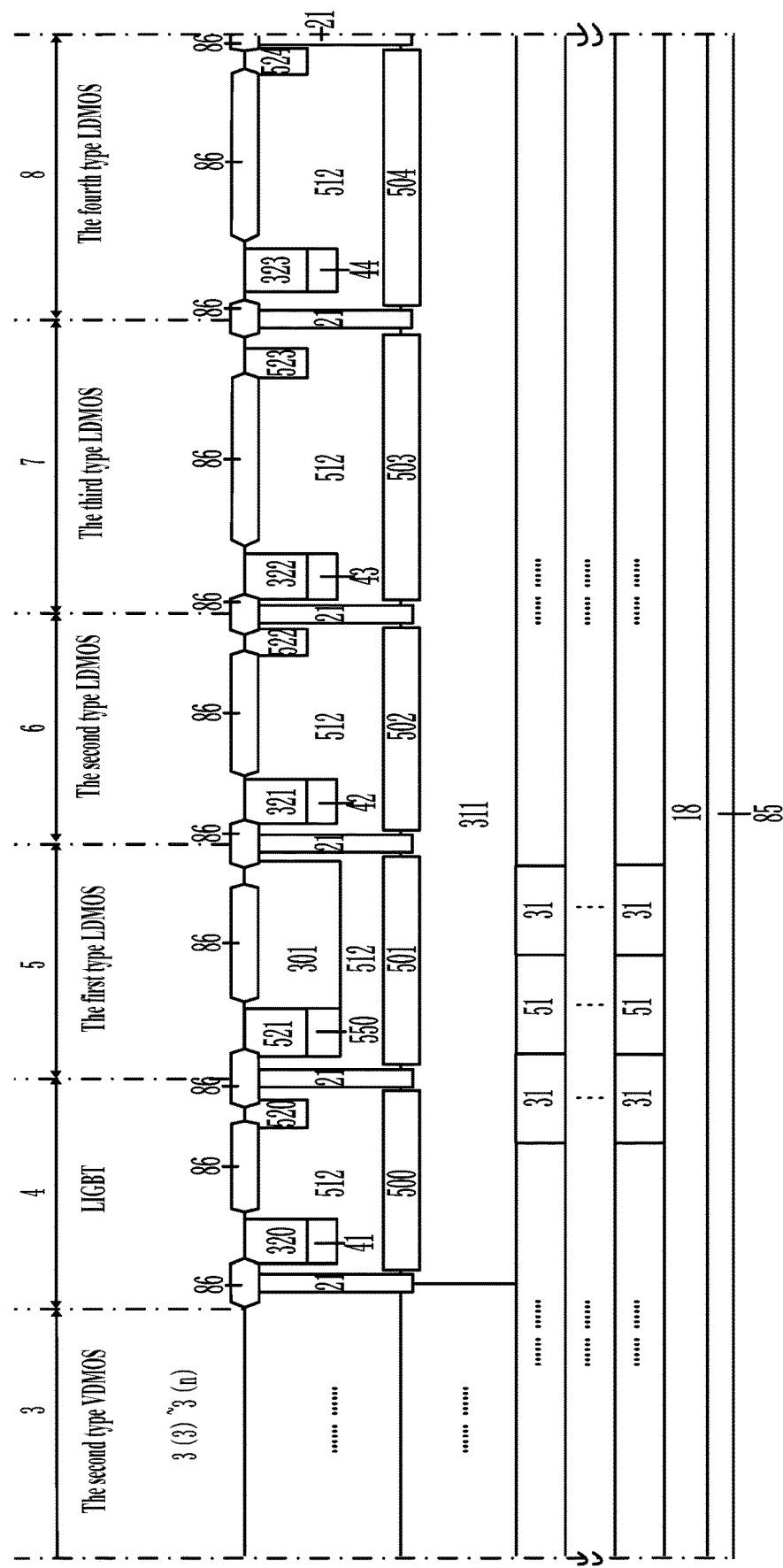
Figure 8:
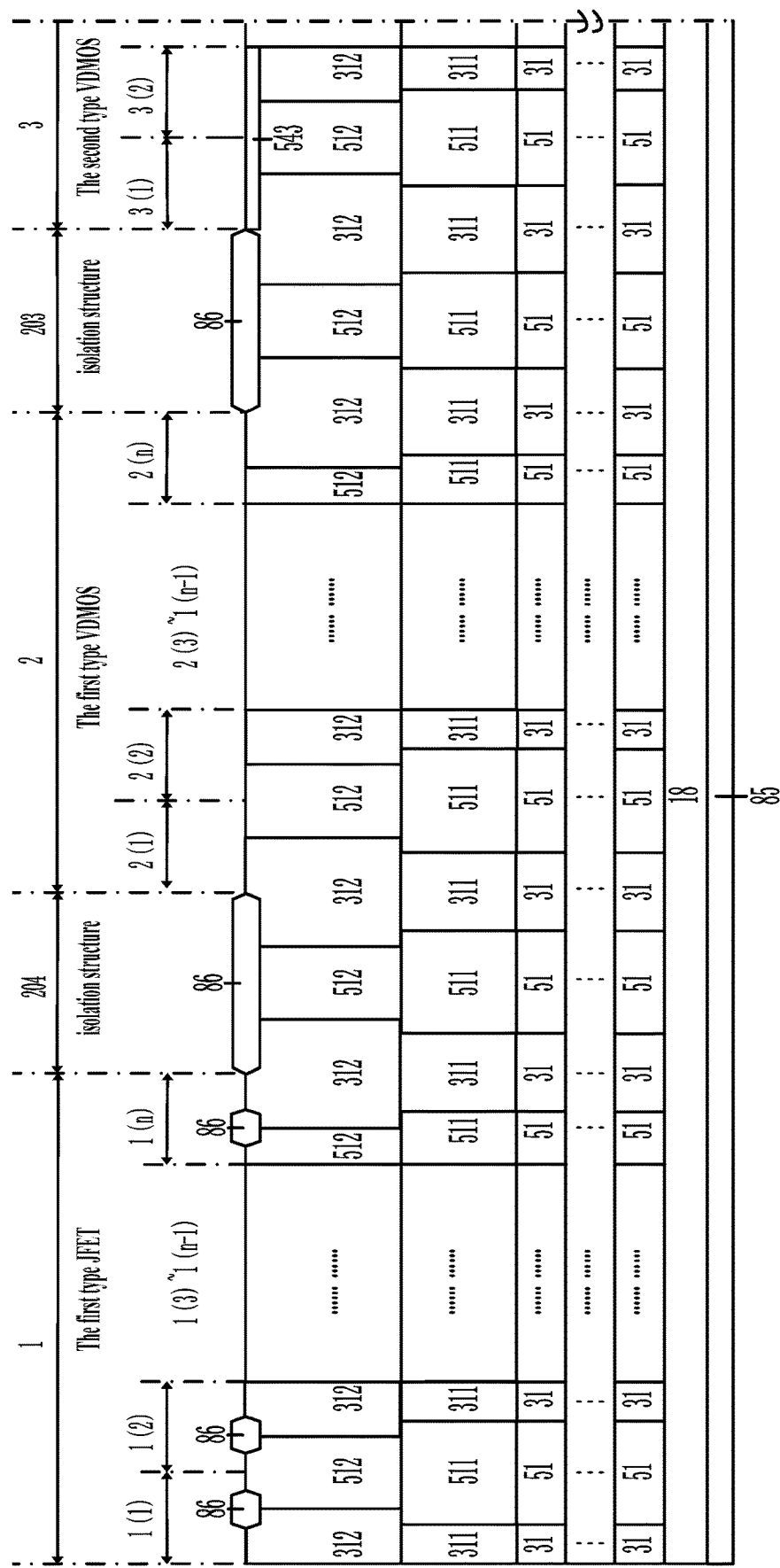
Figure 8:
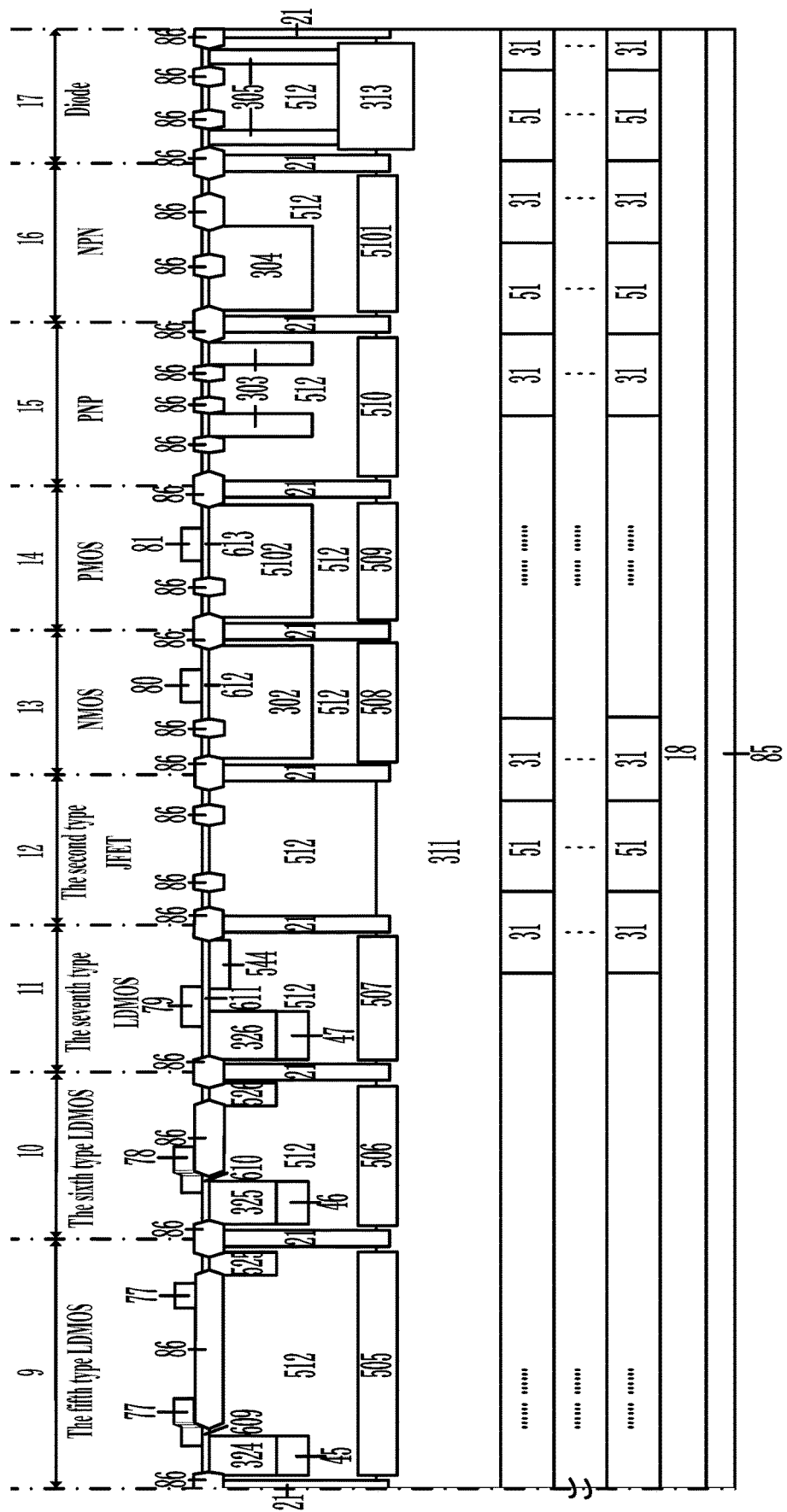
Figure 8:
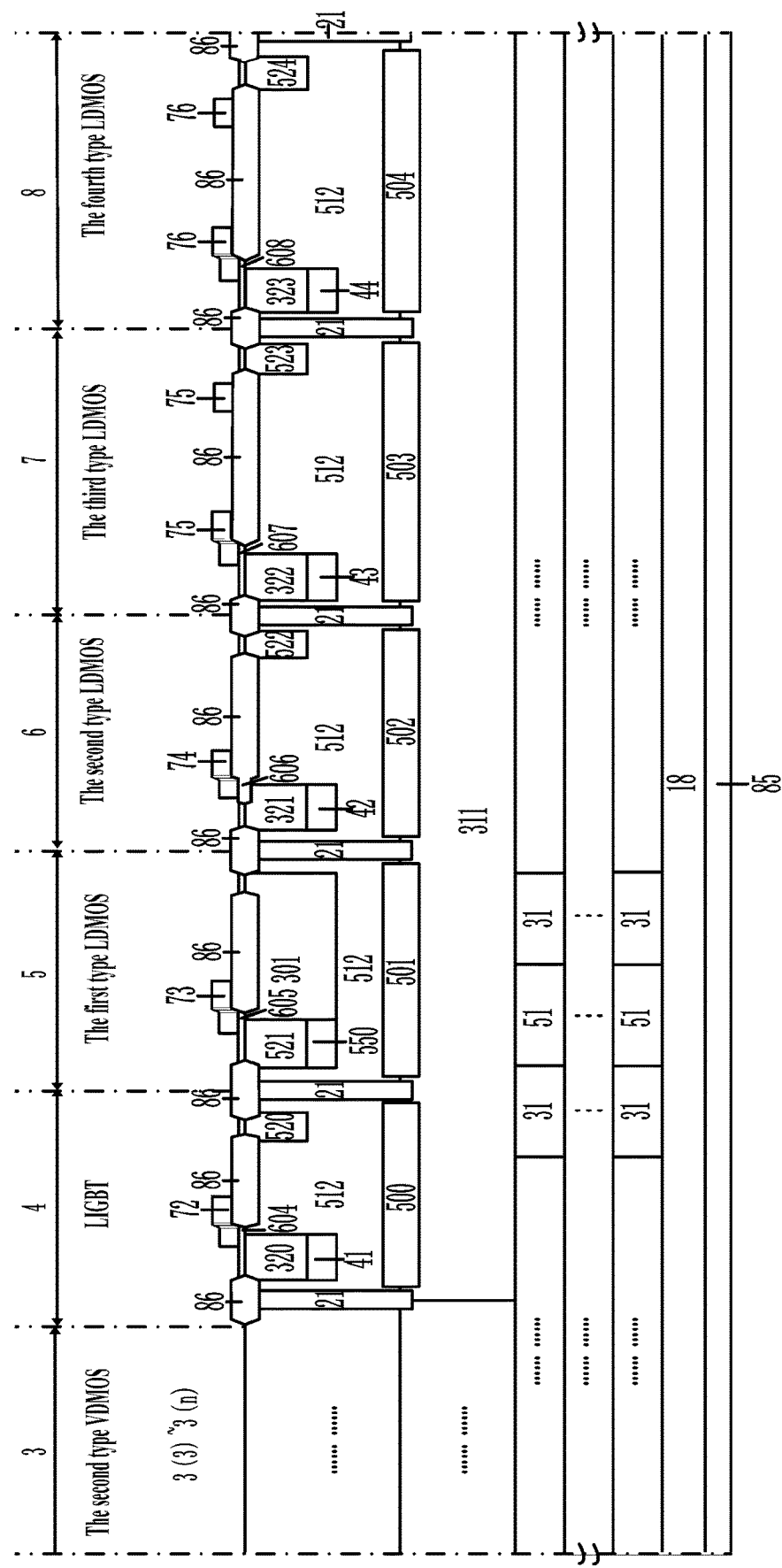

Step 10: successively injecting into impurity to form the first doped type of the deep well region 5102 of the low-voltage PMOS device 14 and the second doped type first deep well region 301 to the second doped type fifth deep well region 305. The second doped type first deep well region 301 to the second doped type fifth deep well region 305 belong to the first type of LDMOS device 5, the low voltage NMOS device 13, the PNP device 15, the NPN device 16, the diodes device 17, respectively. As shown in FIG. 8J.

Step 11: injecting impurities to form the first doped type first well region to seventh well region 520-526 of the device 4-11 at the right side the second type VDMOS device 3; the device on the right side the second type VDMOS device includes the LIGBT device 4, the first type of LDMOS device 5, the second type of LDMOS device 6, the third type of LDMOS device 7, the fourth type of LDMOS device 8, the fifth type of LDMOS device 9, the sixth type of LDMOS device 10 and the seventh type of LDMOS device 11. As shown in FIG. 8K.

Step 12: injecting impurities to form the first doped type falling field layer 550 of the device 4-11 at the right side of the second type VDMOS device 3. Injecting impurities to form the second doped type of the first falling field layer to the seventh falling field layer 41-47 of the device 4-11 at the right side of the second type VDMOS device 3. As shown in FIG. 8L.

Step 13: injecting impurities to form the first lightly doped type depleted channel region 543 of the second type of VDMOS device 3 and the first doped type sustain voltage layer 544 of the seven type of device 11. As shown in FIG. 8M.

Figure 8N:
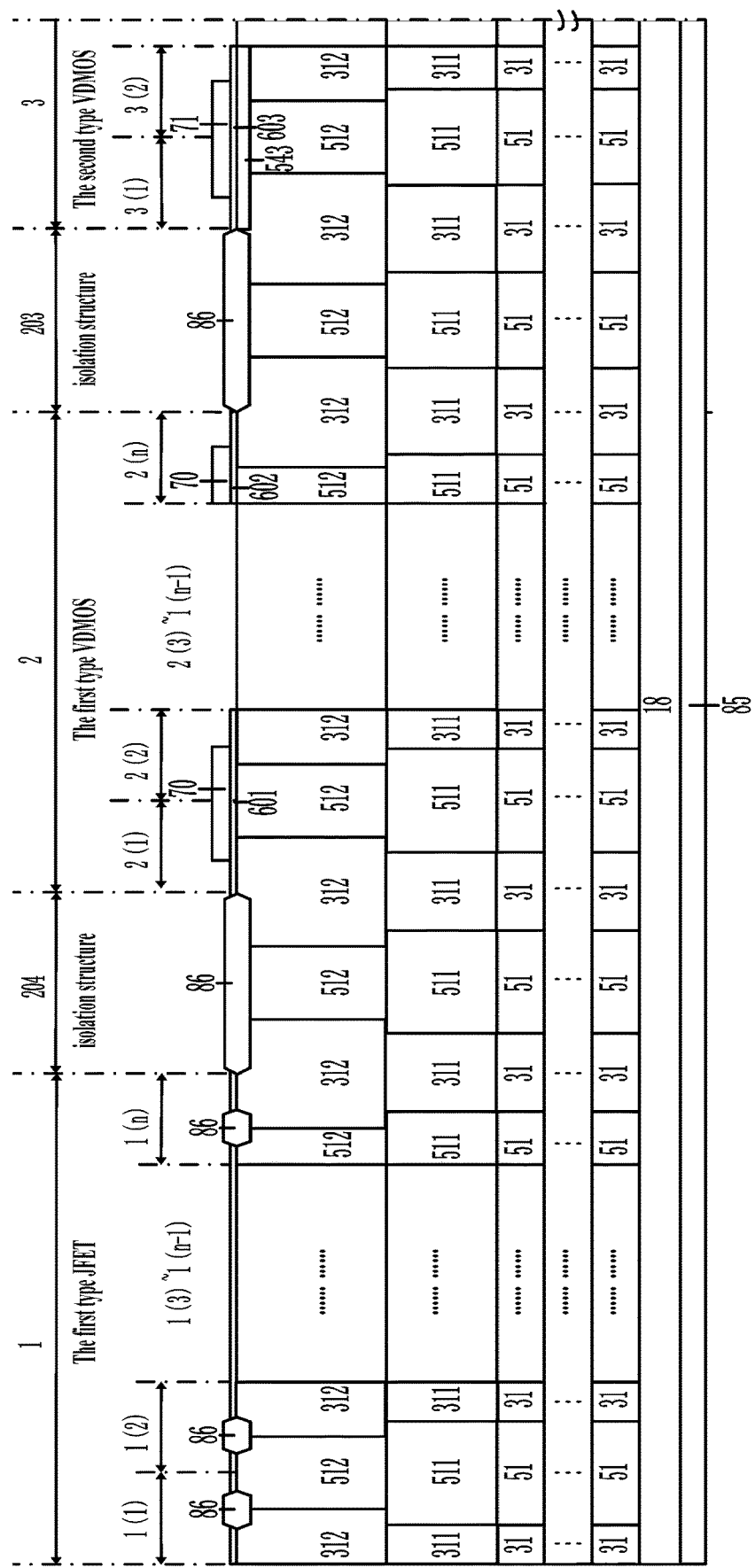
Figure 8:
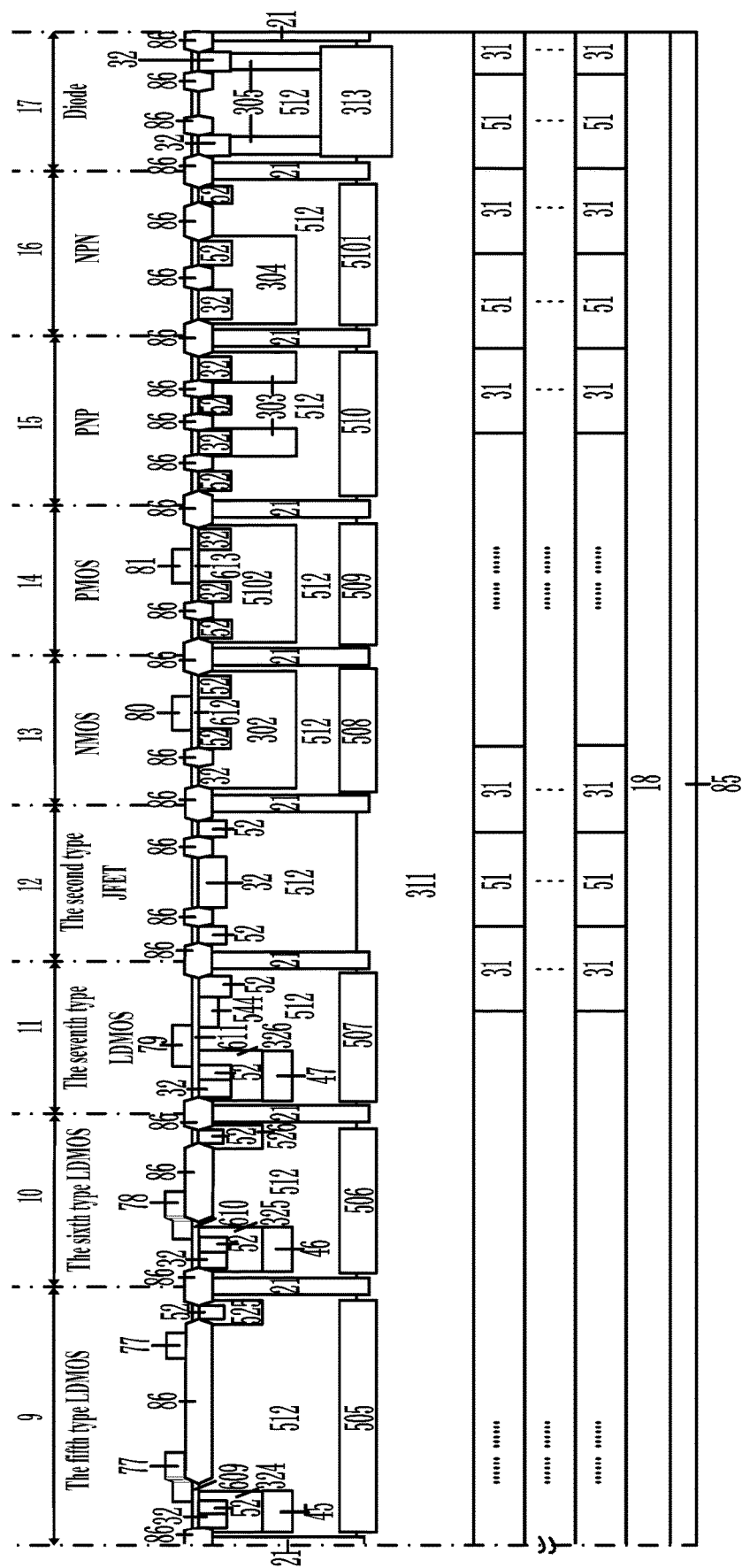

Step 14: forming gate oxide layer, polysilicon gate and polysilicon field plate, the polysilicon gate resistance is 10~40 ohm/square. As shown in FIG. 8N.

Figure 8O:
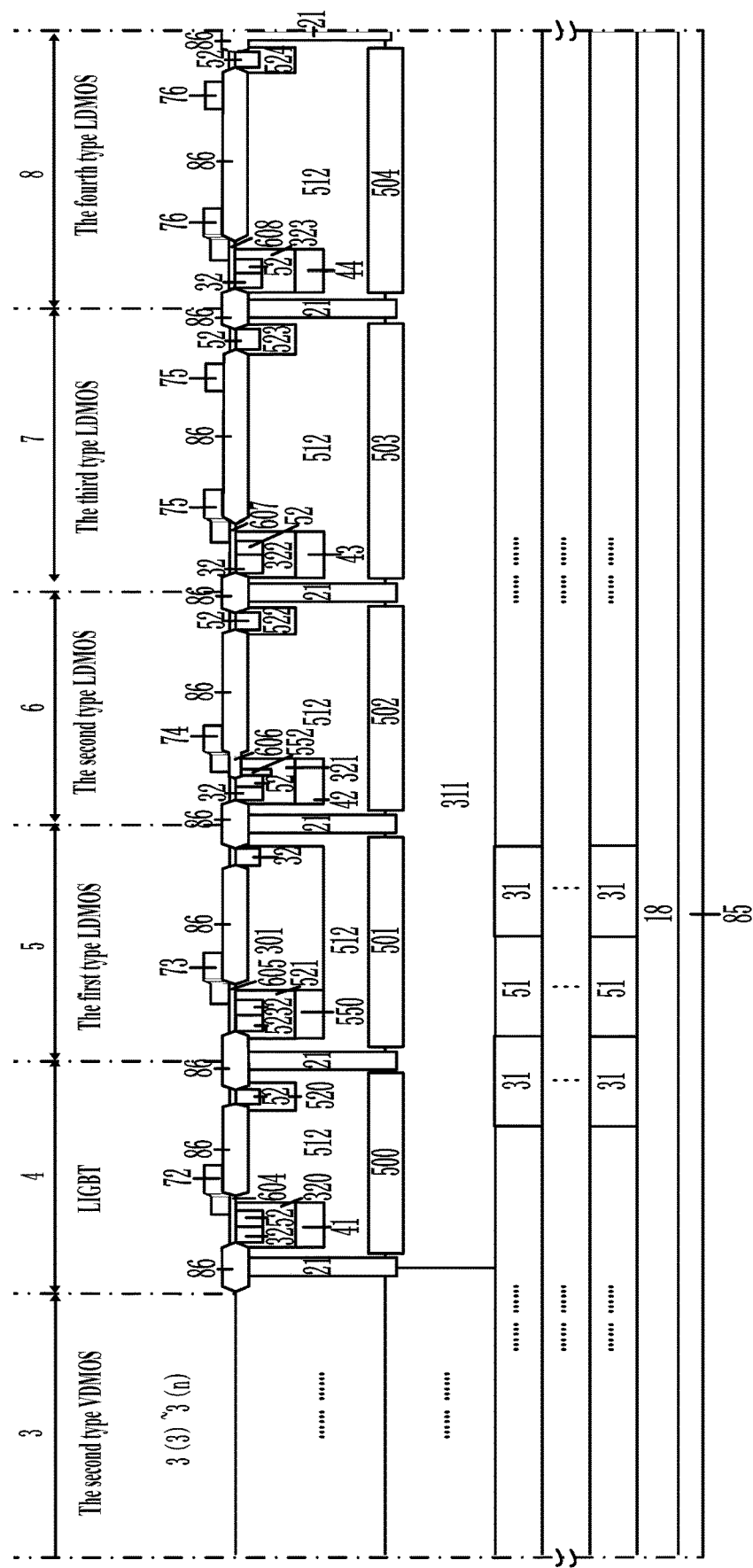
Figure 8:
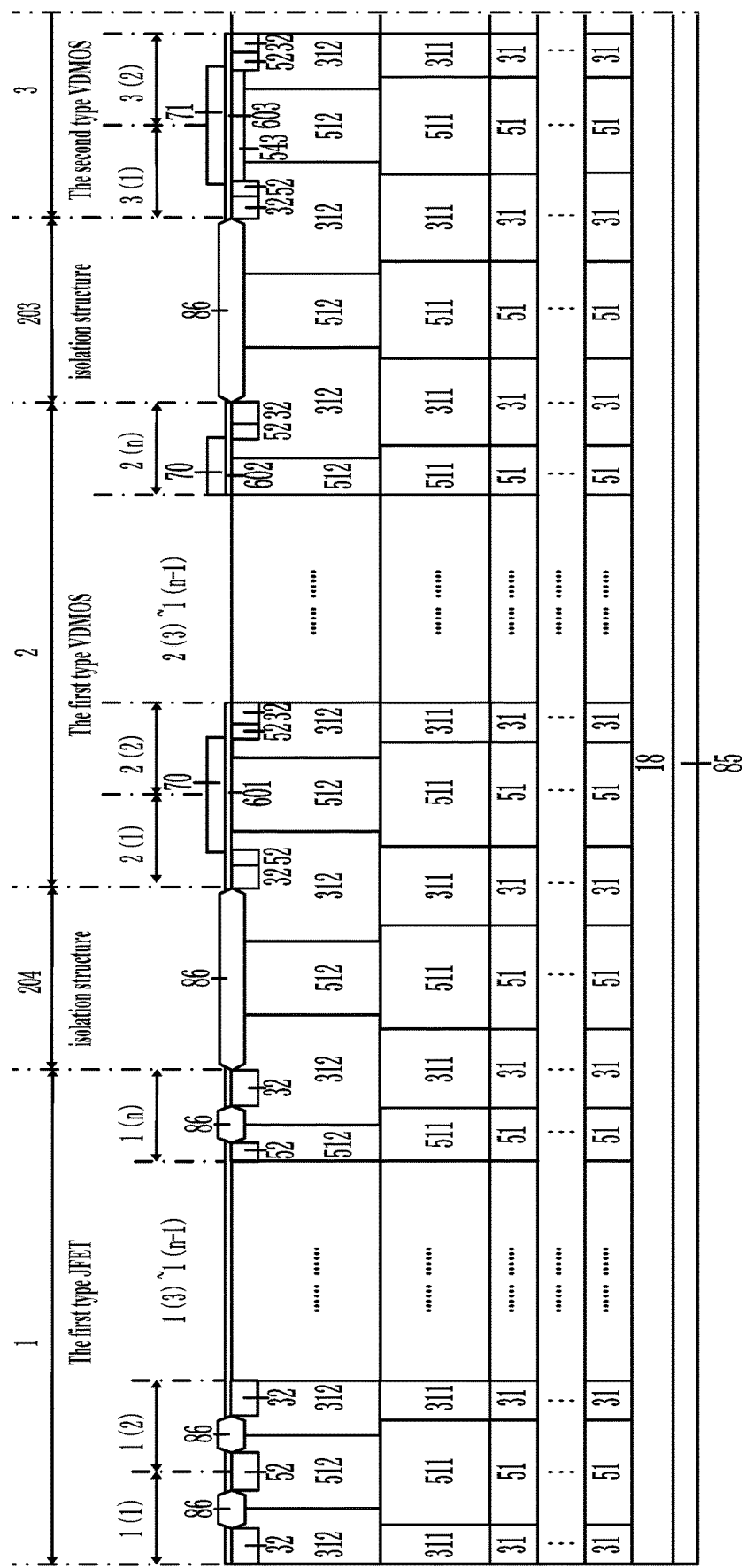
Figure 8:
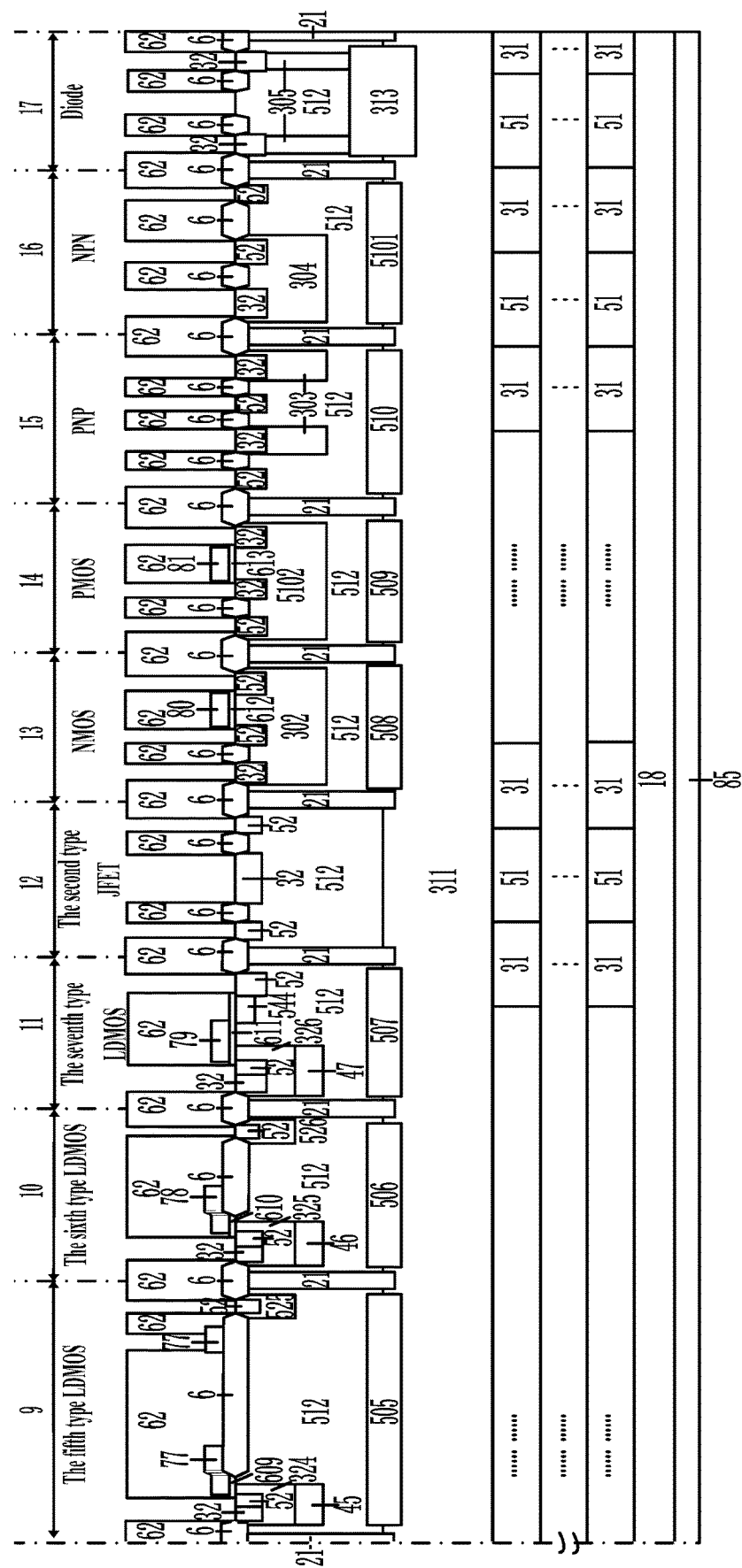

Step 15: injecting successively impurity to form the first heavily doped type source region 52 and the second heavily doped type source region 32, the dose of the impurity is 1e15 cm$^{-2}$~2e16 cm$^{-2}$. As shown in FIG. 8O.

Figure 8P:
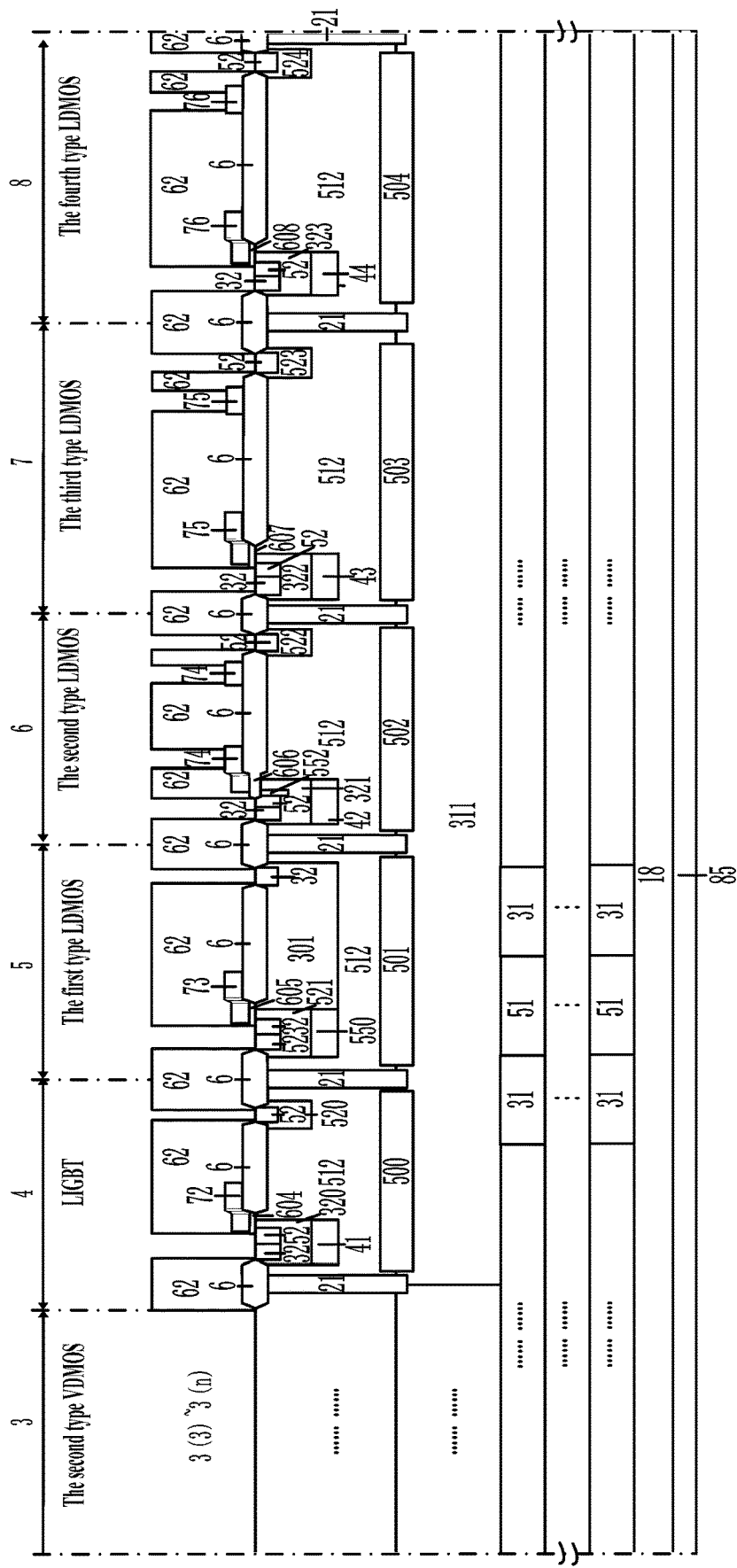
Figure 8P:
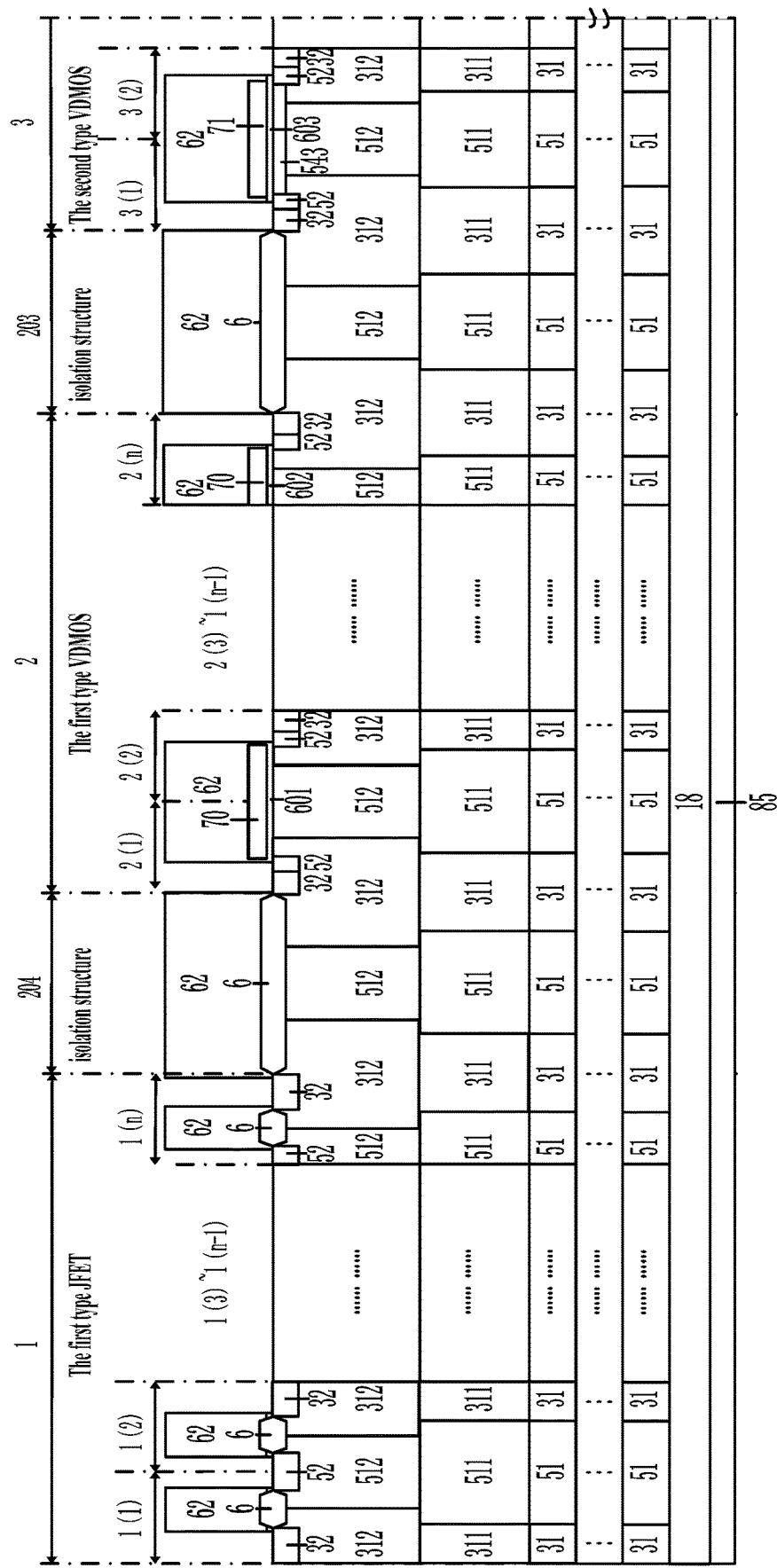
Figure 8:
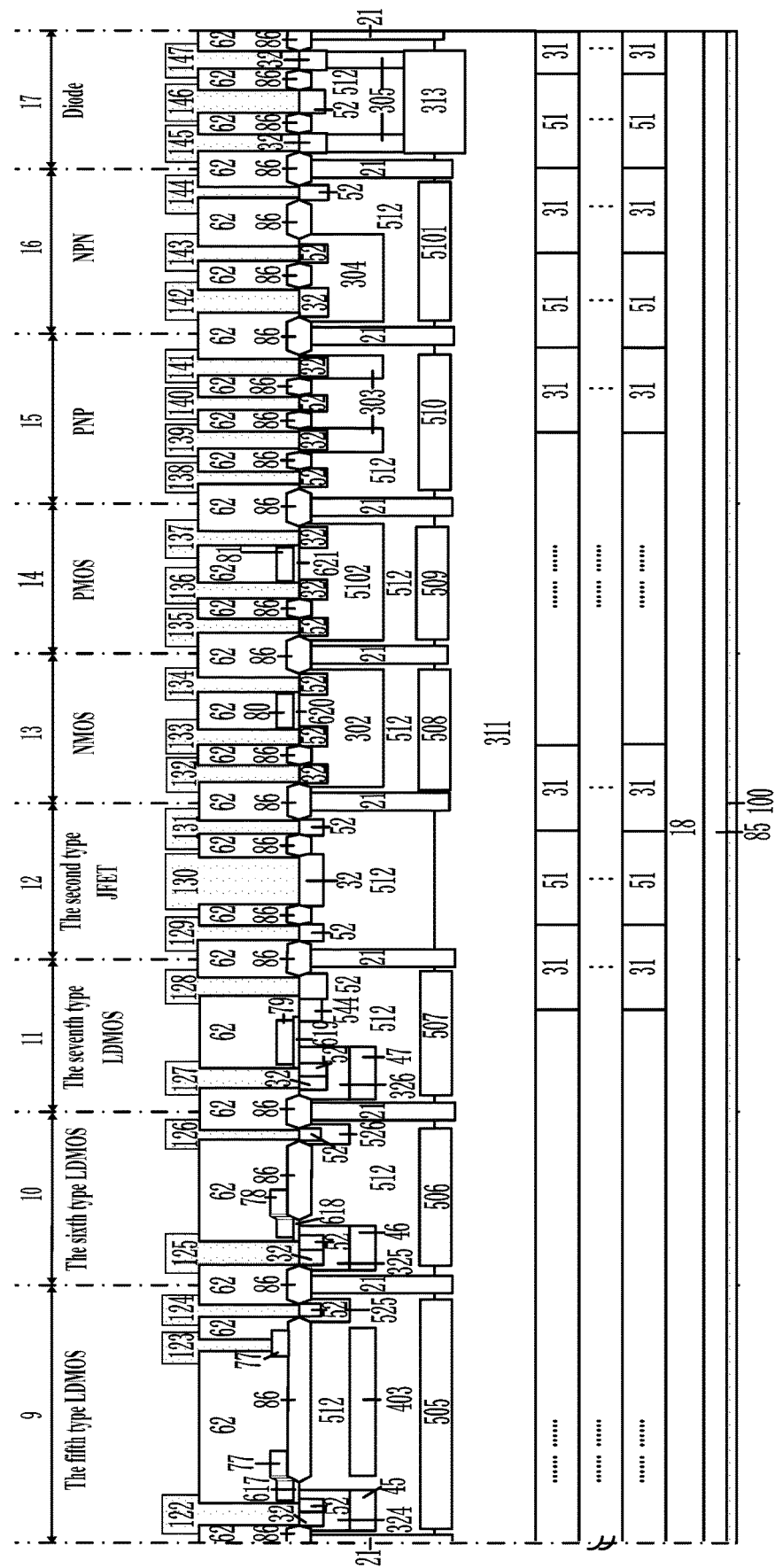
Figure 8:
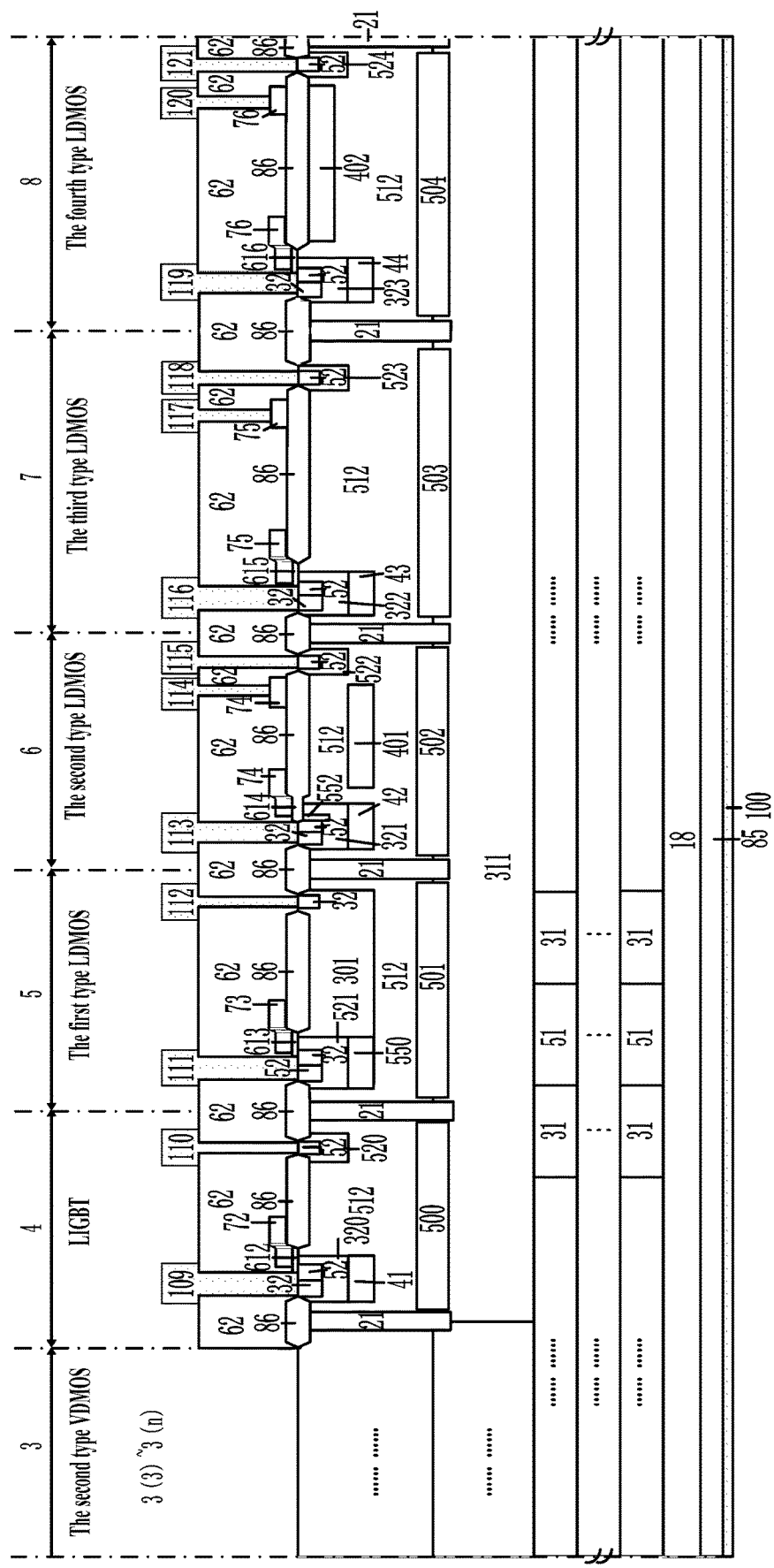
Figure 8:
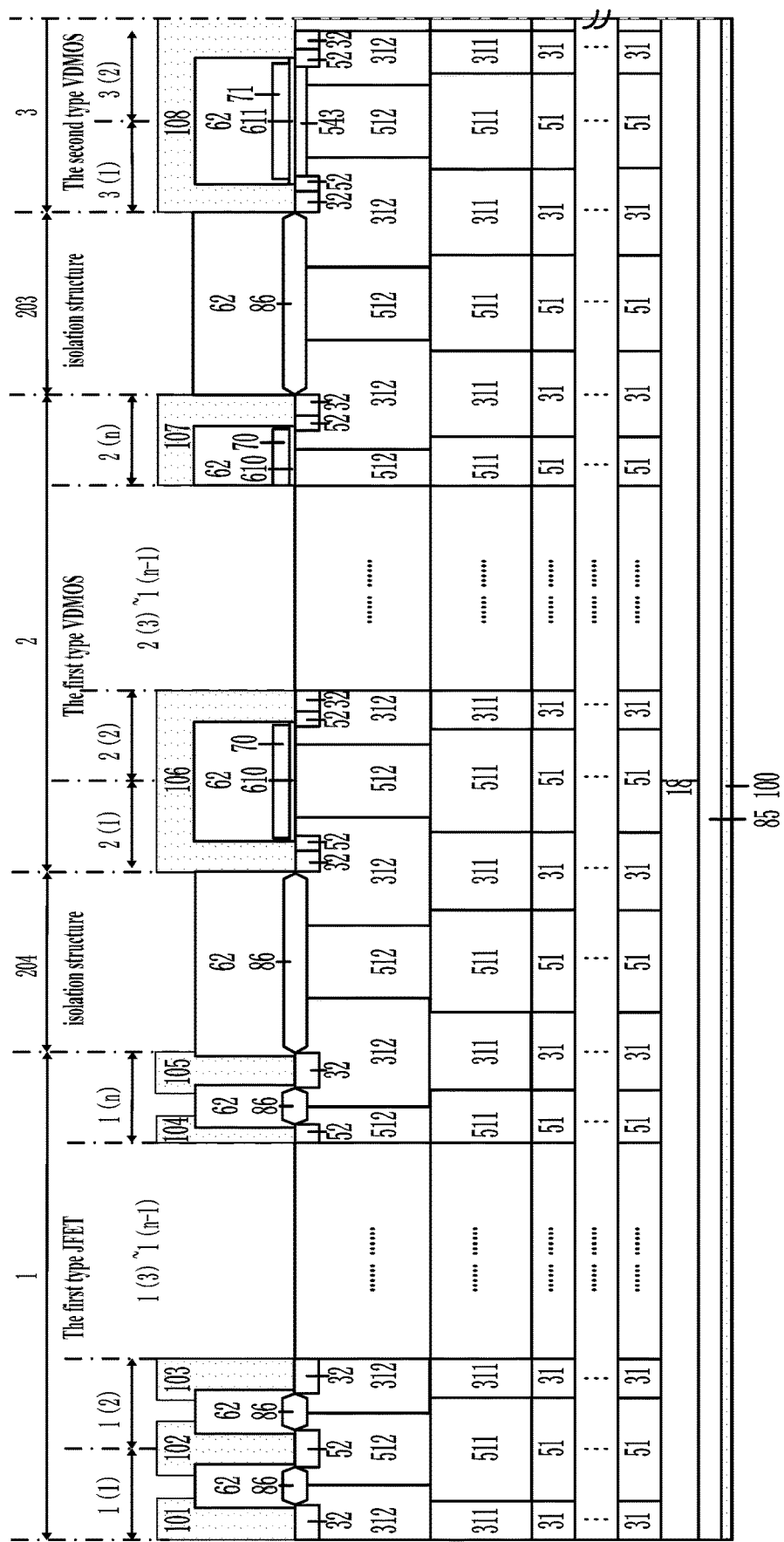

Step 16: depositing dielectric material to form the dielectric layer 62. As shown in FIG. 8P.

Step 17: metallizing the metal electrode, and forming the high voltage drain metal 100 on the back. As shown in FIG. 8Q.

Embodiment 9

Figure 9:
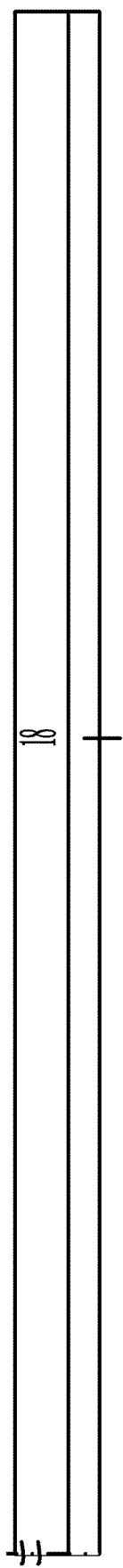
FIG. 9A(a)-FIG. 9O(c) is a flow chart of a manufacturing method of BCD semiconductor device for the embodiment 9.
Figure 9:
Figure 9:
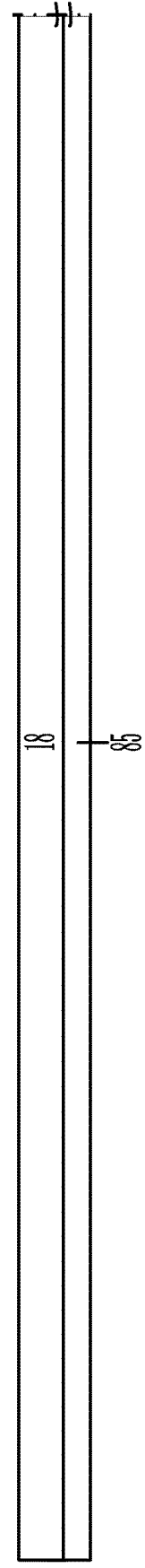
Figure 9:
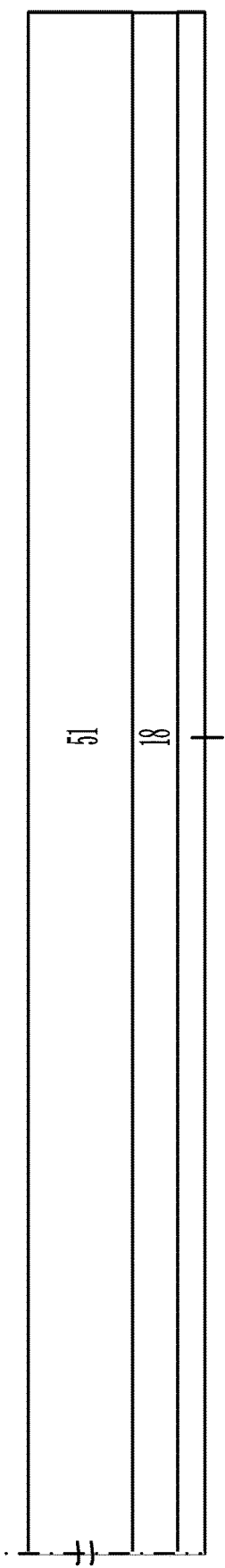
Figure 9:
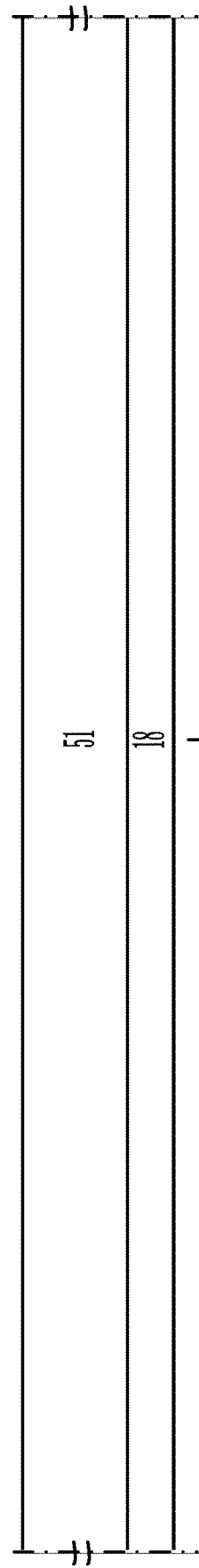
Figure 9:
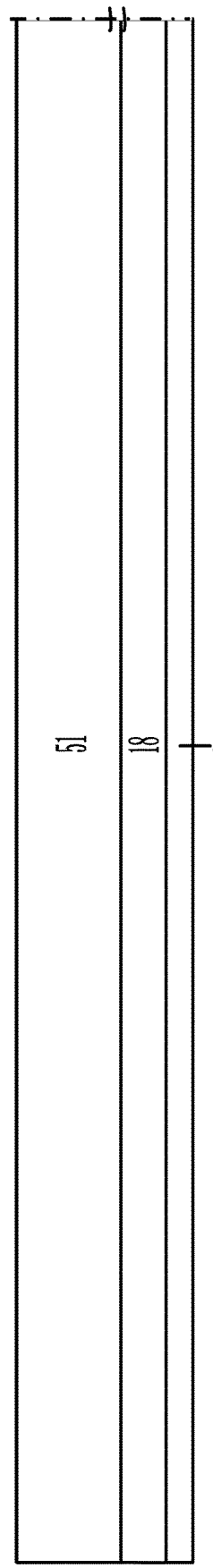
Figure 9C:
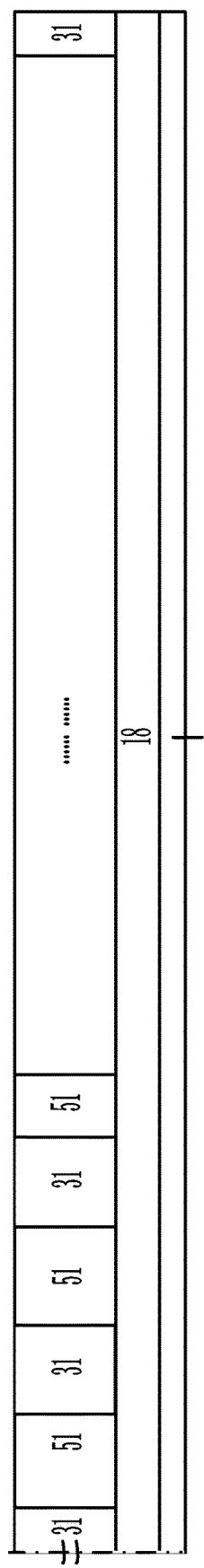
Figure 9C:
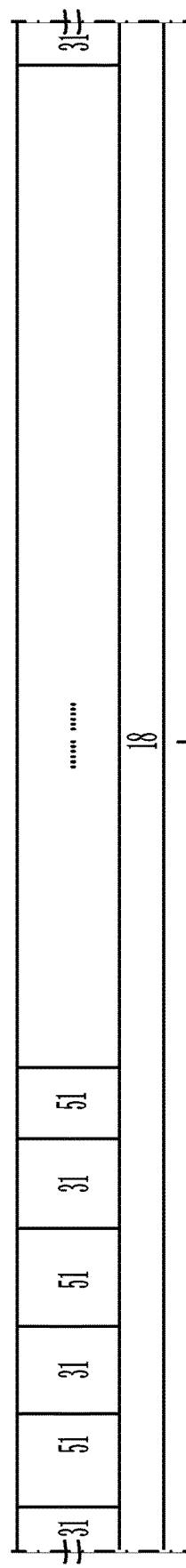
Figure 9C:
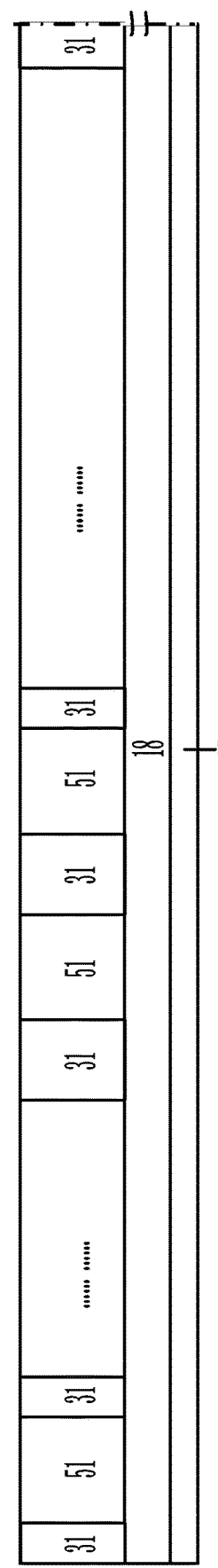
Figure 9:
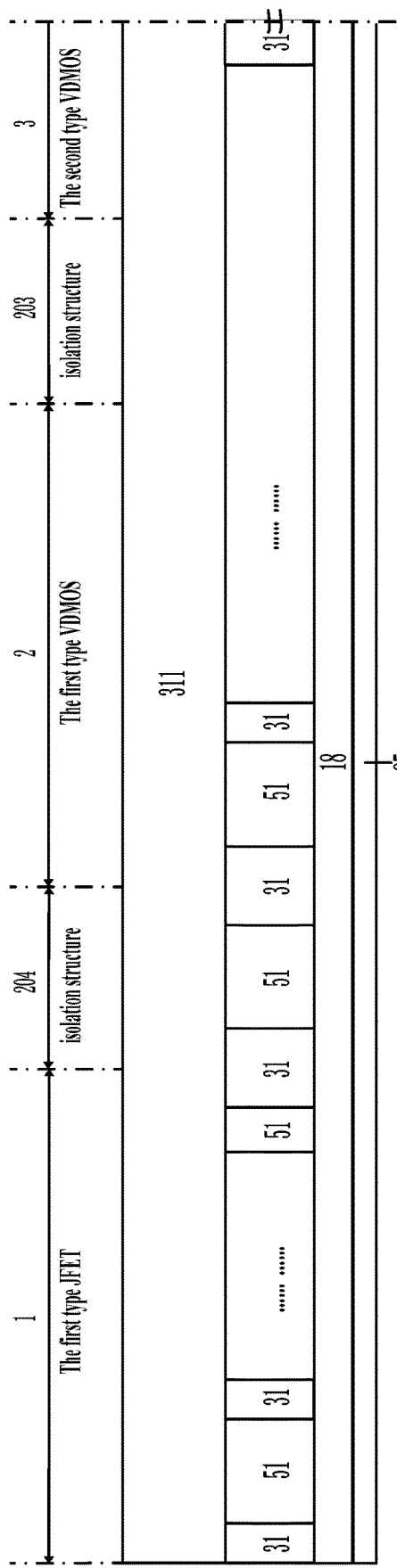
Figure 9:
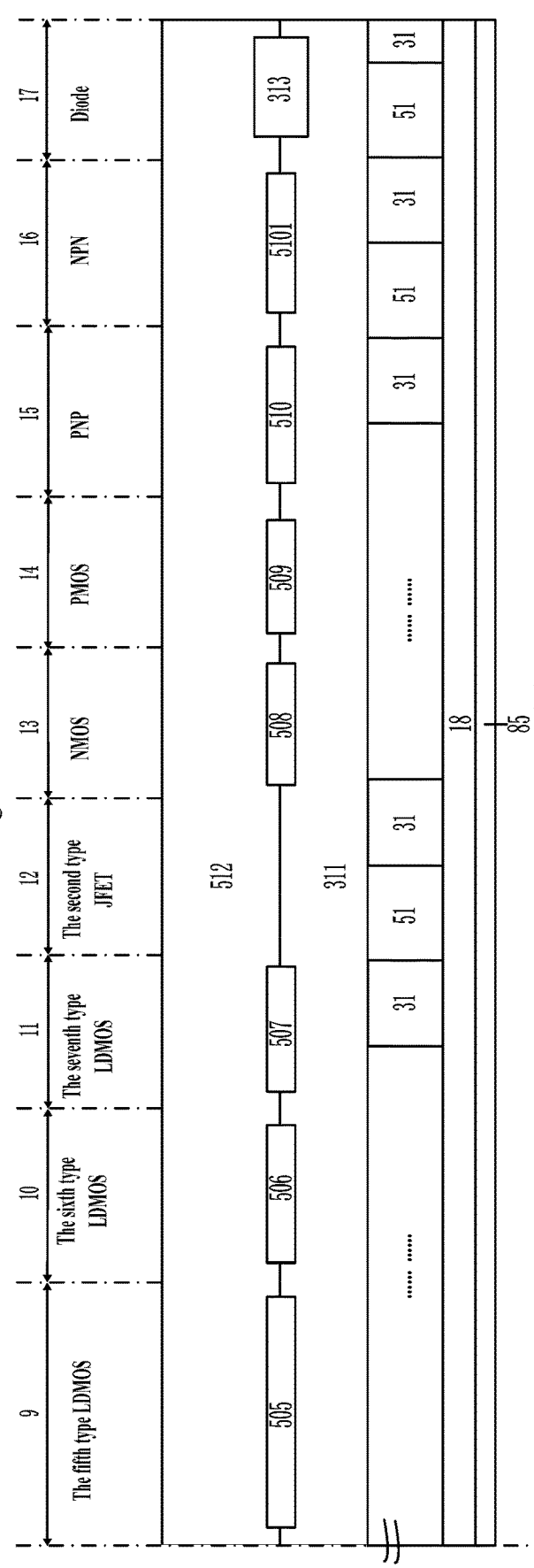
Figure 9:
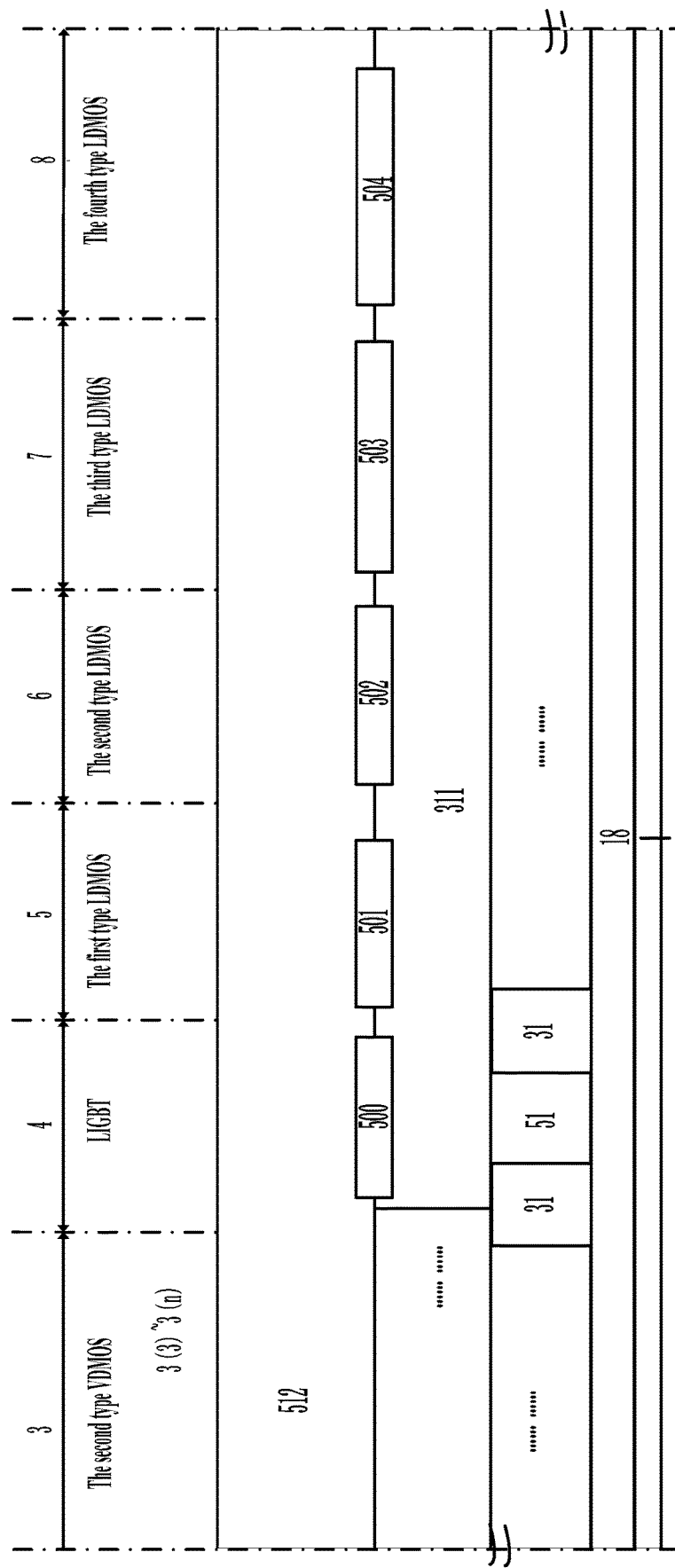
Figure 9:
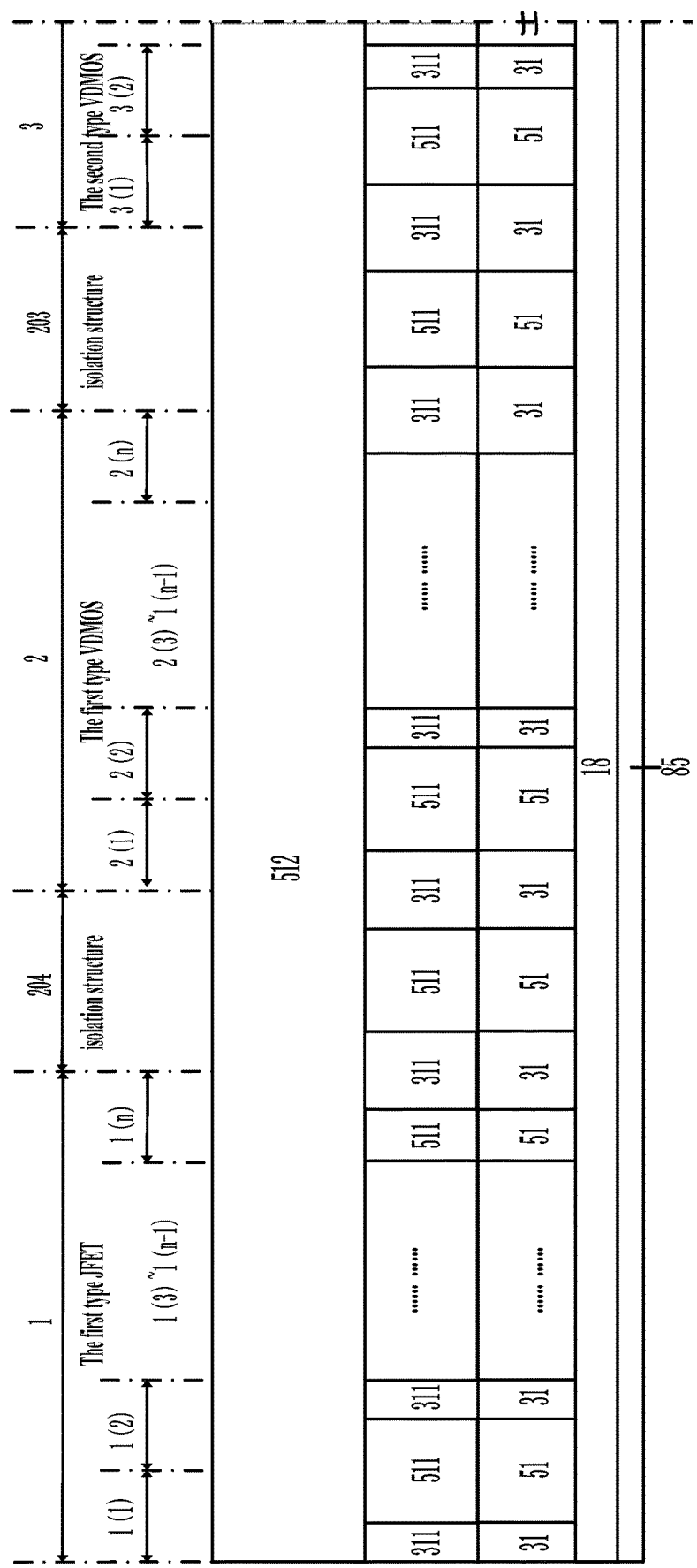
Figure 9:
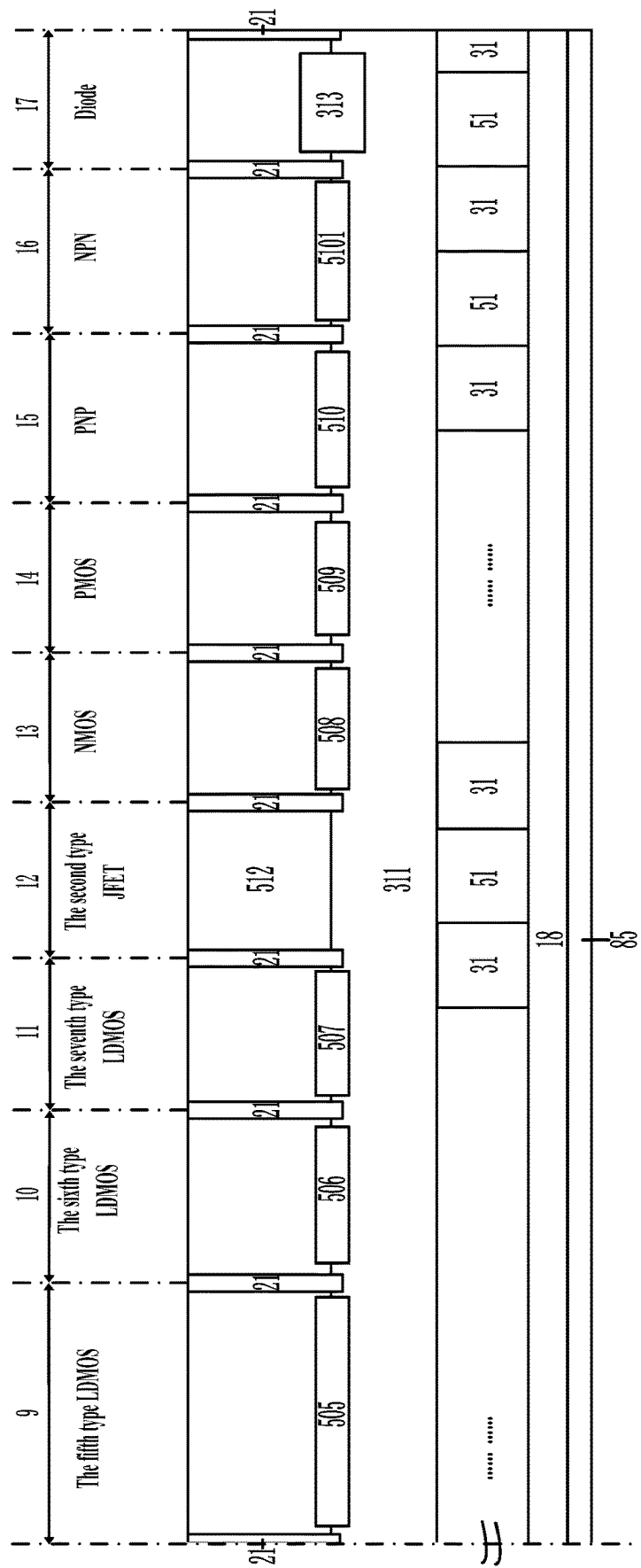
Figure 9:
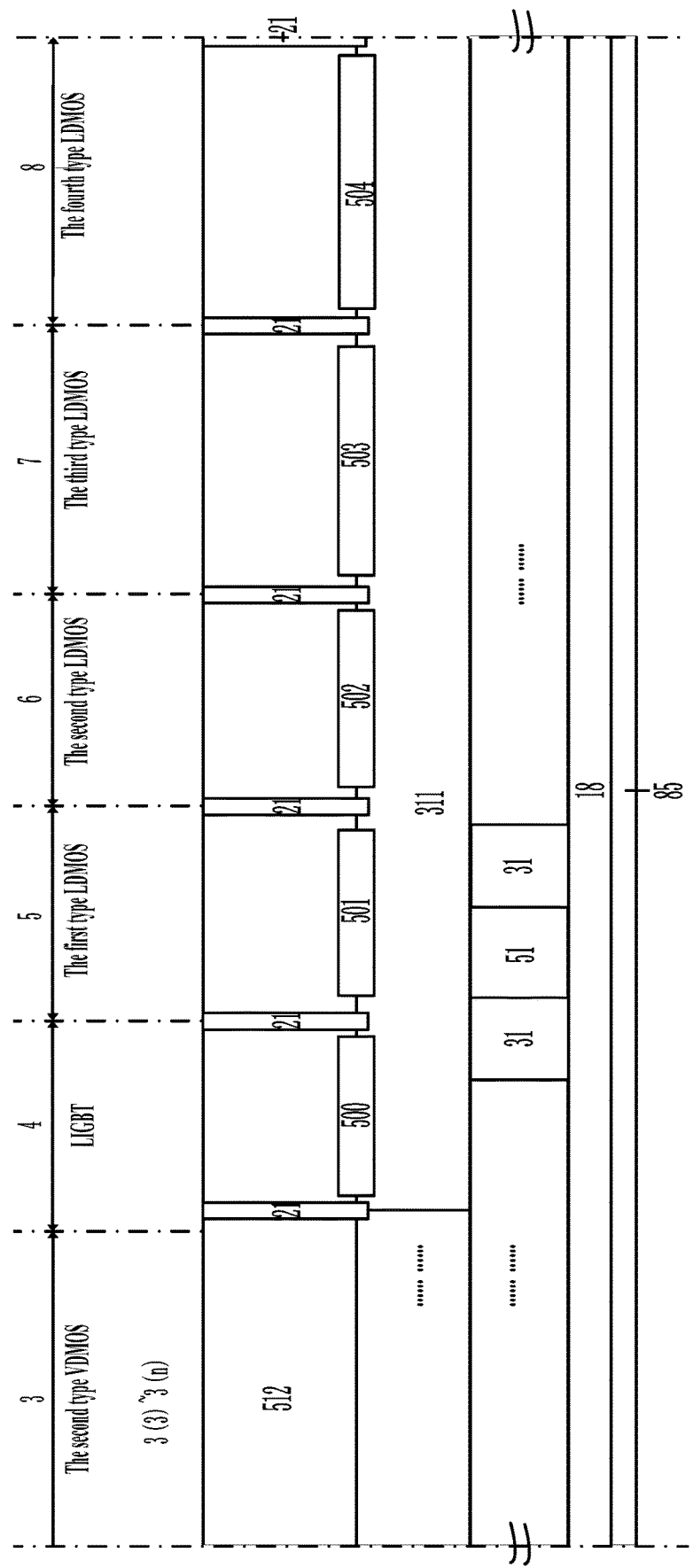
Figure 9:
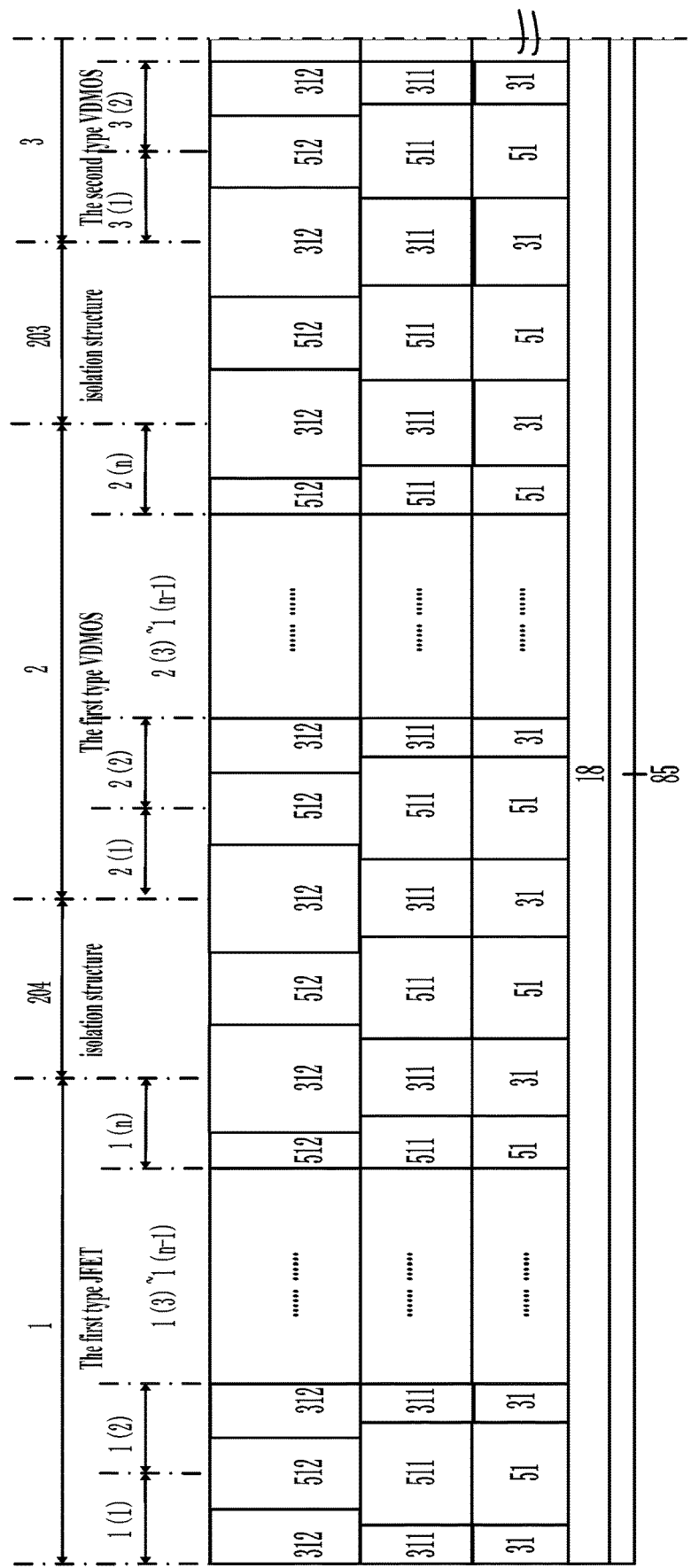
Figure 9:
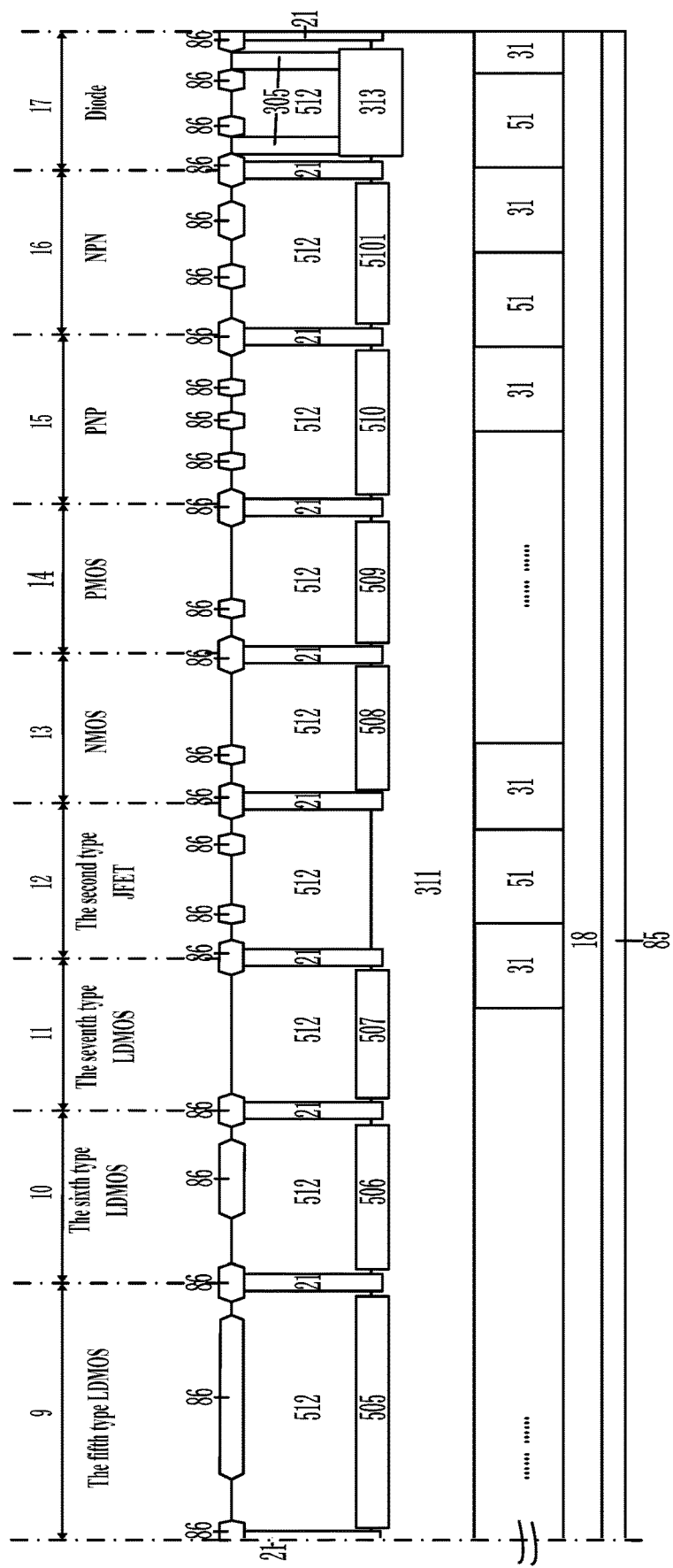
Figure 9:
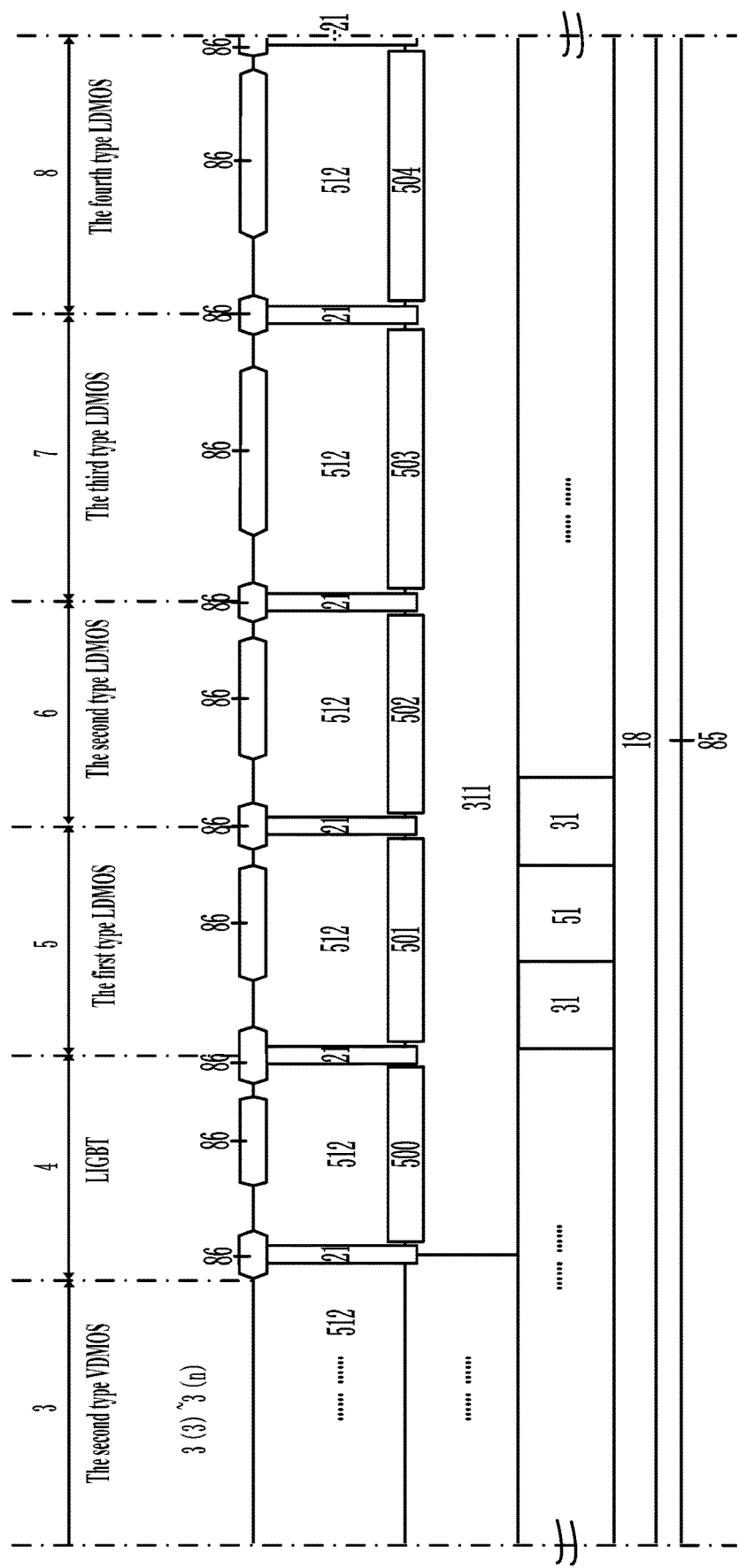
Figure 9:
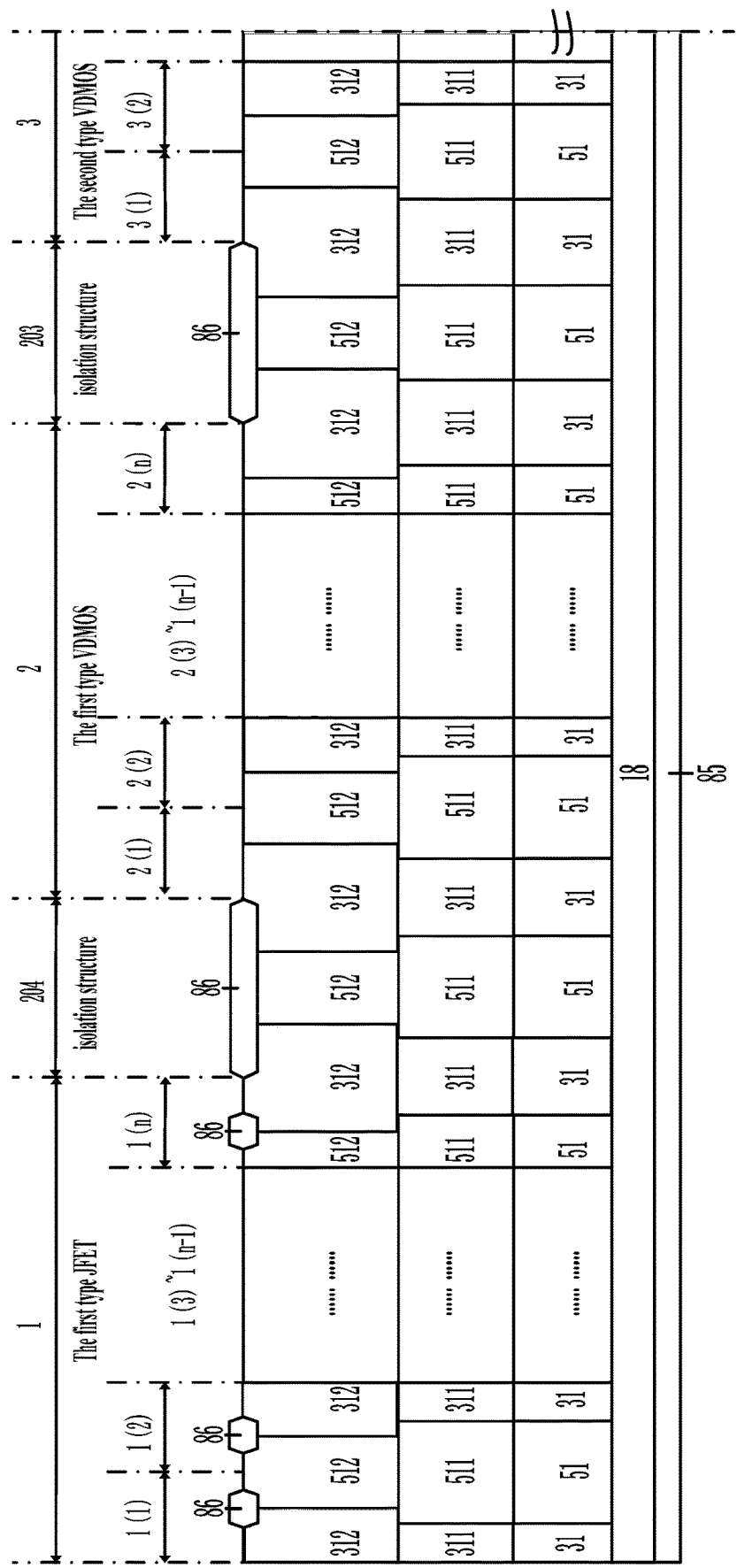
Figure 9:
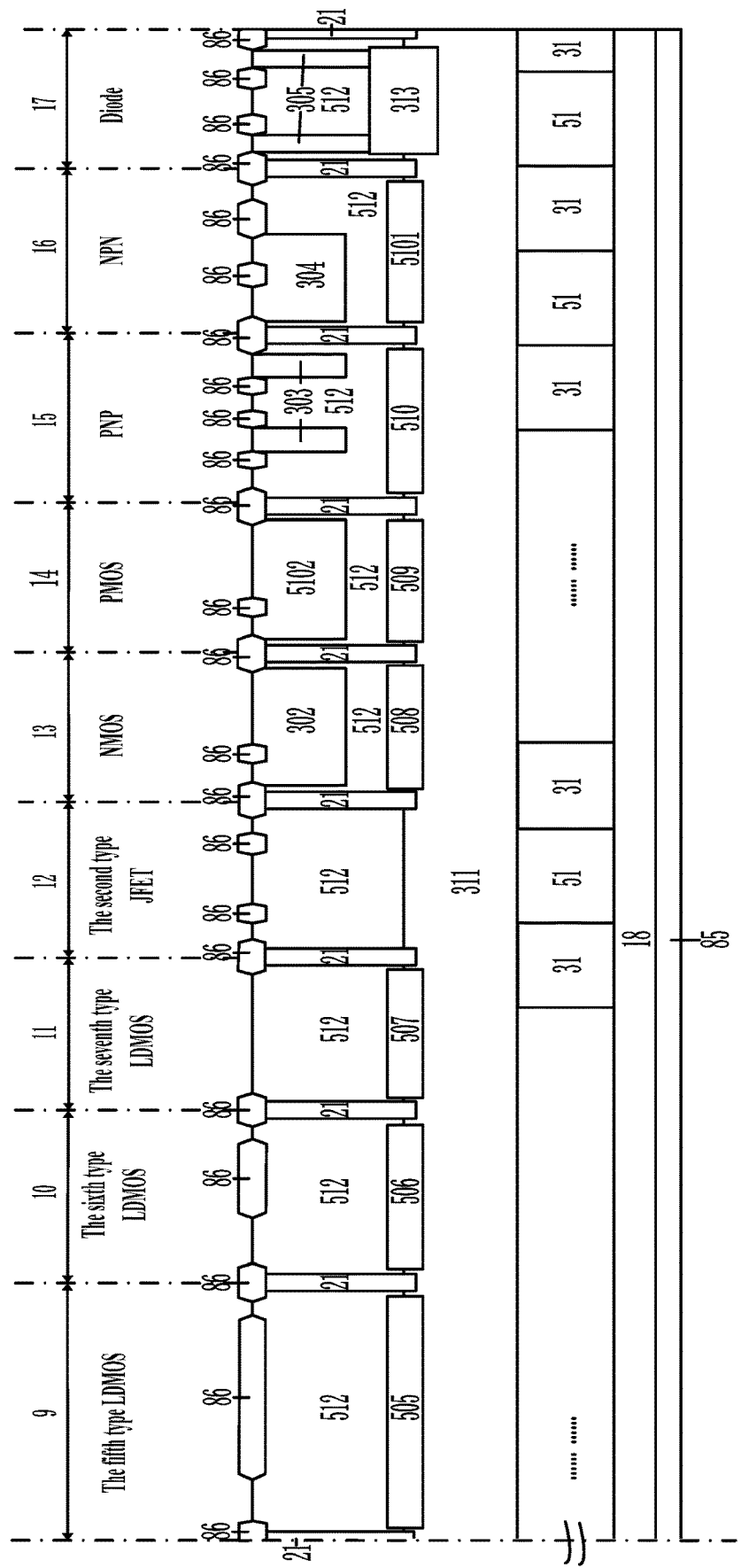
Figure 9H:
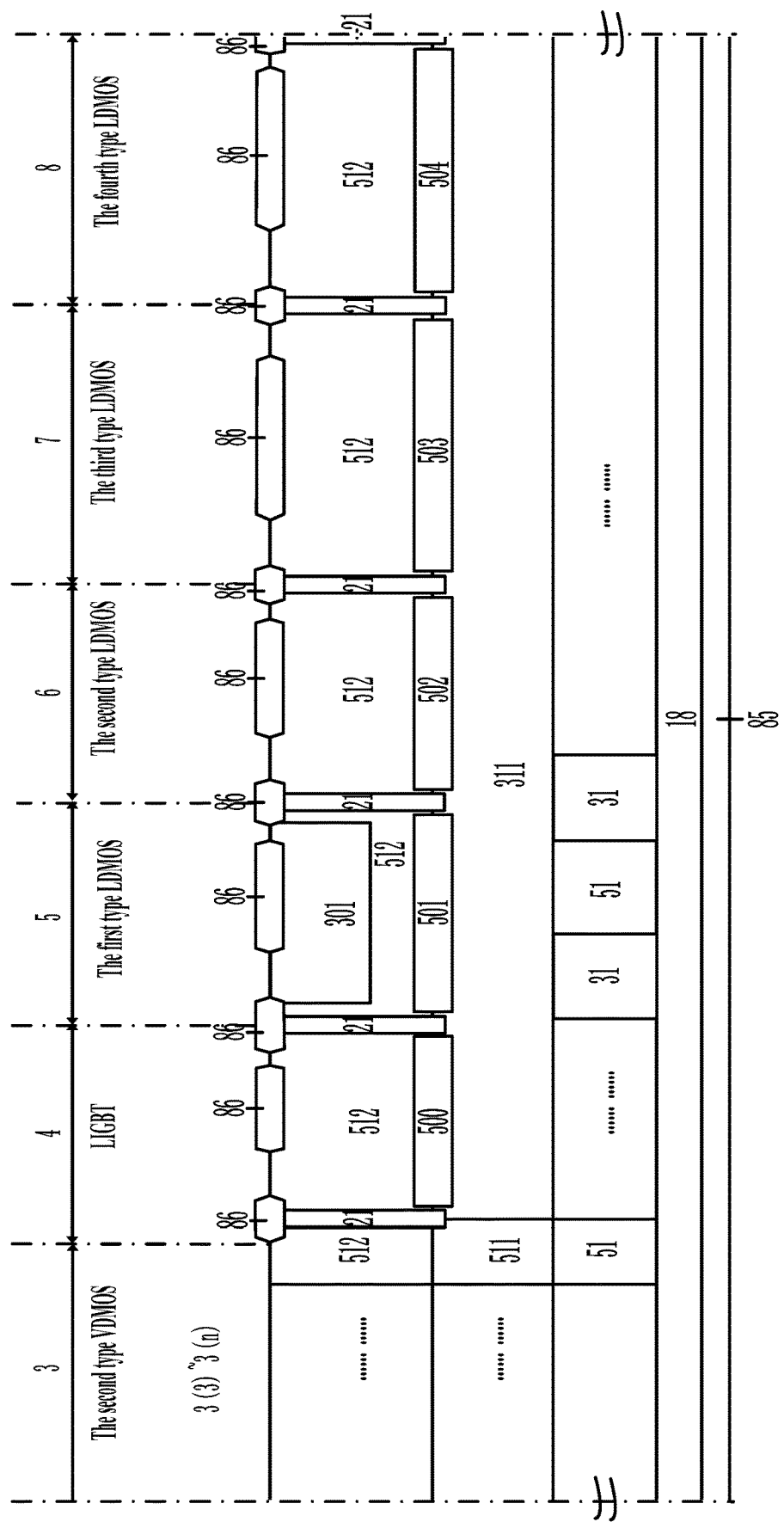
Figure 9:
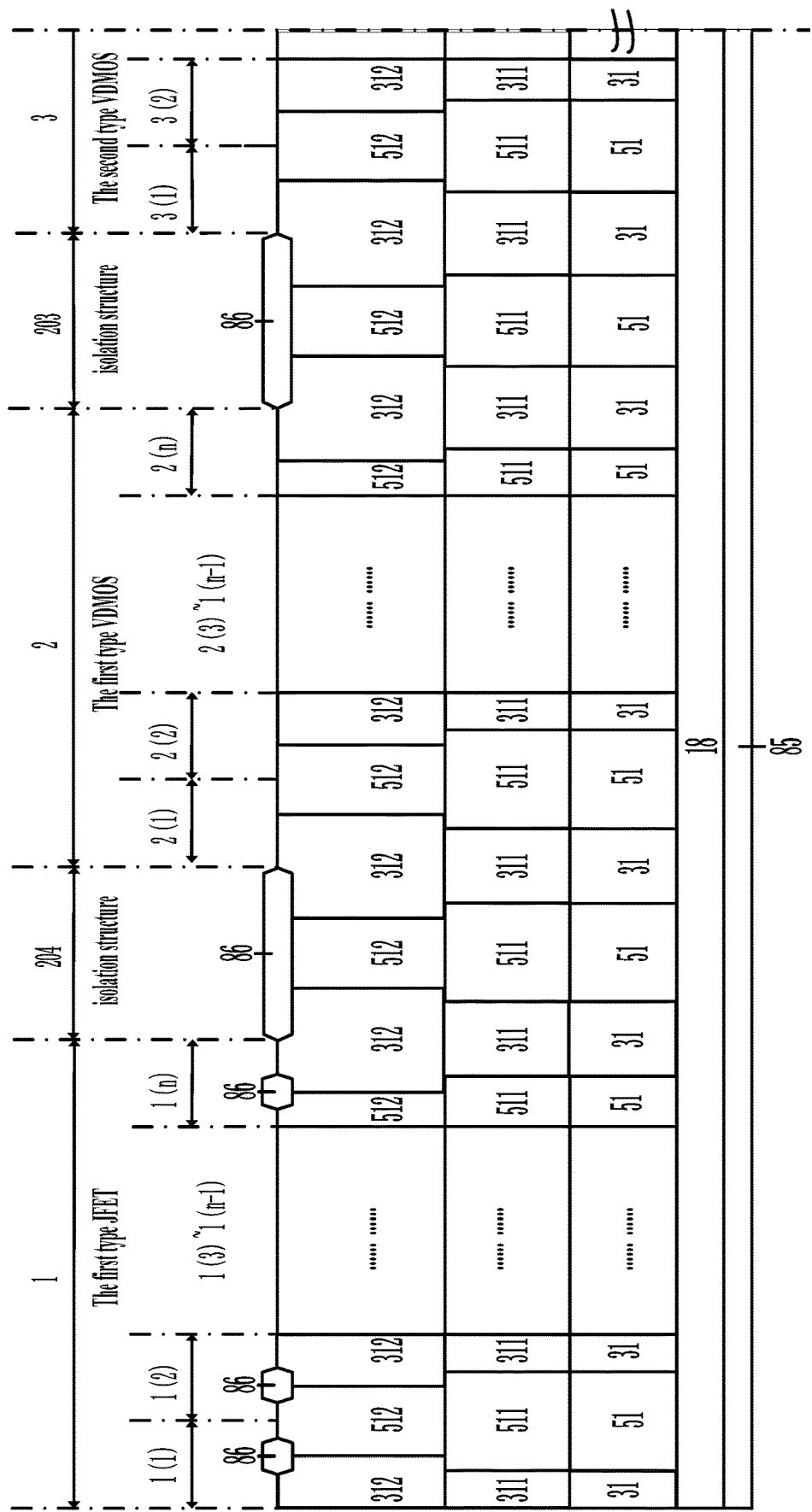
Figure 9:
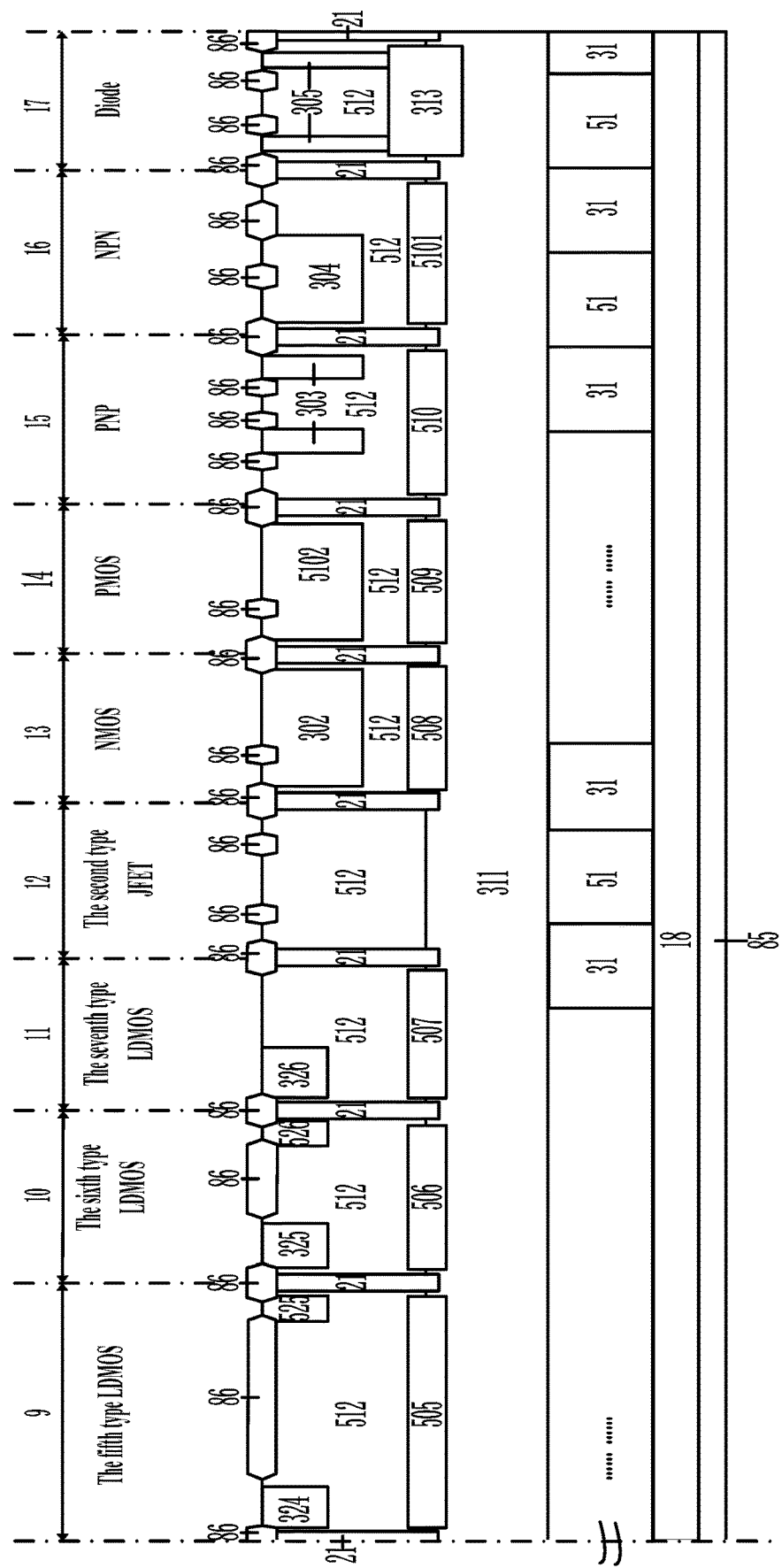
Figure 9:
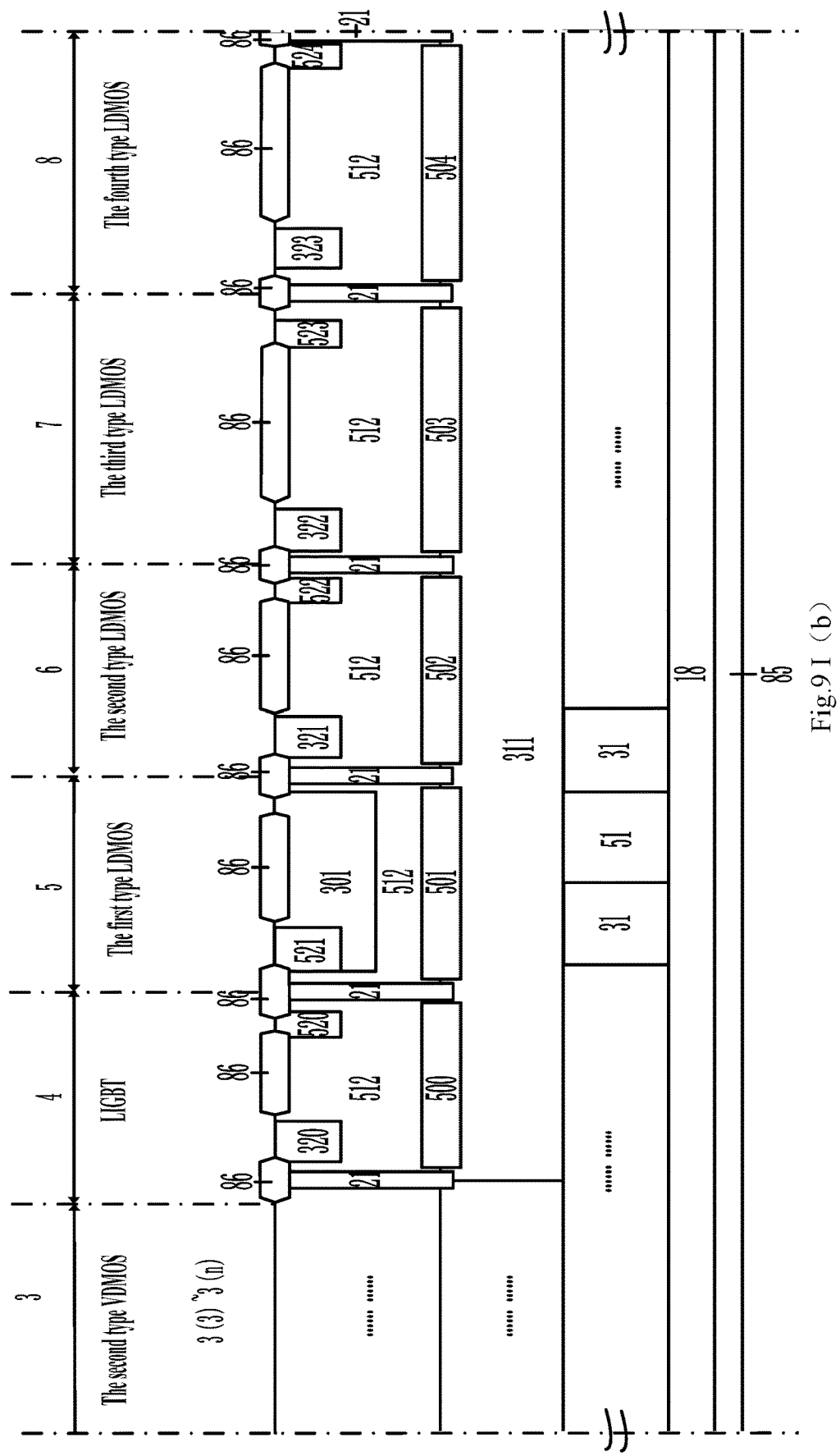
Figure 9:
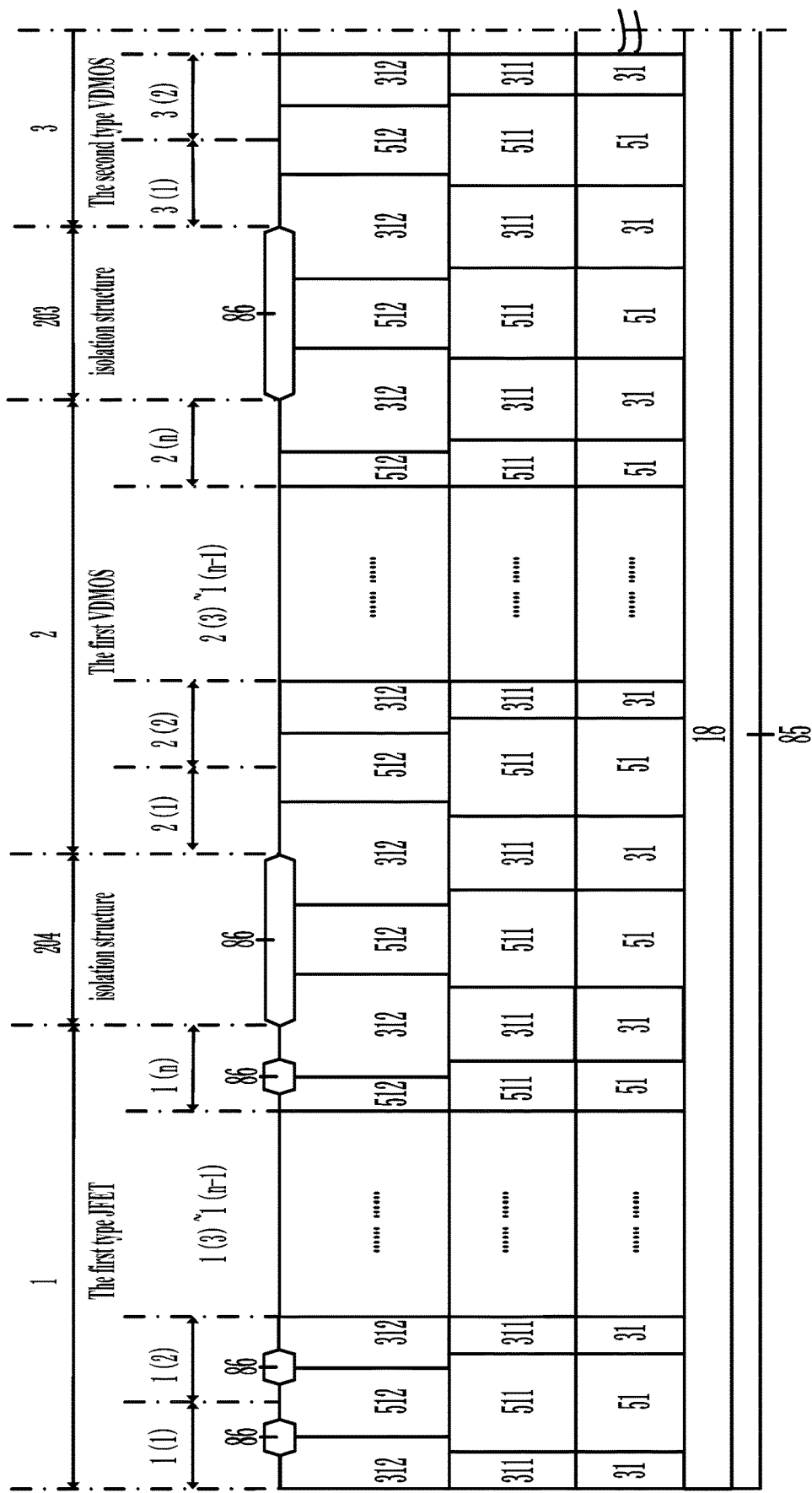
Figure 9:
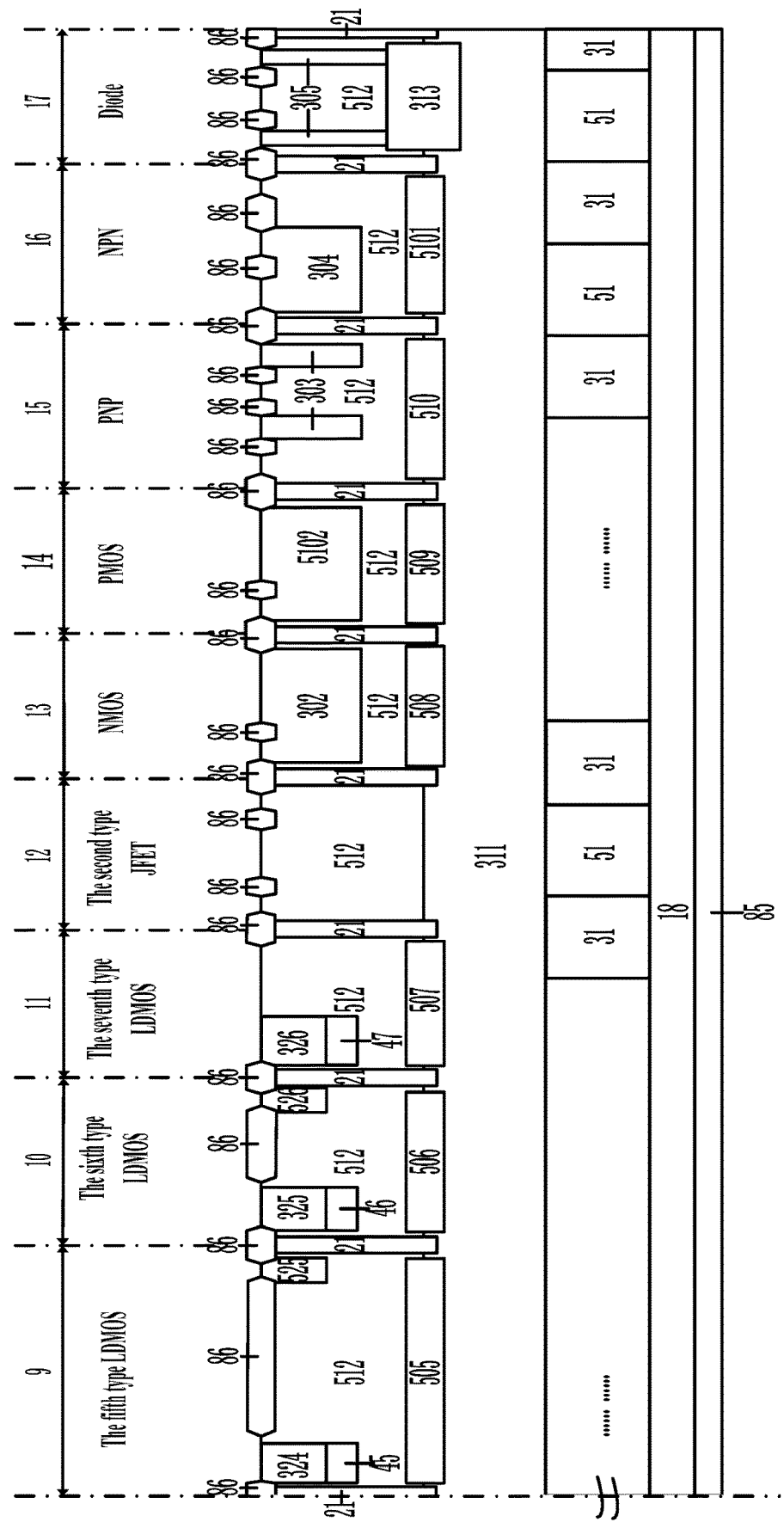
Figure 9:
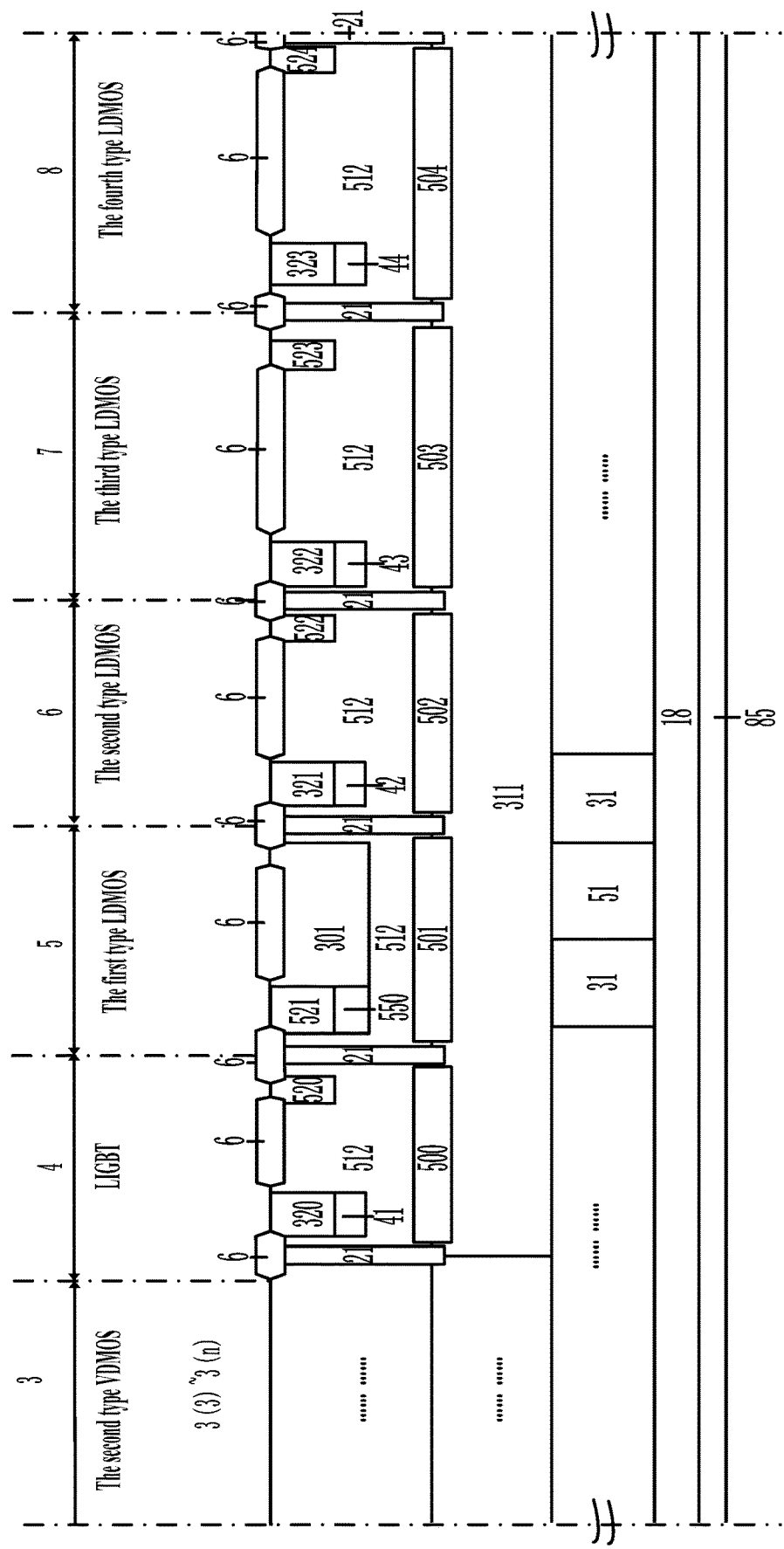
Figure 9:
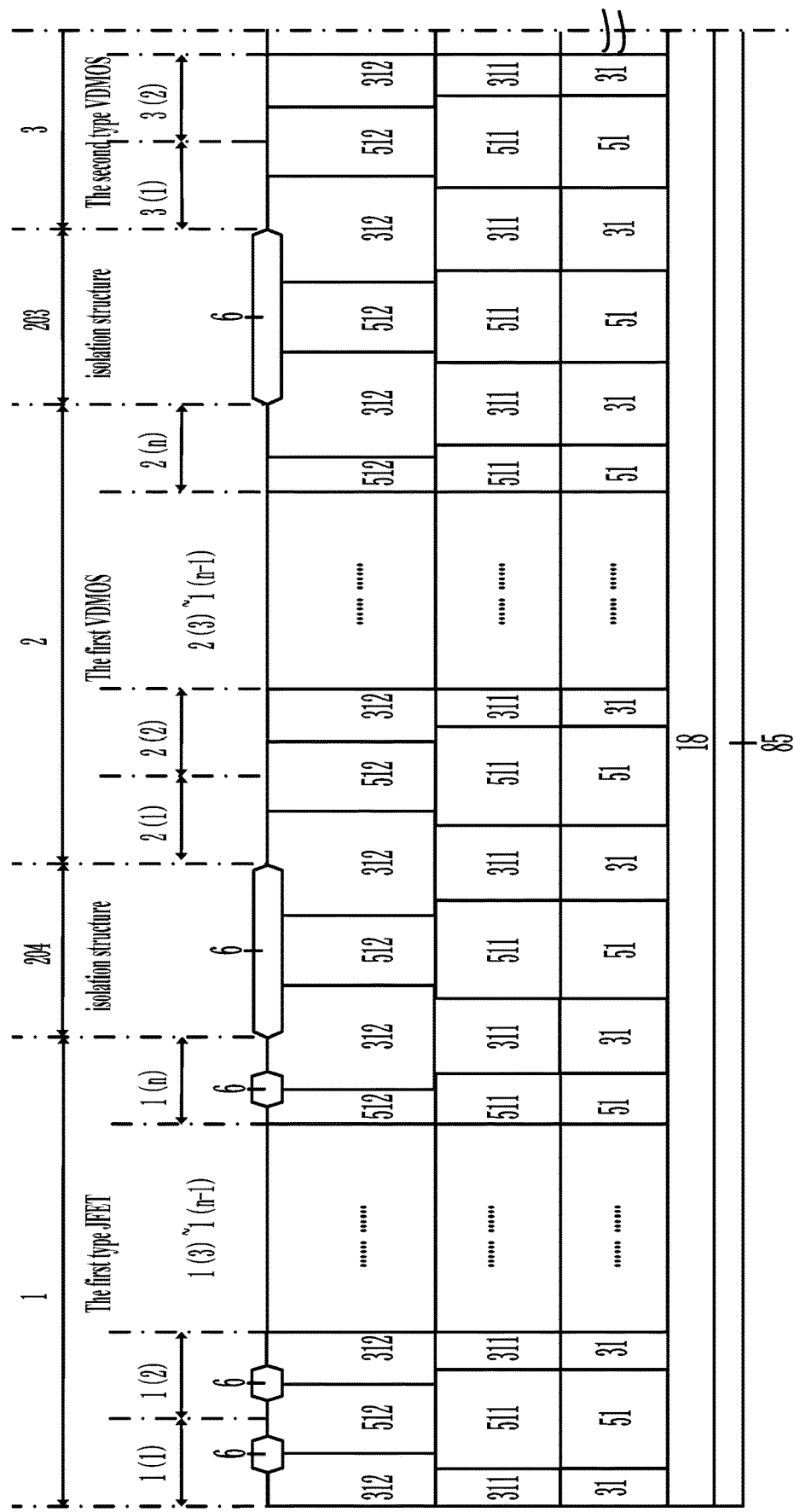
Figure 9:
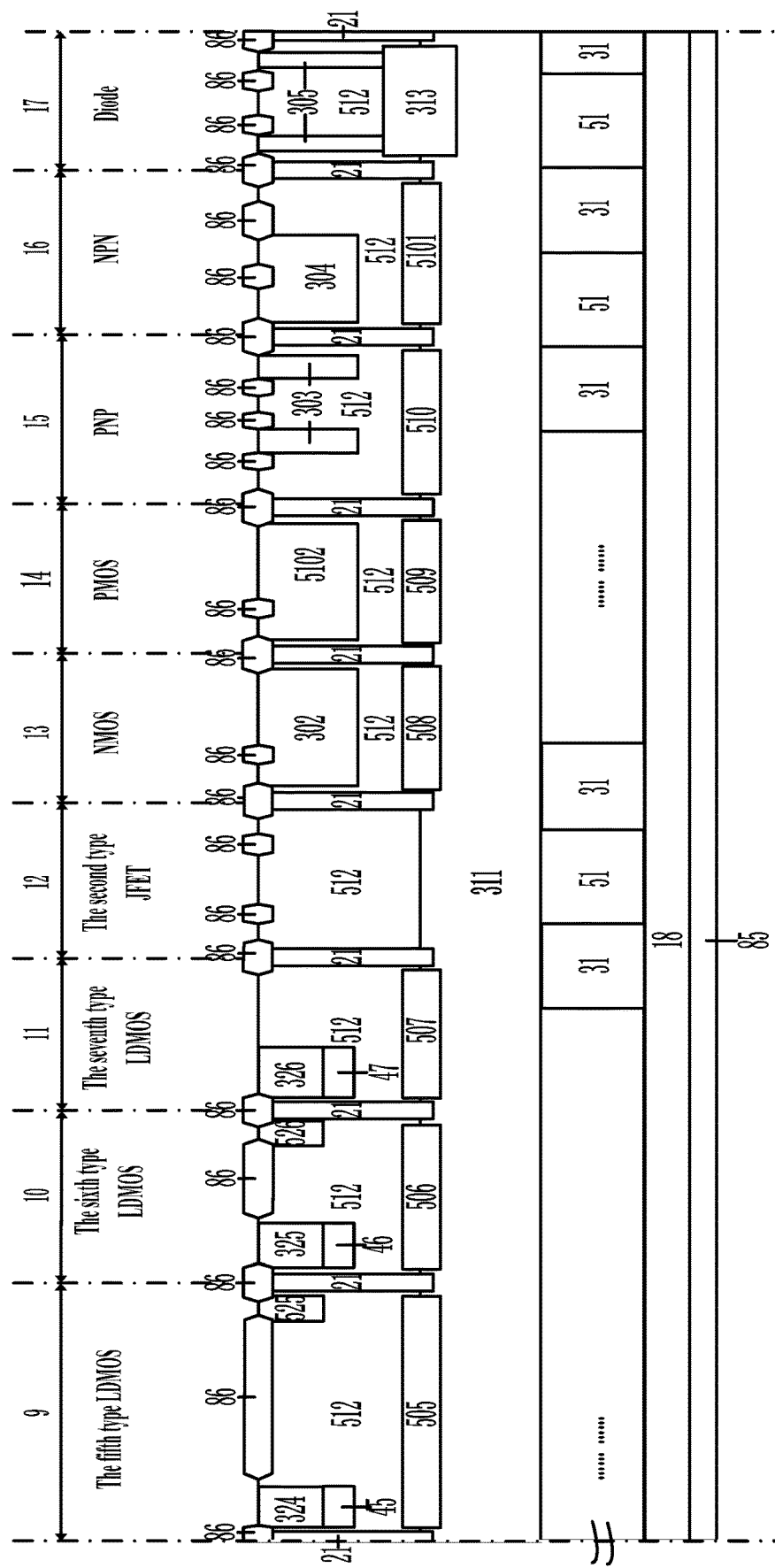
Figure 9:
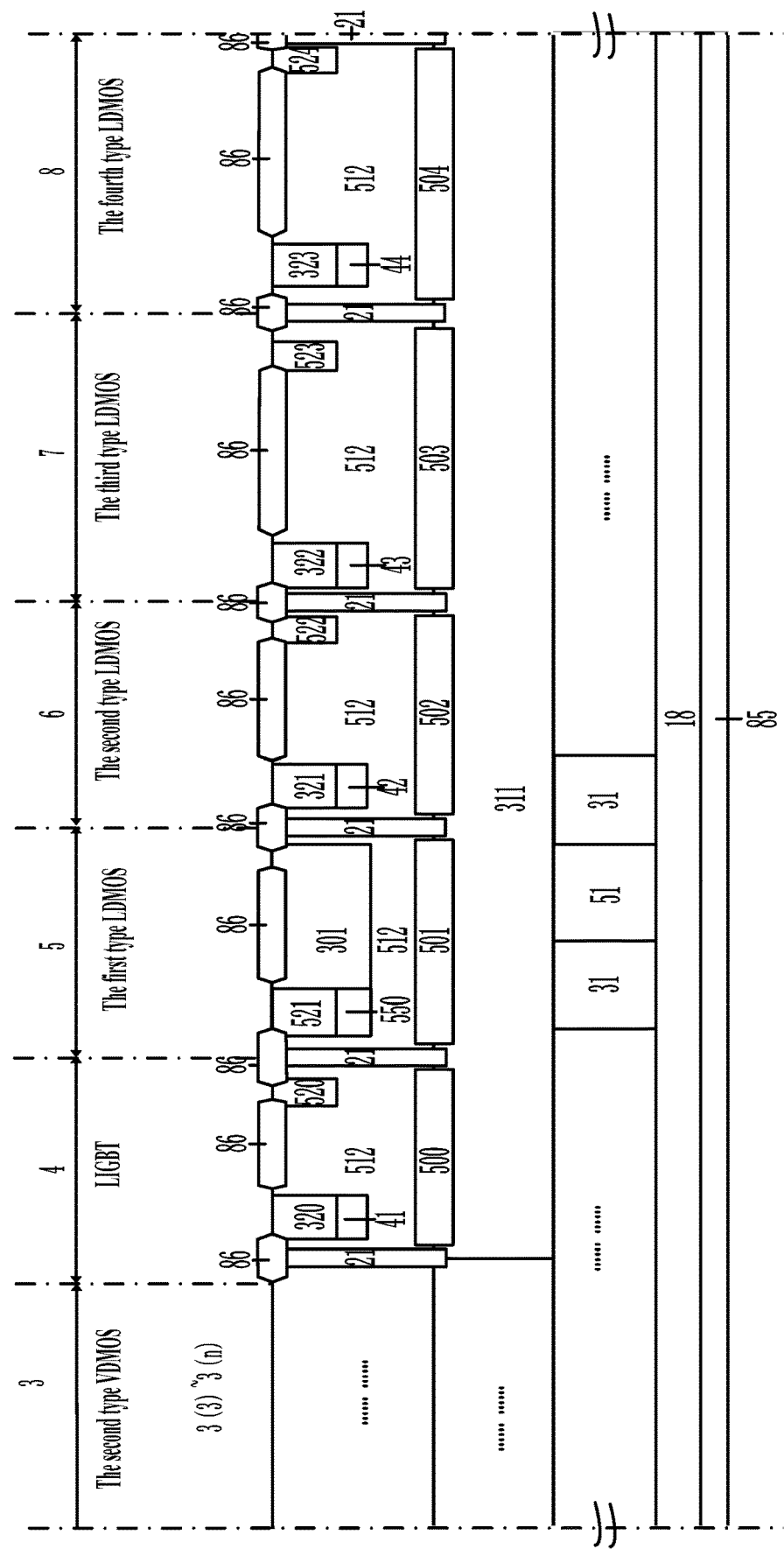
Figure 9:
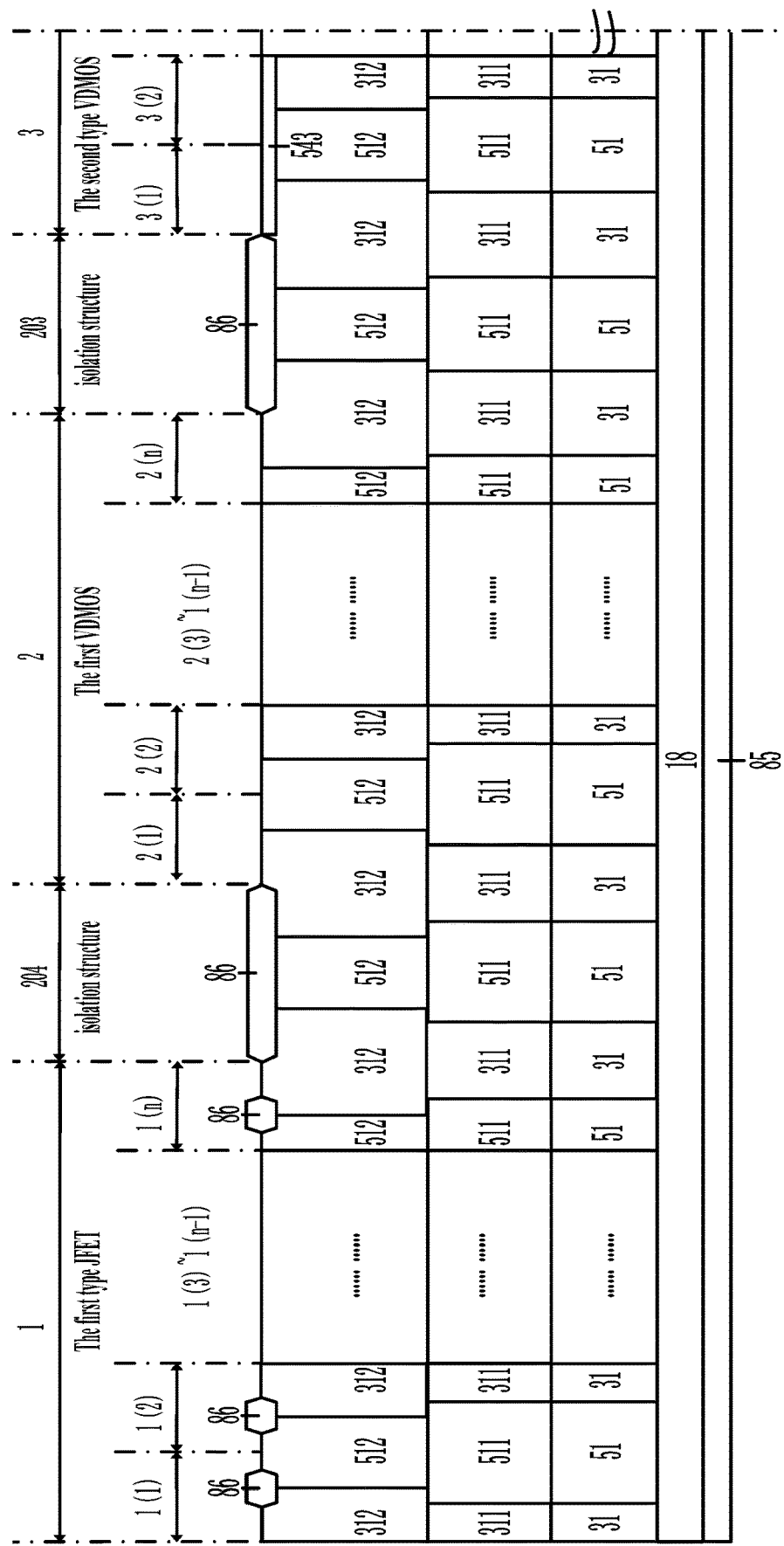
Figure 9:
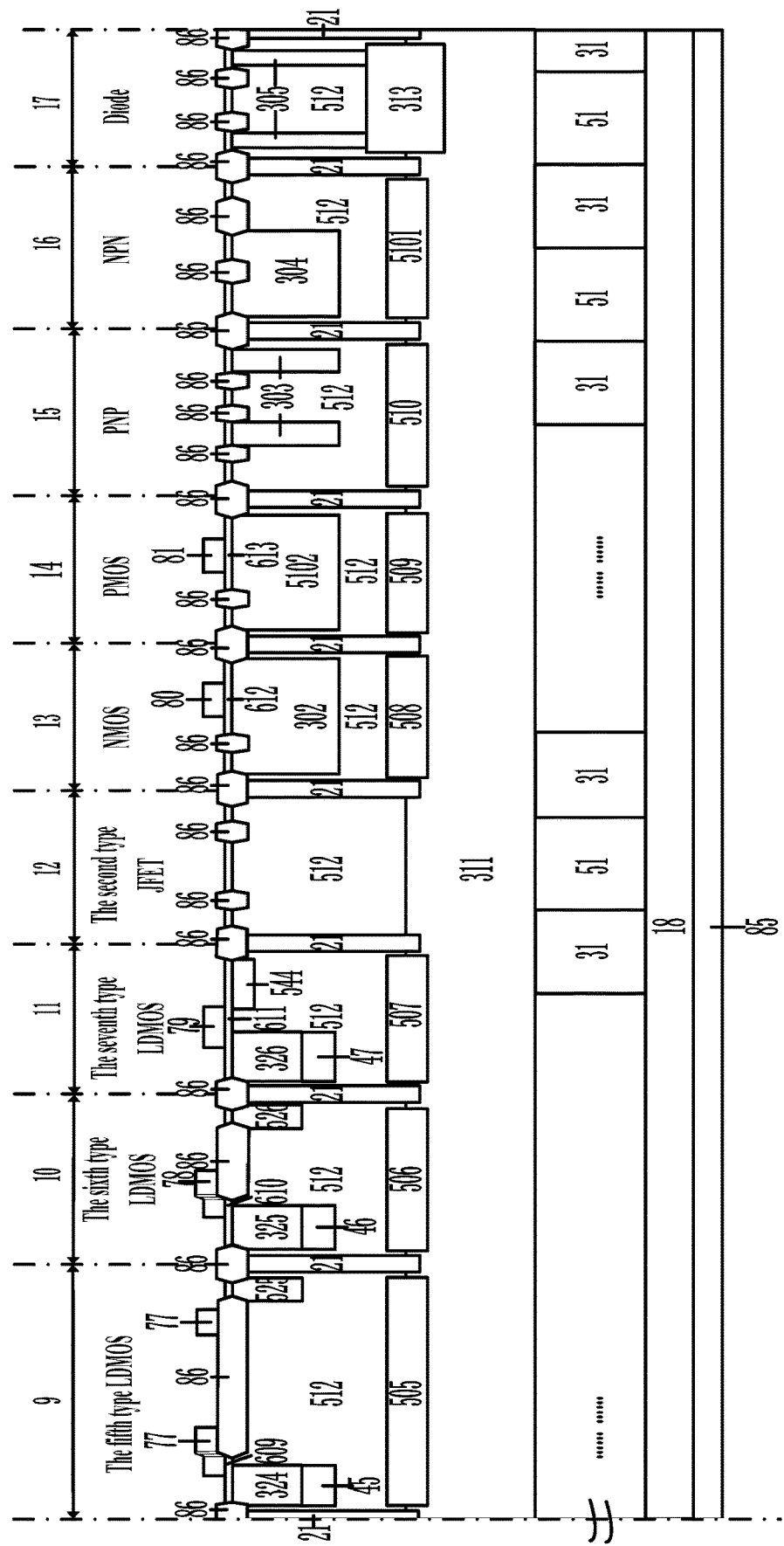
Figure 9:
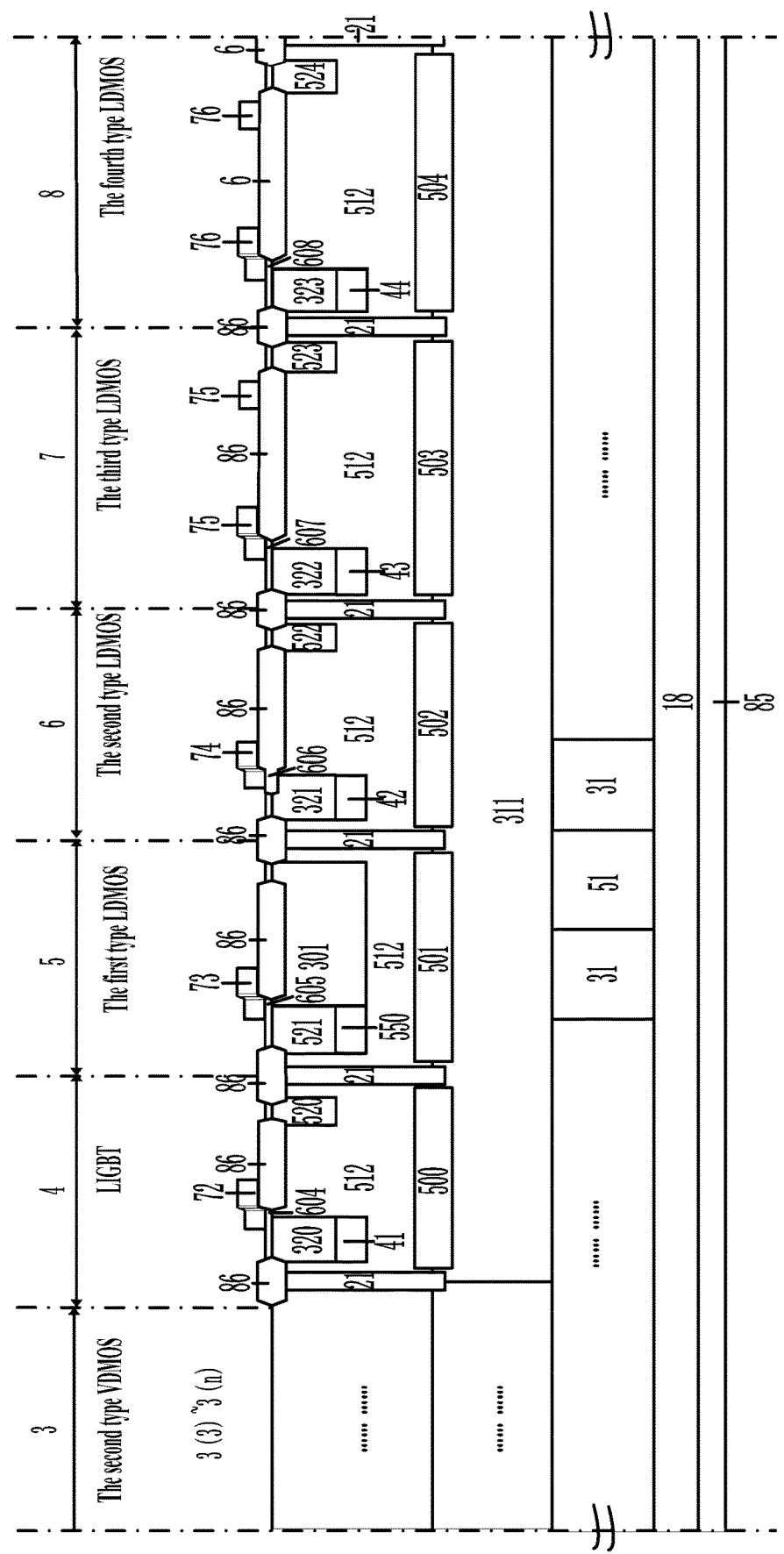
Figure 9:
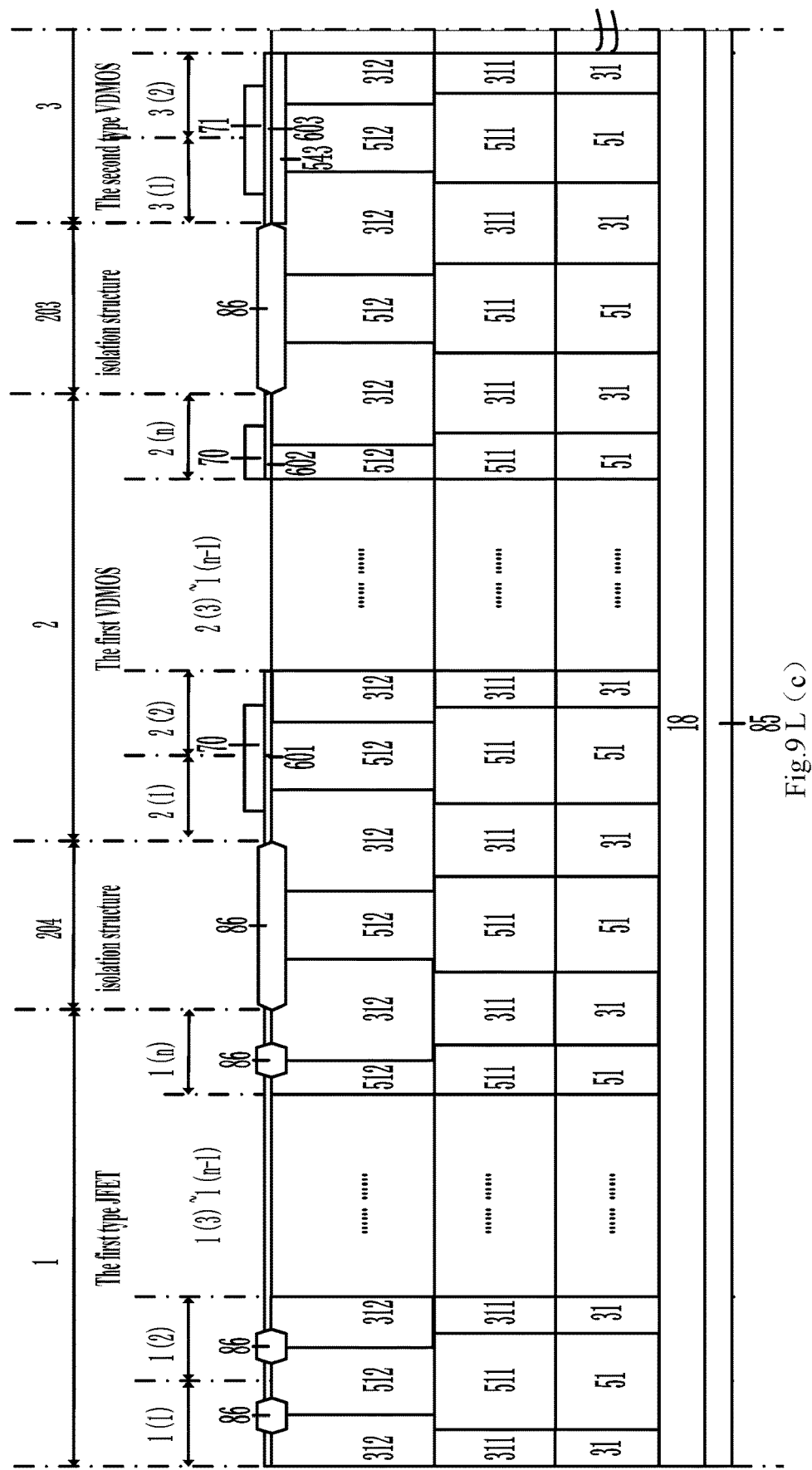
Figure 9:
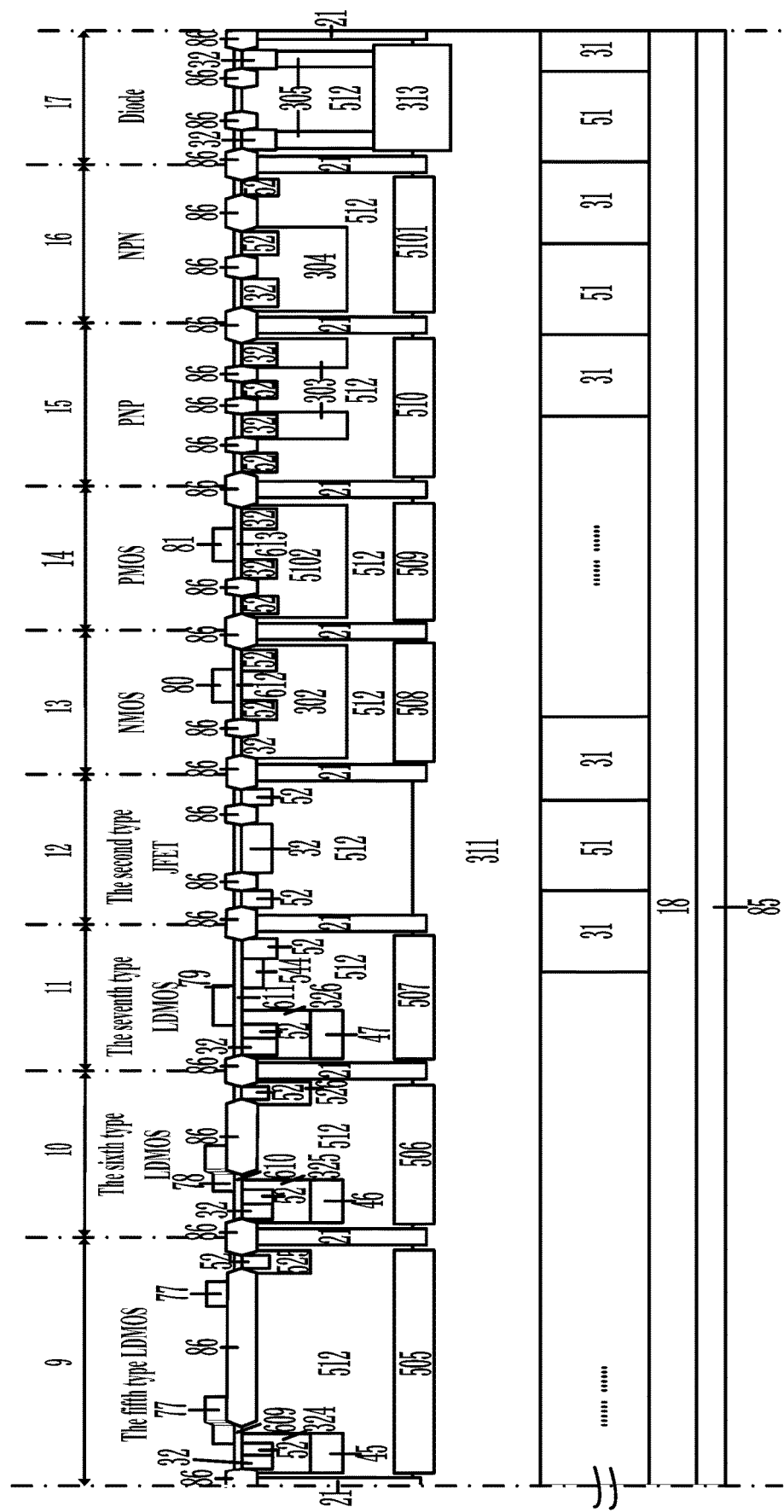
Figure 9:
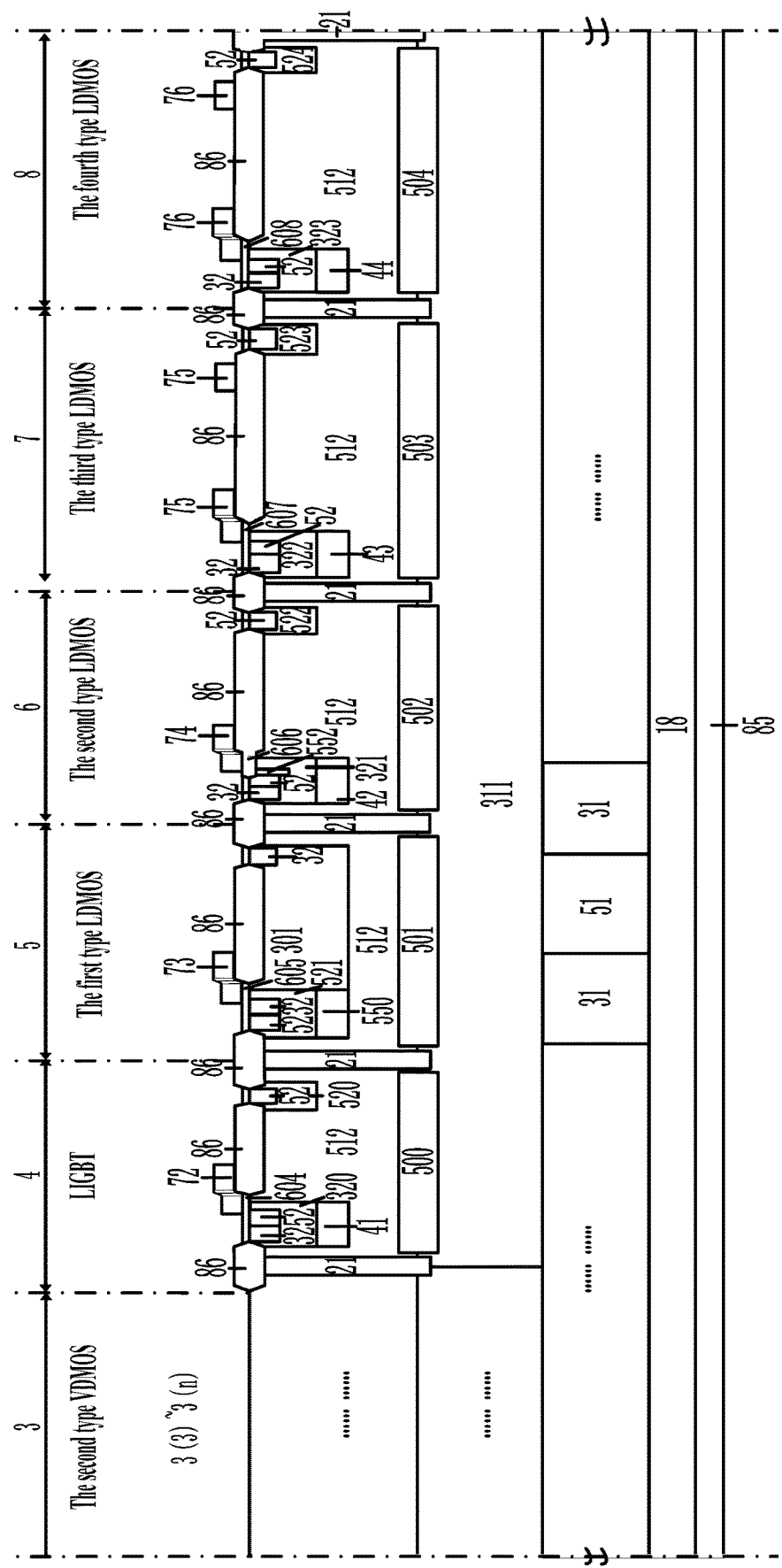
Figure 9:
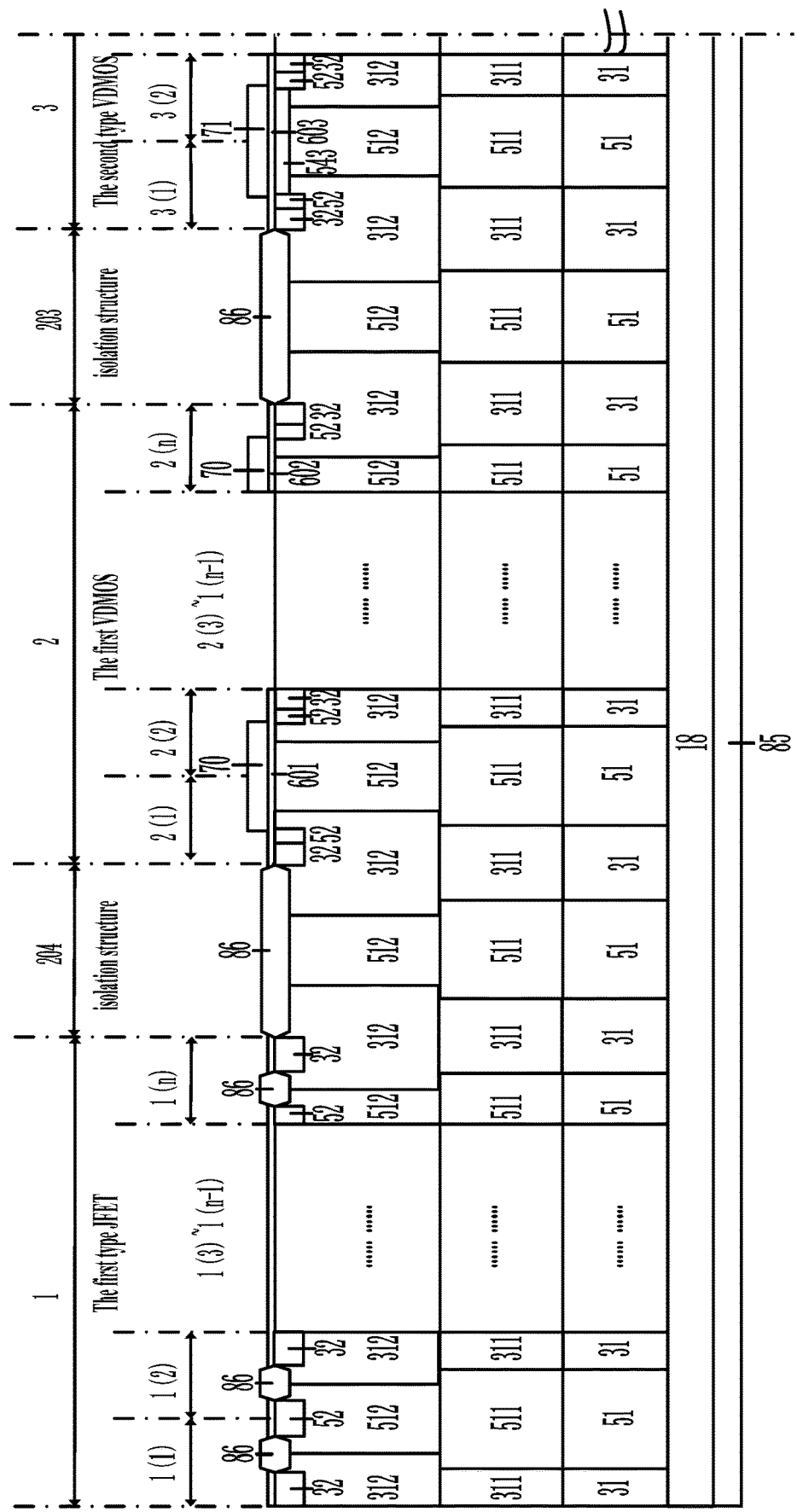
Figure 9:
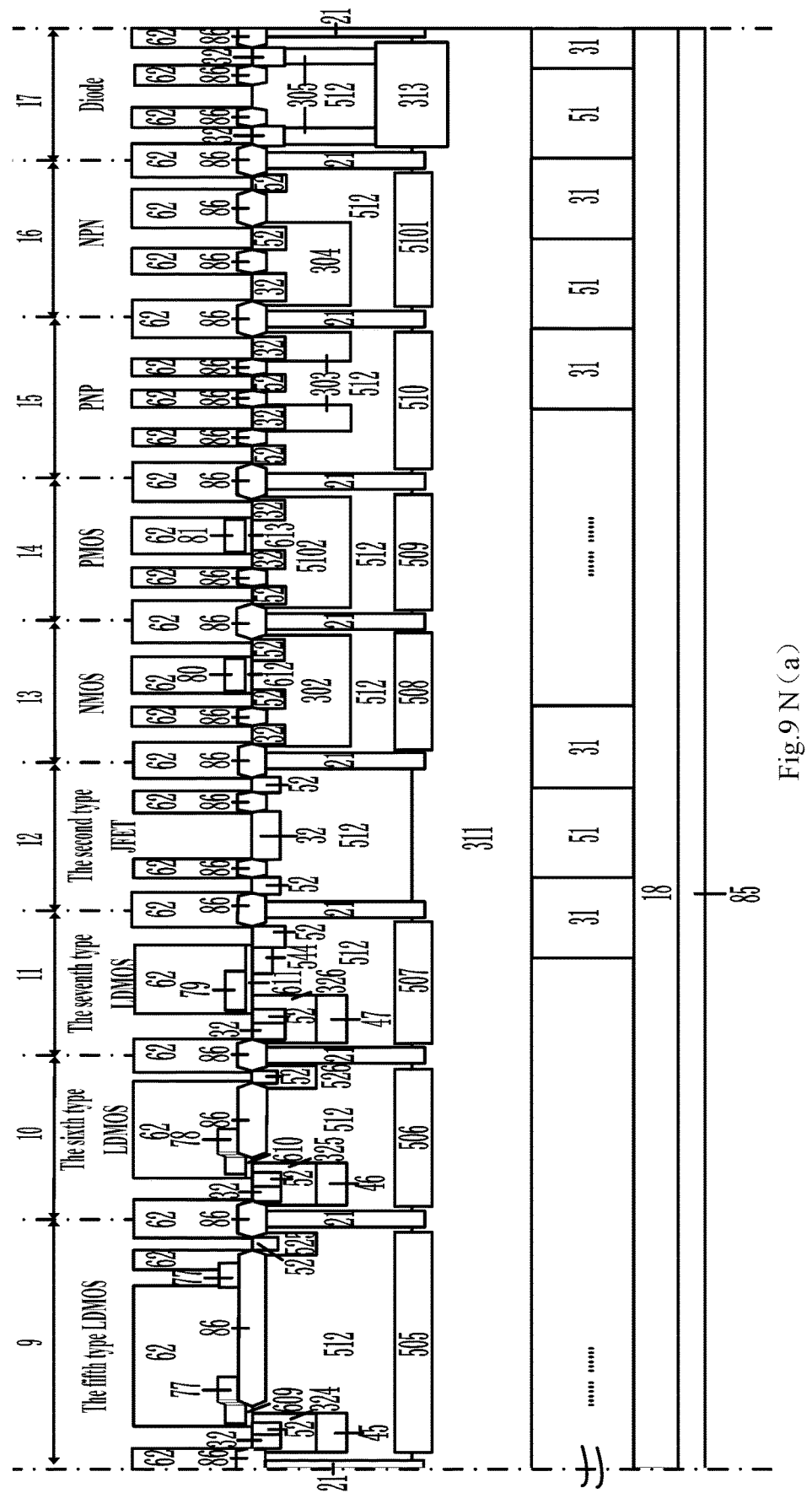
Figure 9:
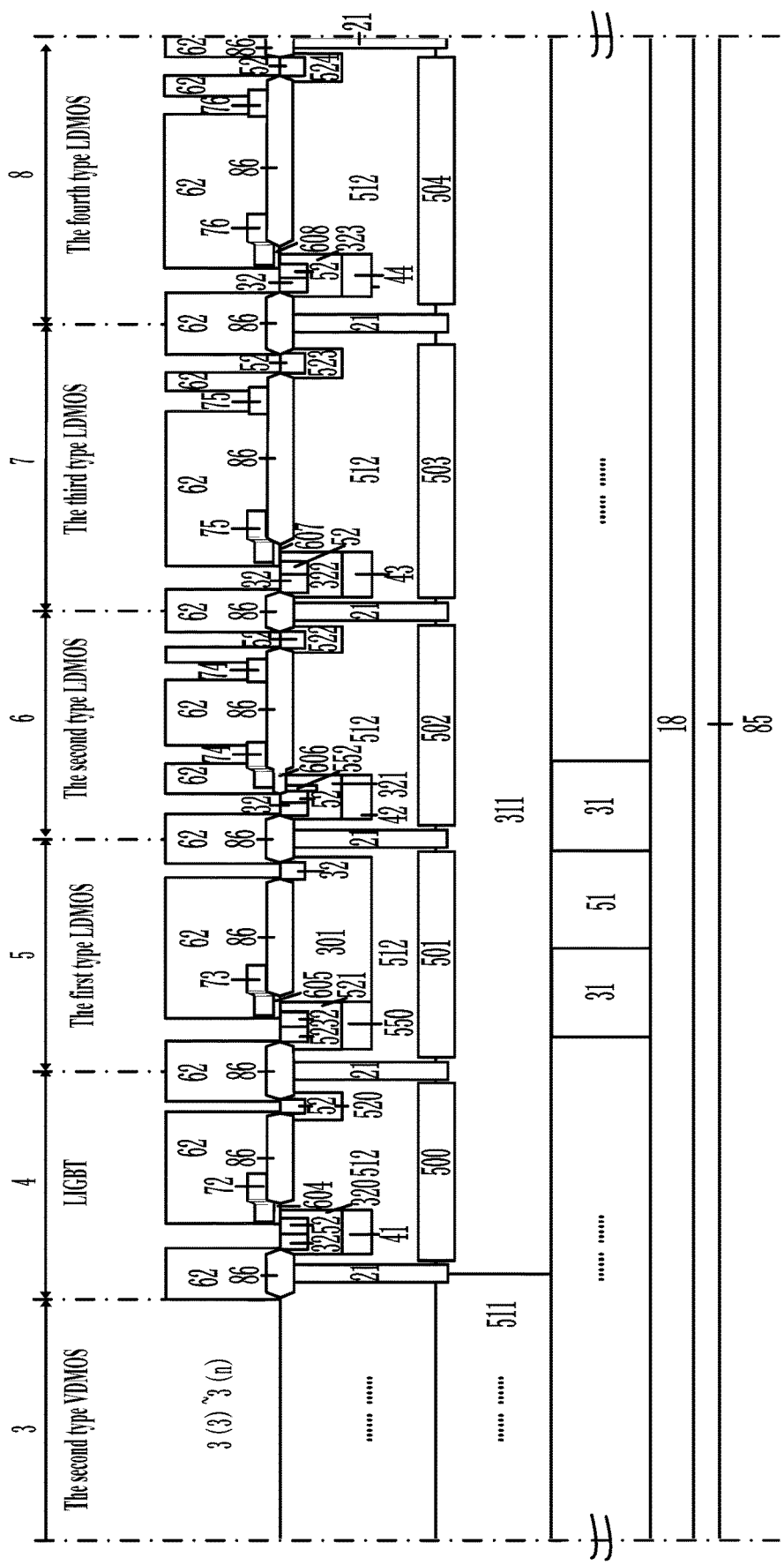
Figure 9:
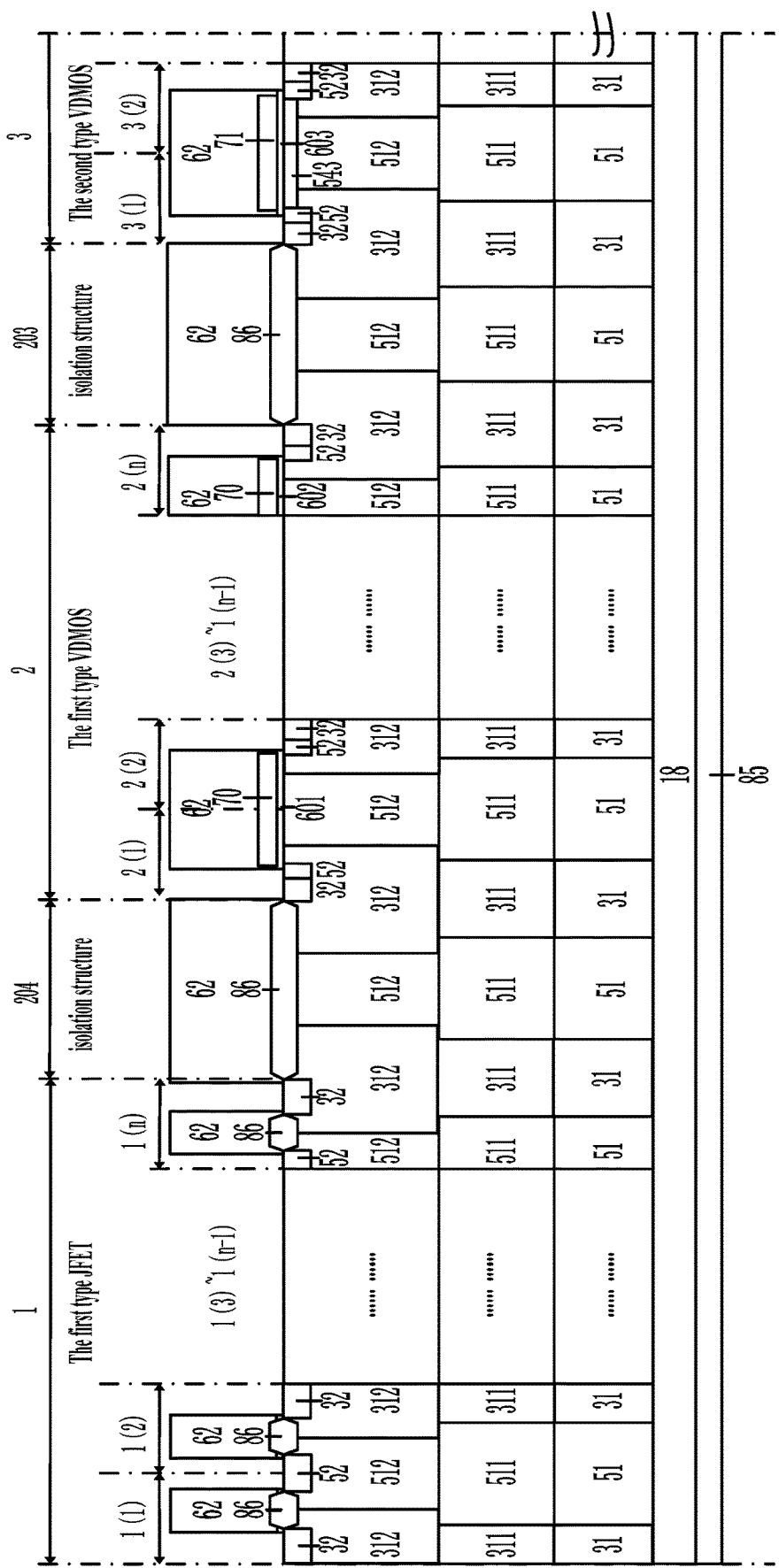
Figure 9O:
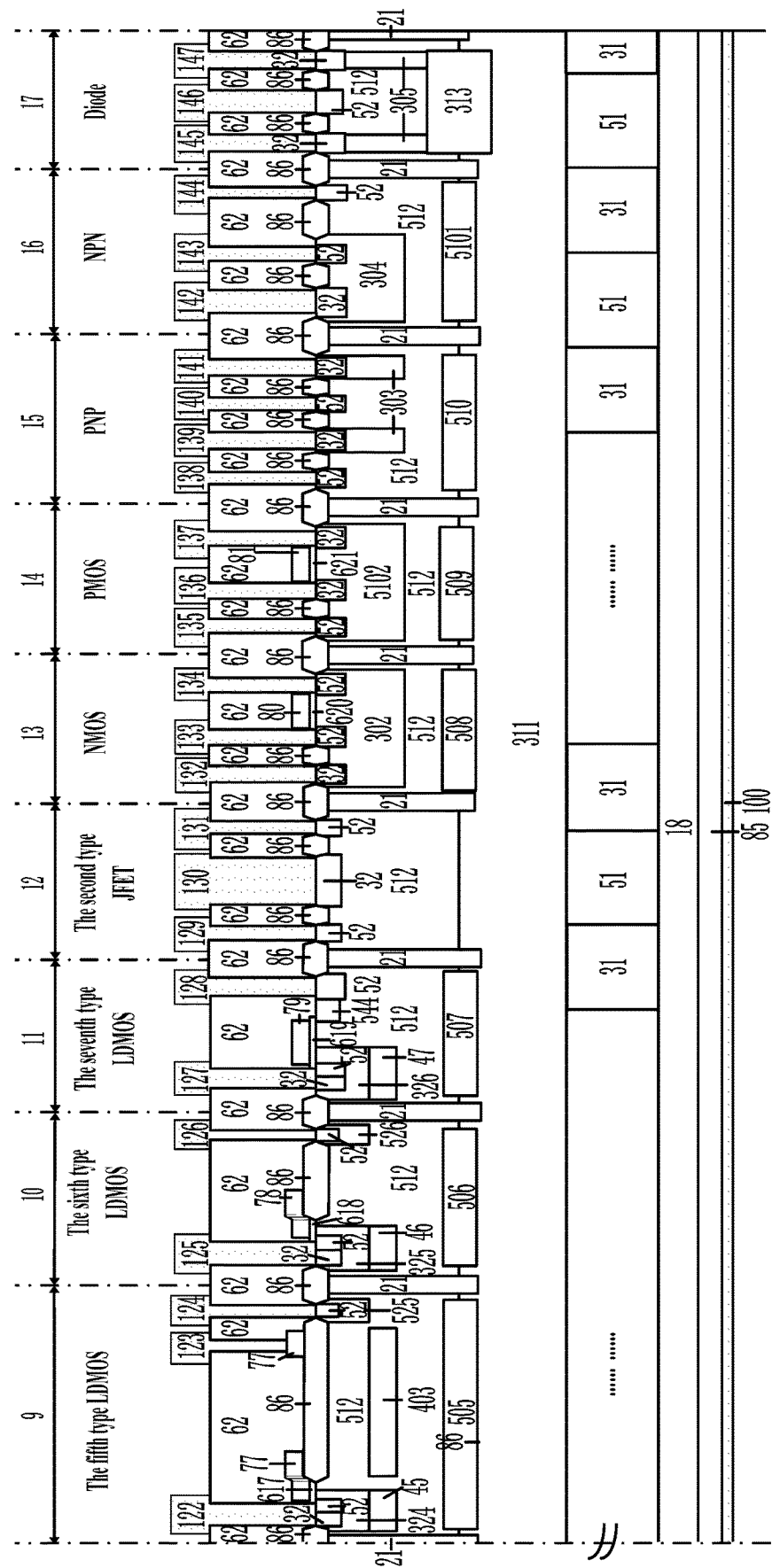
Figure 9:
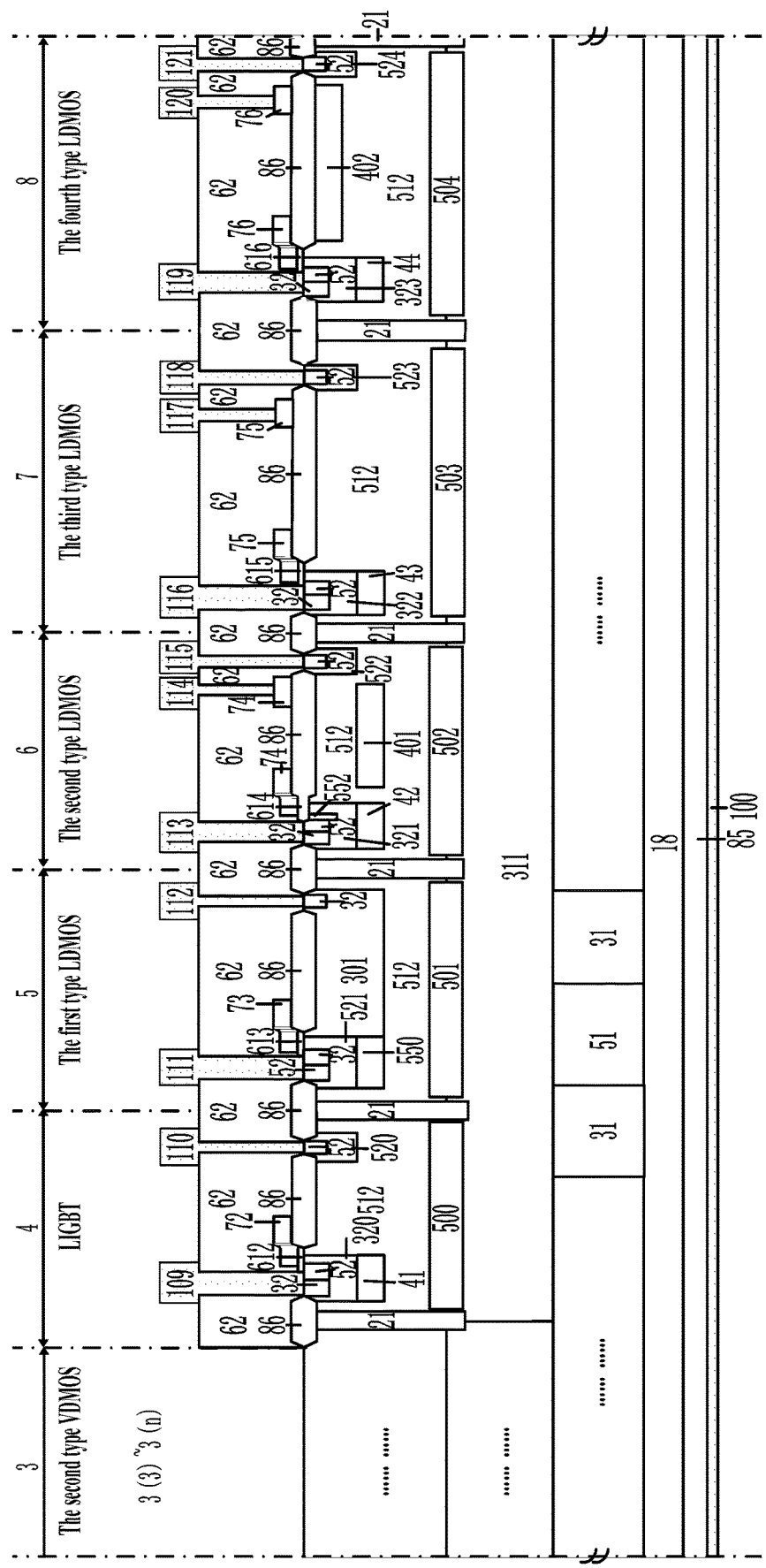
Figure 9:
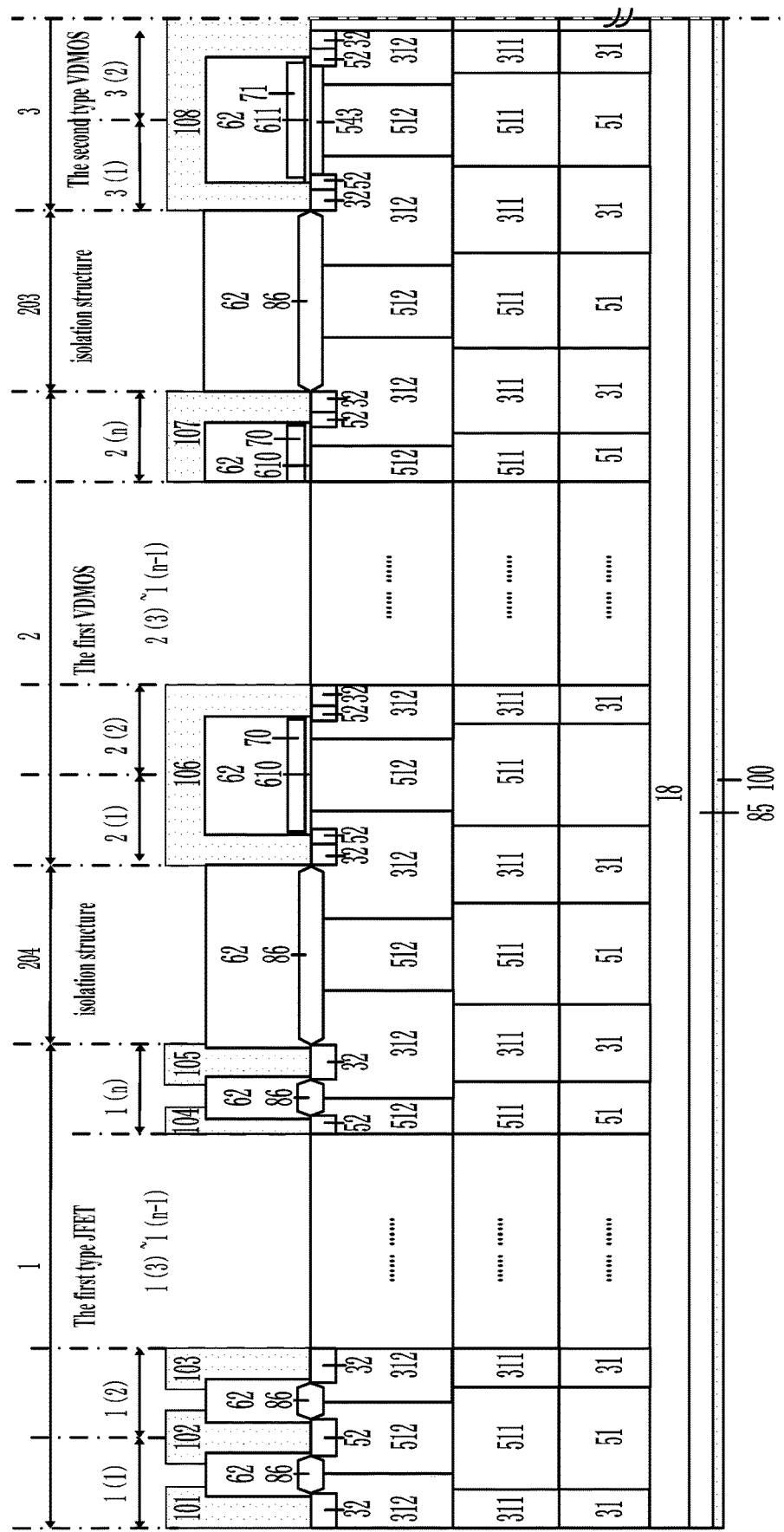

The embodiment provides a method for manufacturing a BCD semiconductor device as described, as shown in FIG. 9A~9O, including the follow steps:

Step 1: on the first doped type substrate 85, the first doped type epitaxial layer 512 is grown by epitaxy, the resistivity of the first doped type substrate 85 is 0.0001~0.01 ohm·cm, and the resistivity of the first doped type epitaxial layer 512 is 1~15 ohm·cm. As shown in FIG. 9A.

Step 2: on the upper of the first doped epitaxial layer 512, the first doped type pillar 51 is grown by epitaxy, and the resistivity of the first doped type pillar 51 is 1~15 ohm·cm. As shown in FIG. 9B.

Step 3: etching the first doped type pillar 51 to form a number of trench, and growing epitaxial layer to form the second doped type pillar 31. After refilling the trench, planarization the upper surface of the epitaxial layer. As shown in FIG. 9C.

Step 4: growing epitaxial layer to form the second doped epitaxial layer 311, implanting the impurities to form the third doped type pillar 511 at the region need to form the devices: the first type JFET 1, the first type of VDMOS devices 2 and the second type of VDMOS devices 3. Implanting the impurities to form the buried layer, which are the first doped type first buried layer 501 to the first doped type buried layer 5101 and the second doped type third buried layer 313 at the other region of the second doped epitaxial layer 311. The requirement for injection impurity of buried layer is heavy impurity ion to prevent the diffusion. As shown in FIG. 9D.

Step 5: growing epitaxial layer to form the first doped type epitaxial layer 512 at the upper surface of the second doped type epitaxial layer 311 and the third doped type pillar 511. As shown in FIG. 9E.

Step 6: implanting impurities to form the isolation pillar 21 and the second doped type body region 312 of the high voltage vertical device. As shown in FIG. 9F.

Step 7: driving in and thermal oxidation to form the field oxide layer 86, and opening the window of source area by etching. As shown in FIG. 9G.

Step 8: successively inject into impurity to form the first doped type of the deep well region 5102 of the low-voltage PMOS device 14 and the second doped type first deep well region 301 to the second doped type fifth deep well region 305. The second doped type first deep well region 301 to the second doped type fifth deep well region 305 belong to the first type of LDMOS device 5, the low voltage NMOS device 13, the PNP device 15, the NPN device 16, the diodes device 17, respectively. As shown in FIG. 9H.

Step 9: injecting impurities to form the first doped type first well region to seventh well region 520-526 of the device 4-11. Injecting impurities to form the well region of the device 4-11 on the right side the second type of VDMOS device 3. the device on the right side the second type of VDMOS device includes: the LIGBT device 4, the first type of LDMOS device 5, the second type of LDMOS device 6, the third type of LDMOS device 7, the fourth type of LDMOS device 8, the fifth type of LDMOS device 9, the sixth type of LDMOS device 10, the seventh type of LDMOS device 11. As shown in FIG. 9I.

Step 10: injecting impurities to form the first doped type falling field layer 550 of the the first type of LDMOS device 5. Inject impurities to form the second doped type of the first falling field layer to the seventh falling field layer 41-47 of the LKH3T device 4, the second type of LDMOS device 6, the third type of LDMOS device 7, the fourth type of LDMOS device 8, the fifth type of LDMOS device 9, the sixth type of LDMOS device 10, the seventh type of LDMOS device 11, respectively.

Step 11: injecting impurities to form the first lightly doped type depleted channel region 543 of the second type of VDMOS device 3 and the first doped type sustain voltage layer 544 of the seven type of device 11. As shown in FIG. 9K.

Step 12: forming gate oxide layer, polysilicon gate and polysilicon field plate, the polysilicon gate resistance is 10~40 ohm/square. As shown in FIG. 9L.

Step 13: injecting successively impurity to form the first heavily doped type source region 52 and the second heavily doped type source region 32, the dose of the impurity is 1e15 $cm^{-2}$~2e16 $cm^{-2}$. As shown in FIG. 9M.

Step 14: depositing dielectric material to form the dielectric layer 62. As shown in FIG. 9N.

Step 15: metallizing the metal electrodes, and forming the high voltage drain metal 100 on the back. As shown in FIG. 9O.

The abovementioned embodiment only demonstrates the principle and effect of the invention, and not the limitation of the invention. Any person familiar with the technology may modify or alter the embodiment without violating the spirit and scope of the invention. Therefore, any equivalent modification or alteration in the technical field of which the usual knowledge has been accomplished without graduation from the spirit and technical thought revealed by the invention shall remain covered by the claim for the right of the invention.

What is claimed:

1. A Bipolar-CMOS-DMOS (BCD) semiconductor device, comprising:
a first type of Junction Field-Effect Transistor (JFET) device, a first isolation structure, a first type of Vertical Double-diffusion Metal Oxide Semiconductor (VD-MOS) device, a second isolation structure, a second type of VDMOS device, a Lateral Insulated-Gate Bipolar Transistor (LIGBT) device, a first type of Laterally Diffused Metal Oxide Semiconductor (LDMOS) device, a second type of LDMOS device, a third type of LDMOS device, a fourth type of LDMOS device, a fifth type of LDMOS device, a sixth type of LDMOS device, a seventh type of LDMOS device, a second type of JFET device, a low-voltage N-channel Metal Oxide Semiconductor (NMOS) device, a low-voltage P-channel Metal Oxide Semiconductor(PMOS) device, a low-voltage PNP device, a low-voltage NPN device and a diode, wherein the first type of JFET device, the first isolation structure, the first type of VDMOS device, the second isolation structure, the second type of VDMOS device, the LIGBT device, the first type of LDMOS device, the second type of LDMOS device, the third type of LDMOS device, the fourth type of LDMOS device, the fifth type of LDMOS device, the sixth type of LDMOS device, the seventh type of LDMOS device, the second type of JFET device, the low-voltage NMOS device, the low-voltage PMOS device, the low-voltage PNP device, the low-voltage NPN device and the diode are integrated on a chip;
the first type of JFET device comprises a plurality of cells, wherein the plurality of first cells are directly formed on a first doped type substrate; a high voltage drain metal is located below the first doped type substrate; a drift region comprises a first doped type buffer region; a super junction located on the upper surface of the first doped type buffer region comprises a first part composed of a first doped type pillar and a second doped type pillar, and a second part composed of a third doped type pillar and a second doped type epitaxial layer; the first doped type pillar and the second doped type pillar are arranged periodically and intervally, the third doped type pillar and the second doped type epitaxial layer are arranged periodically and intervally; a first doped type epitaxial layer and a second doped type body region are located on an upper surface of the third doped type pillar and the second doped type epitaxial layer; a second heavily doped type source region is disposed on an upper surface of the second doped type body region; a first heavily doped type source region is disposed in a middle of the upper surface of the first doped type epitaxial layer; a field oxide layer is disposed between the first heavily doped type source region and the second heavily doped type source region; a dielectric layer covers the field oxide layer; a first electrode covers a first portion of the dielectric layer and an upper surface of the second heavily doped type source region; a second electrode covers a second portion of the dielectric layer and the upper surface of the first heavily doped type source region; the third electrode covers a third portion of the dielectric layer and the upper surface of the second heavily doped type source region; the fourth electrode covers a portion of the dielectric layer and the upper surface of the first heavily doped type source region; the fifth electrode covers a portion of the dielectric layer and the upper surface of the second heavily doped type source region;

the first type of VDMOS device comprises a plurality of cells, wherein the plurality of cells are directly formed on the first doped type substrate, the high voltage drain metal is located below the first doped type substrate; the drift region comprises a first doped type buffer region at the bottom and the super junction; the super junction comprises the first part composed of the first doped type pillar and the second doped type pillar and the second part composed of the third doped type pillar and the second doped type epitaxial layer; the first doped type pillar and the second doped type pillar are arranged periodically and intervally, the third doped type pillar and the second doped type epitaxial layer are arranged periodically and intervally; the first doped type epitaxial layer and the second doped type body region are located on the upper surface of the third doped type pillar and the second doped type epitaxial layer; the second heavily doped type source region and the first heavily doped type source region are located on the second doped type body region; a bottom of a first type of gate oxide layer is bridged between two first heavily doped type source regions; the two first heavily doped type source regions are located in two adjacent second doped type body regions respectively; a first type of polysilicon layer connects the first heavily doped type source region and the first heavily doped type source region located on the two adjacent second doped type body region; the dielectric layer covers a portion of the first type of gate oxide layer and the first type of polysilicon layer; the first type metal layer covers the dielectric layer and the exposed first heavily doped type source region and the upper surface of the second heavily doped type source region; the second type metal layer covers the dielectric layer and the first heavily doped type source region and the upper surface of the second heavily doped type source region;

the first isolation structure is located between a last cell of the first type JFET device and a first cell of the first type of VDMOS device, and placed directly in the first doped type substrate; a bottom of the first doped type substrate is the high voltage drain metal; the drift region comprises a first doped type buffer region at the bottom and the super junction on the upper surface of the first doped type buffer region; the super junction comprises the first part composed of the first doped type pillar and the second doped type pillar on the first part, the second part composed of the third doped type pillar and the second doped type epitaxial layer; the first doped type pillar and the second doped type pillar are arranged periodically and intervally; the third doped type pillar and the second doped type epitaxial layer are arranged periodically and intervally; the first doped type epitaxial layer and the second doped type body region are located on the upper surface of the third doped type pillar and the second doped type epitaxial layer; a half of the two adjacent second doped type body regions belongs to the first isolation structure; a pillar structure composed of the second doped type pillar and the second doped type epitaxial layer extends lengthways through the drift region; an upper surface of the half of the two second doped type body region belonging to the first isolation structure is covered with the field oxide layer; the field oxide layer covers an entire upper surface of the first isolation structure the dielectric layer covers the field oxide layer;

the second type VDMOS device comprises the plurality of cells, the plurality of cells are directly formed on the first doped type substrate; the high voltage drain metal is located below the first doped type substrate; the drift region comprises a first doped type buffer region and the super junction on the first doped type buffer region; the super junction comprises the first part composed of the first doped type pillar and the second doped type pillar, and the second part composed of the third doped type pillar and the second doped type epitaxial layer; the first doped type pillar and the second doped type pillar are arranged periodically and intervally, the third doped type pillar and the second doped type epitaxial layer are arranged periodically and intervally; the first doped type epitaxial layer and the second doped type body region are located on the third doped type pillar and an upper surface of the second doped type epitaxial layer; the second heavily doped type source region and the first heavily doped type source region are located on the second doped type body region; the first lightly doped type depleted channel region is disposed between the first heavily doped type source region and the first heavily doped type source region embedded in the two adjacent second doped type body region; a bottom of a second type of gate oxide layer is bridged between two first heavily doped type source regions in the two adjacent second doped type body region; two first heavily doped type source region embedded in the two adjacent second doped type body region respectively are connected by a second type of polysilicon layer; the dielectric layer covers a portion of the second type of gate oxide layer and the second type of polysilicon layer; the third type of metal layer covers the dielectric layer and the first heavily doped type source region and the upper surface of the second heavily doped type source region;

the second isolation structure is located between the last cell of the first type of VDMOS device and the first cell of the second type of VDMOS device, and formed directly on the first doped type substrate; the high voltage drain metal is located below the first doped type substrate; the drift region comprises a first doped type buffer region and the super junction; the super junction comprises a first part and a second part, wherein the second part is on the first part, the first part composed of the first doped type pillar and the second doped type pillar, and the second part composed of the third doped type pillar and the second doped type epitaxial layer; the first doped type pillar and the second doped type pillar are arranged periodically and intervally; the third doped type pillar and the second doped type epitaxial layer are arranged periodically and intervally; the first doped type epitaxial layer and the second doped type body region are located on the upper surface of the third doped type pillar and the second doped type epitaxial layer; a half of each of the two adjacent second doped type body regions belongs to the second isolation structure; a pillar structure of the super junction composed of a second doped type pillar and a second doped type epitaxial layer extends through the entire drift region; the upper surface of the half of the two adjacent second doped type body region is covered with the field oxide layer; the upper surface of the second doped type body region belonging to the second isolation structure is covered with the field oxide layer; the field oxide layer covers the entire upper surface of the second isolation structure; the dielectric layer covers the field oxide layer;

the LIGBT device, the first type of LDMOS device, the second type of LDMOS device, the third type of LDMOS device, the fourth type of LDMOS device, the fifth type of LDMOS device, the sixth type of LDMOS device, the seventh type of LDMOS device, the second type of JFET device, the low voltage NMOS device, the low voltage PMOS device, the low voltage PNP, the low voltage NPN device and the diode are located at a right side of the last cell of the second type VDMOS device respectively, and are located in the second doped type epitaxial layer; the second doped type epitaxial layer are located on the first doped type pillar and the second doped type pillar; the first doped type pillar and the second doped type pillar are arranged periodically and intervally; an isolation strip comprises three isolation pillars, the field oxide layer on an upper surface of the isolation pillar, and the dielectric layer covered on an upper surface of the field oxide layer; the LIGBT device, the first type of LDMOS device, the second type of LDMOS device, the third type of LDMOS device, the fourth type of LDMOS device, the fifth of LDMOS device, the sixth type of LDMOS device, the seventh type of LDMOS device, the second type of JFET device, the low voltage NMOS device, the low voltage PMOS device, the low voltage PNP, the low voltage NPN device and the diode are separated from each other by the isolation strip;

the LIGBT device is located between two adjacent isolation strips on the right side of the last cell of the second type VDMOS device; the field oxide layer is on the upper surface of the isolation pillar; the dielectric layer covers the upper surface of the field oxide layer; a first doped type buried layer is located on the upper surface of the second doped type epitaxial layer; the first doped type epitaxial layer is located on the first doped type buried layer between two adjacent isolation pillars; a second doped type well region is disposed on a left side of the first doped type epitaxial layer; a second doped type of a first falling field layer is underneath and tangent to the second doped type well region; a pair tangent of the first heavily doped type source region and the second heavily doped type source region near the upper surface are located in the second doped type well region; the first doped type first well region is disposed on a right side of the first doped type epitaxial layer; the first heavily doped type source region is disposed at a middle portion near an upper surface of the first doped type first well region; the first doped type epitaxial layer is located between the first doped type first well region and the second doped type well region; the field oxide layer covers the upper surface of the first doped type epitaxial layer; the field oxide layer is apart from the second doped type well region by a certain distance; a third type of gate oxide layer connects a left boundary of the first heavy doped type source region and the field oxide layer located on an upper surface of the second doped type well region; the third type of gate oxide layer is partially covered or tangent to a right boundary of the first heavily doped type source region; an upper surface of the third type gate oxide layer is covered with a third type polysilicon layer; a left of the third type polysilicon layer is tangent or does not extend to the left boundary of the third type gate oxide layer; the third type polysilicon layer is covered or tangent to a right boundary of the first heavily doped type source region; the field oxide layer is partially covered with the right side of the third type polysilicon layer; an exposed part of the third type of gate oxide and a surface of the third type of polysilicon layer, an exposed surface of field oxide layer are covered with the dielectric layer, respectively; a surface of the first heavily doped type source region and the second heavily doped type source region are partially covered with a source metal; the first heavily doped type source region nearly located on a middle of the upper surface of the first doped type first well region is covered with a drain metal;

the first type of LDMOS device is located on the right side of the LIGBT device and separated from the adjacent LIGBT device by isolation strips; the field oxide layer is on the upper surface of the isolation pillar, the upper surface of the field oxide layer is covered with the dielectric layer; the first type of LDMOS device is located in the second doped type epitaxial layer; a first doped type first buried layer is disposed at a partial upper surface of the second doped type epitaxial layer; the first doped type epitaxial layer is located on the first doped type first buried layer and located between the two adjacent isolation pillar; a first doped type of a first deep well region is disposed on the upper surface of the first doped type epitaxial layer; a first doped type second well region is disposed on a left side of a second doped type of the first deep well region; a first doped type falling field layer is located directly below the first doped type second well region; the first heavily doped type source region is located nearly in an upper surface of the first doped type second well region, and the second heavily doped type source region is tangential to the first heavily doped type source region; the second heavily doped type source region is disposed at a right side of upper surface of the second doped type of the first deep well region; a partial field oxide layer is located at an upper surface of the second doped type of the first deep well region; the field oxide layer is at a certain distance away from the first doped type of the second well region; a fourth type of gate oxide layer partially covers or is tangent to the right border of the second heavily doped type source region, and is connected to the second heavily doped type source region and a left boundary of the field oxide layer at the upper surface of the first doped type second well region; the fourth type of gate oxide layer is tangent to or does not extend to a left boundary of the second heavily doped type source region; an upper surface of the fourth type of gate oxide layer is covered with a fourth type of polysilicon layer; a right side of the fourth type of polysilicon layer covers a portion of the field oxide layer; the fourth type of polysilicon layer also covers or is tangent to a right boundary of the second heavily doped type source region; an exposed portion of the fourth type of gate oxide layer, the upper surface of the fourth type of polysilicon layer, and the exposed upper surface of the field oxide layer are covered with the dielectric layer; the first heavily doped type source region and the second heavily doped type source region partially covered with a first type of source metal; the upper surface of the second heavily doped type source region located in a middle near the upper surface of the second doped type of the first deep well region covered with a first type of drain metal;

the second type of LDMOS device are separated from the first type LDMOS device by isolation strips; a first doped type of a second buried layer of the second type of LDMOS device is located at a portion of the upper surface of the second doped type epitaxial layer; the first doped type epitaxial layer is located above the first doped type of the second buried layer; the second doped type of the first buried layer is located directly above the first doped type of the second buried layer; the second doped type of the first well region is disposed on a left side of an upper portion of the first doped type epitaxial layer; a second doped type of a second falling field layer is located directly below the second doped type of the first well region, and is tangent to the second doped type of the first well region; the first doped type of a third well region is disposed on the right side of the first doped type epitaxial layer, and the first heavily doped type source region is disposed near an upper surface of the first doped type of the third well region; the first doped type field region is disposed on the right side of the first heavily doped type source region; a certain distance between the field oxide layer and the second doped type of the first well region; a fifth type of gate oxide layer is connected the first heavily doped type source region located at the upper surface of the second doped type of the first well region and the left boundary of the field oxide layer; the fifth type of gate oxide layer is thicker than the fourth type gate of oxide layer of the first type of LDMOS device and covers partially or is tangent to the right boundary of the first heavily doped type source region; the upper surface of the fifth type of gate oxide layer is covered with a fifth type of polysilicon layer which is tangentially left or not extended to the left boundary of the fifth type gate oxide layer; the fifth type of polysilicon layer is covered or tangent to the right boundary of the first heavily doped type source region; the fifth type polysilicon layer covers a portion of the field oxide layer on the right side; the dielectric layer covers three parts, they are the exposed portion of the fifth type of gate oxide layer, the upper surface of the fifth type of polysilicon layer and the exposed upper surface of the field oxide layer, respectively; the second type of source metal covers a first heavily doped type source region and a portion of the upper surface of the second heavily doped type source region that is tangential to the left side of the first heavily doped type source region; the second type of drain metal covers the first heavily doped type source region on the right; the second type of field plate electrode metal partially covers the upper surface of the fifth type polysilicon layer;

the third type of LDMOS device is separated from the second type LDMOS device by isolation strips; the first doped type of the third buried layer is located on the portion upper surface of the second doped type epitaxial layer; the first doped type epitaxial layer is located above the first doped type of the third buried layer, the field oxide layer is disposed directly above the first doped type epitaxial layer; the second doped type of the second well region is disposed on the left side of the first doped type epitaxial layer; the second doped type of a third falling field layer is located directly below the second doped type of the second well region and is tangent to the second doped type of the second well region; the first doped type of a fourth well region is disposed on the right side of the first doped type epitaxial layer, and the first heavily doped type source region is disposed near the upper surface of the first doped type of the fourth well region; the field oxide layer is spaced apart from the second doped type of the second well region by a certain distance; a sixth type of gate oxide layer partially covers or is tangent to the right boundary of the first heavily doped type source region, and is connected to the first heavily doped type source region located in the upper surface of the second doped type of the second well region and the left boundary of the field oxide layer; the surface of the sixth gate oxide layer is covered with a sixth type of polysilicon layer, the sixth type of polysilicon layer is tangentially left or not extended to the left boundary of the sixth type of gate oxide layer, it is covered or tangential to the right boundary of the first heavily doped type source region; a portion of the field oxide layer is covered with the right side of the sixth type of polysilicon layer; the dielectric layer overs three parts, they are the exposed portion of the sixth type of gate oxide layer and the upper surface of the sixth type of polysilicon layer and the exposed upper surface of the field oxide layer, respectively; the third type of drain metal overs the first heavily doped type source region on the right side, the third type of field plate electrode metal overs the partially surface of the sixth type polysilicon layer;

the fourth type of LDMOS device separated from the third type of LDMOS device by isolation strips; the first doped type of the fourth buried layer is located on the portion upper surface of the second doped type epitaxial layer, the first doped type epitaxial layer is located above the first doped type of the fourth buried layer; the second doped type of the top layer is disposed directly above the first doped type epitaxial layer, the field oxide layer is located above the second doped type of top layer; the second doped type of the third well region is disposed on the left side of the first doped type epitaxial layer, the second doped type of a fourth falling field layer is located directly below and tangent to the second doped type of the third well region; the first doped type of a fifth well region is disposed on the right side of the first doped type epitaxial layer, and a first heavily doped type source region is disposed near the surface of the first doped type of the fifth well region; the field oxide layer is spaced apart from the second doped type of the third well region by a certain distance; a seventh type of gate oxide layer partially covers or is tangent to the right boundary of the first heavily doped type source region, and is connected to the first heavily doped type source region located at the upper surface of the second doped type of the third well region and the left boundary of the field oxide layer; the seventh type of gate oxide layer is covered with a seventh type of polysilicon layer which is tangentially left or not extended to the left boundary of the seventh type gate oxide layer; the seventh type of polysilicon layer is covered or tangential to the right boundary of the first heavily doped type source region, the seventh type of polysilicon layer also covers a portion of the field oxide layer on the right side; the dielectric layer covers three parts, they are the exposed portion of the seventh type of gate oxide layer, the upper surface of the seventh type of polysilicon layer and the exposed upper surface of the field oxide layer, respectively; the fourth type of source metal covers a portion of the first heavily doped type source region and a portion of the second heavily doped type source region; the fourth type of drain metal covers a portion of the first heavily doped type source region, the fourth type of field plate electrode metal covers part of the upper surface of the seventh type of polysilicon layer field plate;

the fifth type of LDMOS device is separated from the fourth type LDMOS device by isolation strips, the fifth type of LDMOS device is provided with a first doped type of the fifth buried layer located at a portion of the upper surface of the second doped type epitaxial layer; the second doped type buried layer is located above the first doped type of the fifth buried layer, the field oxide layer is disposed over the second doped type buried layer; the second doped type of the fourth well region is disposed on the left side of the first doped type epitaxial layer; the second doped type of a fifth falling field layer is located directly below the second doped type of the fourth well region and is tangent to the second doped type of the fourth well region; the first doped type of a sixth well region is disposed on the right side of the first doped type epitaxial layer and a first heavily doped type source region is disposed near the upper surface the first doped type of the sixth well region; the field oxide layer is spaced apart from the second doped type of the fourth well region by a certain distance; an eighth type gate oxide layer partially covers or is tangent to the right boundary of the first heavily doped type source region, and is connected to the first heavily doped type source region located at the upper surface of the second doped type fourth well region and the left boundary of the field oxide layer; the eighth type of gate oxide layer is covered with an eighth type polysilicon layer which is tangentially left or not extended to the left boundary of the eighth type gate oxide layer; the eighth type polysilicon layer is covered or tangential to the right boundary of the first heavily doped type source region, and covers a portion of the eighth type field oxide layer on the right side; the dielectric layer covers three parts, they are the exposed portion of the eighth type gate oxide layer, the upper surface of the eighth type polysilicon layer, and the exposed upper surface of the field oxide layer, respectively; the fifth type of source metal covers a portion of the first heavily doped type source region and a portion of the second heavily doped type source region; the fifth type of drain metal covers a portion of the first heavily doped type source region, the fifth type of field plate electrode metal covers part of the polysilicon;

the sixth type of LDMOS device is separated from the fifth type LDMOS device by isolation strips; the sixth type of LDMOS device is provided with a first doped type of the sixth buried layer at a portion of the upper surface of the second doped type epitaxial layer; the first doped type epitaxial layer is located above the first doped type of the sixth buried layer; the field oxide layer is disposed over the first doped type epitaxial layer, the second doped type of the fifth well region is disposed on the left side of the first doped type epitaxial layer; the second doped type of a sixth falling field layer is located directly below and tangent to the second doped type of the fifth well region; the first doped type of a seventh well region is disposed on the right side of the first doped type epitaxial layer and a first heavily doped type source region is disposed near the upper surface of the first doped type of the seventh well region; the field oxide layer is spaced apart from the second doped type of the fifth well region by a certain distance; a ninth type gate oxide layer covers or is tangent to the right boundary of the first heavily doped type source region, and is connected to the first heavily doped type source region located at the upper surface of the second doped type of the fifth well region and the left boundary of the field oxide layer; a ninth type polysilicon layer is covered on the upper surface of the ninth type gate oxide layer and is tangentially left or not extended to the left boundary of the ninth type gate oxide layer; the ninth type polysilicon layer covered or tangential to the right boundary of the first heavily doped type source region; the ninth type polysilicon layer covers a portion of the ninth field oxide layer on the right side; the ninth type of dielectric layer is covered with three parts, they are the exposed portion of gate oxide layer, the upper surface of ninth type polysilicon layer, and the exposed upper surface of field oxide layer, respectively; the sixth source metal covers a portion of the first heavily doped type source region and a portion of the second heavily doped type source region; the sixth type of drain metal covers a portion of the first heavily doped type source region;

the seventh type LDMOS device is separated from the sixth type LDMOS device by isolation strips; the seventh type of LDMOS device is provided with a first doped type of the seventh buried layer located at a portion of the upper surface of the second doped type epitaxial layer, the first doped type epitaxial layer is located above the first doped type of the seventh buried layer; the second doped type of the sixth well region is disposed on the left side of the first doped type epitaxial layer; the second doped type of a seventh falling field layer is located just below and is tangent to the second doped type of the sixth well region, the first heavily doped type source region is disposed on the right side of the first doped type epitaxial layer; a tenth type gate oxide layer is partially covered or tangential to the right boundary of the first heavily doped type source region, and is connected to the first heavily doped type source region which located at the upper surface of the second doped type of the sixth well region and the first doped type sustain voltage layer disposed on the right side of the first doped type epitaxial layer; the upper surface of the tenth type gate oxide layer is covered with a tenth type polysilicon layer which is tangentially left or not extended to the left boundary of the tenth gate oxide layer and is covered or tangent to the right boundary of the first heavily doped type source region; the dielectric layer is covered by three parts, they are the exposed portion of the tenth type of gate oxide layer, the upper surface of the tenth type of polysilicon layer, and the exposed upper surface of the field oxide layer, respectively; the seventh type of source metal covers a portion of the first heavily doped type source region and a portion of the second heavily doped type source region, the seventh type of drain metal covers a portion of the first heavily doped type source region;

the second type of JFET device is separated from the seventh type LDMOS device by the isolation strips; the second type of JFET device is provided with a first doped type epitaxial layer located at a portion of the upper surface of the second doped type epitaxial layer, a second type of heavily doped type is disposed at near the middle upper surface of the first doped type epitaxial layer; the first type of heavily doped type source region is symmetrically disposed on the left and right sides of the second type of heavily doped type source region; the first type of heavily doped type source region is isolated from the second type of heavily doped type source region by a field oxide layer in the horizontal direction, the field oxide layer is covered with a dielectric layer; the fourth type of metal layer covers the first type of heavily doped type source region on the left side of the second type of heavily doped type source region; the fifth type of metal layer covers a portion of the second type of heavily doped type source regions; the sixth type of metal layer covers the first type of heavily doped type source region on the right side of the second type of heavily doped type source region;

the low voltage NMOS device is separated from the second type JFET device by the isolation strips; the low voltage NMOS device is provided with a first doped type of the eighth buried layer located at a portion of the upper surface of the second doped type epitaxial layer; the first doped type epitaxial layer is located above the first doped type of the eighth buried layer; the second doped type of the second deep well region is located above the first doped type epitaxial layer; the second doped type of the second deep well region is provided with a first heavily doped type source region and a second heavily doped type source region on the left side; the first heavily doped type source region is disposed on the right side of the second doped type of the second deep well region; the upper surfaces of two adjacent first heavily doped type source regions are connected by an eleventh type of gate oxide layer; the eleventh type of gate oxide layer is tangent or covers a portion of the first heavily doped type source region; an eleventh type of polysilicon layer covers an upper surface of the eleventh type of gate oxide layer; the dielectric layer covers the eleventh type of polysilicon layer; The first type of body region metal layer covers the second heavily doped type source region, the eighth type source metal layer covers the first heavily doped type source region, the eighth type of drain metal layer covers the first heavily doped type source region;

the low voltage PMOS device is separated from the low voltage NMOS devices by isolation strips; the low voltage PMOS device is provided with a first doped type of the ninth type of buried layer located at a portion of the upper surface of the second doped type epitaxial layer; the first doped type epitaxial layer is located above the first doped type of the ninth buried layer; the first doped type of the second well region is located above the first doped type epitaxial layer; the first doped type of the deep well region is provided with a first heavily doped type source region and a second heavily doped type source region on the left side; the second heavily doped type source region is disposed on the right side of the first doped type of the deep well region; the upper surfaces of two adjacent second heavily doped type source regions are connected by a twelfth type of gate oxide layer; the twelfth type of gate oxide layer is tangent or covers a portion of the second heavily doped type source region, a twelfth type of polysilicon layer covers an upper surface of the twelfth type of gate oxide layer, the dielectric layer covers the upper surface of the twelfth type of polysilicon layer; the second type of body region metal layer covers the first heavily doped type source region, the ninth source metal covers the second heavily doped type source region, the ninth type drain metal covers the second heavily doped type source region;

the PNP device is separated from adjacent low voltage PMOS devices by isolation strips; the PNP device is provided with a first doped type of the tenth buried layer located at a portion of the upper surface of the second doped type epitaxial layer; the first doped type epitaxial layer is located above the first doped type of the tenth buried layer, the first doped type epitaxial layer is provided with two first heavily doped type source regions and two second heavily doped type source regions both of which are alternately distributed with equally spaced; the first heavily doped type source region disposed at a leftmost side of the first doped type epitaxial layer, adjacent to the right side of the first heavily doped type source region is a second heavily doped type source region; the surfaces of both the first heavily doped type source region and the second heavily doped type source region each other are isolated by the field oxide layer; the two first heavily doped type source regions and the second heavily doped type source regions distributed alternately with equally spaced, are isolated from each other by the field oxide layer; two second heavily doped type source regions surrounded by a second doped type of the third deep well region; the seventh type of metal layer covers the upper surface of the first heavily doped type source region, the eighth type of metal layer covers the second heavily doped type source region, the ninth metal layer covers the first heavily doped type source region, the tenth metal layer covers the second heavily doped type source region;

the NPN device is separated from the adjacent PNP device by the isolation strips; the NPN device is provided with the first doped type of eleventh buried layer located at a portion of the upper surface of the second doped type epitaxial layer; the first doped type epitaxial layer is located above the first doped type of eleventh buried layer; the second doped type of the fourth deep well region is disposed at the upper left of the first doped type epitaxial layer; the first heavily doped type source region and the second heavily doped type source region separated by the field oxide layer are disposed at the upper surface of the second doped type fourth of the deep well region; the upper surface of the field oxide layer covered with a dielectric layer; the first heavily doped type source region is disposed at the upper surface of the first doped type epitaxial layer which is outside the fourth doped type of the fourth deep well region; the left side of the first heavily doped type source region is separated from the right side of the second doped type of the fourth deep well region by the field oxide layer; the dielectric layer covers field oxide layer; the twelfth type metal layer covers the first heavily doped type source region located in the fourth deep well region; the eleventh metal layer covers the second heavily doped type source region in the fourth deep well region; the thirteenth metal layer covers the first heavily doped type source region outside the third deep well region;

the diode device is separated from the adjacent PNP device by isolation strips; the diode device is provided with a second doped type of the third buried layer at a portion of the upper surface of the second doped type epitaxial layer; the second doped type of the third buried layer is led to the surface through the second doped type of the fifth deep well region, realizing the function of a diode anode; the first doped type epitaxial layer is located above the second doped type of the third buried layer; the second doped type of the fifth deep well region is disposed on each side of the first doped type epitaxial layer; the second heavily doped type source region is disposed at an upper surface of the second doped type of the fifth well region; two second heavily doped type source regions and a first heavily doped type source region are located on the upper surface of the first doped type epitaxial layer; the first heavily doped type source region and the two adjacent second heavily doped type source regions each other are separated by field oxide layer; the upper surface of the field oxide layer is covered with a dielectric layer; the fourteenth metal layer covers the second heavily doped type source region, the fifteenth class of metal covers the first heavily doped type source region, the sixteenth metal layer covers the second heavily doped type source region.

2. The BCD semiconductor devices according to claim 1, wherein the isolation strip is formed by filling the dielectric layer.

3. The BCD semiconductor devices according to claim 1, wherein the first doped type pillar and the second doped type pillar are formed by etching trench and refilling.

4. The BCD semiconductor devices according to claim 1, wherein a thin dielectric layer is provided between the first doped type pillar and the second doped type pillar.

5. The BCD semiconductor devices according to claim 1, wherein the first doped type pillar and the second doped type pillar of the device are directly formed on the first doped type substrate, and the first doped type buffer region is removed.

6. The BCD semiconductor devices according to claim 1, wherein the LIGBT device, the first type of LDMOS device, the second type of LDMOS device, the third type of LDMOS device, the fourth type of LDMOS device, the fifth type of LDMOS device, the sixth type of LDMOS device, the seventh type of LDMOS device, the second type of JFET device, the low voltage NMOS device, the low voltage PMOS device, the low voltage PNP, the low voltage NPN device and the diode are manufactured in the second doped epitaxial layer.

7. The BCD semiconductor devices according to claim 5, wherein the LIGBT device, the first type of LDMOS device, the second type of LDMOS device, the third type of LDMOS device, the fourth type of LDMOS device, the fifth type of LDMOS device, the sixth type of LDMOS device, the seventh type of LDMOS device, the second type of JFET device, the low voltage NMOS device, the low voltage PMOS device, the low voltage PNP, the low voltage NPN device and the diode are separated from the second doped type epitaxial layer by the dielectric layer.

8. The BCD semiconductor devices according to claim 1, wherein the isolation strip comprises a second doped type isolation buried layer and the isolation pillar.

9. A method of manufacturing the BCD semiconductor device according to claim 1, comprising the following steps;

step 1: growing a first epitaxial layer on the first doped type substrate to form the first doped type epitaxial layer, wherein a resistivity of the first doped type substrate is 0.0001~0.01 ohm·cm, and a resistivity of the first doped type epitaxial layer is 1~15 ohm·cm;

step 2: growing a second epitaxial layer on the upper surface of the first doped epitaxial layer to form the first doped type pillar, wherein a resistivity of the first doped type pillar is 1~15 ohm·cm;

step 3: injecting impurities to form the second doped type pillar, wherein an injection dose of the impurities is 1e11 $cm^{-2}$~1e14 $cm^{-2}$;

step 4: repeating step 2 and step 3 until a pressure resistance meets a preset requirements;

step 5: growing a third epitaxial layer on the drift region formed by a periodic arrangement of the first doped type pillar and the second doped type pillar to form the second doped epitaxial layer;

step 6: injecting the impurities in a first area of the second doped type epitaxial layer to form the third doped type pillar, wherein the first area of the second doped type epitaxial layer forms high voltage vertical devices comprising the first type of JFET device, the first type of VDMOS devices and the second type of VDMOS devices; injecting the impurities on a second area of the second doped type epitaxial layer to form from the first doped type first buried layer to the first doped type eleventh buried layer; and injecting the impurities to form the second doping type of third buried layer of the diodes, wherein an injection impurity of a buried layer is required to be a heavy impurity ion; the heavy impurity ion is non-diffusible;

step 7: growing a fourth epitaxial layer at the upper surface of the second doped type epitaxial layer, the third doped type pillar, the first doped type first buried layer to the eleventh buried layer and the second doped type third buried layer to form the first doped type epitaxial layer;

step 8: injecting the impurities to form the isolation pillar and the second doped type body region; the isolation pillar is located between the right of second type of VDMOS devices and a lateral device; the second doped type body region belonging to the high-voltage vertical devices comprises the first type of the JFET devices, the first type of VDMOS devices and the second type of VDMOS devices; the lateral device comprises the LIGBT device, the first type of LDMOS device, the second type of LDMOS device, the third type of LDMOS device, the fourth type of LDMOS device, the fifth type of LDMOS device, the sixth type of LDMOS device and the seventh type of LDMOS device, the second type of JFET device, the low-voltage NMOS device, the low-voltage PMOS device, the low-voltage PNP device, the low-voltage NPN device and the diode;

step 9: driving in and thermally oxidating to form the field oxide layer, and opening a window of a source area by etching;

step 10: successively injecting the impurities to respectively form the first doped type of the deep well region of the low-voltage PMOS device and the second doped type first deep well region to the second doped type fifth deep well region; the second doped type first deep well region to the second doped type fifth deep well region belong to the first type of LDMOS device, the low voltage NMOS device, the PNP device, the NPN device, the diodes device;

step 11: injecting the impurities to form the first doped type first well region to seventh well region of the device; injecting the impurities to form a well region of a device on the right side the second type VDMOS device; the device on the right side the second type VDMOS device comprises the LIGBT device, the first type of LDMOS device, the second type of LDMOS device, the third type of LDMOS device, the fourth type of LDMOS device, the fifth type of LDMOS device, the sixth type of LDMOS device and the seventh type of LDMOS device;

step 12: injecting the impurities to form a first doped type falling field layer of the device on the right side of the second type VDMOS device; injecting the impurities to form the second doped type of the first falling field layer to the seventh falling field layer of the device on the right side of the second type VDMOS device;

step 13: injecting the impurities to form a first lightly doped type depleted channel region of VDMOS device and a first doped type sustain voltage layer of the seventh type of LDMOS device;

step 14: forming a gate oxide layer, a polysilicon gate and a polysilicon field plate, wherein the polysilicon gate resistance is 10~40 ohm/square;

Step 15: injecting successively the impurities to form the first heavily doped type source region and the second heavily doped type source region, wherein a dose of the impurities is 1e15 cm$^{-2}$~2e16 cm$^{-2}$;

step 16: depositing a dielectric material to form the dielectric layer;

step 17: metallizing a metal electrode, and forming the high voltage drain metal on the bottom of the first doped type substrate.

10. A method of manufacturing the BCD semiconductor device according to claim 1, comprising the following steps:

step 1: growing a first epitaxial layer on the first doped type substrate form the first doped type epitaxial layer, wherein a resistivity of the first doped type substrate is 0.0001~0.01 ohm·cm, and a resistivity of the first doped type epitaxial layer is 1~15 ohm·cm;

step 2: growing a second epitaxial layer on the upper surface of the first doped epitaxial layer to form the first doped type pillar, wherein a resistivity of the first doped type pillar is 1~15 ohm·cm;

step 3: etching the first doped type pillar to form a plurality of trenches, and growing a third epitaxial layer to form the second doped type pillar; refilling the plurality of trenches; and planarizing an upper surface of the epitaxial layer;

step 4: growing a fourth epitaxial layer to form the second doped epitaxial layer; injecting the impurities to form the third doped type pillar at a region forming the first type JFET, the first type of VDMOS devices and the second type of VDMOS devices;

implanting the impurities to form buried layers, comprising the first doped type first buried layer to the first doped type buried layer and the second doped type third buried layer at the other region of the second doped epitaxial layer; wherein an injection impurity of the buried layer is required to be a heavy impurity ion; the heavy impurity ion is non-diffusible;

step 5: growing a fifth epitaxial layer to form the first doped type epitaxial layer at the upper surface of the second doped type epitaxial layer and the third doped type pillar;

step 6: injecting the impurities to form the isolation pillar and the second doped type body region of a high voltage vertical device;

step 7: driving in and thermally oxidating to form the field oxide layer, and opening a window of a source area by etching;

step 8: successively injecting the impurities to respectively form the first doped type of the deep well region of the low-voltage PMOS device, the second doped type first deep well region to the second doped type fifth deep well region, the second doped type first deep well region to the second doped type fifth deep well region belonging to the first type of LDMOS device, the low voltage NMOS device, the PNP device, the NPN device and the diodes device;

step 9: injecting the impurities to form the first doped type first well region to seventh well region of the device on the right side the second type of VDMOS device; injecting the impurities to form well regions of devices on the right side the second type of VDMOS device; the devices on the right side the second type of VDMOS device comprises: the LIGBT device, the first type of LDMOS device, the second type of LDMOS device, the third type of LDMOS device, the fourth type of LDMOS device, the fifth type of LDMOS device, the sixth type of LDMOS device and the seventh type of LDMOS device;

step 10: injecting the impurities to form the first doped type falling field layer of the first type of LDMOS device; injecting the impurities to form the second doped type of the first falling field layer to the seventh falling field layer of the LIGBT device, the second type of LDMOS device, the third type of LDMOS device, the fourth type of LDMOS device, the fifth type of LDMOS device, the sixth type of LDMOS device, the seventh type of LDMOS device, respectively;

step 11: injecting the impurities to form a first lightly doped type depleted channel region of the second type of VDMOS device and a first doped type sustain voltage layer of a seven type of device;

step 12: forming a gate oxide layer, a polysilicon gate and a polysilicon field plate, the polysilicon gate resistance is 10~40 ohm/square;

step 13: injecting successively the impurity to form the first heavily doped type source region and the second heavily doped type source region, wherein a dose of the impurity is 1e15 cm$^{-2}$~2e16 cm$^{-2}$;

step 14: depositing a dielectric material to form the dielectric layer;

step 15: metallizing a metal electrode, and forming the high voltage drain metal on the bottom of the first doped type substrate.

* * * * *